US011637227B2

(12) United States Patent
Lee et al.

(10) Patent No.: US 11,637,227 B2
(45) Date of Patent: Apr. 25, 2023

(54) SEMICONDUCTOR DEVICE INCLUDING MULTIPLE DISTRIBUTED BRAGG REFLECTOR LAYERS

(71) Applicant: SUZHOU LEKIN SEMICONDUCTOR CO., LTD., Taicang (CN)

(72) Inventors: Keon Hwa Lee, Seoul (KR); Su Ik Park, Seoul (KR); Yong Gyeong Lee, Seoul (KR); Baek Jun Kim, Seoul (KR); Myung Sub Kim, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 570 days.

(21) Appl. No.: 16/476,773

(22) PCT Filed: Jan. 25, 2018

(86) PCT No.: PCT/KR2018/001131
§ 371 (c)(1),
(2) Date: Jul. 9, 2019

(87) PCT Pub. No.: WO2018/139877
PCT Pub. Date: Aug. 2, 2018

(65) Prior Publication Data
US 2019/0386189 A1    Dec. 19, 2019

(30) Foreign Application Priority Data

Jan. 25, 2017 (KR) .................. 10-2017-0012006
Mar. 30, 2017 (KR) .................. 10-2017-0040524
Mar. 30, 2017 (KR) .................. 10-2017-0040526

(51) Int. Cl.
*H01L 33/60*        (2010.01)
*H01L 33/30*        (2010.01)
(Continued)

(52) U.S. Cl.
CPC .............. *H01L 33/60* (2013.01); *H01L 33/30* (2013.01); *H01L 33/405* (2013.01); *H01L 33/145* (2013.01)

(58) Field of Classification Search
CPC ......... H01L 33/30; H01L 33/40; H01L 33/60; H01L 33/62; H01L 33/44; H01L 33/382;
(Continued)

(56) References Cited

U.S. PATENT DOCUMENTS 6,658,041 B2   12/2003  Uebbing
7,605,403 B2   10/2009  Horio et al.
(Continued)

FOREIGN PATENT DOCUMENTS

CN      102074893 A    5/2011
CN      105874662 A    8/2016
(Continued)

*Primary Examiner* — David Chen
(74) *Attorney, Agent, or Firm* — Birch, Stewart, Kolasch & Birch, LLP

(57) ABSTRACT

A semiconductor device according to an embodiment may include a plurality of light emitting structures, a first electrode disposed around the plurality of light emitting structures, a second electrode disposed on an upper surface of the plurality of light emitting structures, a first bonding pad electrically connected to the first electrode, and a second bonding pad electrically connected to the second electrode. The plurality of light emitting structures may include a first light emitting structure that includes a first DBR layer of a first conductivity type, a first active layer disposed on the first DBR layer, and a second DBR layer of a second conductivity type disposed on the first active layer; and a second light emitting structure that includes a third DBR layer of the first conductivity type, a second active layer disposed on the third DBR layer, and a fourth DBR layer of the second conductivity type disposed on the second active layer. The first electrode may be electrically connected to the (Continued)

first DBR layer and the third DBR layer, and disposed between the first light emitting structure and the second light emitting structure. The second electrode may be electrically connected to the second DBR layer and the fourth DBR layer, and disposed on an upper surface of the second DBR layer and an upper surface of the fourth DBR layer.

17 Claims, 88 Drawing Sheets

(51) Int. Cl.
*H01L 33/40* (2010.01)
*H01L 33/14* (2010.01)

(58) Field of Classification Search
CPC ....... H01L 33/58; H01L 33/36; H01L 33/145; H01L 33/405
USPC ............................ 257/79, 88, 98, 99; 438/34
See application file for complete search history.

(56) References Cited

U.S. PATENT DOCUMENTS

| | | | |
|---|---|---|---|
| 8,675,706 B2 | 3/2014 | Seurin et al. | |
| 2003/0231682 A1 | 12/2003 | Eitel | |
| 2004/0041753 A1* | 3/2004 | Nakanishi | H01L 27/3279 345/76 |
| 2006/0261361 A1 | 11/2006 | Shakuda | |
| 2007/0241354 A1* | 10/2007 | Tanaka | H01S 5/04257 257/E33.001 |
| 2007/0284598 A1* | 12/2007 | Shakuda | H01L 27/156 257/E33.012 |
| 2009/0245312 A1* | 10/2009 | Kageyama | H01S 5/423 372/50.124 |
| 2010/0303113 A1* | 12/2010 | Joseph | H01S 5/423 372/36 |
| 2011/0116147 A1 | 5/2011 | Motomura et al. | |
| 2011/0304682 A1* | 12/2011 | Irinoda | H01S 5/04254 372/44.01 |
| 2012/0223345 A1 | 9/2012 | Tomoda et al. | |
| 2013/0240923 A1* | 9/2013 | Hsu | H01L 33/20 257/94 |
| 2013/0266326 A1 | 10/2013 | Joseph et al. | |
| 2015/0280074 A1* | 10/2015 | Lee | H01L 33/405 257/98 |
| 2015/0311673 A1 | 10/2015 | Wang et al. | |
| 2016/0118773 A1 | 4/2016 | Hayakawa et al. | |
| 2016/0240759 A1 | 8/2016 | Chae et al. | |
| 2018/0026163 A1 | 1/2018 | Seo et al. | |

FOREIGN PATENT DOCUMENTS

| | | |
|---|---|---|
| CN | 107431103 A | 12/2017 |
| EP | 1 596 441 A2 | 11/2005 |
| EP | 2325957 A2 | 5/2011 |
| JP | 2000-114858 A | 4/2000 |
| JP | 2006-324433 A | 11/2006 |
| JP | 2008-118024 A | 5/2008 |
| JP | 2011-003748 A | 1/2011 |
| JP | 2011-129869 A | 6/2011 |
| JP | 2016-82199 A | 5/2016 |
| JP | 2016-519436 A | 6/2016 |
| JP | 2016-146417 A | 8/2016 |
| JP | 2017-84899 A | 5/2017 |
| JP | 2018-509758 A | 4/2018 |
| KR | 10-2016-0026922 A | 3/2016 |
| KR | 10-2016-0081075 A | 7/2016 |
| KR | 10-2016-0115301 A | 10/2016 |
| WO | WO 2014/175901 A1 | 10/2014 |

* cited by examiner

[FIG. 1]
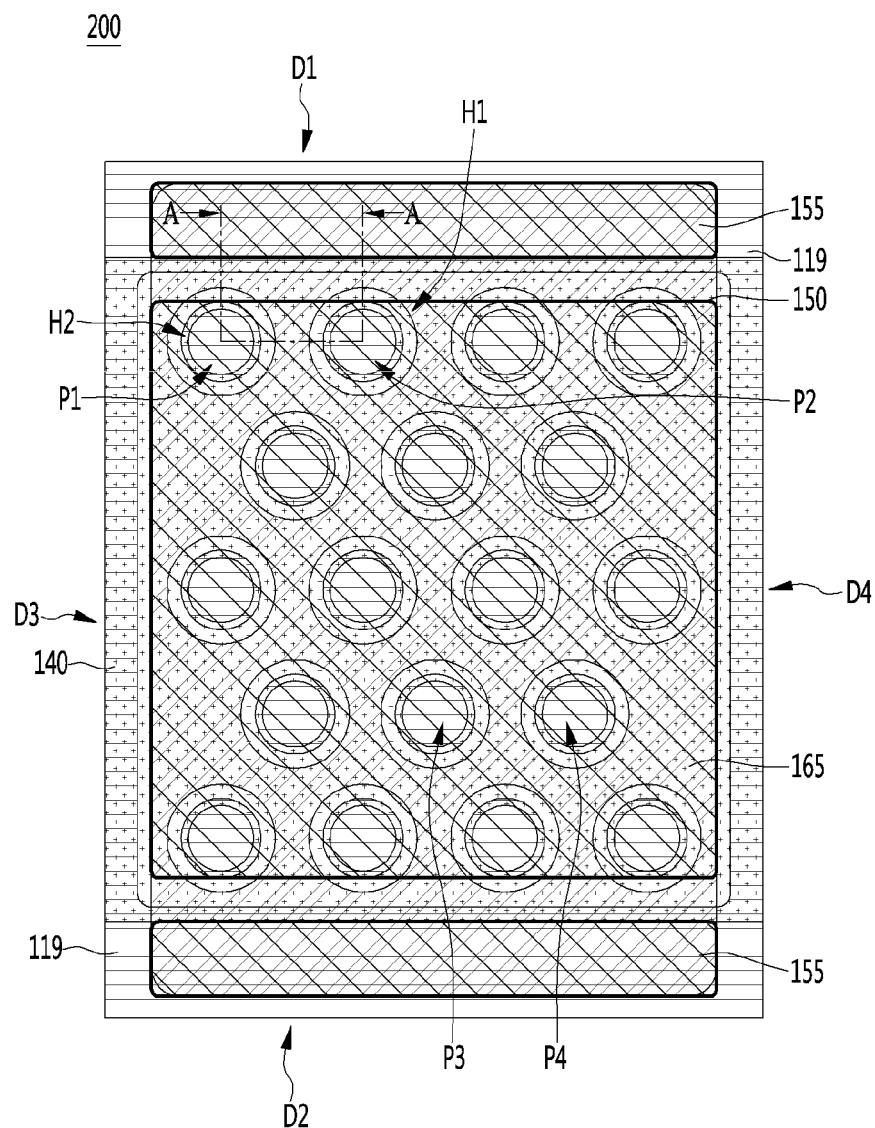

[FIG. 2]
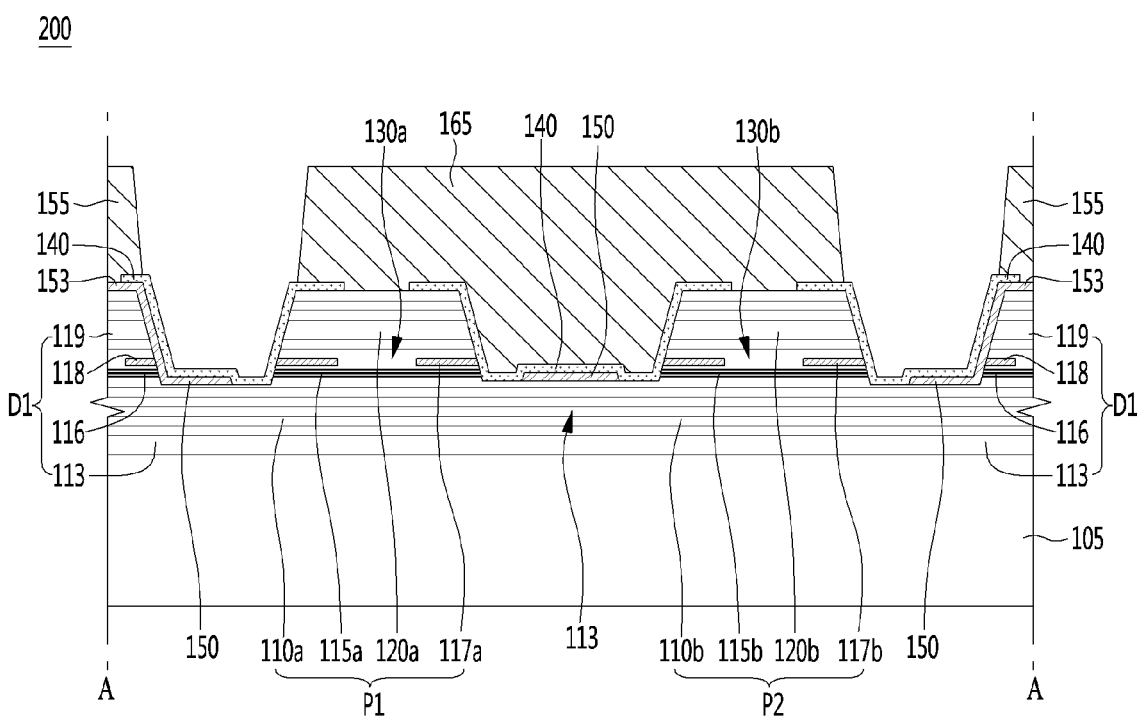

[FIG. 3a]
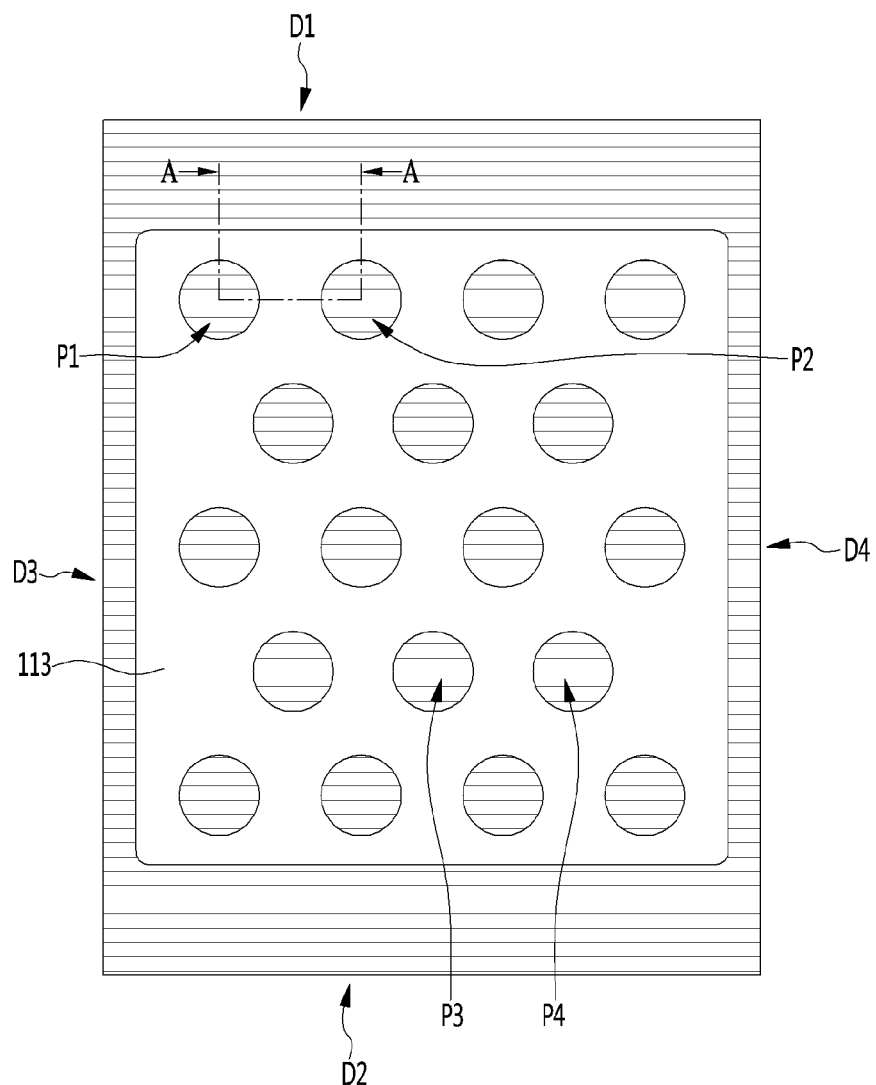

[FIG. 3b]
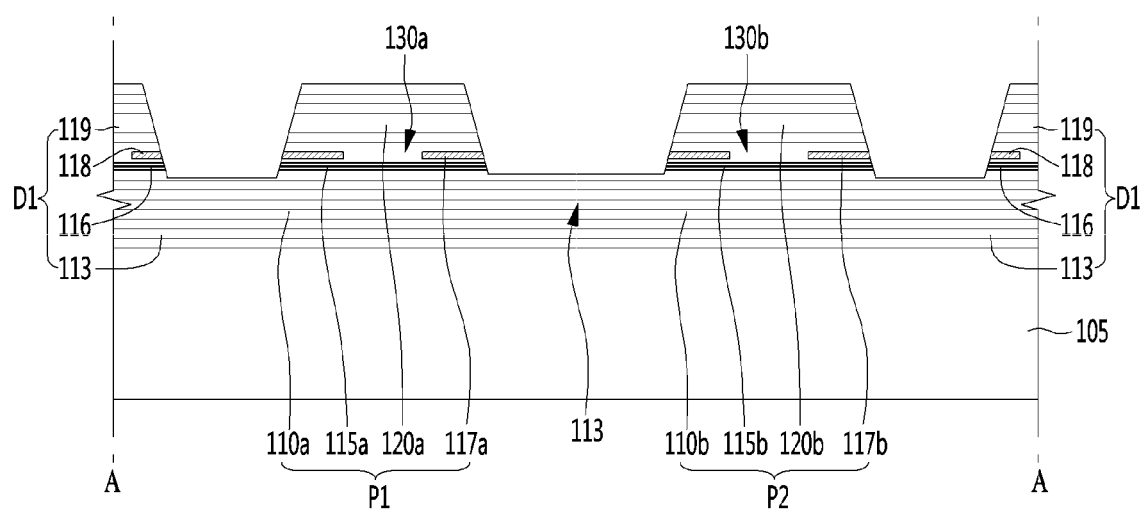

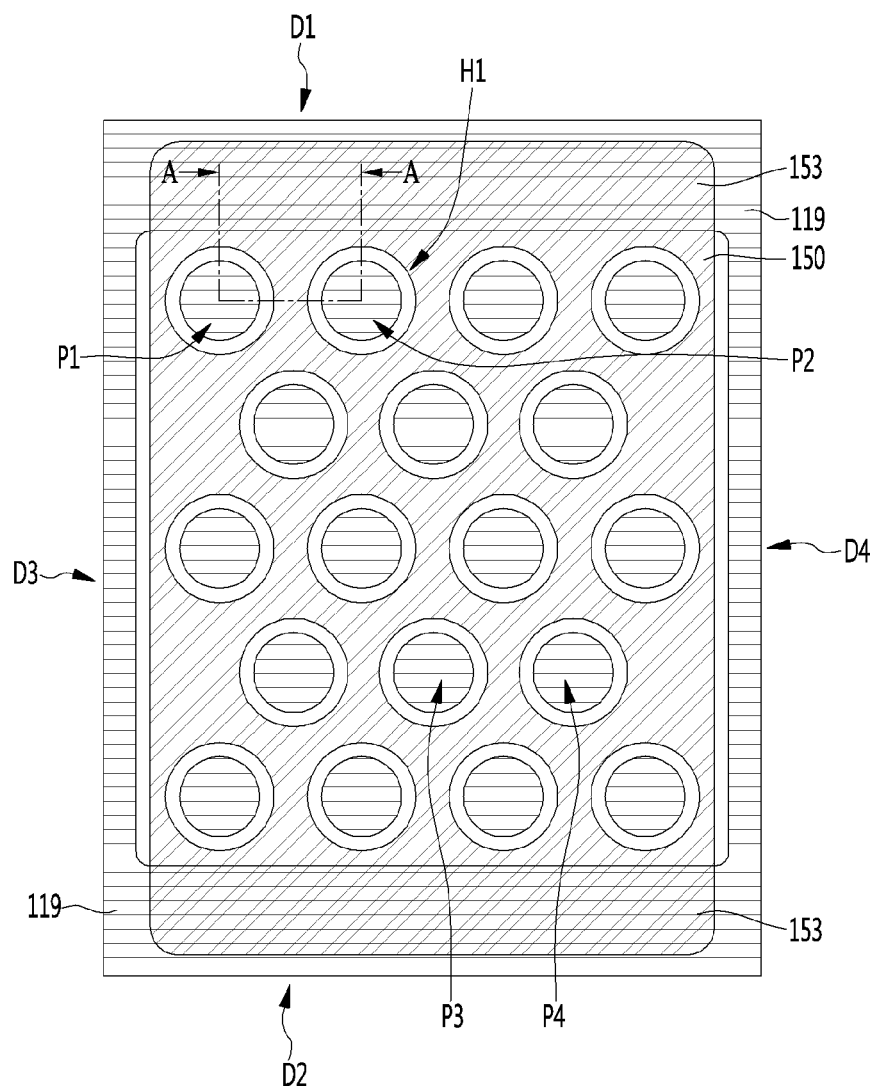
[FIG. 4a]

[FIG. 4b]
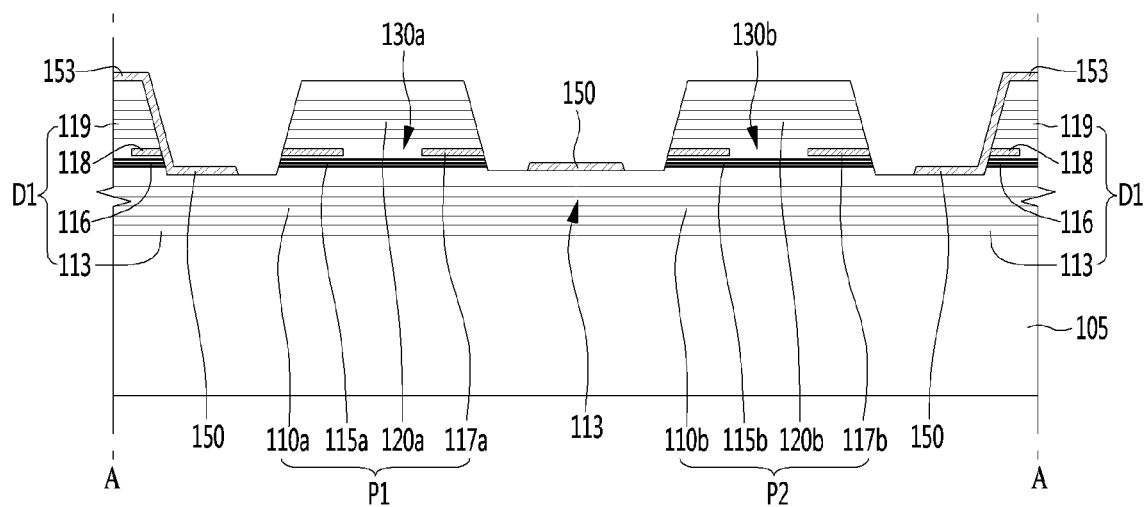

[FIG. 5a]
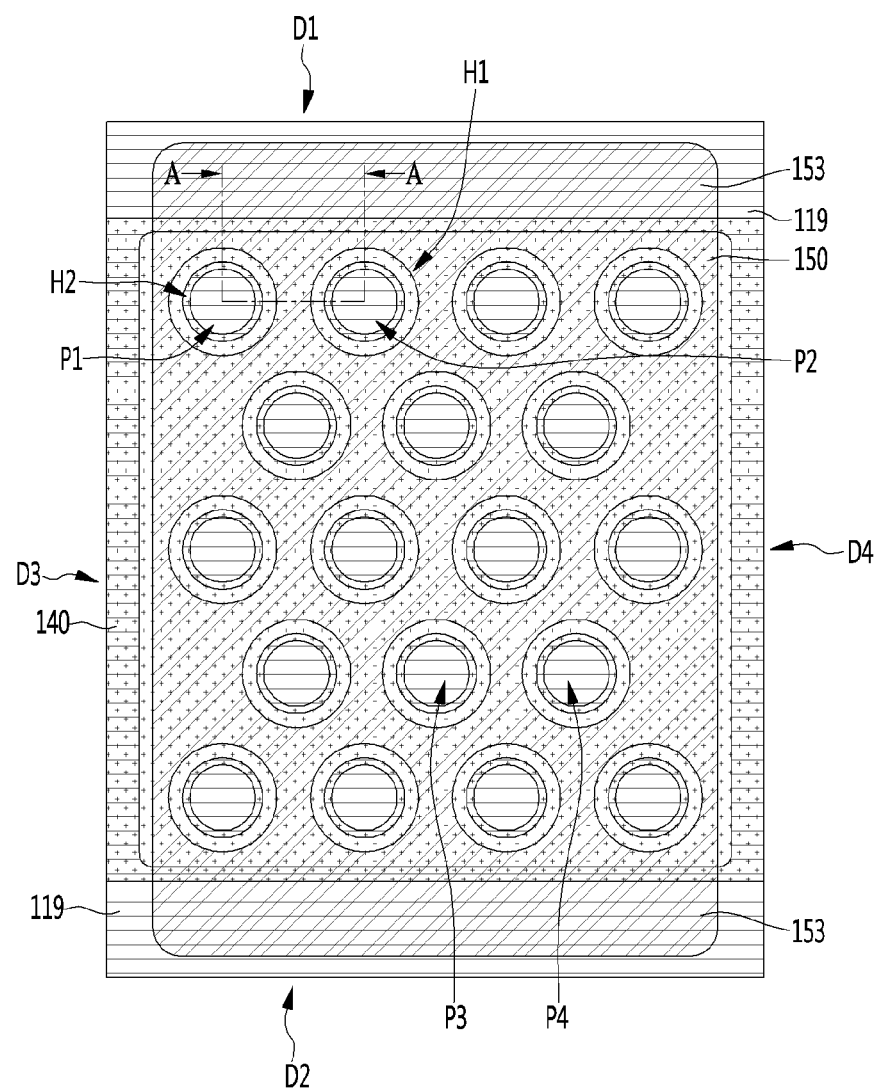

【FIG. 5b】
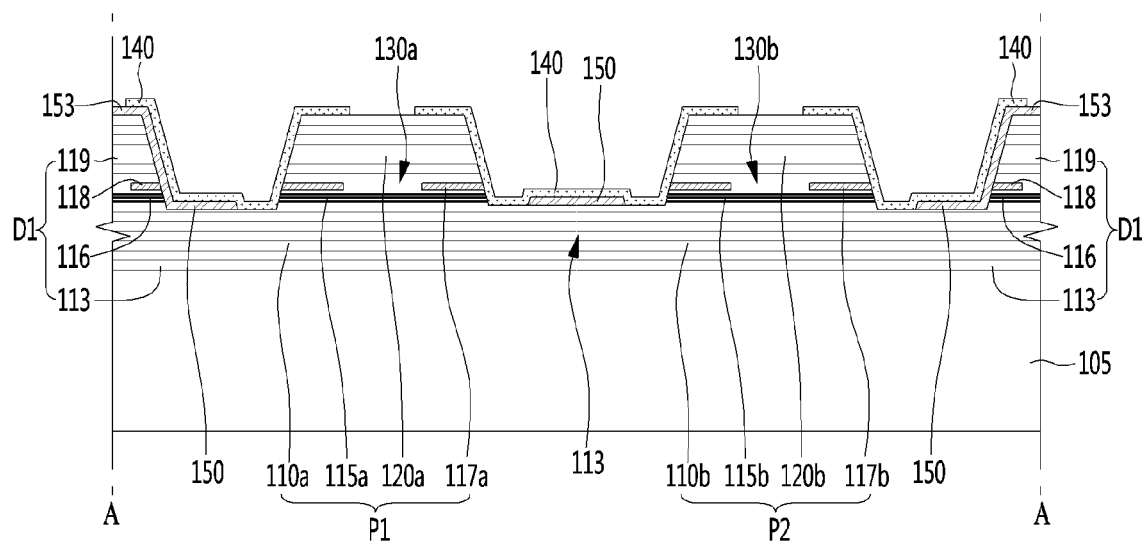

[FIG. 6a]
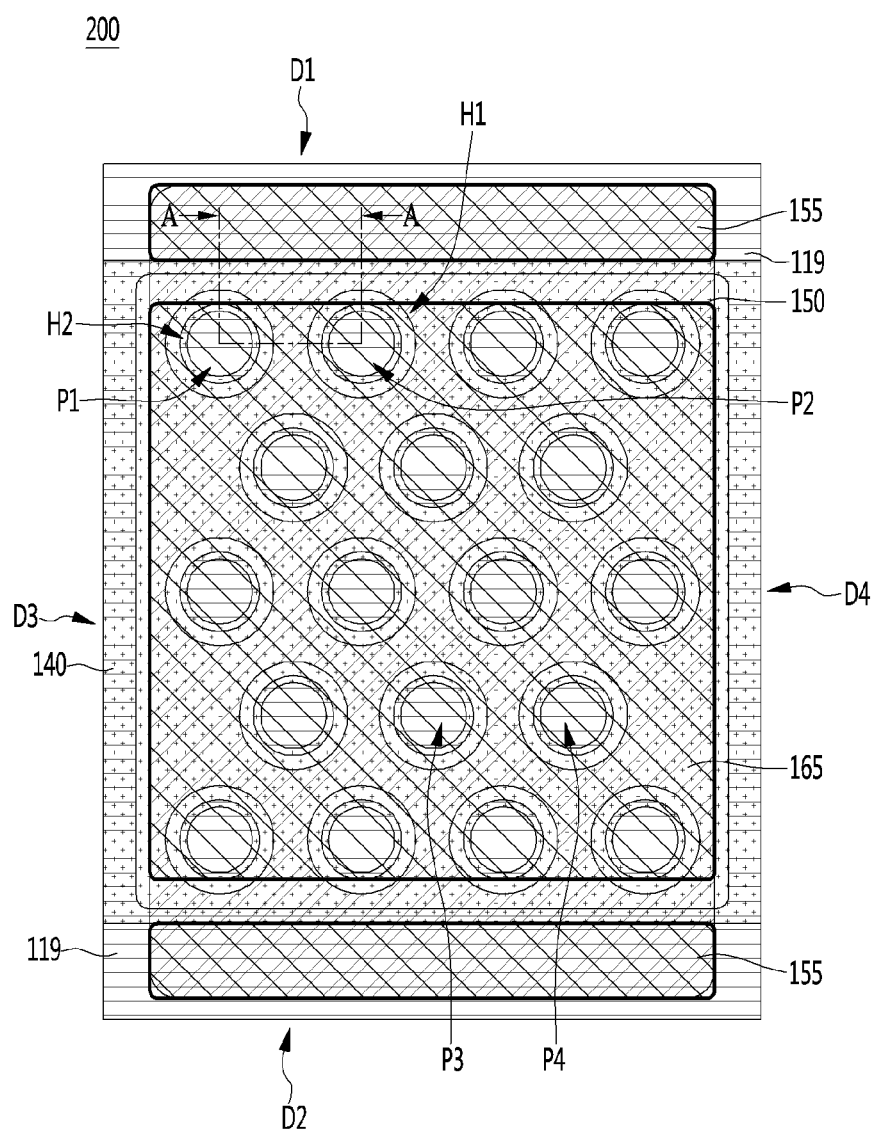

[FIG. 6b]
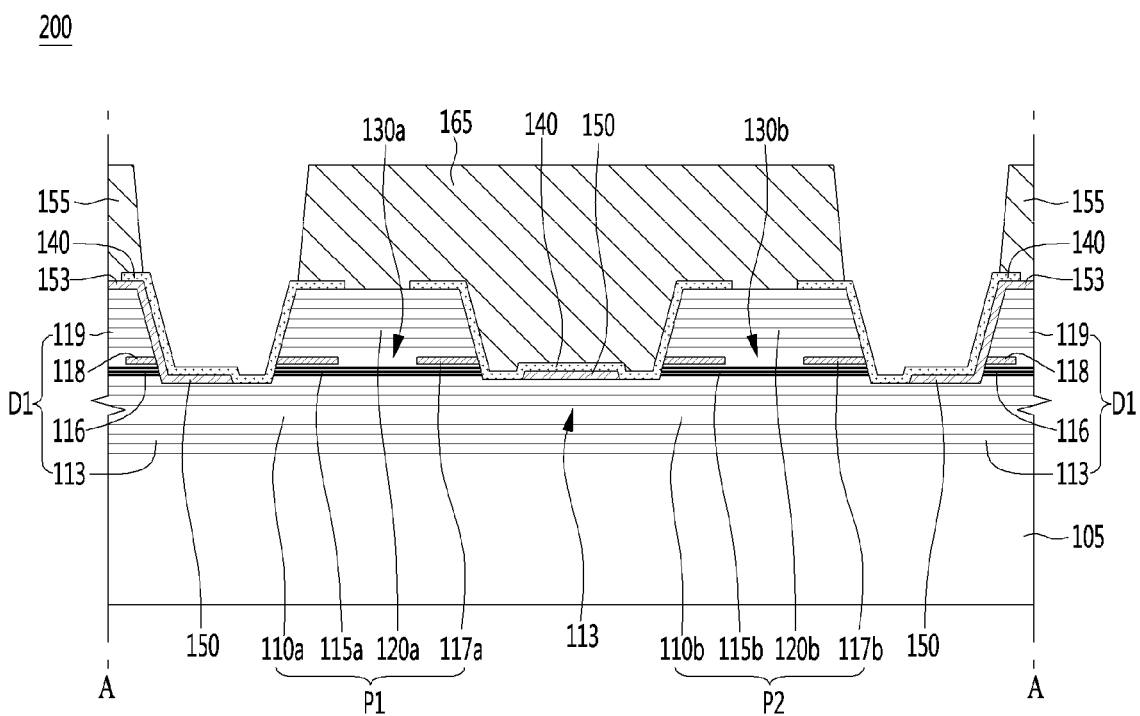

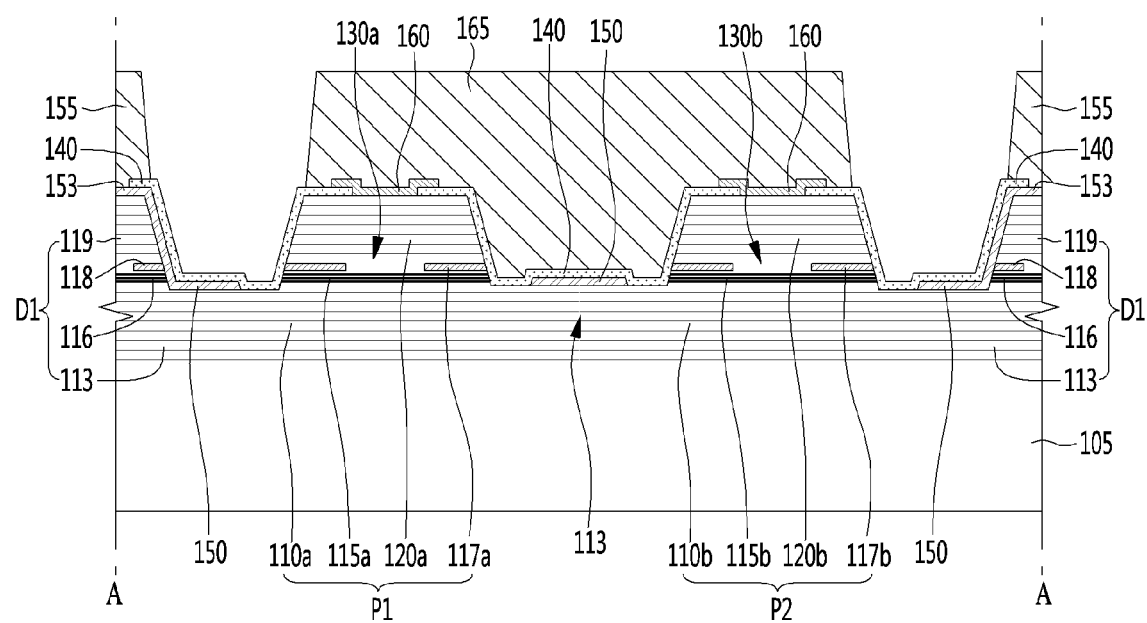
[FIG. 7]

[FIG. 8]
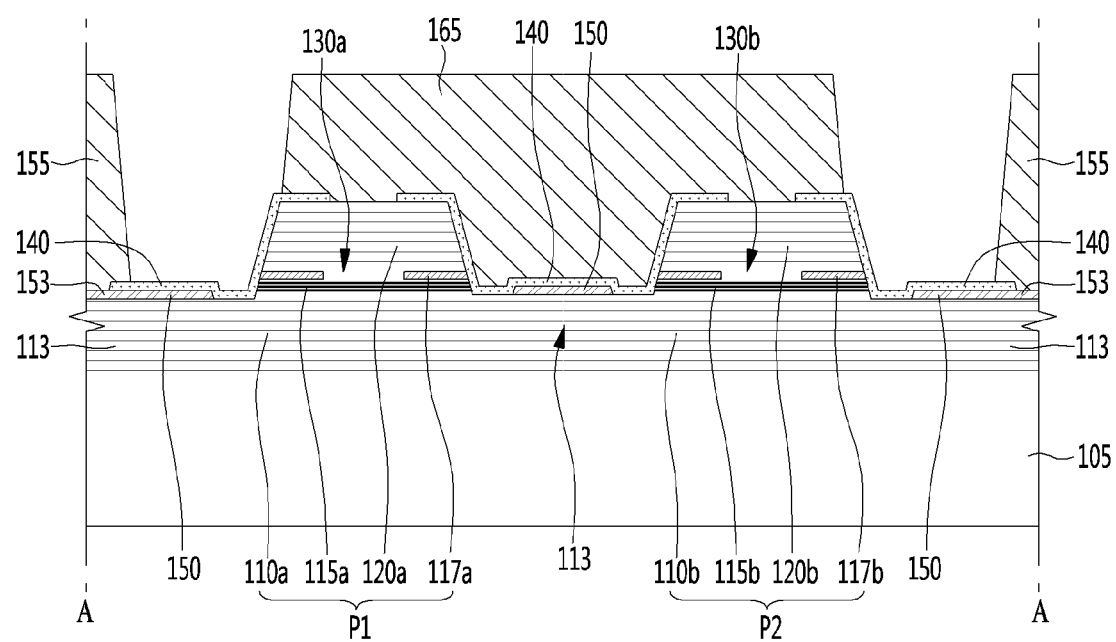

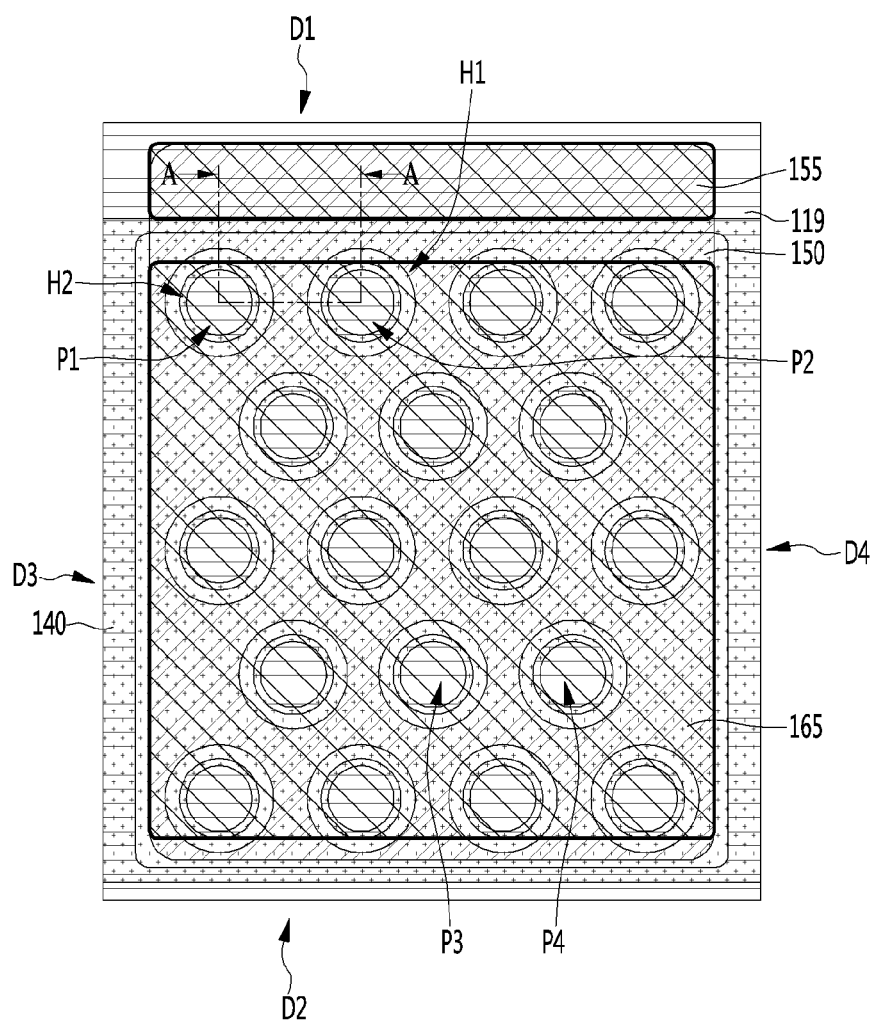
[FIG. 9]

[FIG. 10]
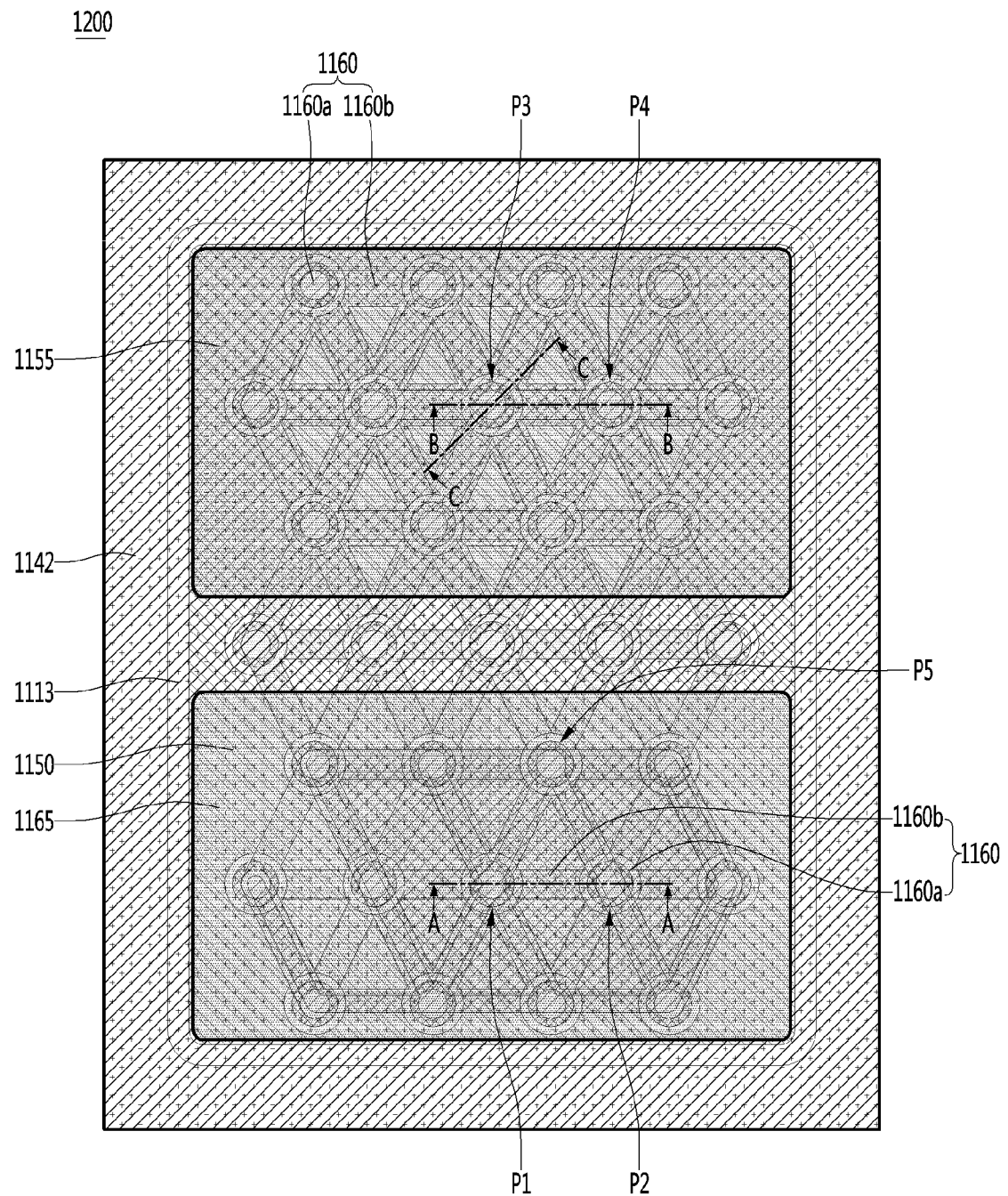

[FIG. 11]
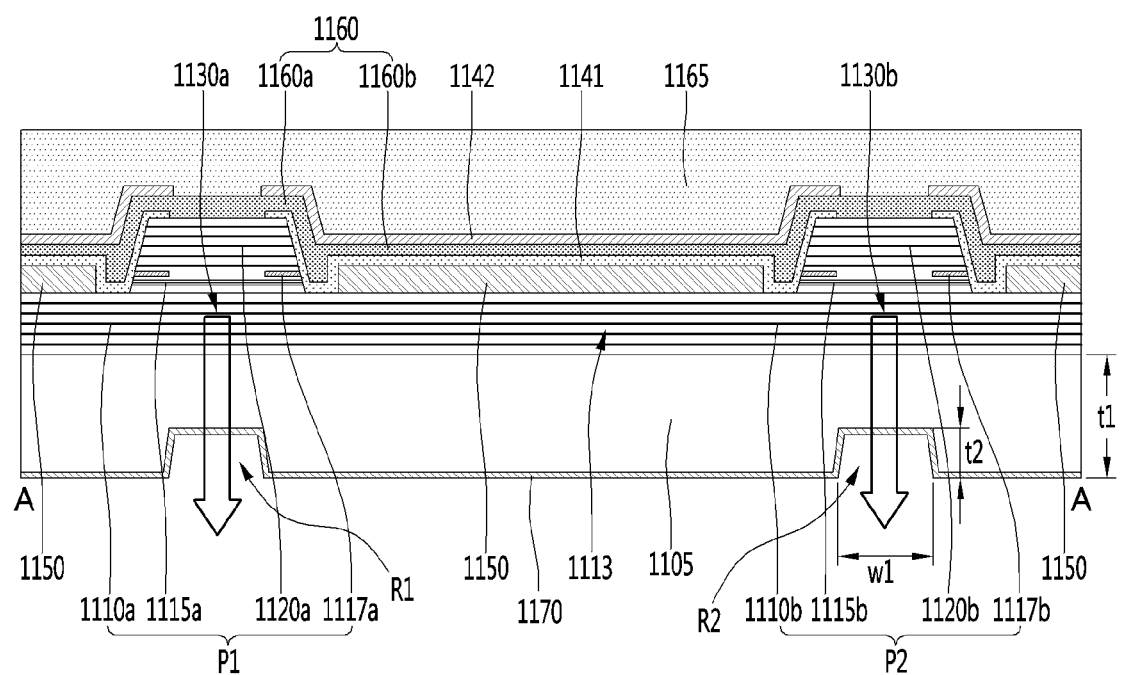

[FIG. 12]
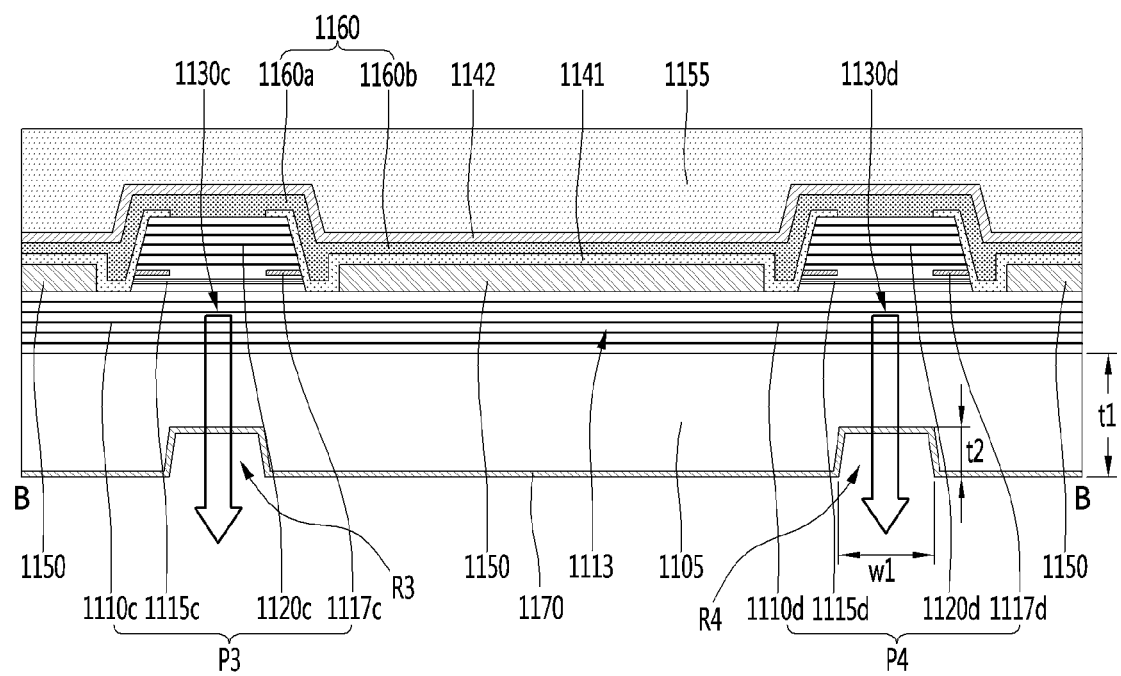

[FIG. 13]
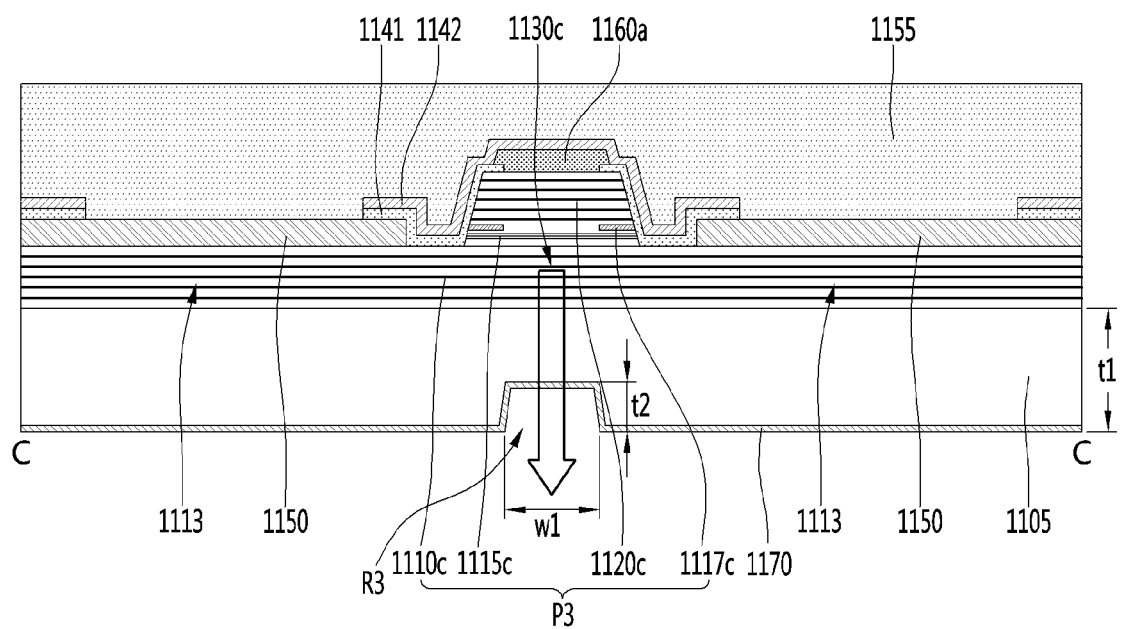

【FIG. 14a】
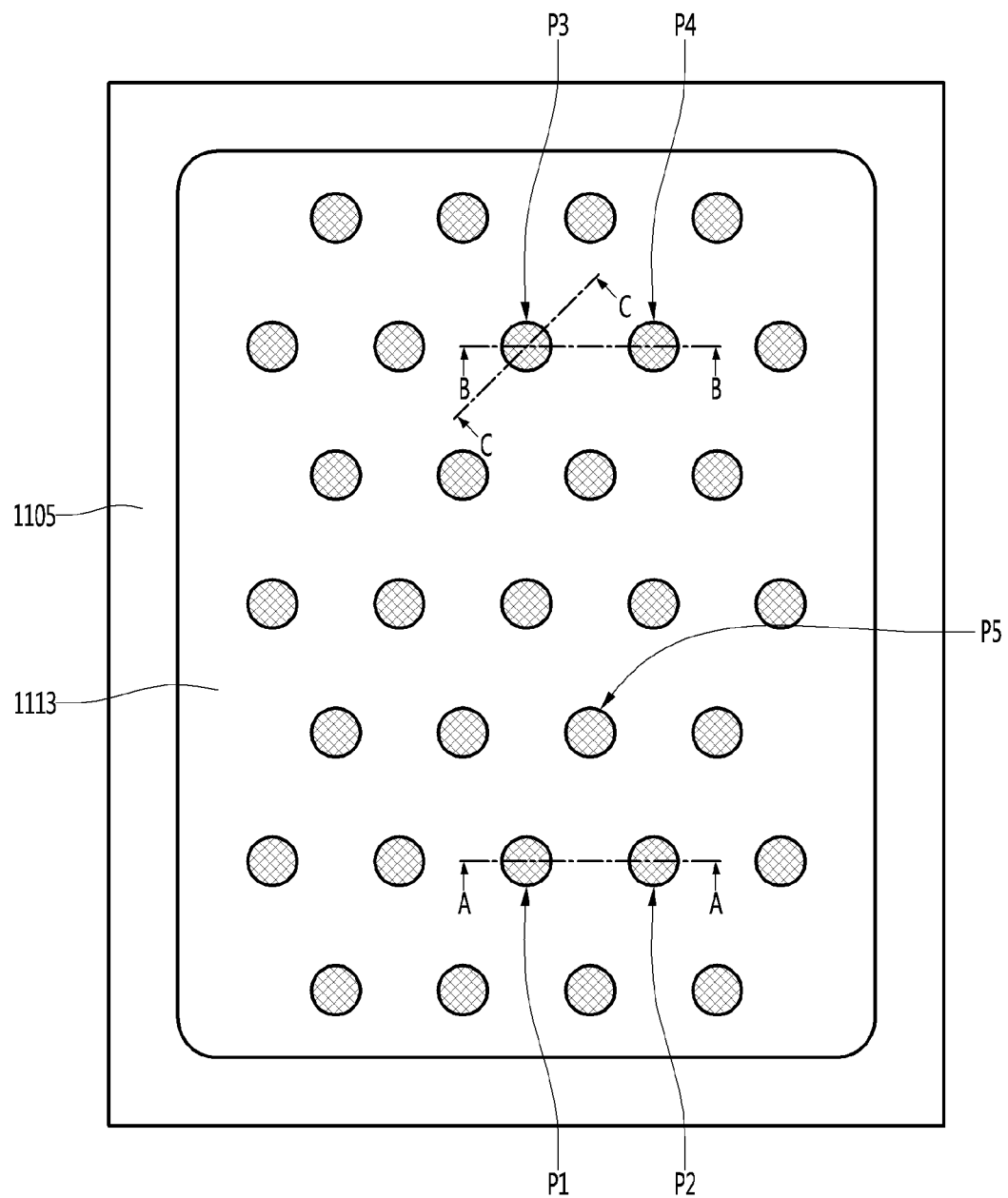

[FIG. 14b]
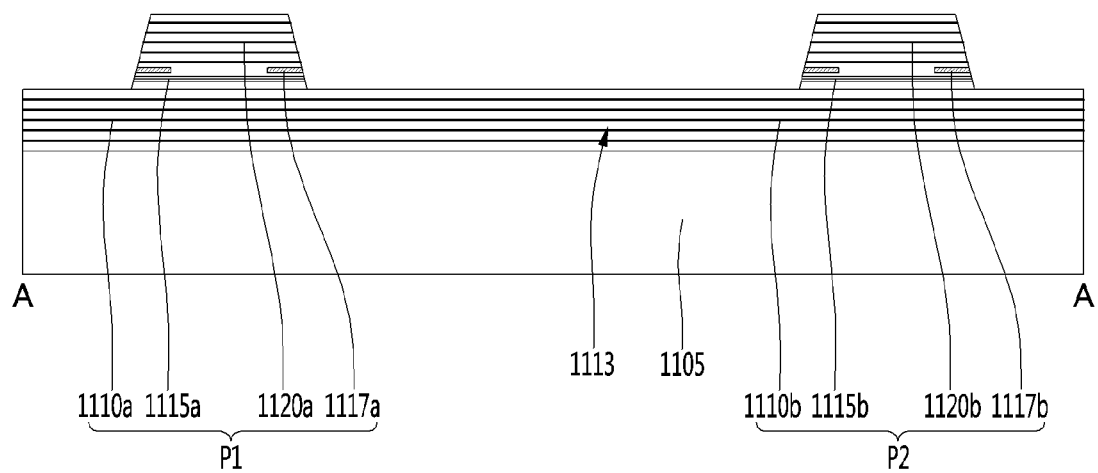

[FIG. 14c]
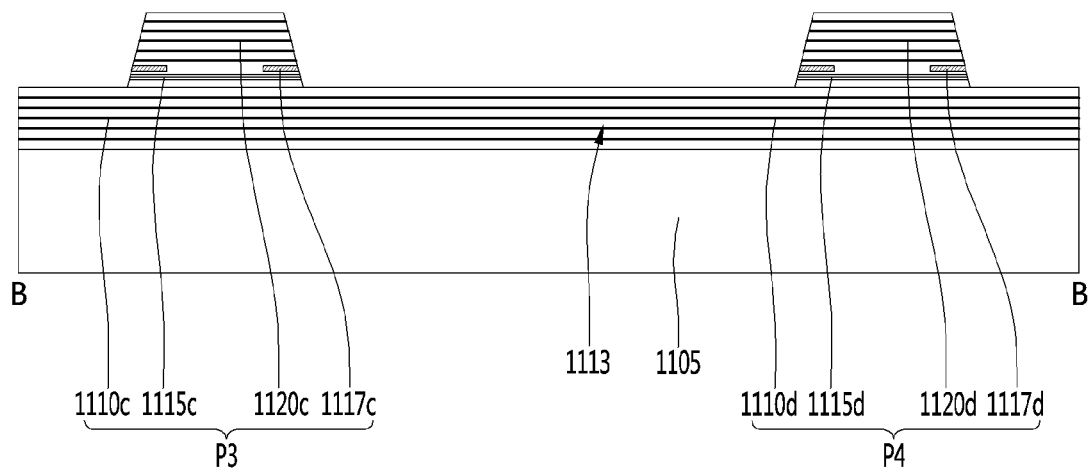

[FIG. 14d]
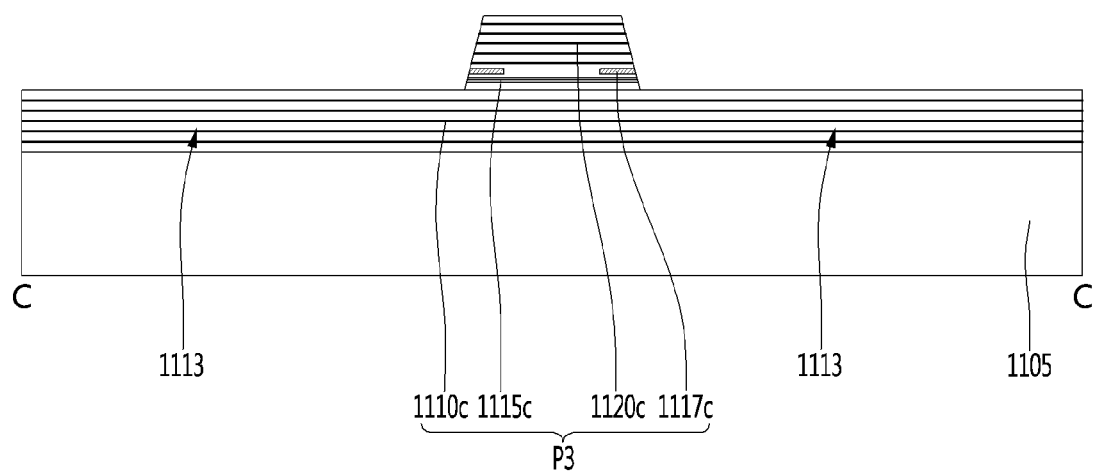

[FIG. 15a]
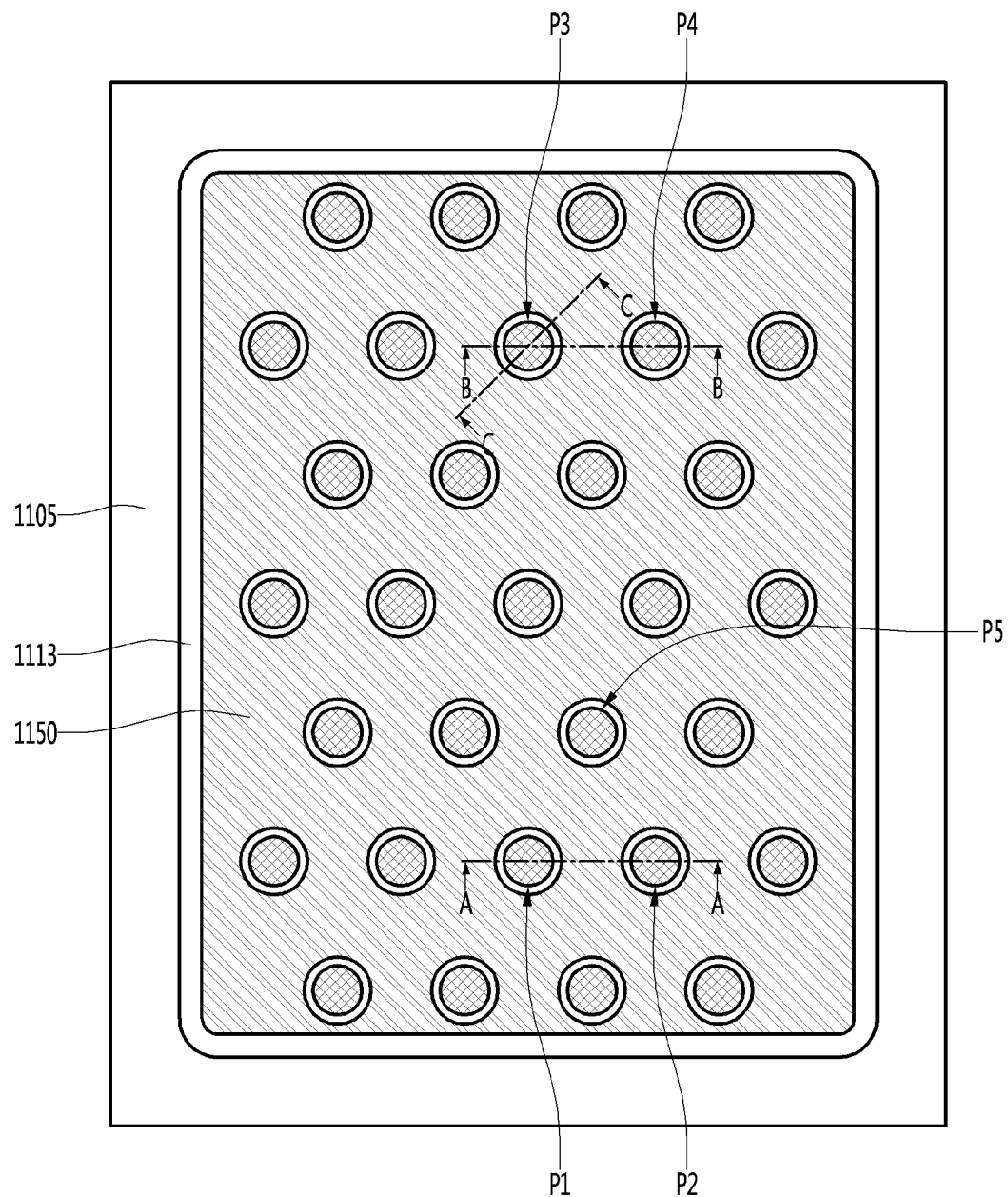

[FIG. 15b]
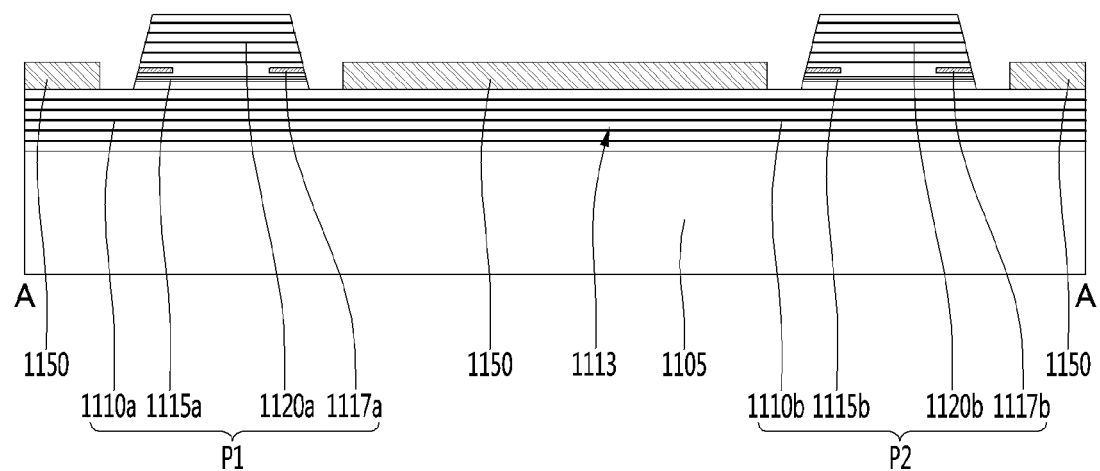

【FIG. 15c】
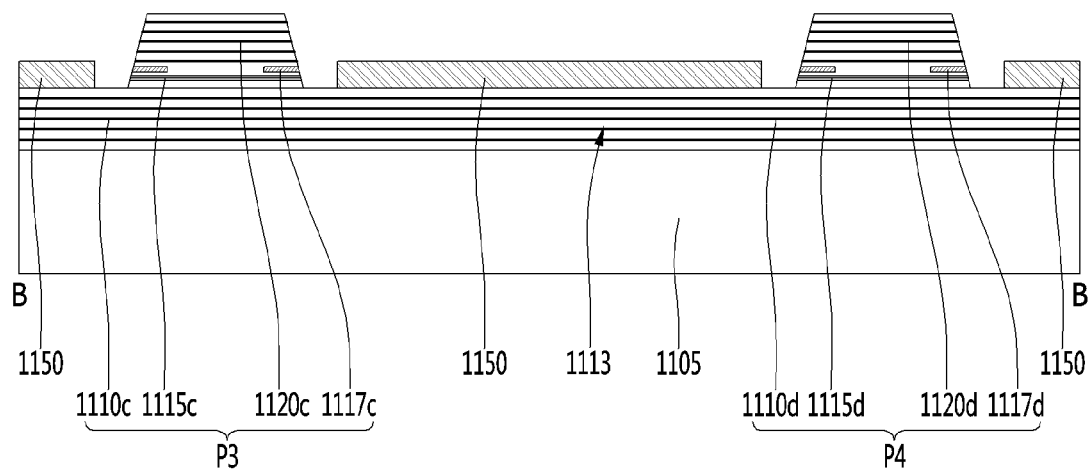

[FIG. 15d]
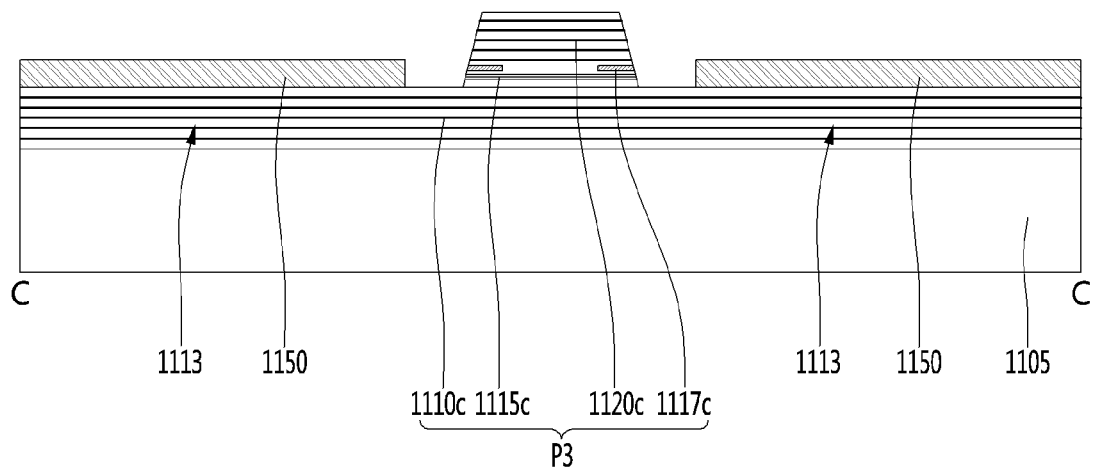

【FIG. 16a】
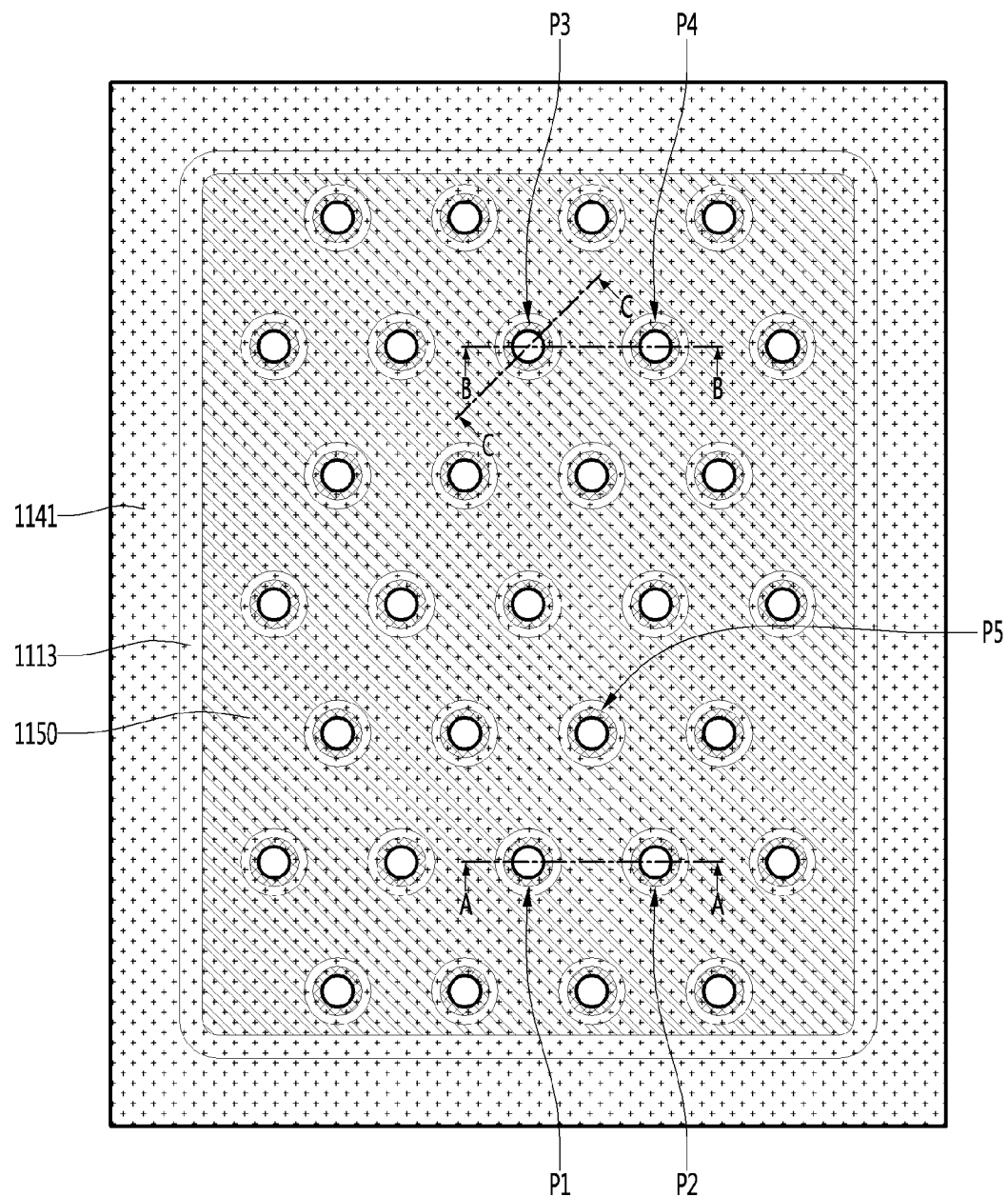

【FIG. 16b】
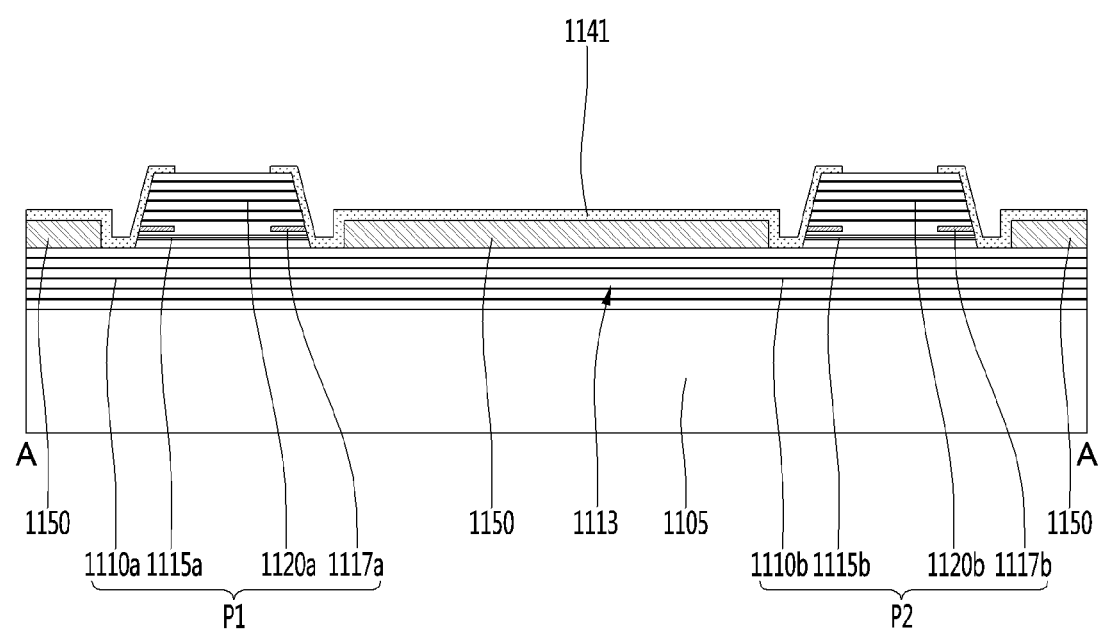

[FIG. 16c]
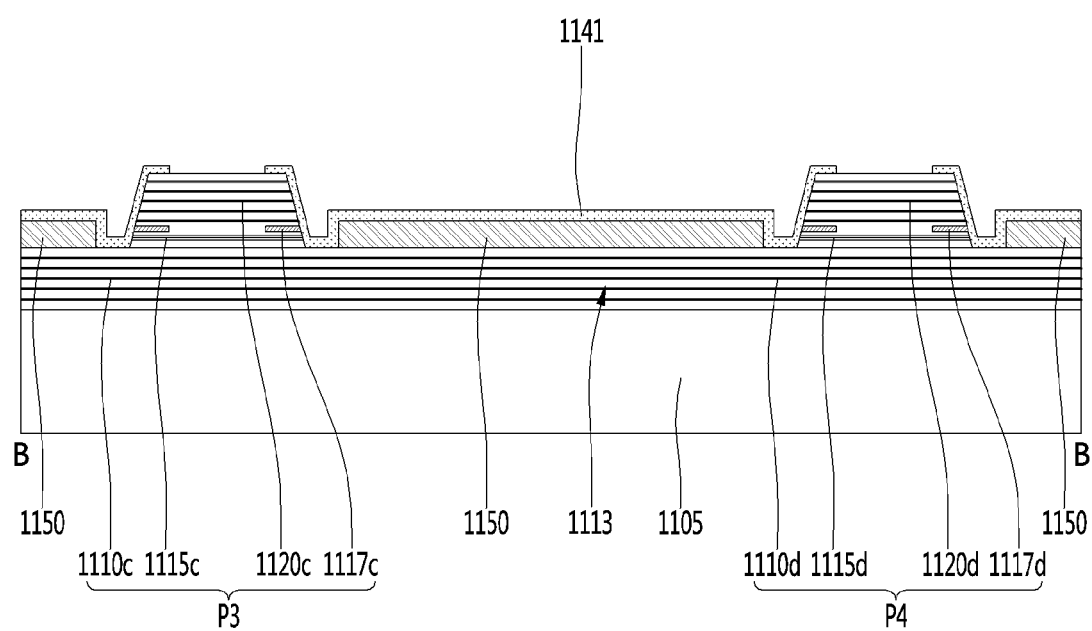

[FIG. 16d]
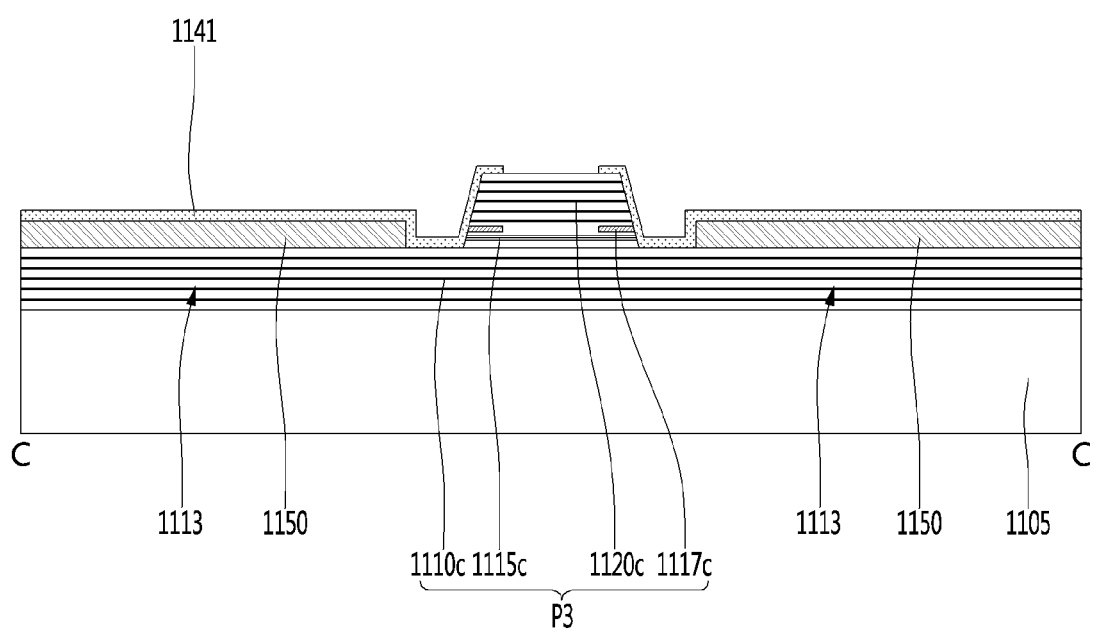

【FIG. 17a】
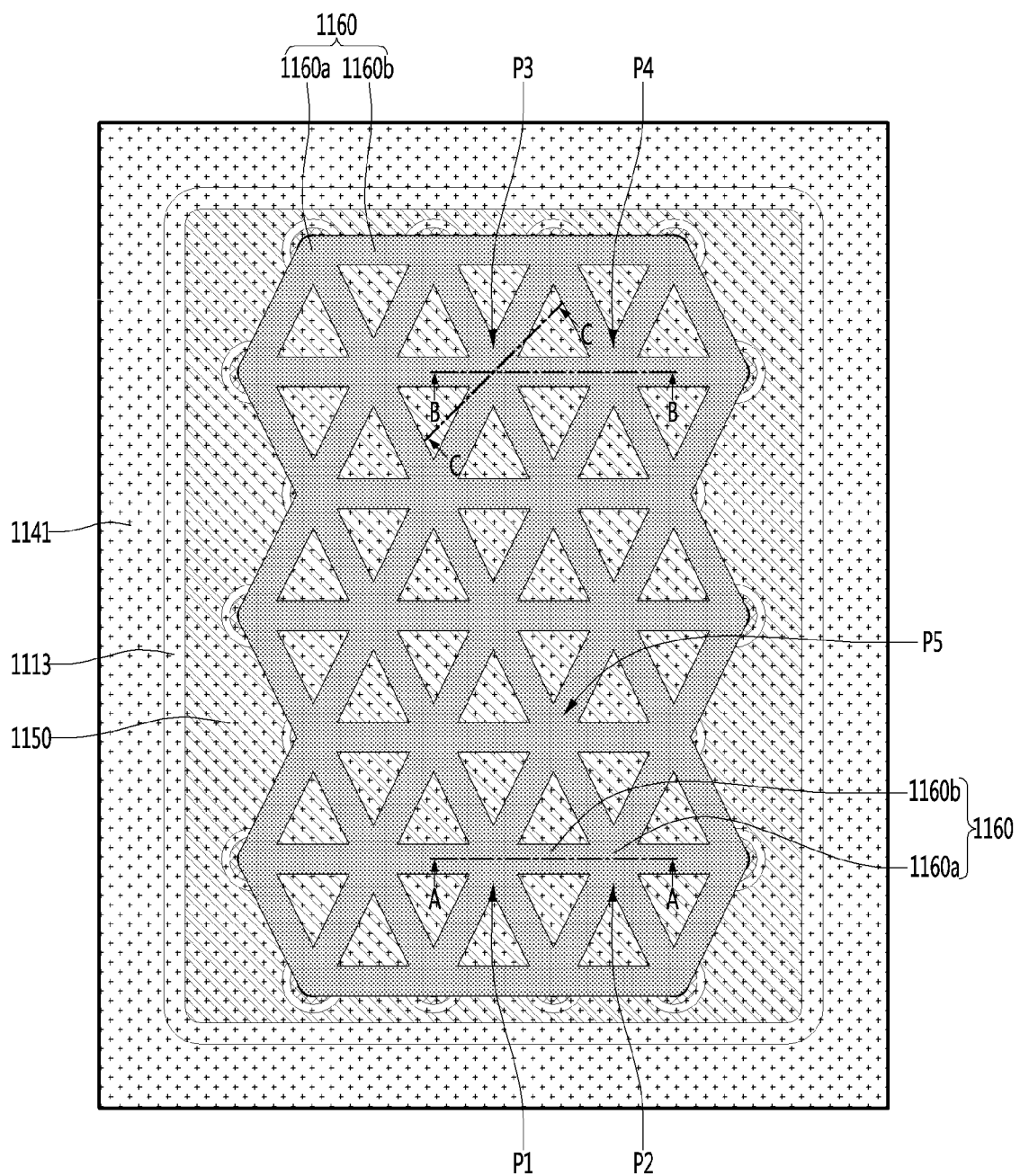

【FIG. 17b】
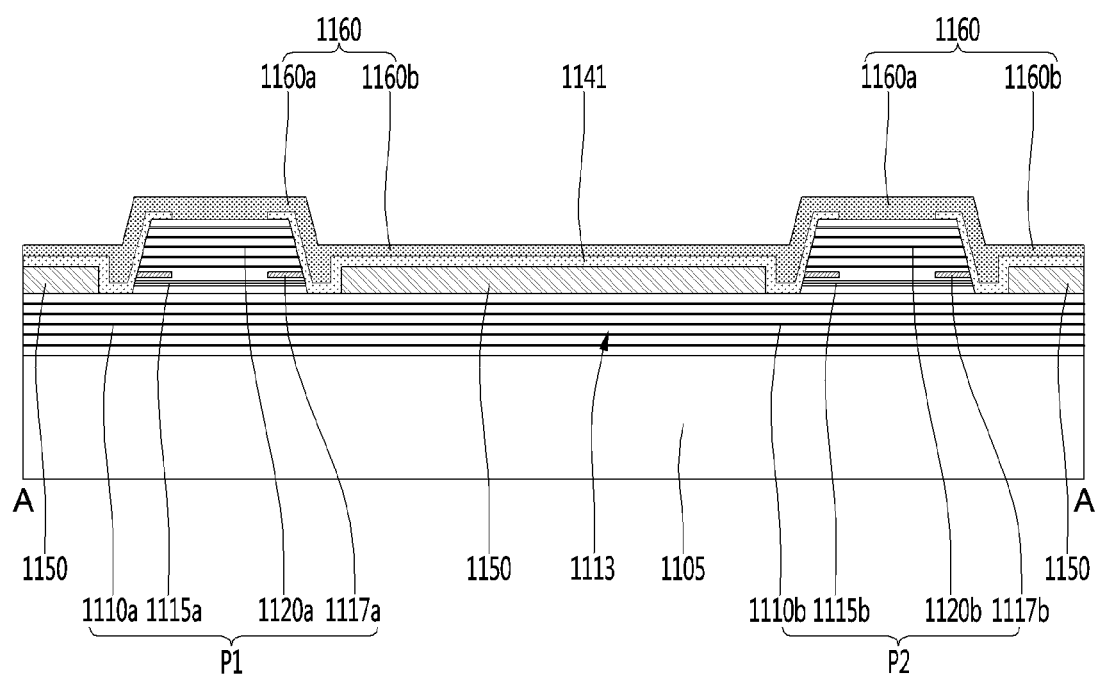

[FIG. 17c]
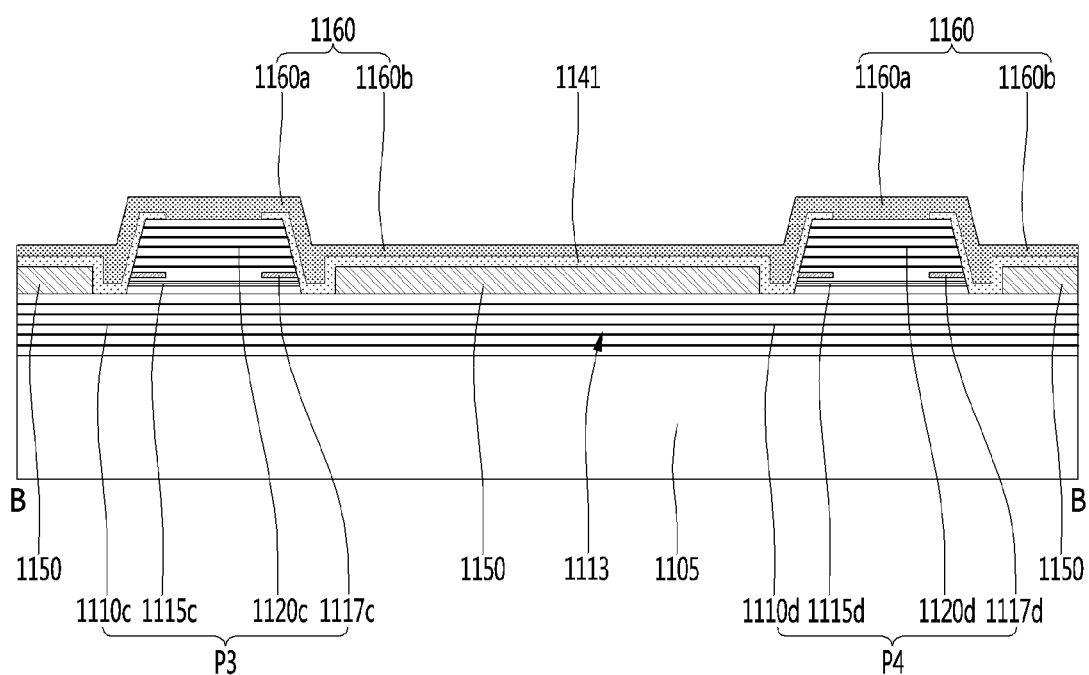

[FIG. 17d]
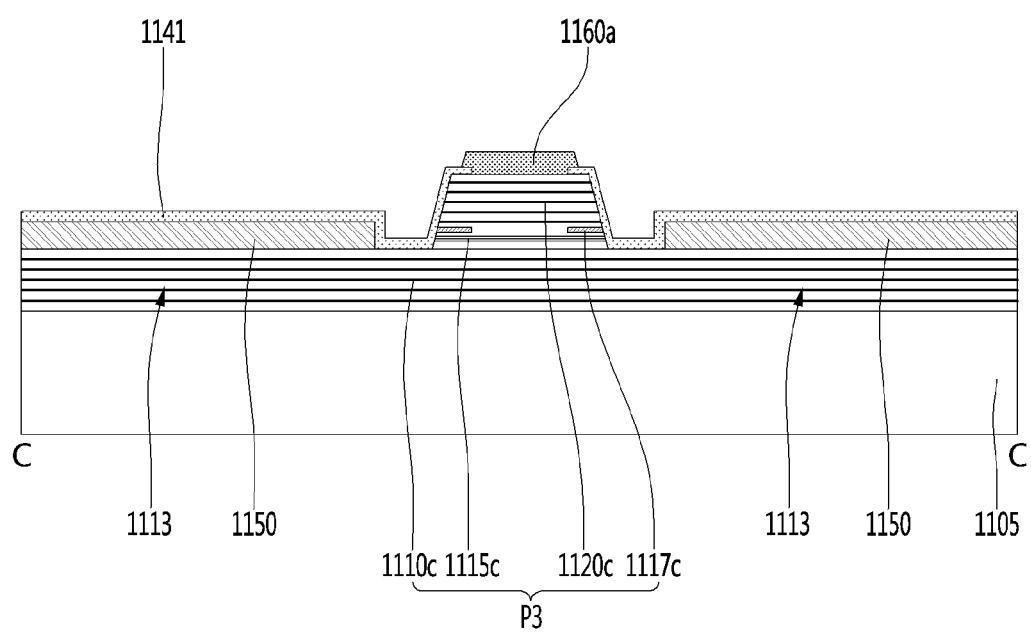

[FIG. 18a]
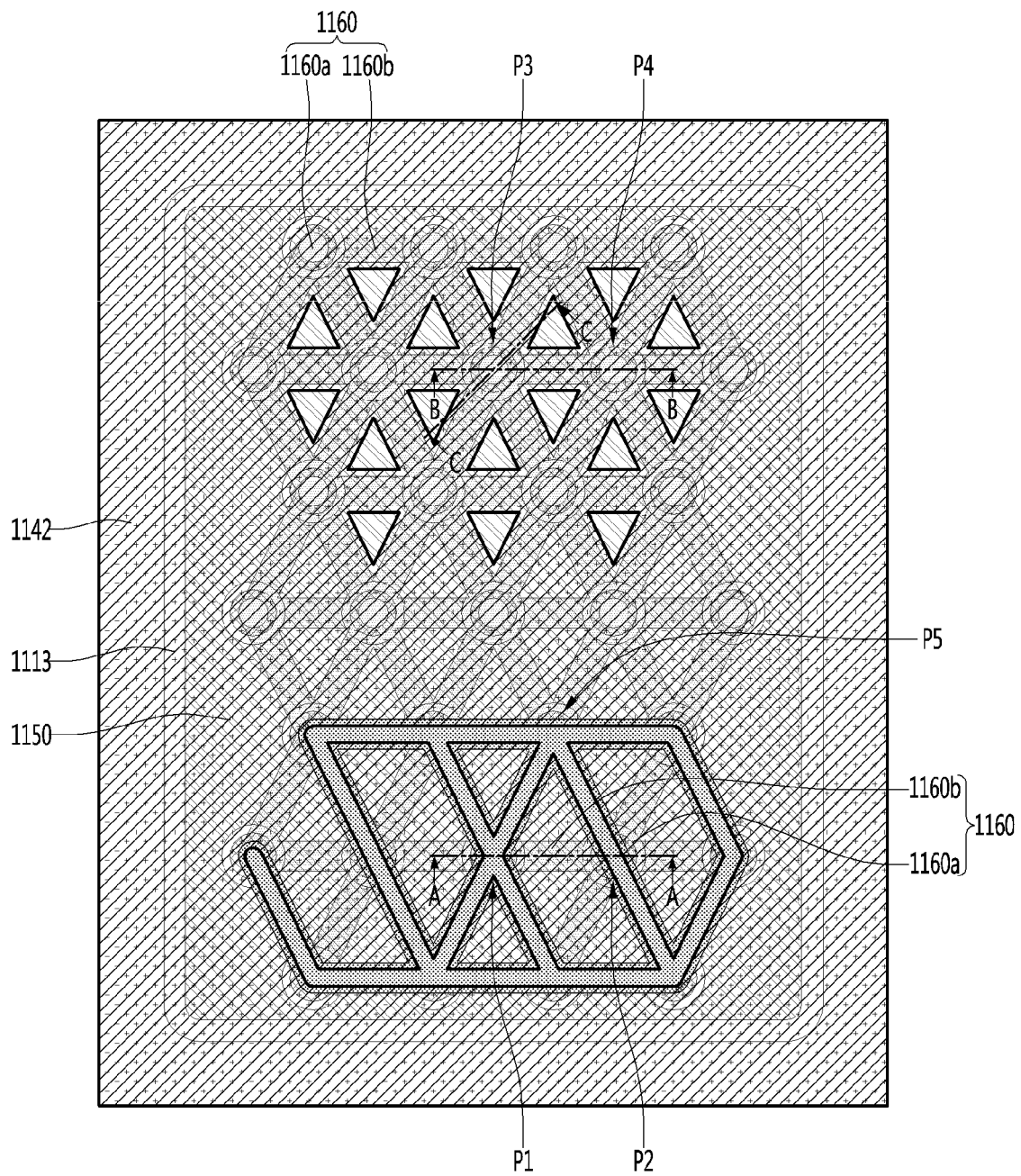

[FIG. 18b]
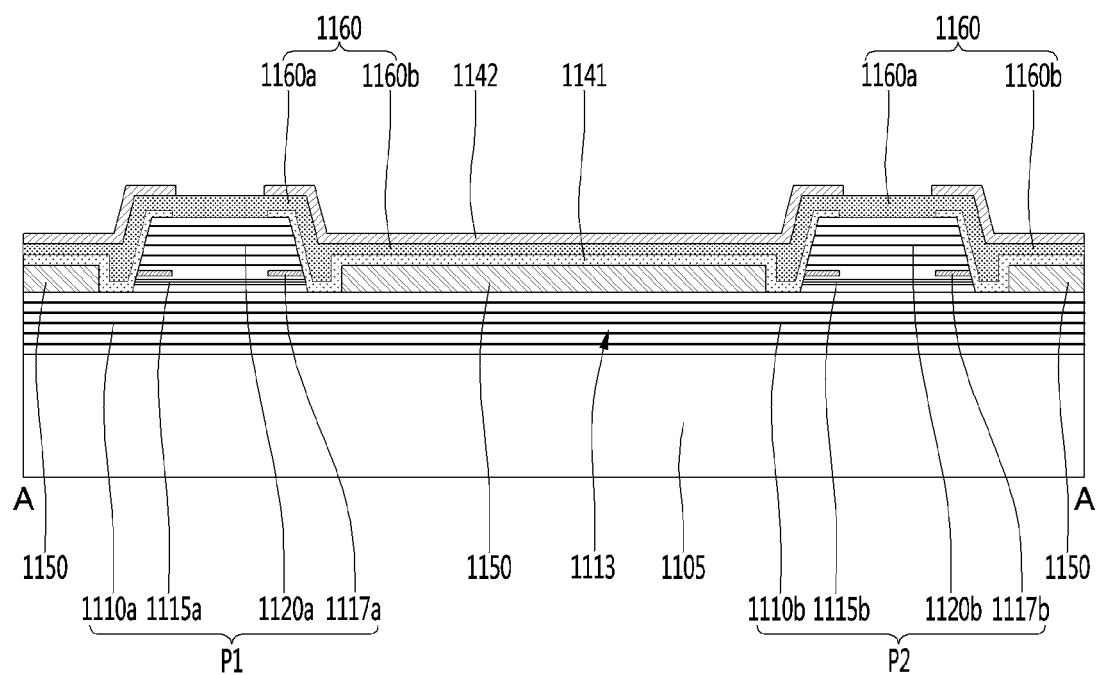

[FIG. 18c]
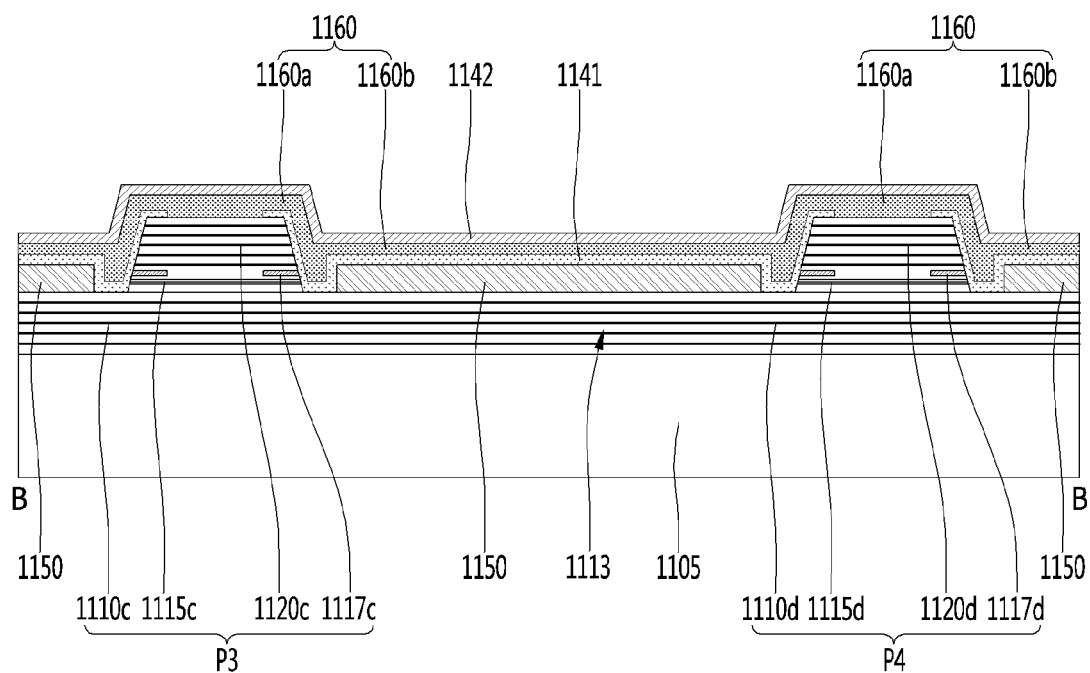

[FIG. 18d]
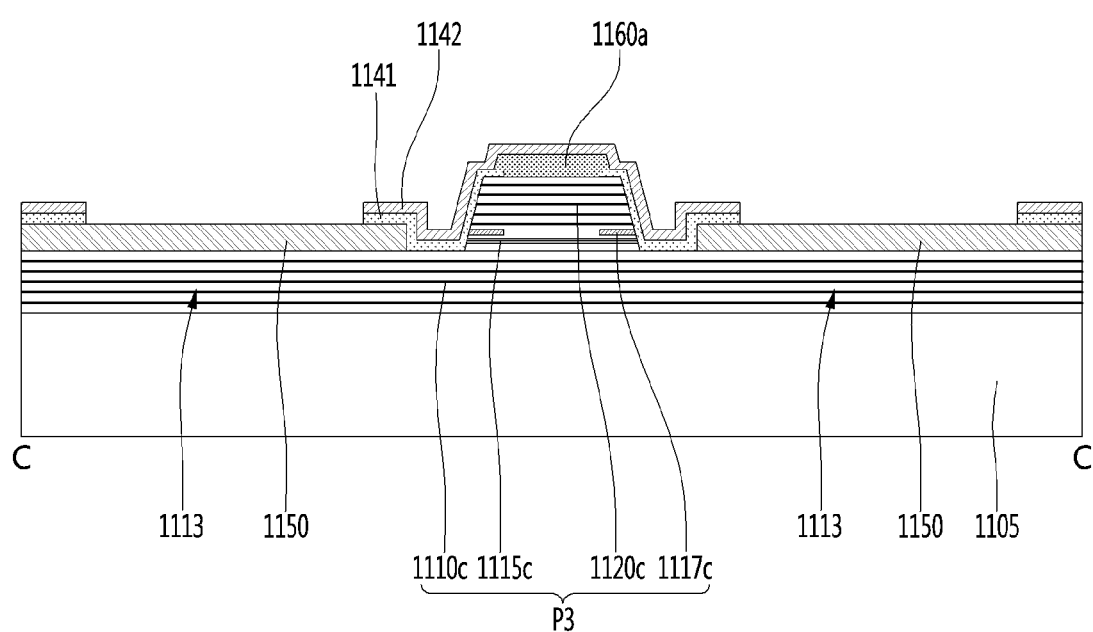

[FIG. 19a]
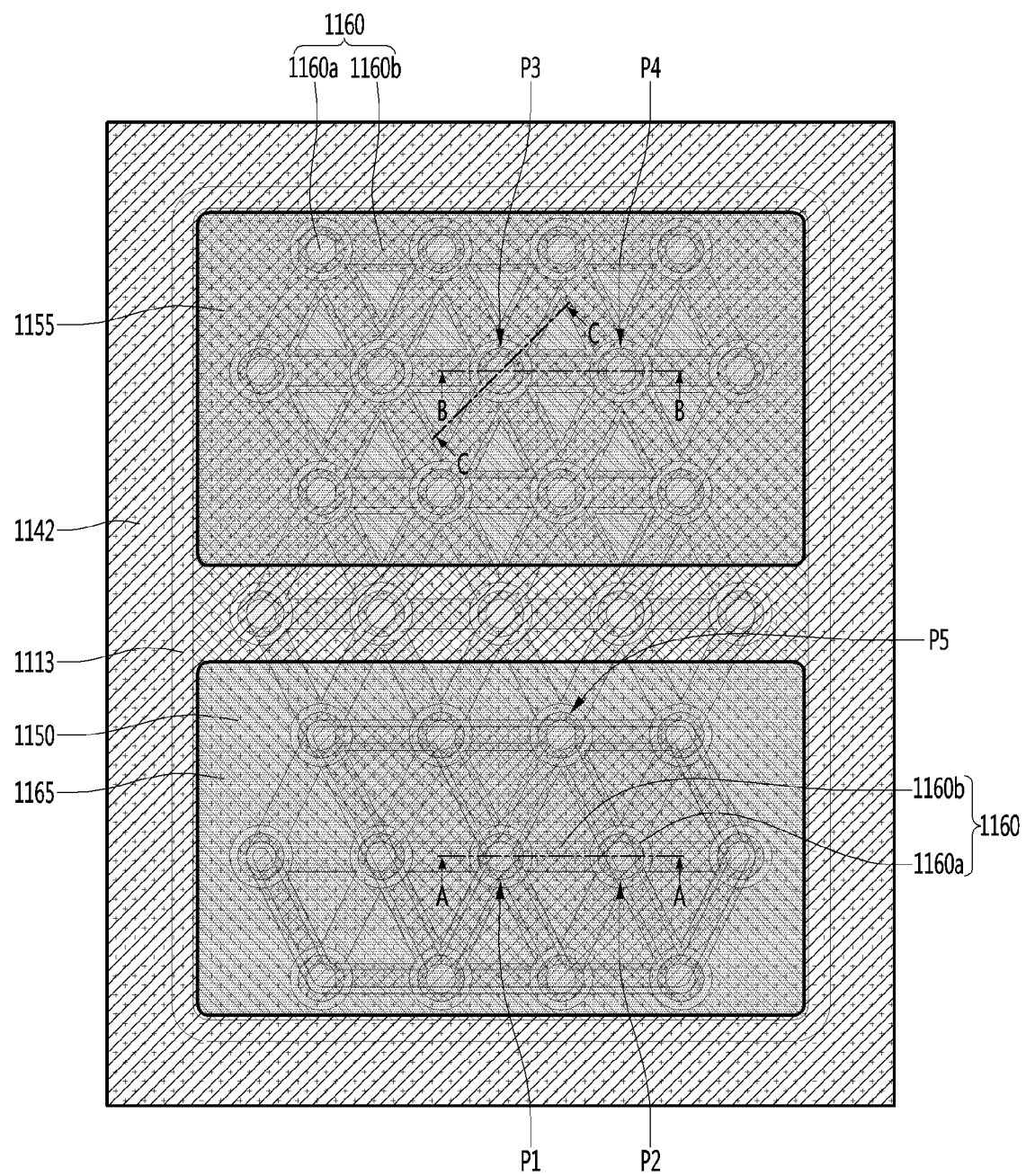

[FIG. 19b]
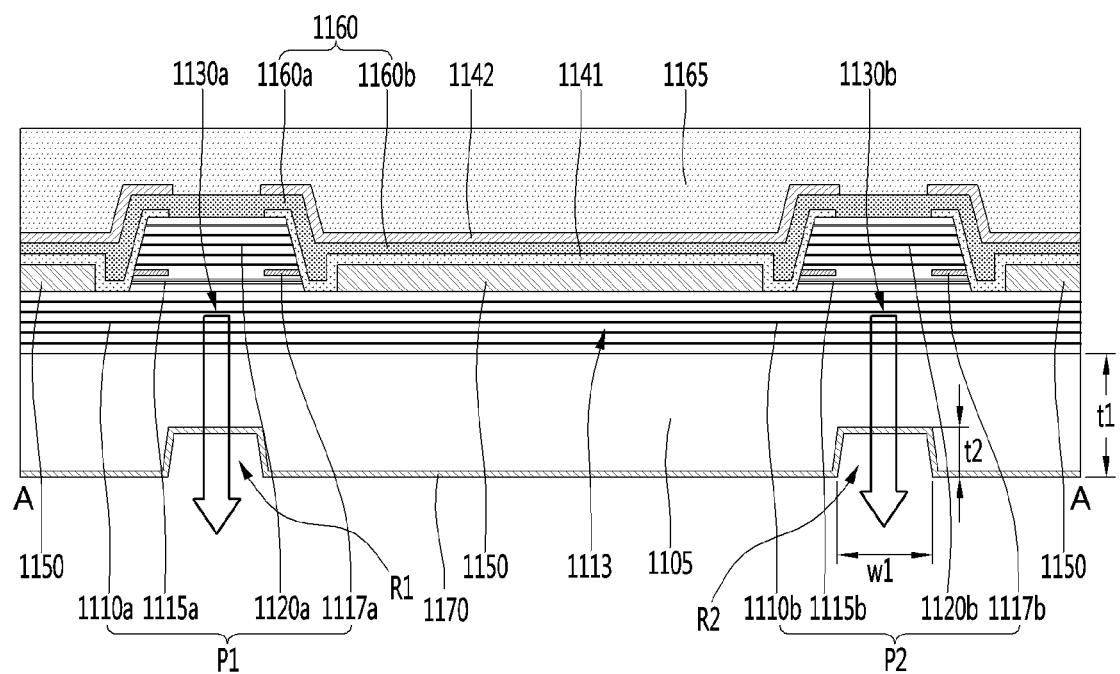

[FIG. 19c]
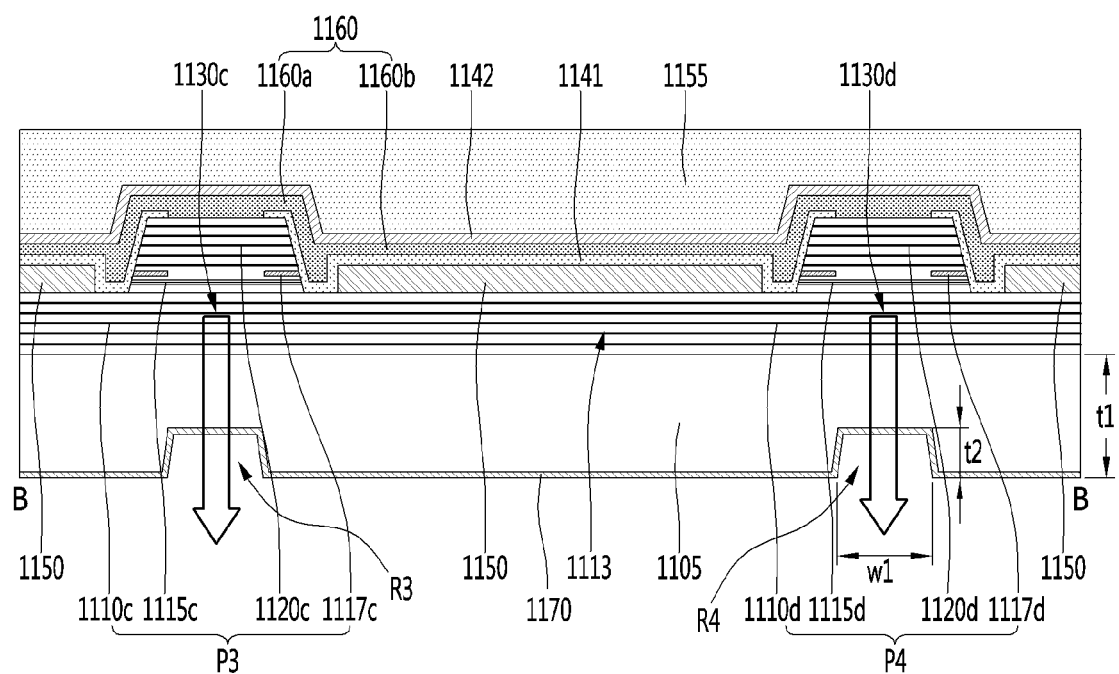

[FIG. 19d]
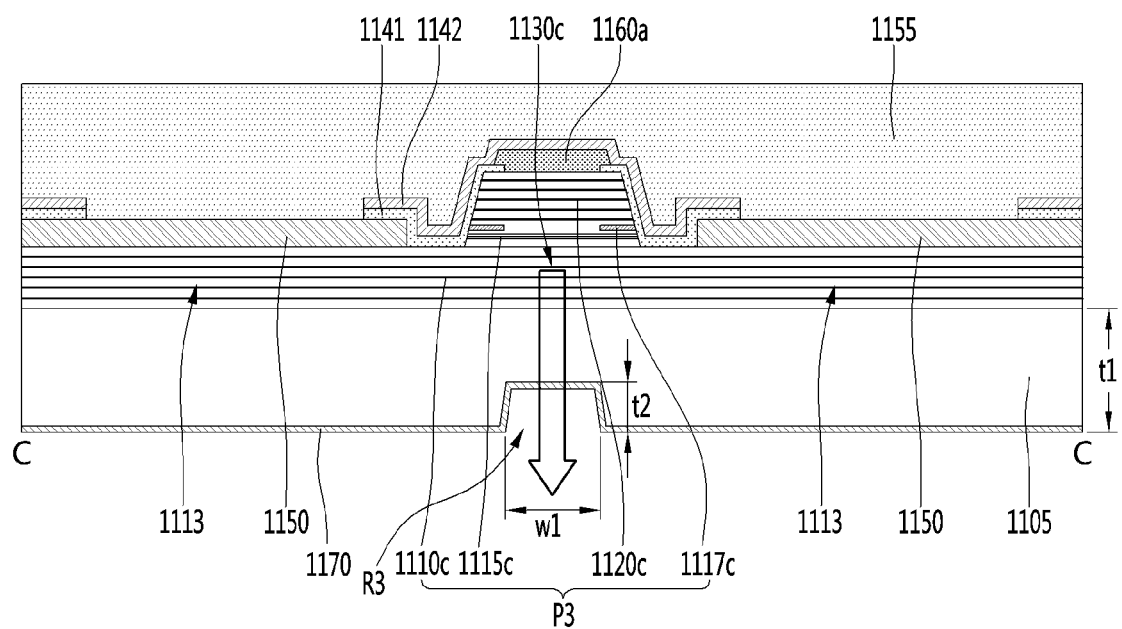

[FIG. 20]
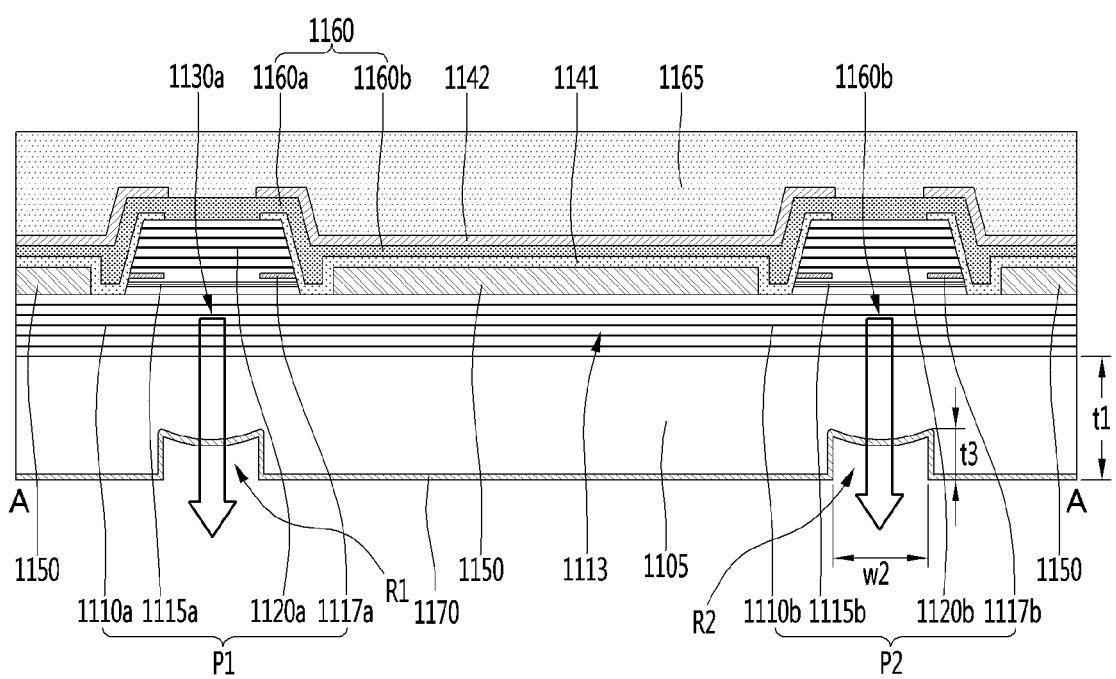

[FIG. 21]
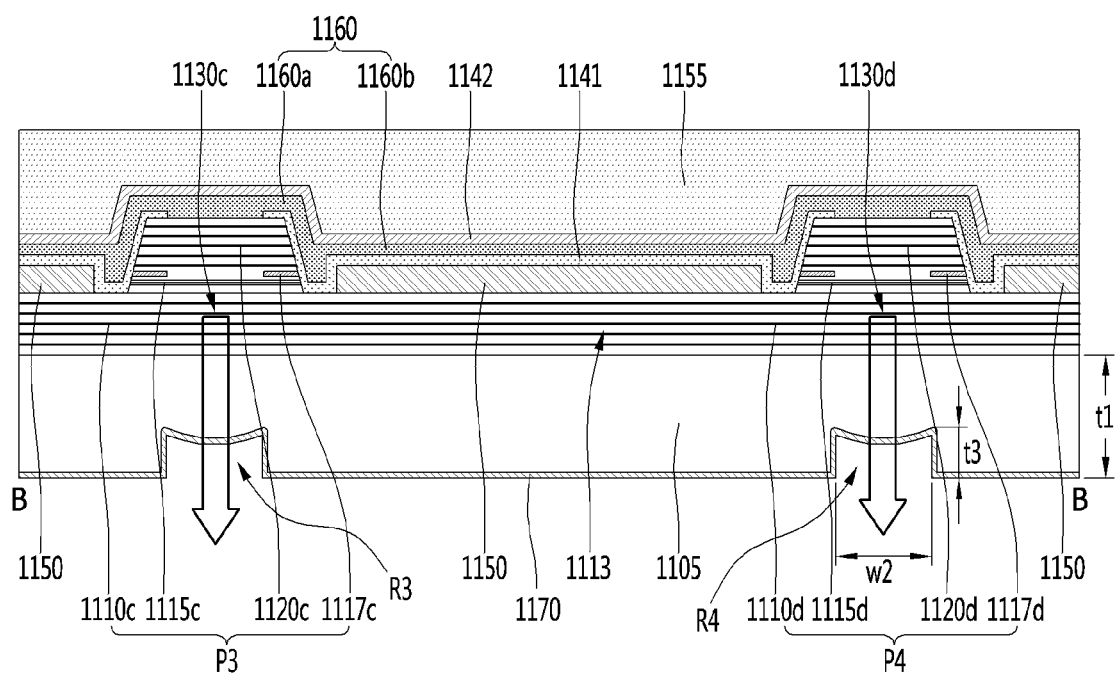

[FIG. 22]
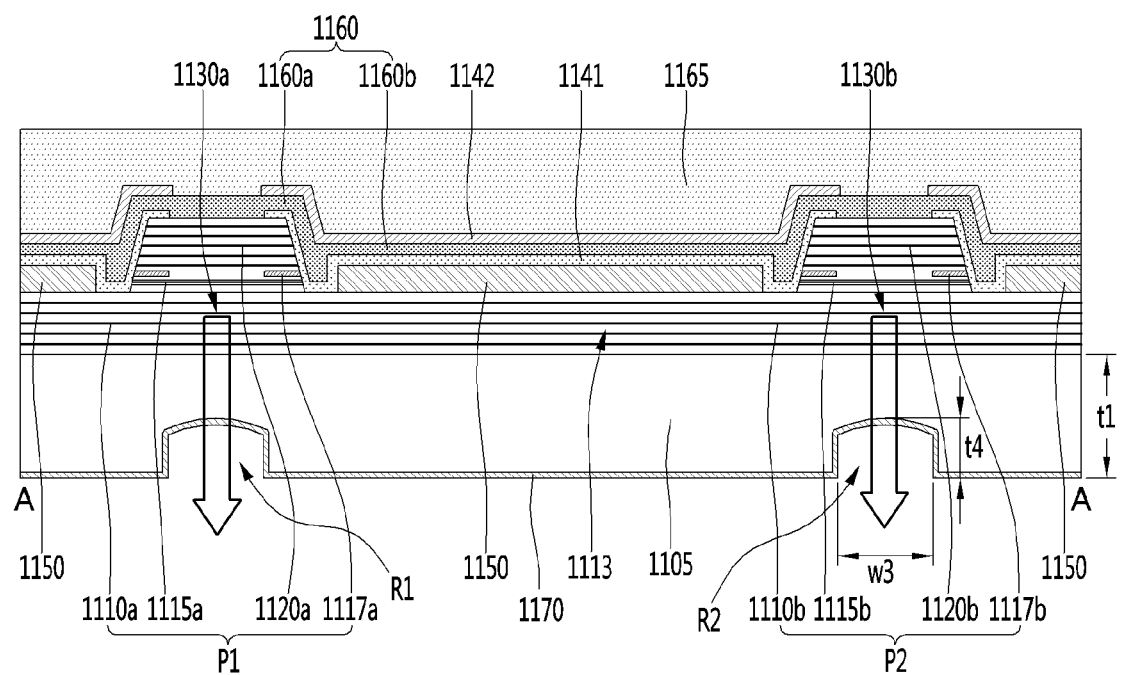

[FIG. 23]
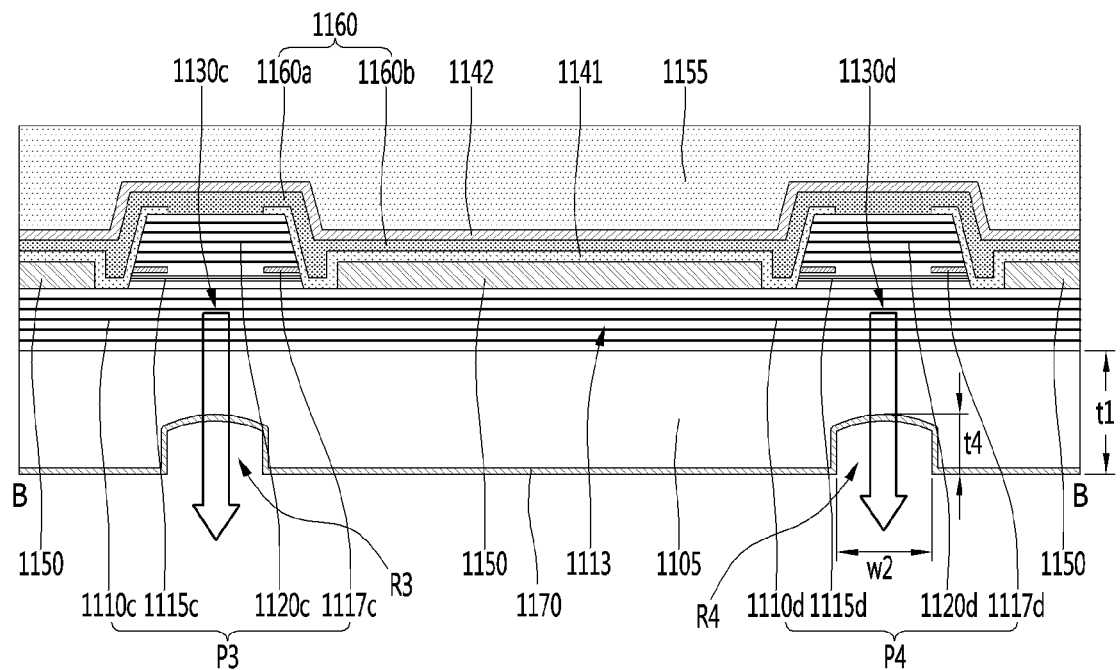

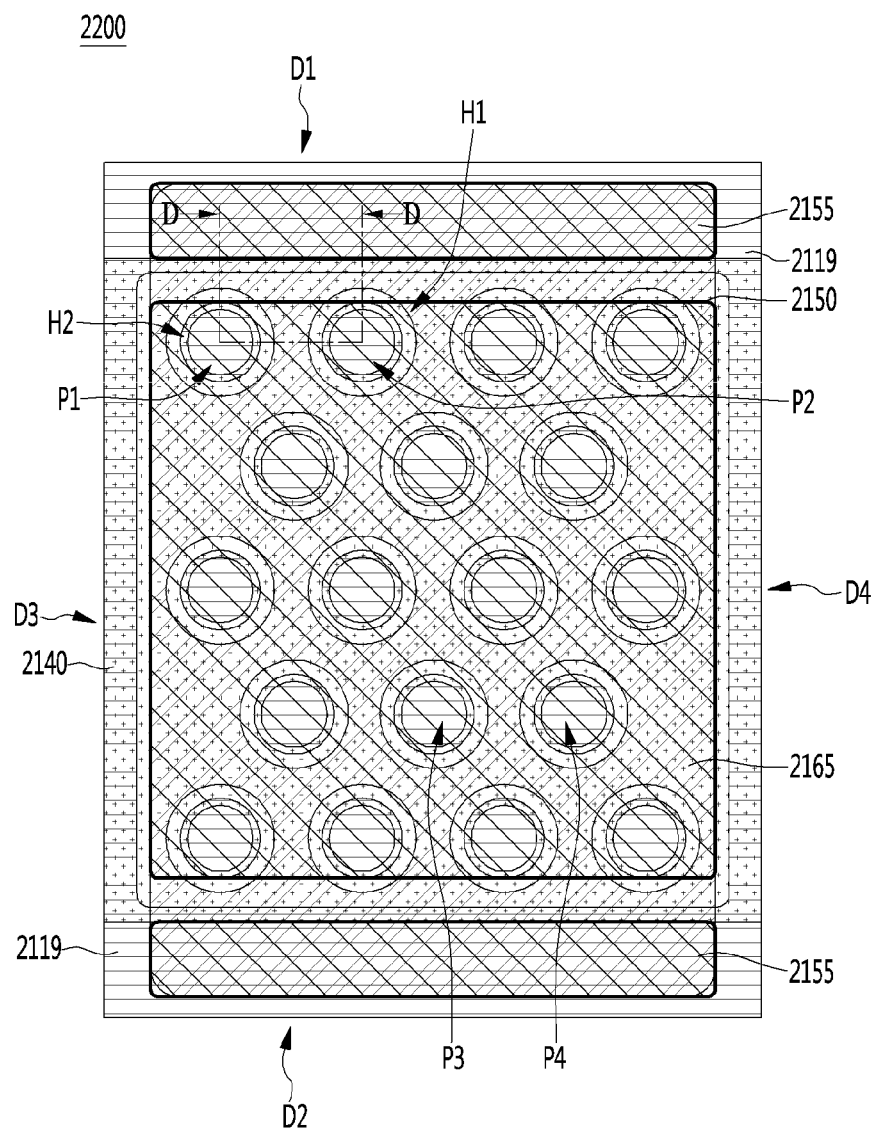
[FIG. 24]

[FIG. 25]
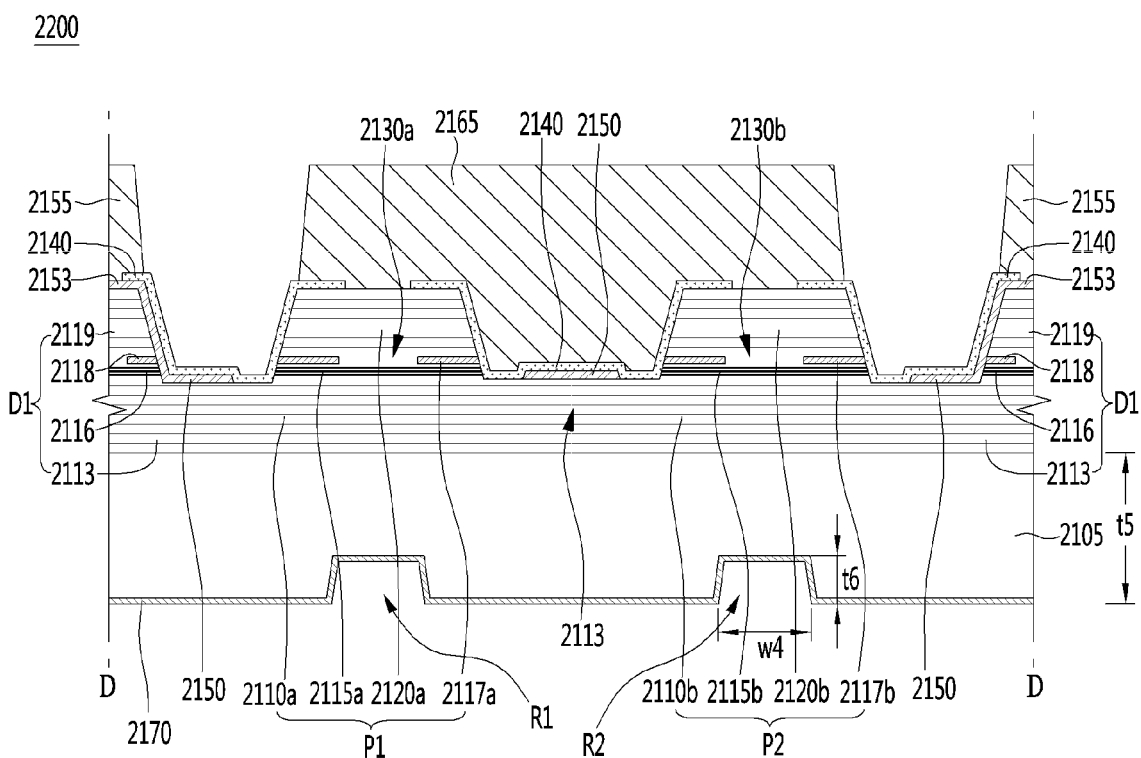

【FIG. 26a】
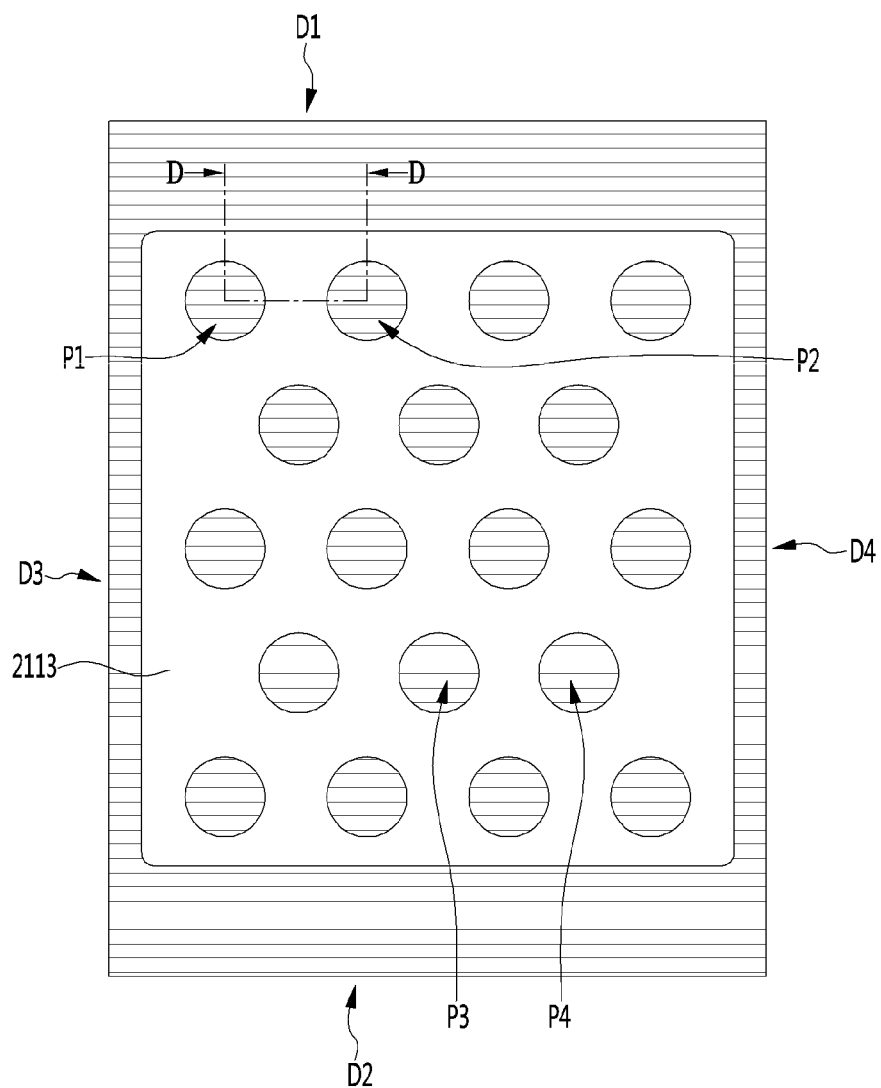

【FIG. 26b】
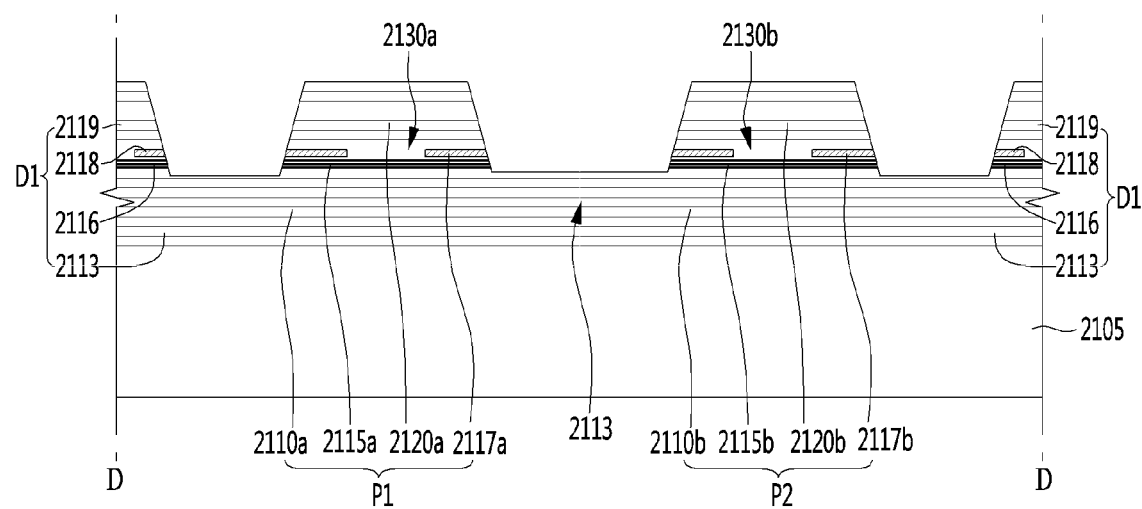

【FIG. 27a】
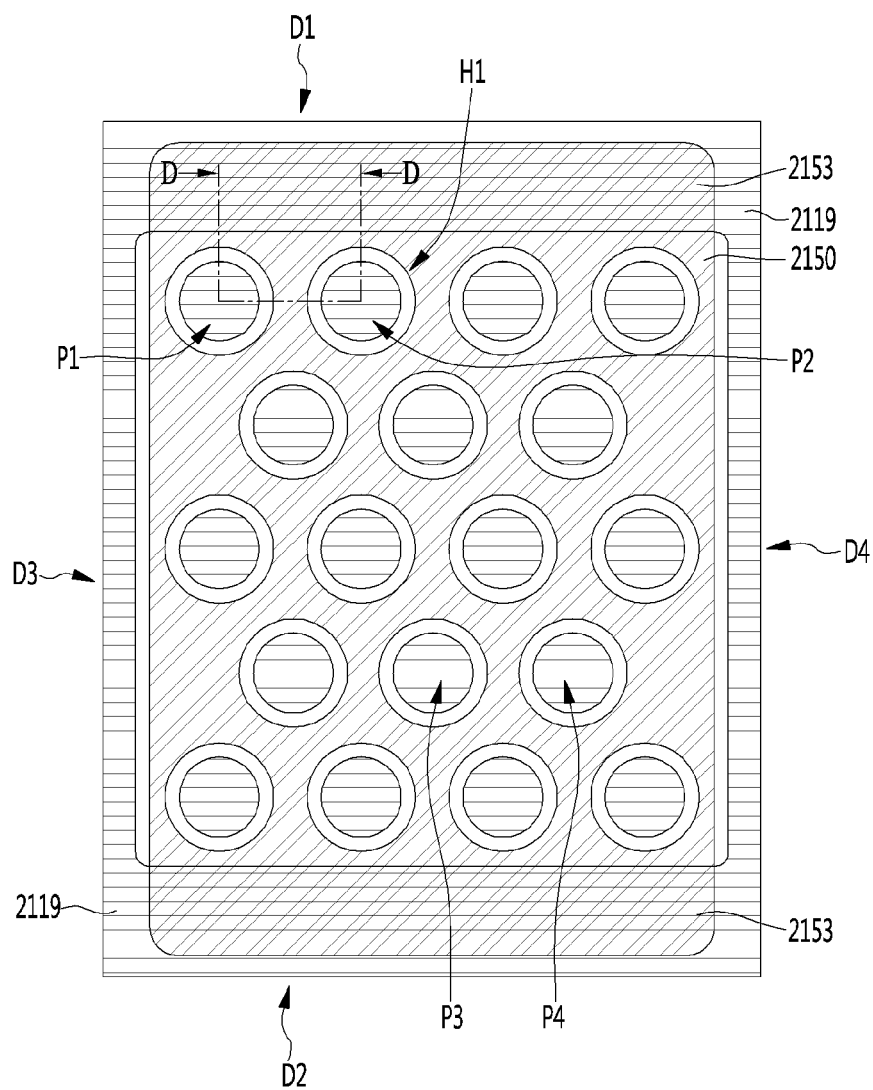

[FIG. 27b]
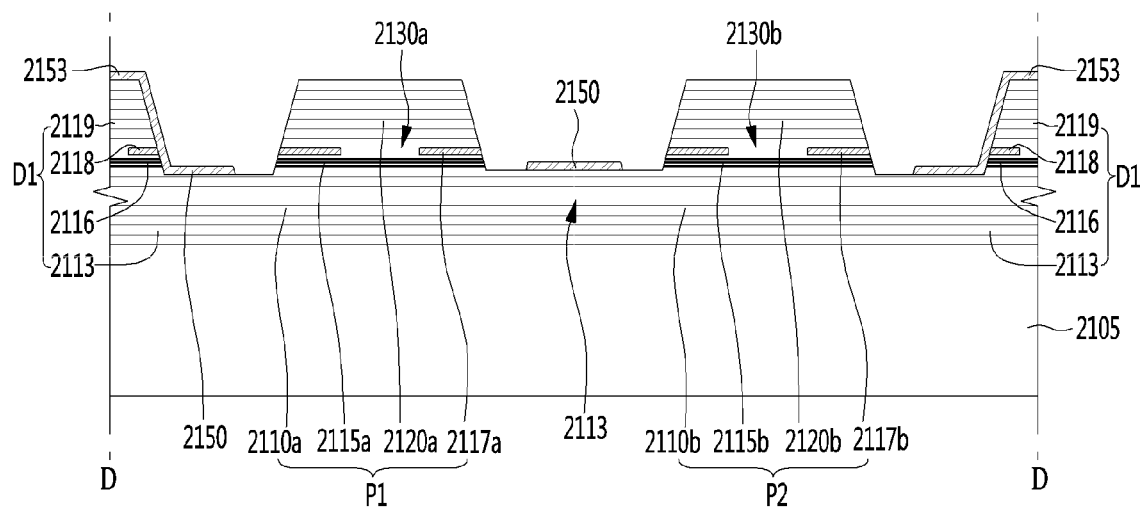

[FIG. 28a]
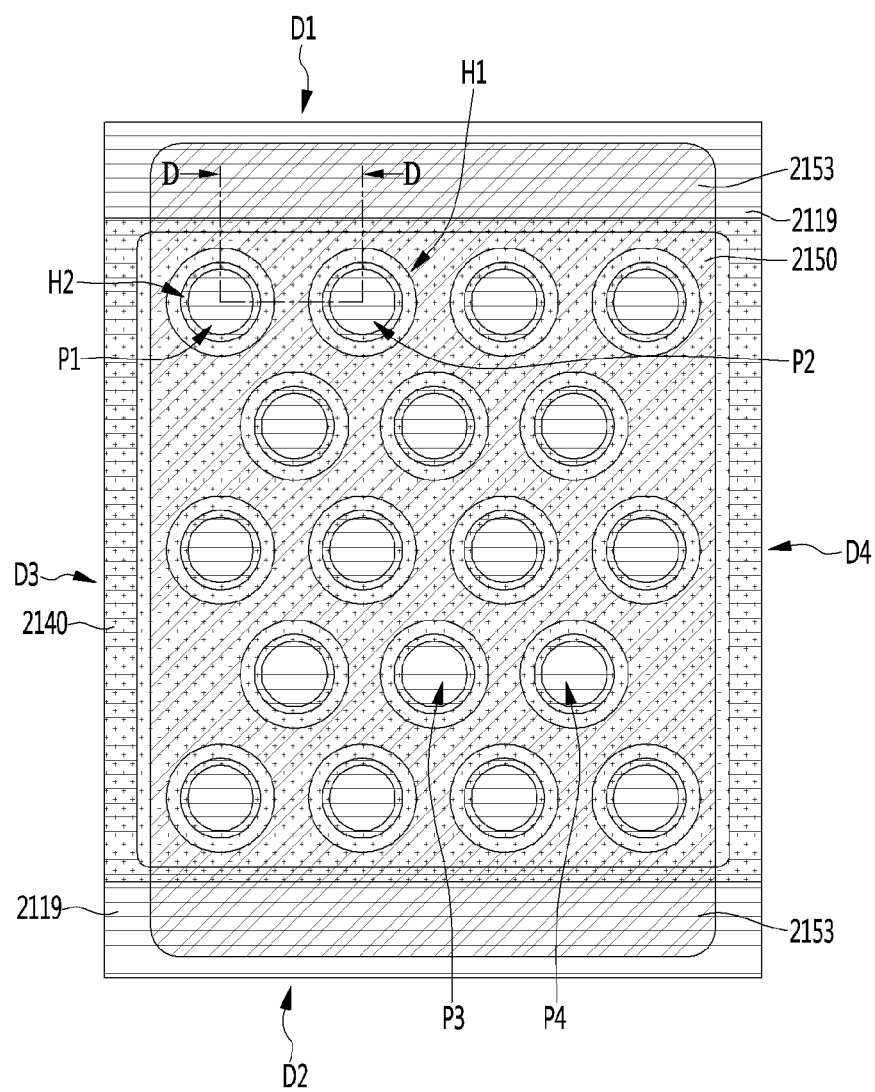

[FIG. 28b]
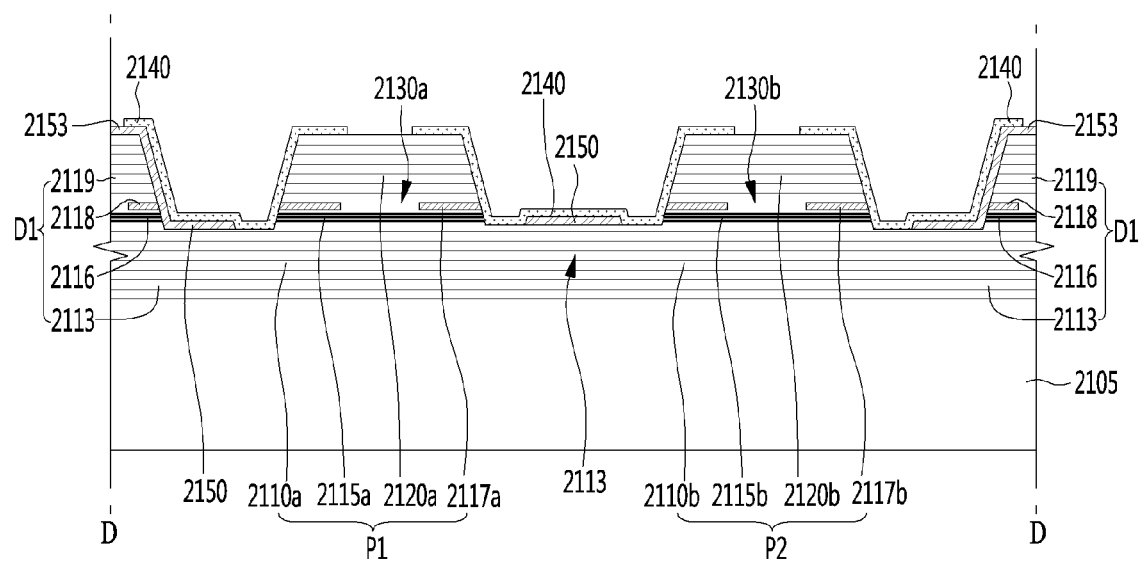

[FIG. 29a]
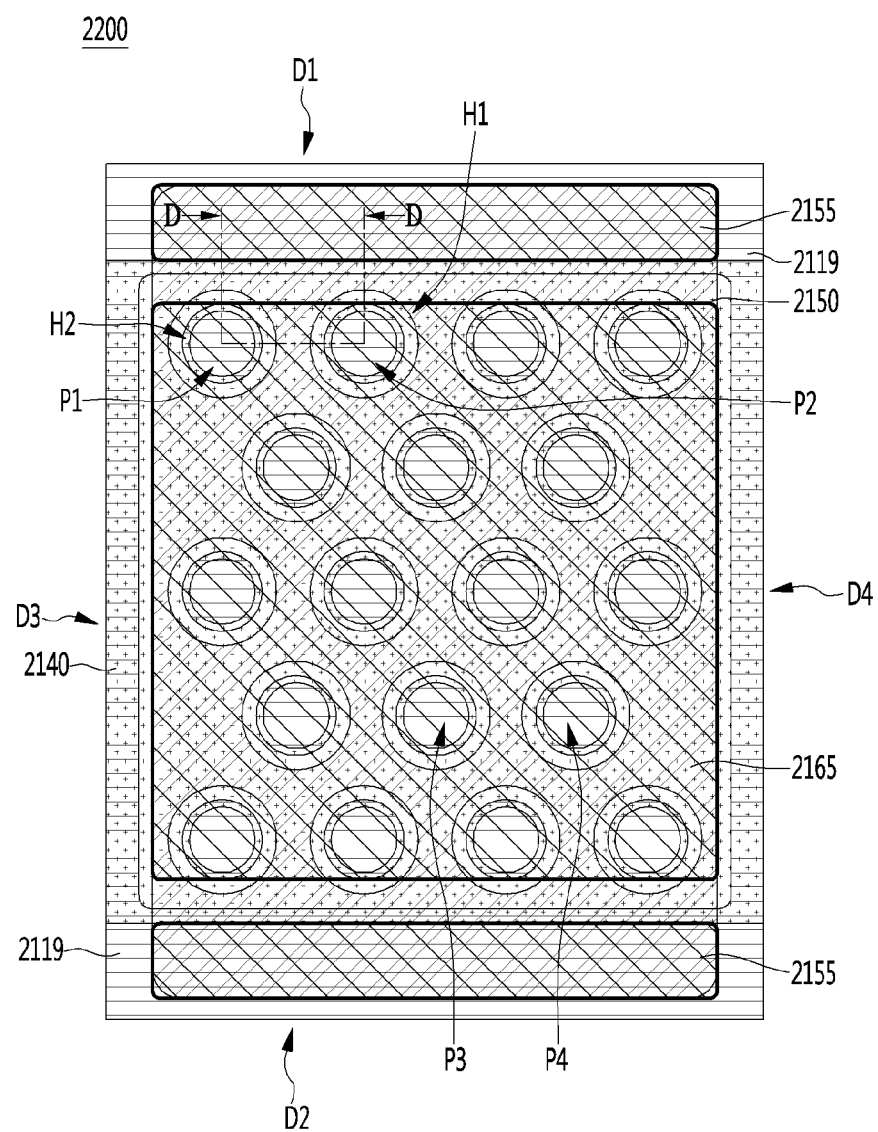

[FIG. 29b]
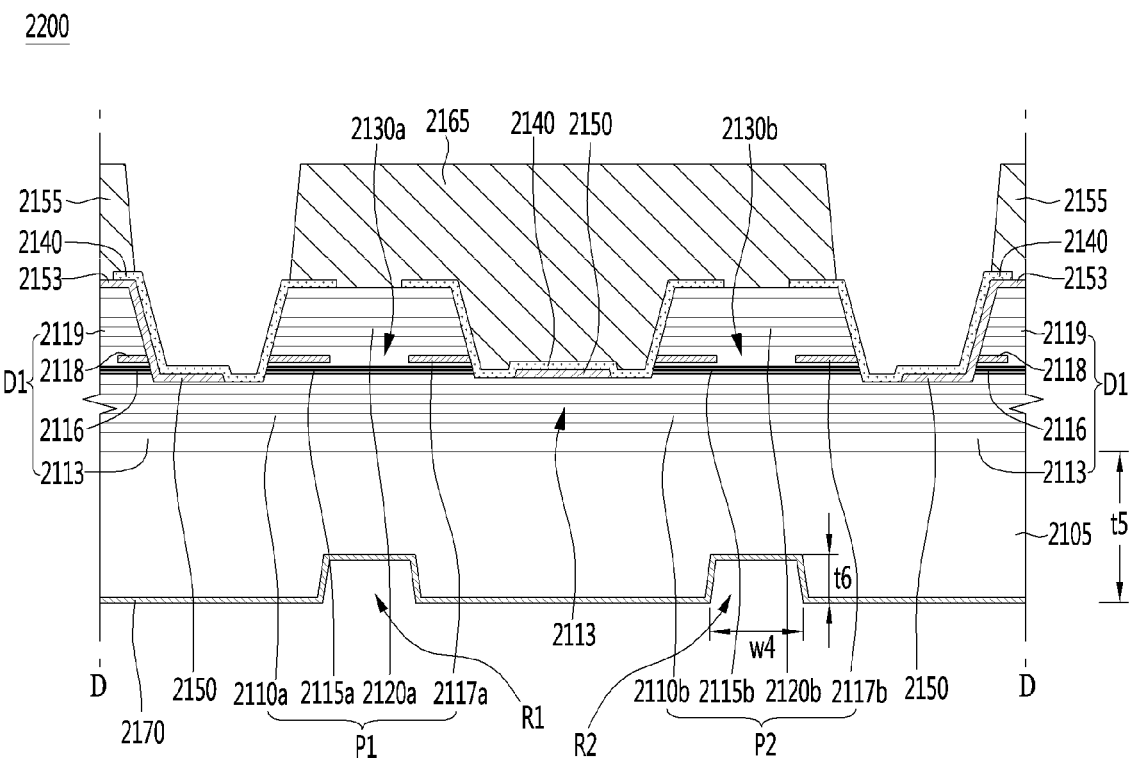

[FIG. 30]
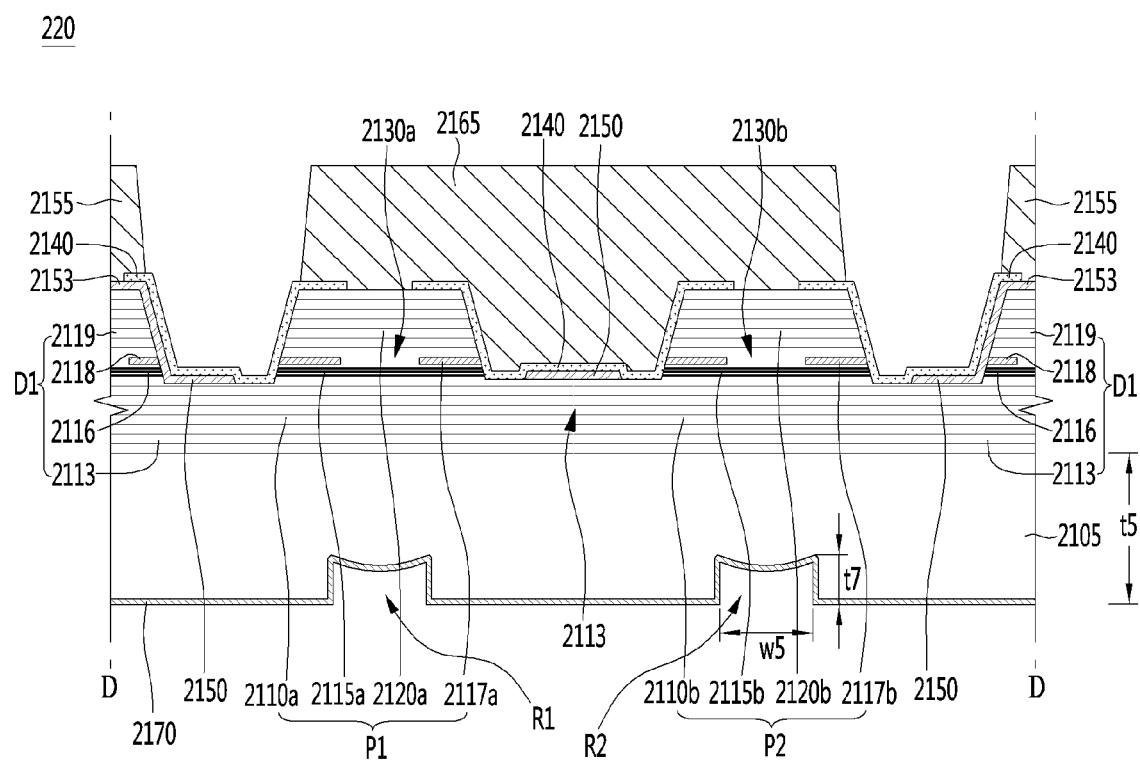

[FIG. 31]
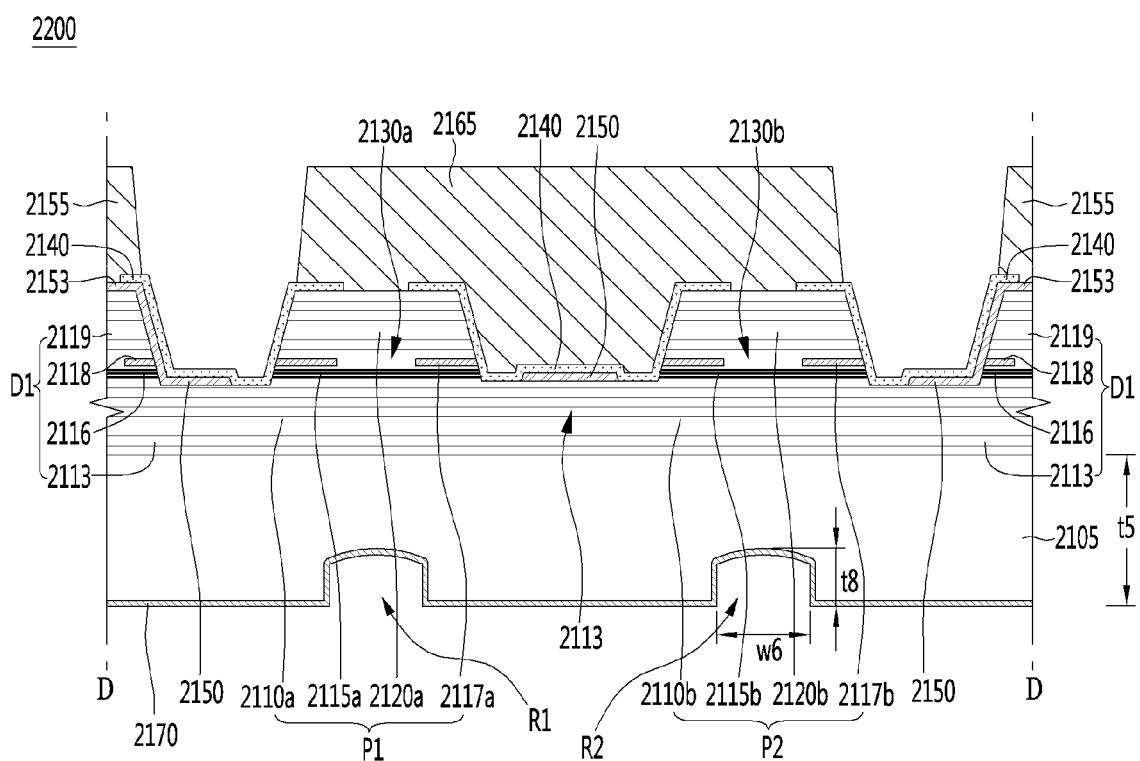

[FIG. 32]
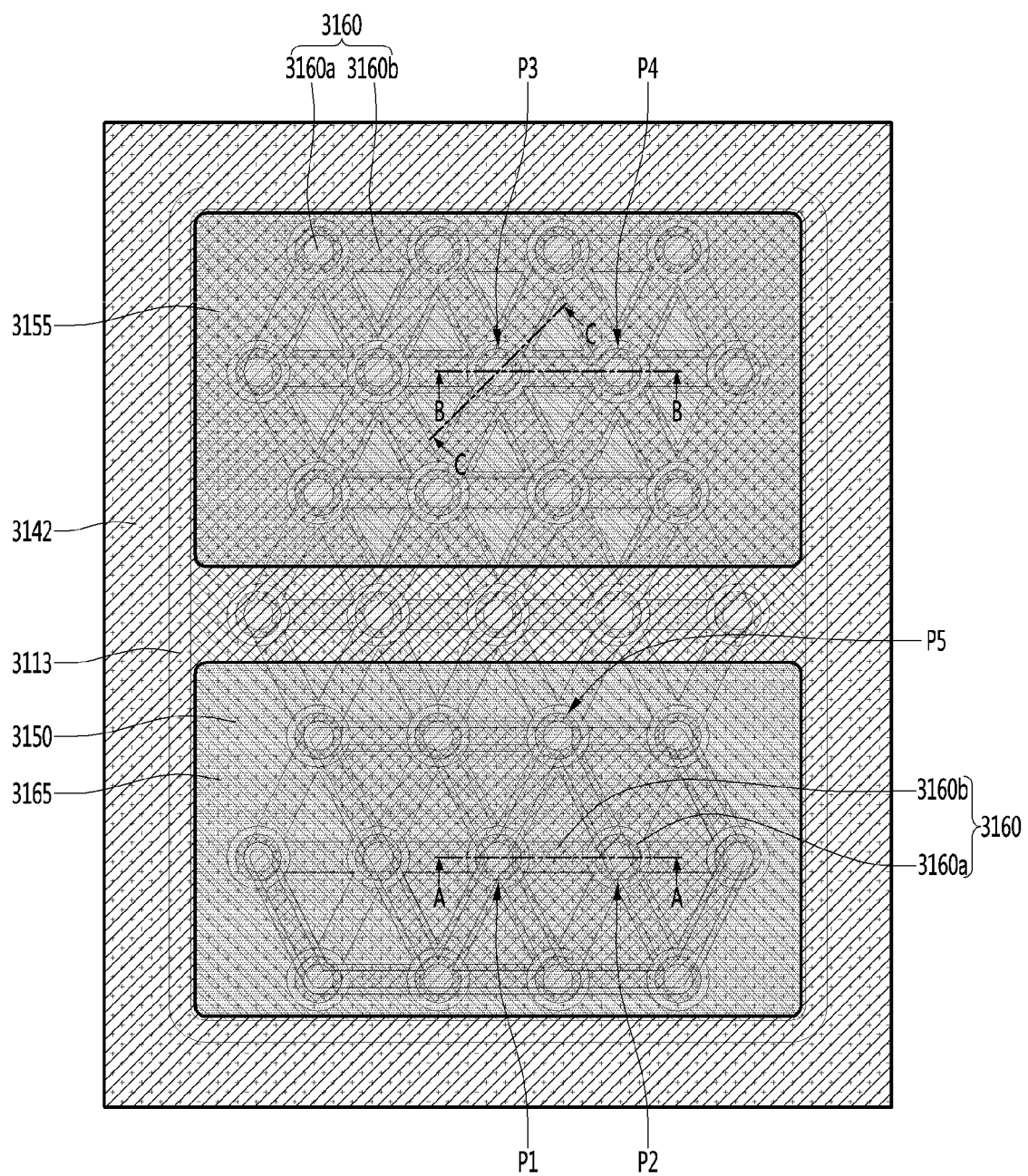

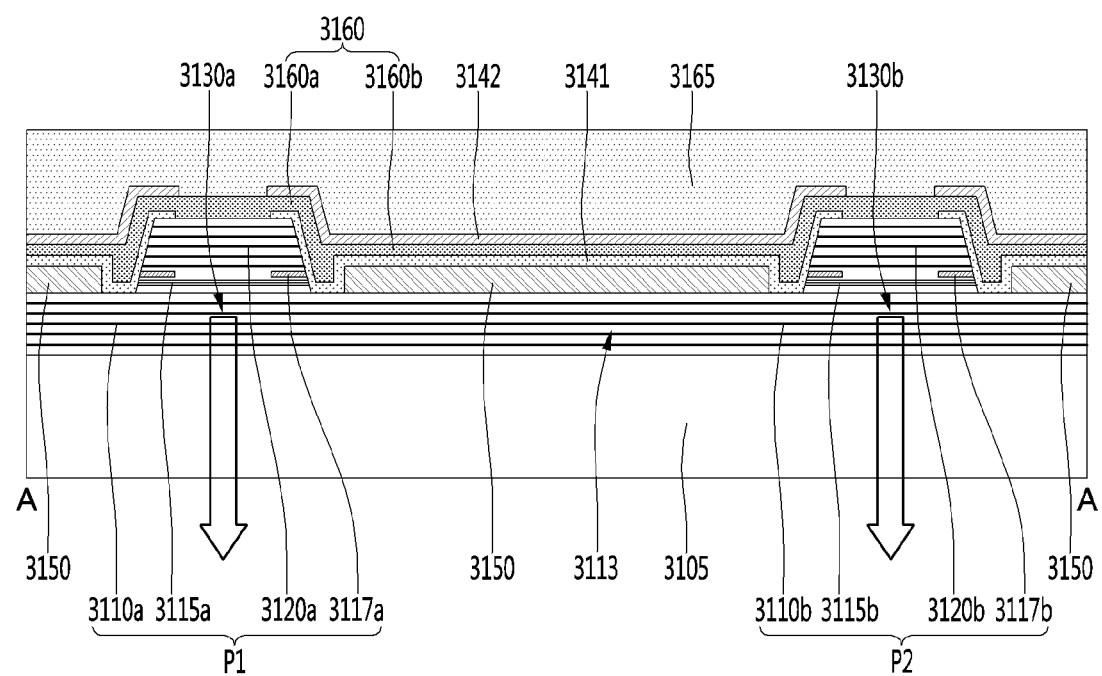
[FIG. 33]

[FIG. 34]
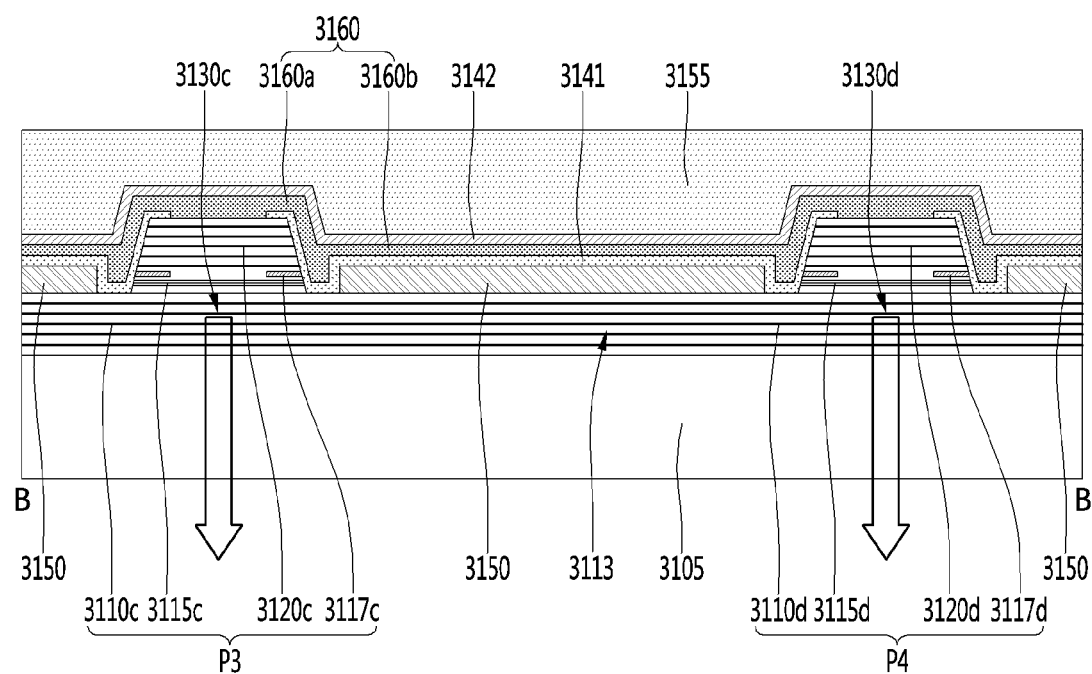

[FIG. 35]
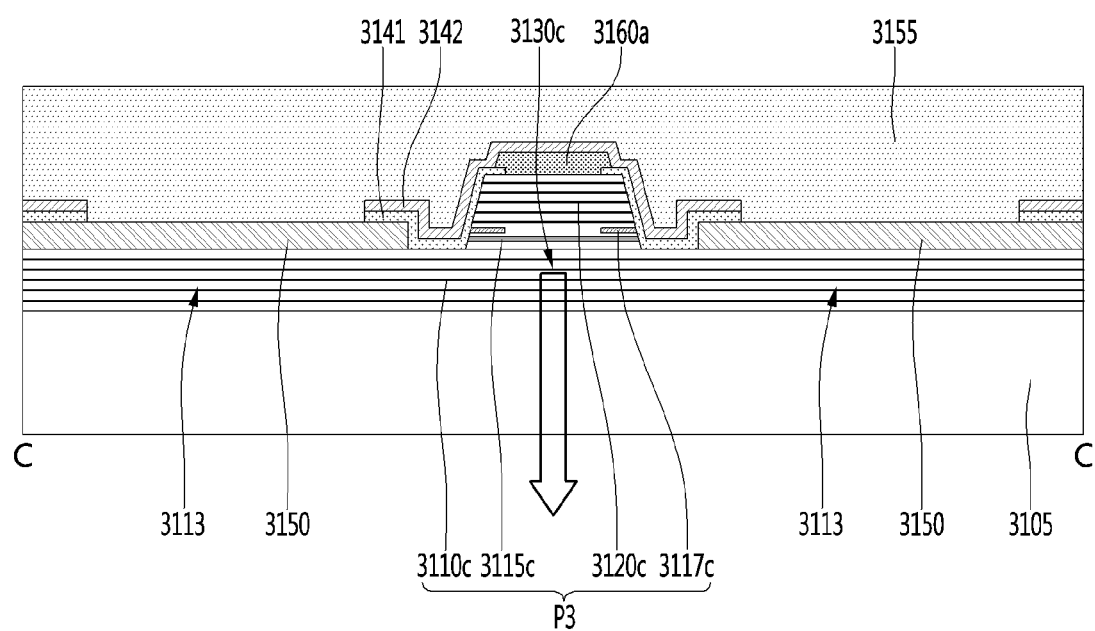

【FIG. 36a】
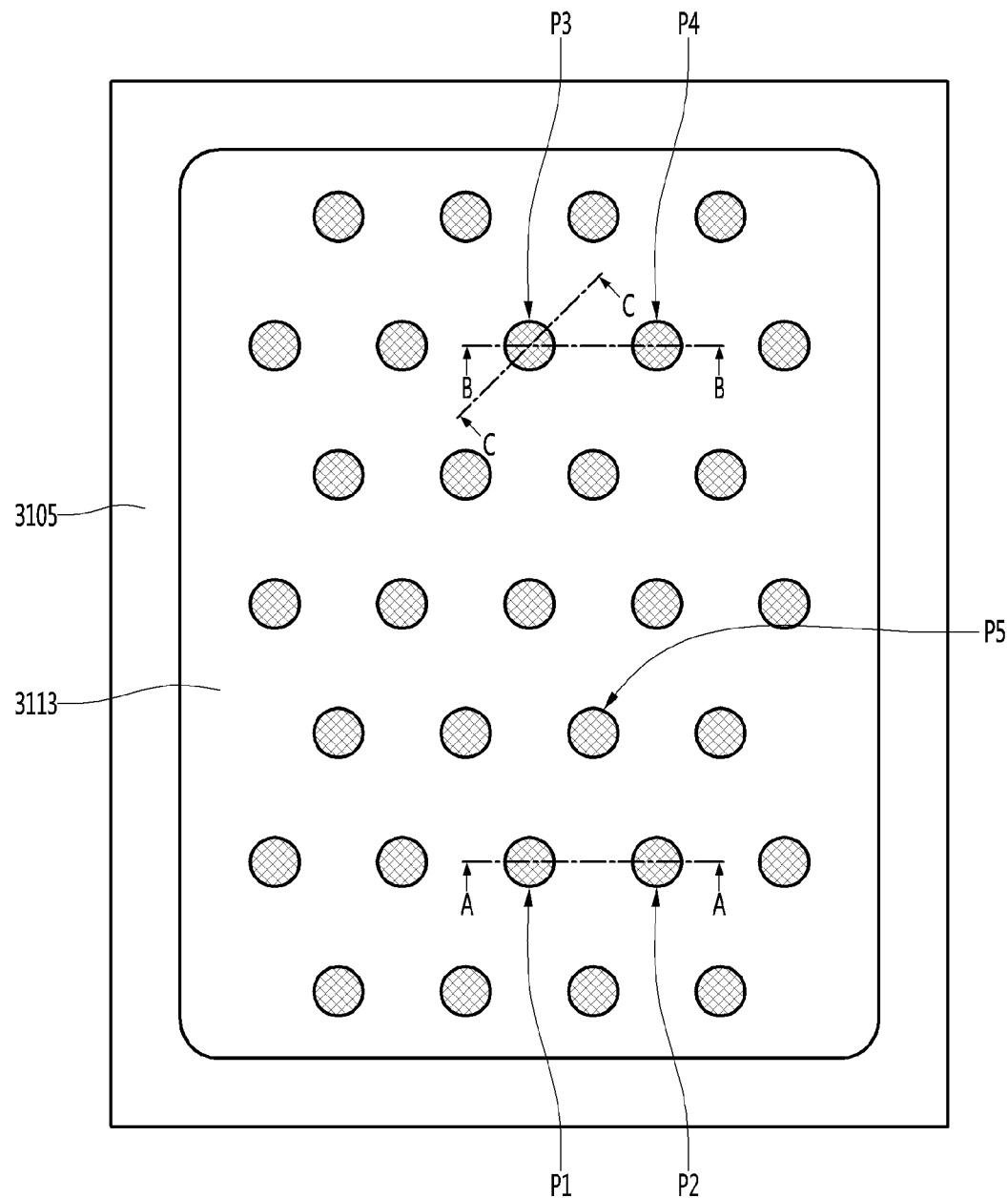

[FIG. 36b]
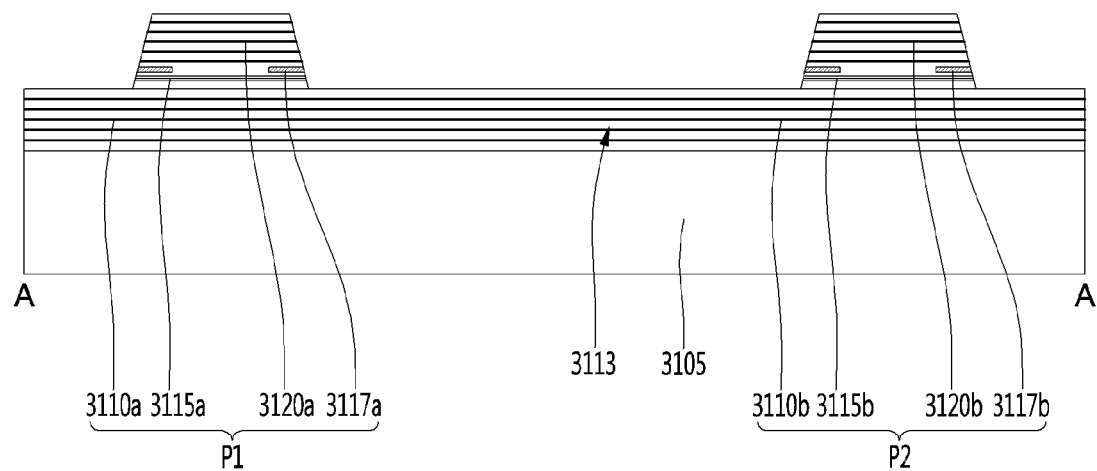

【FIG. 36c】
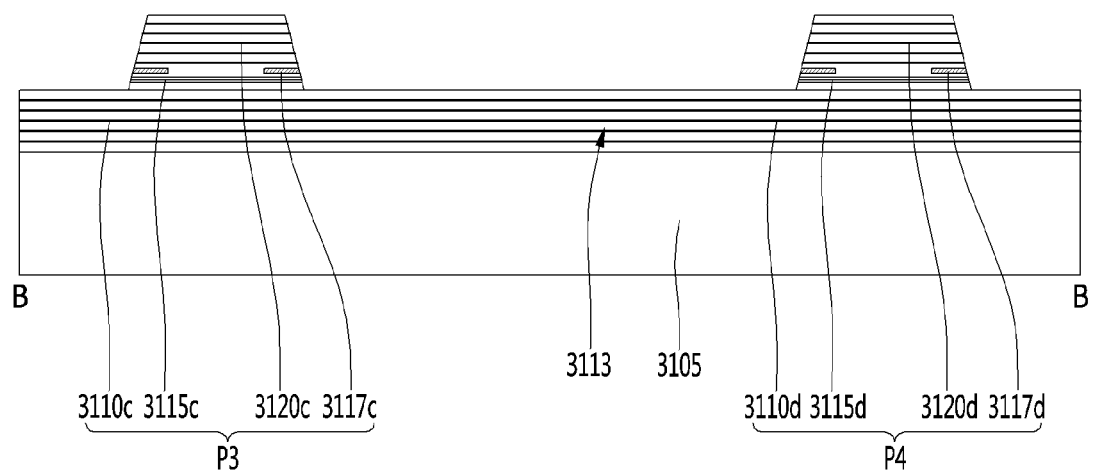

【FIG. 36d】
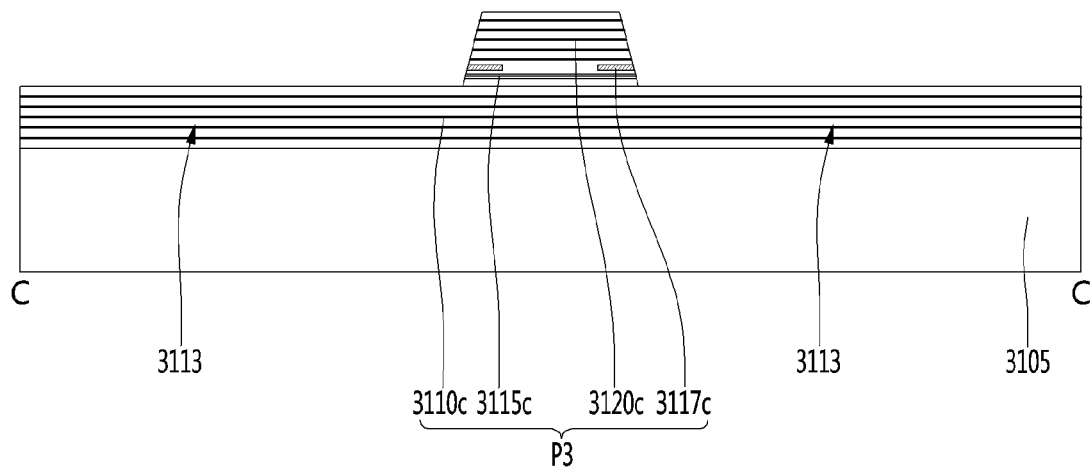

【FIG. 37a】
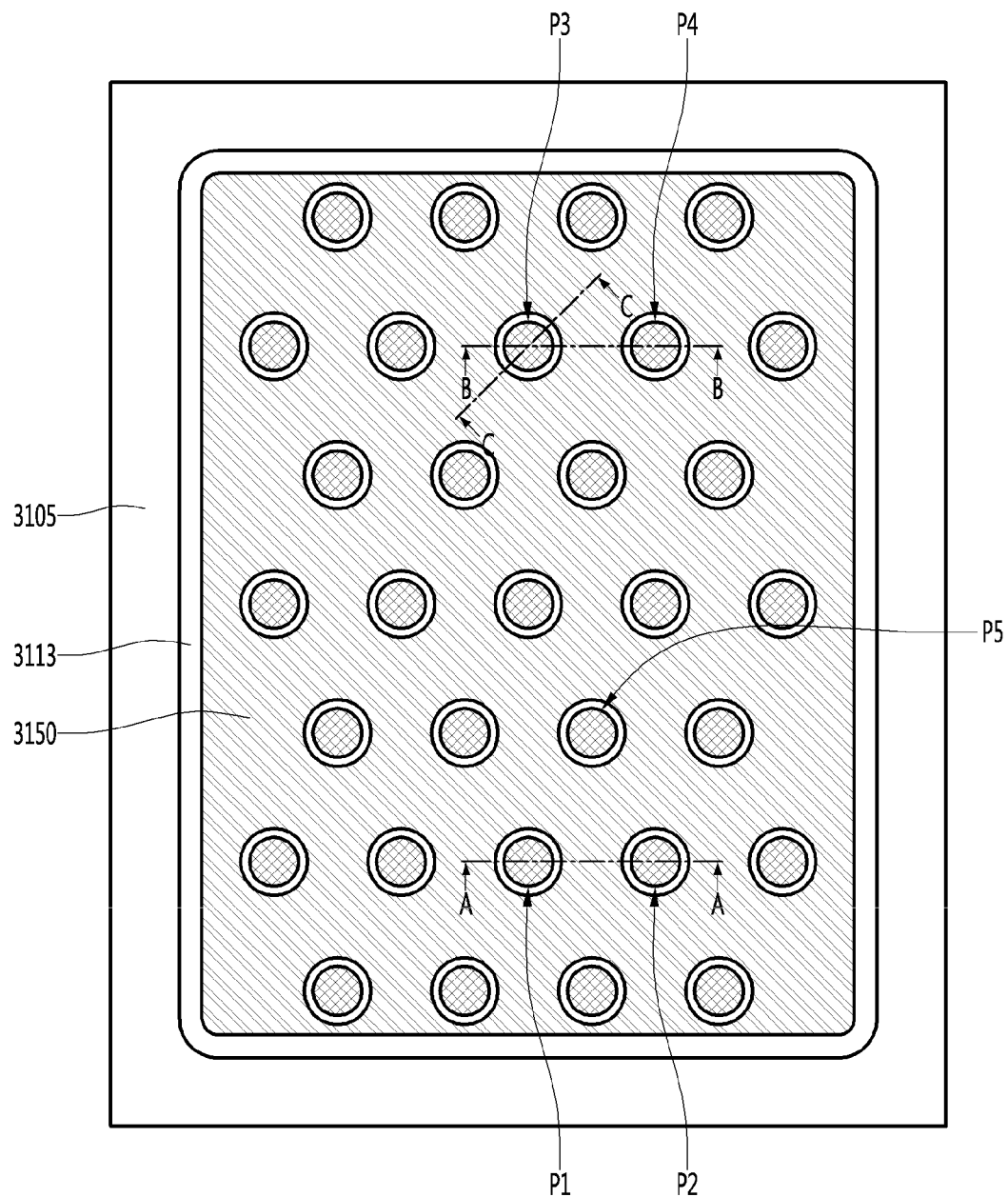

[FIG. 37b]
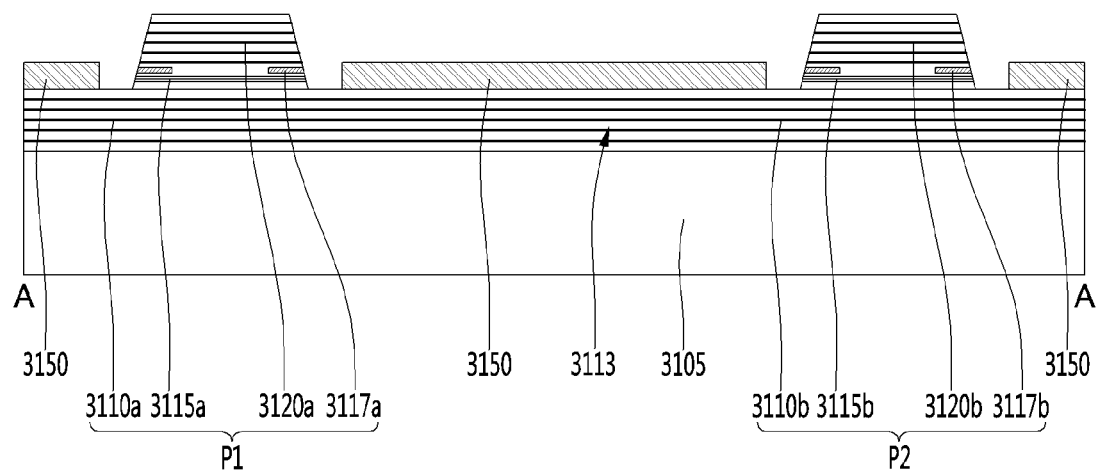

[FIG. 37c]
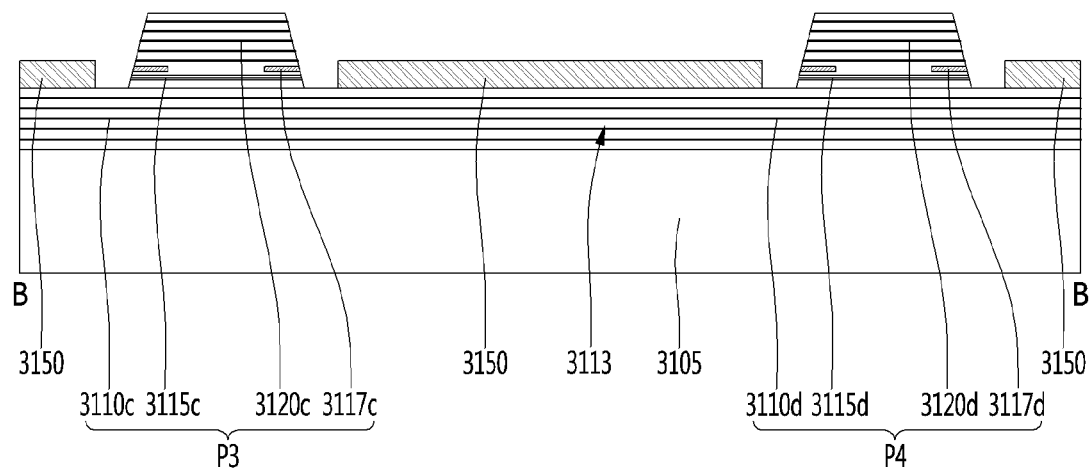

[FIG. 37d]
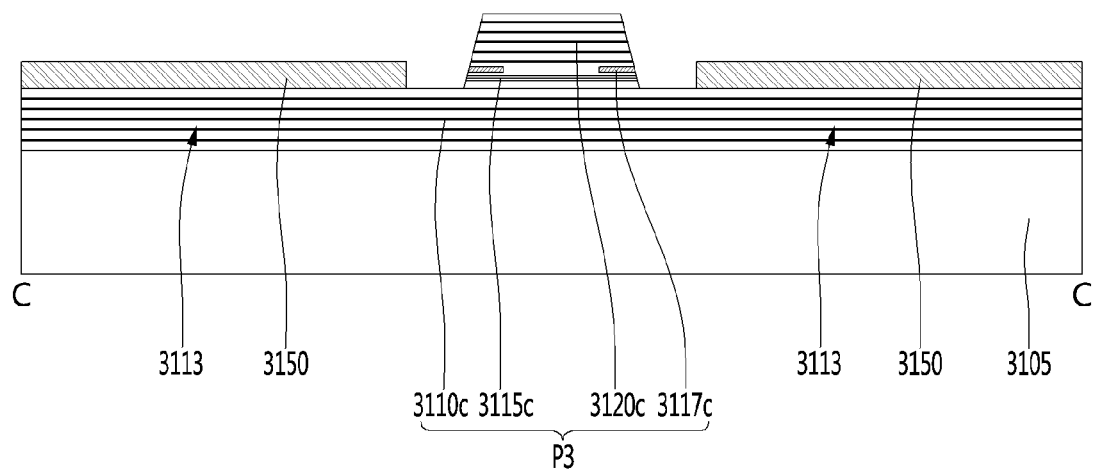

[FIG. 38a]
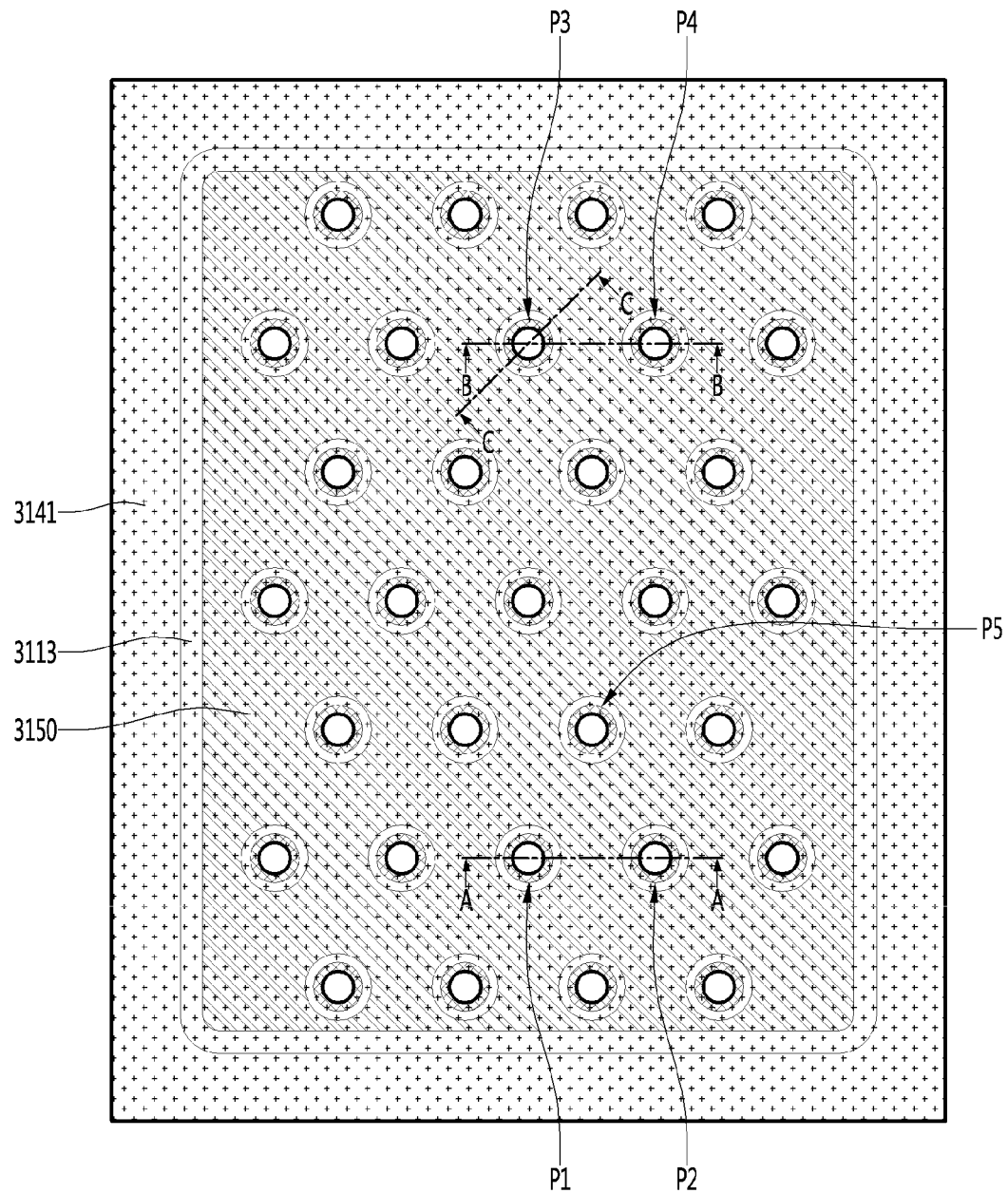

[FIG. 38b]
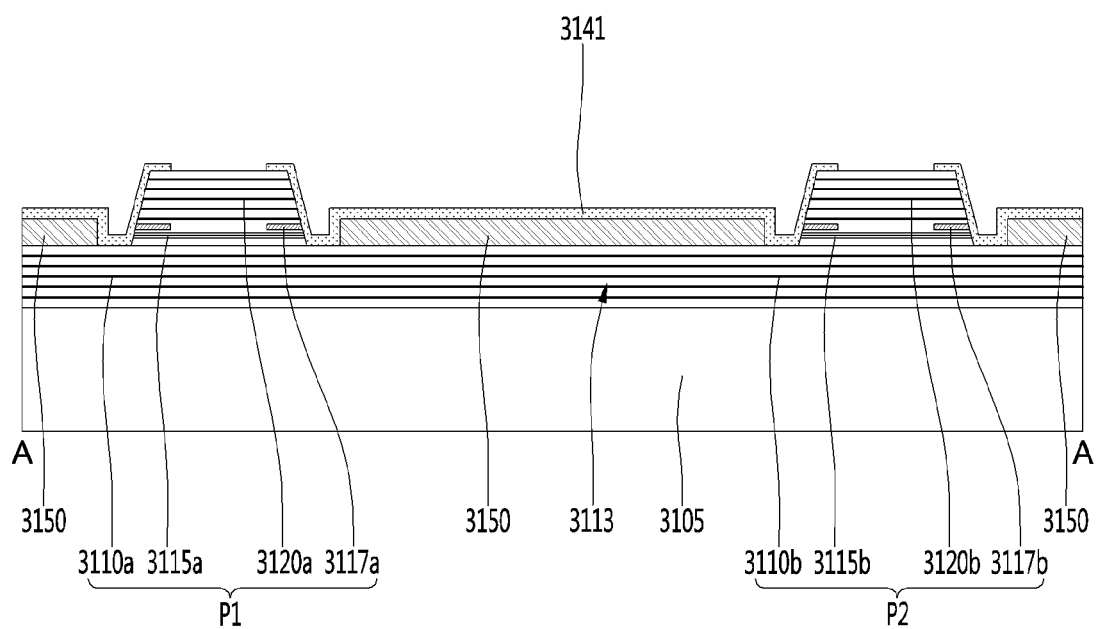

[FIG. 38c]
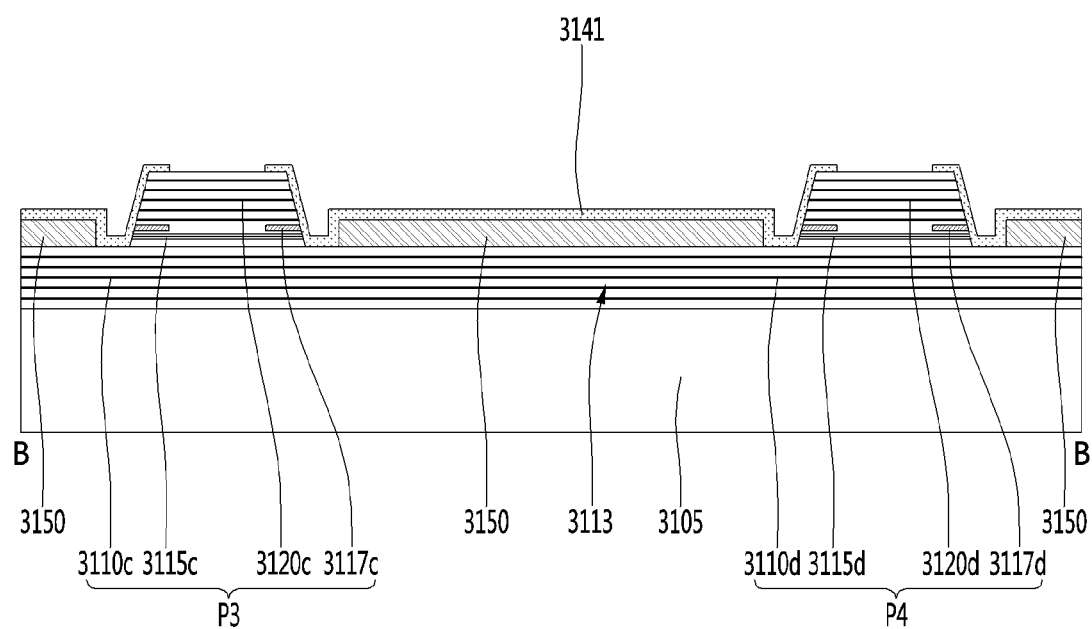

[FIG. 38d]
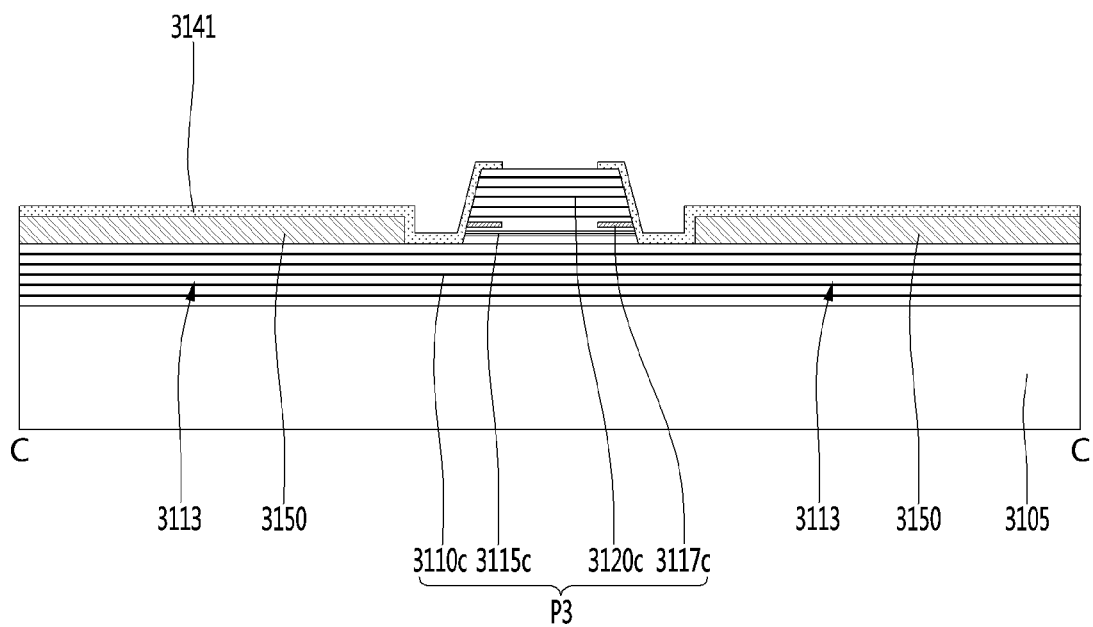

[FIG. 39a]
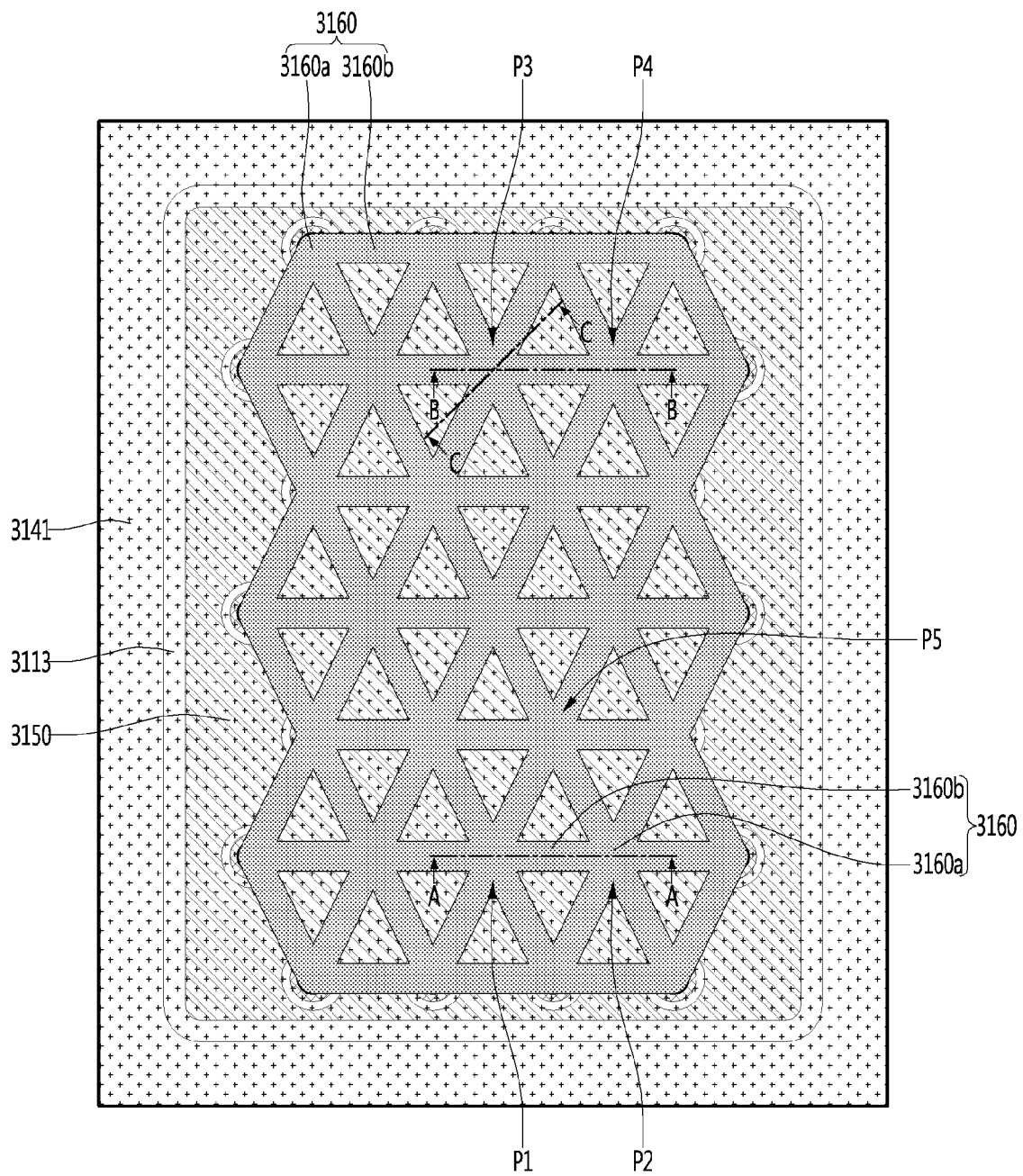

[FIG. 39b]
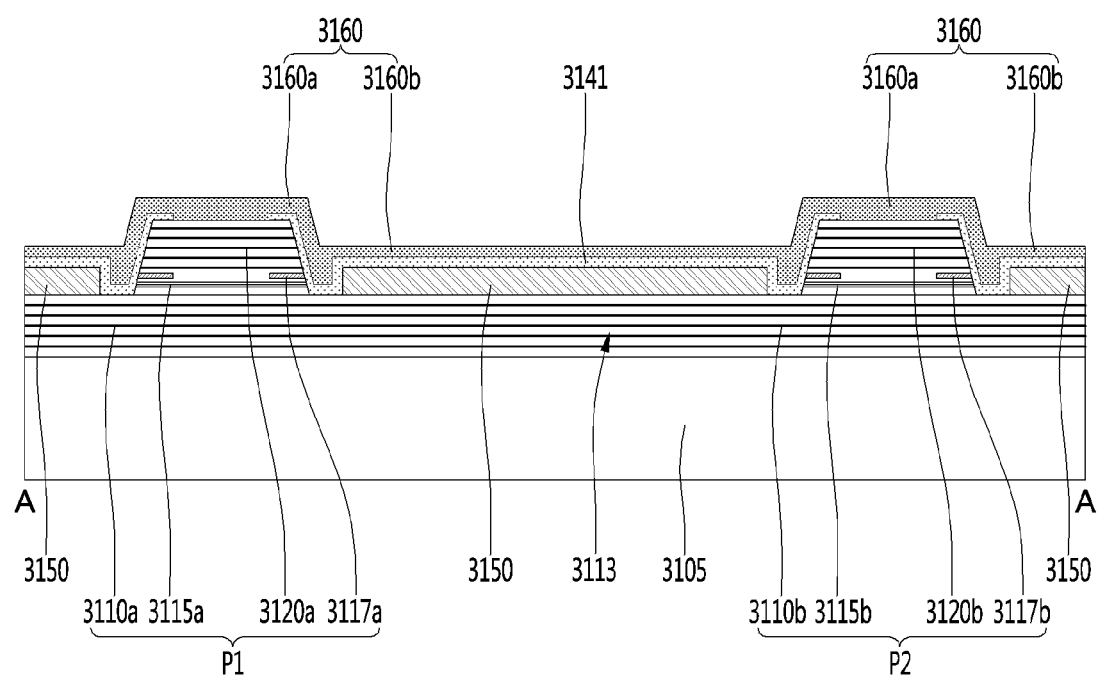

[FIG. 39c]
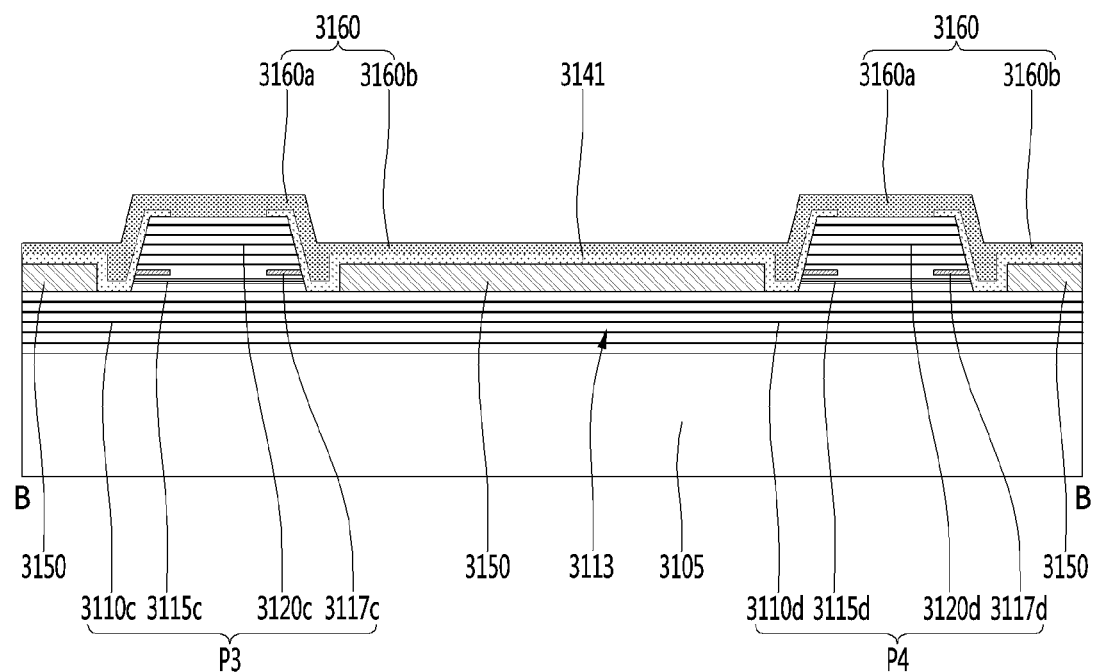

【FIG. 39d】
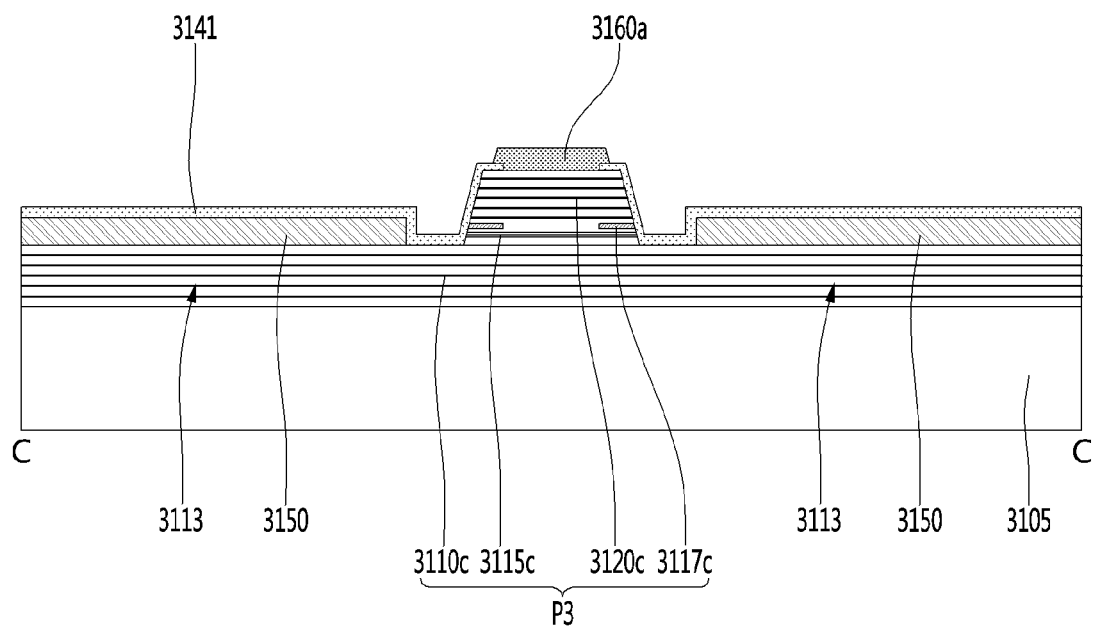

[FIG. 40a]
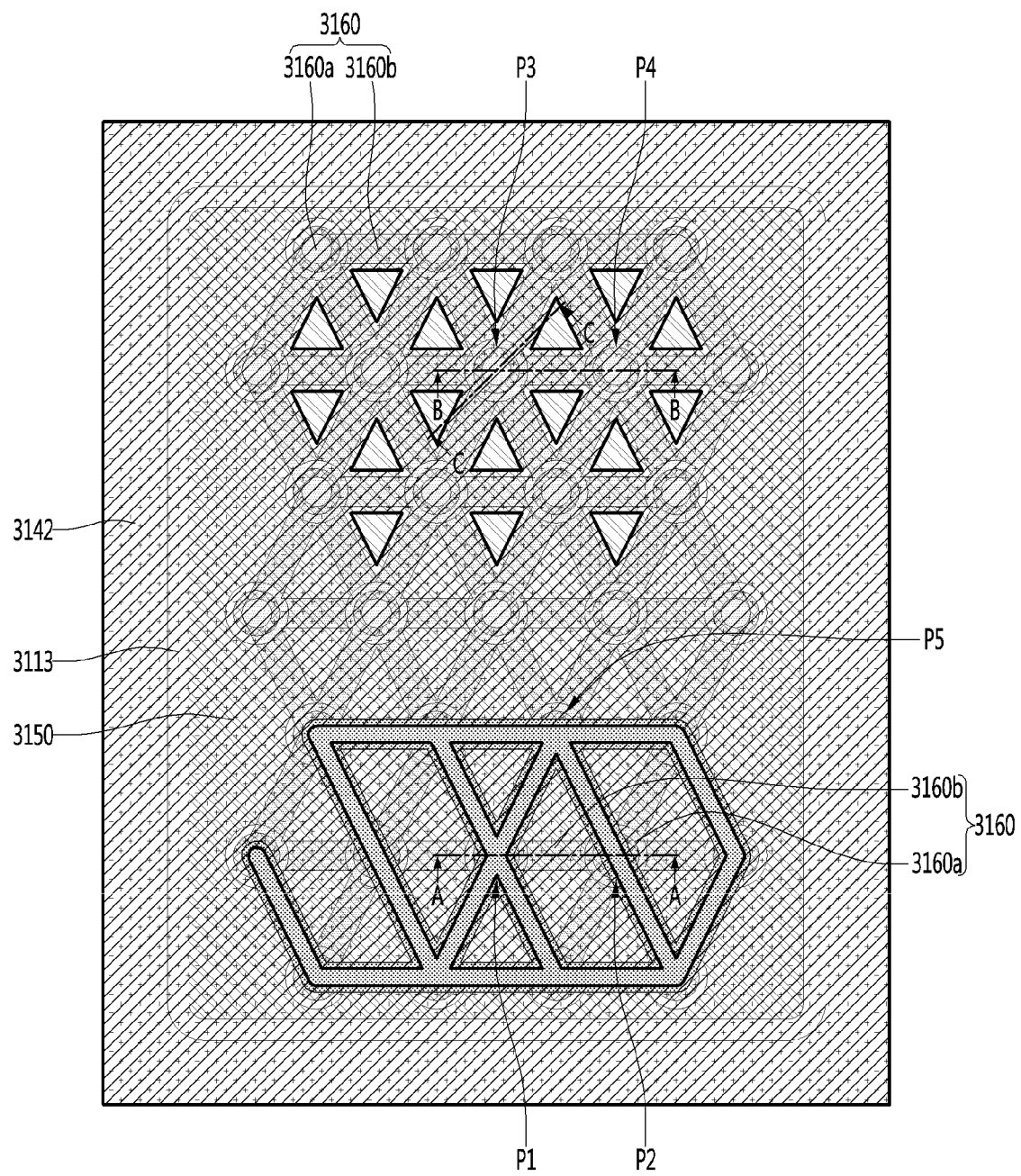

[FIG. 40b]
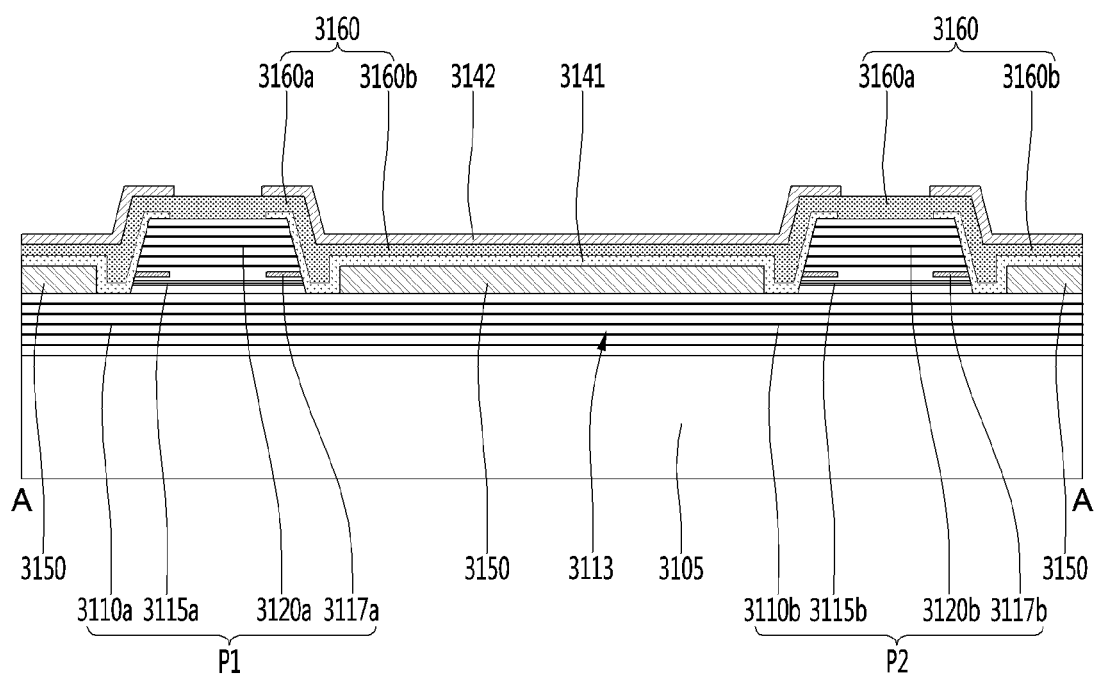

[FIG. 40c]
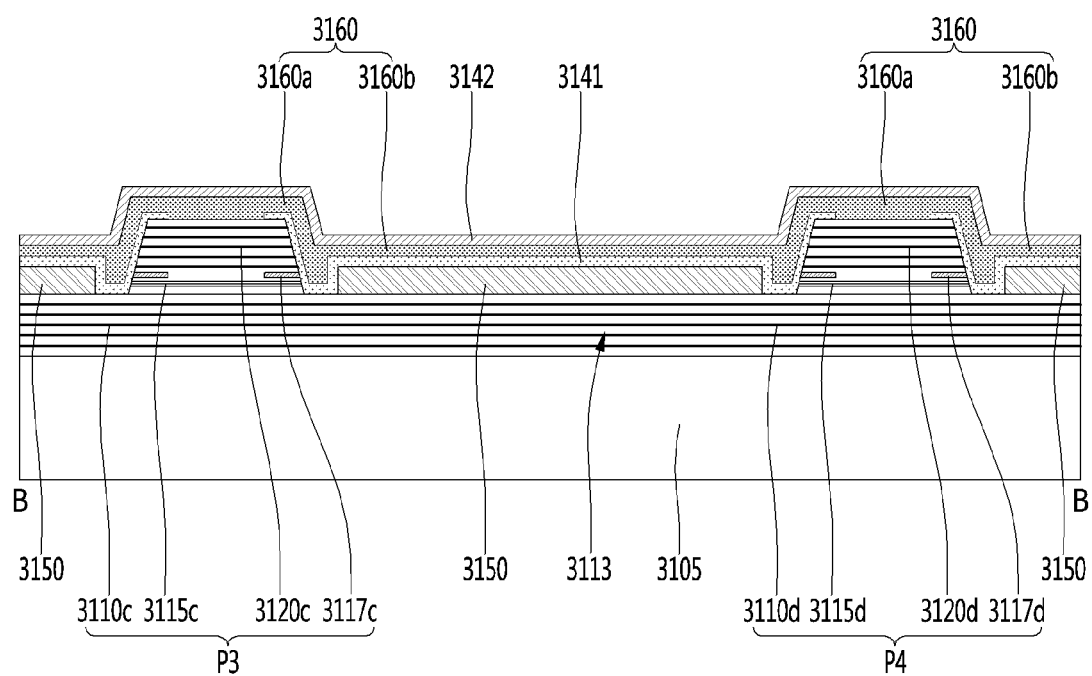

[FIG. 40d]
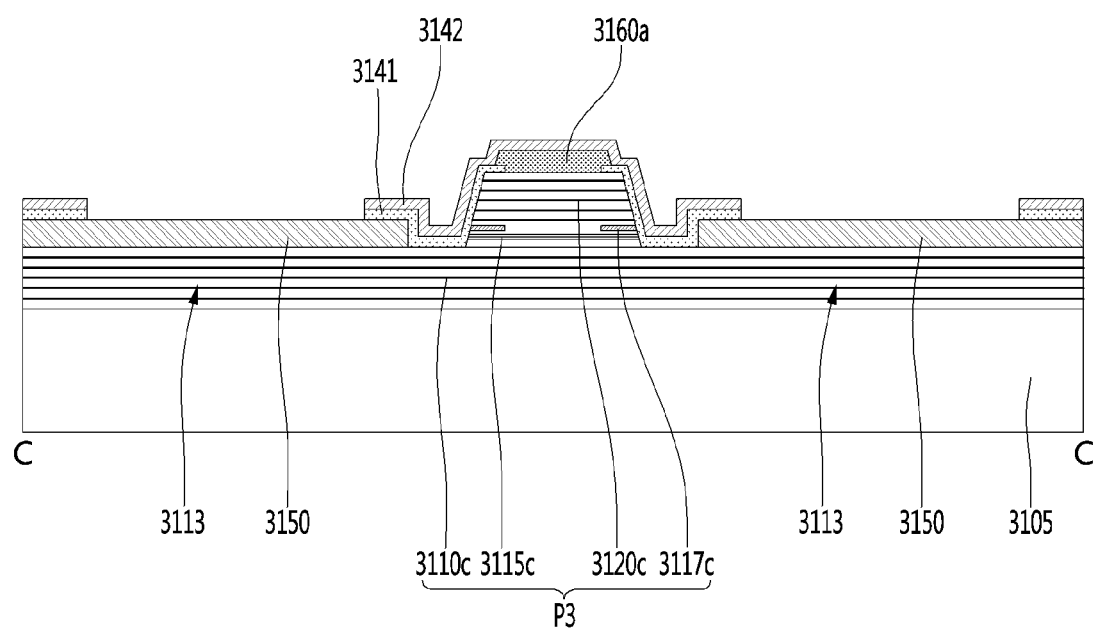

[FIG. 41a]
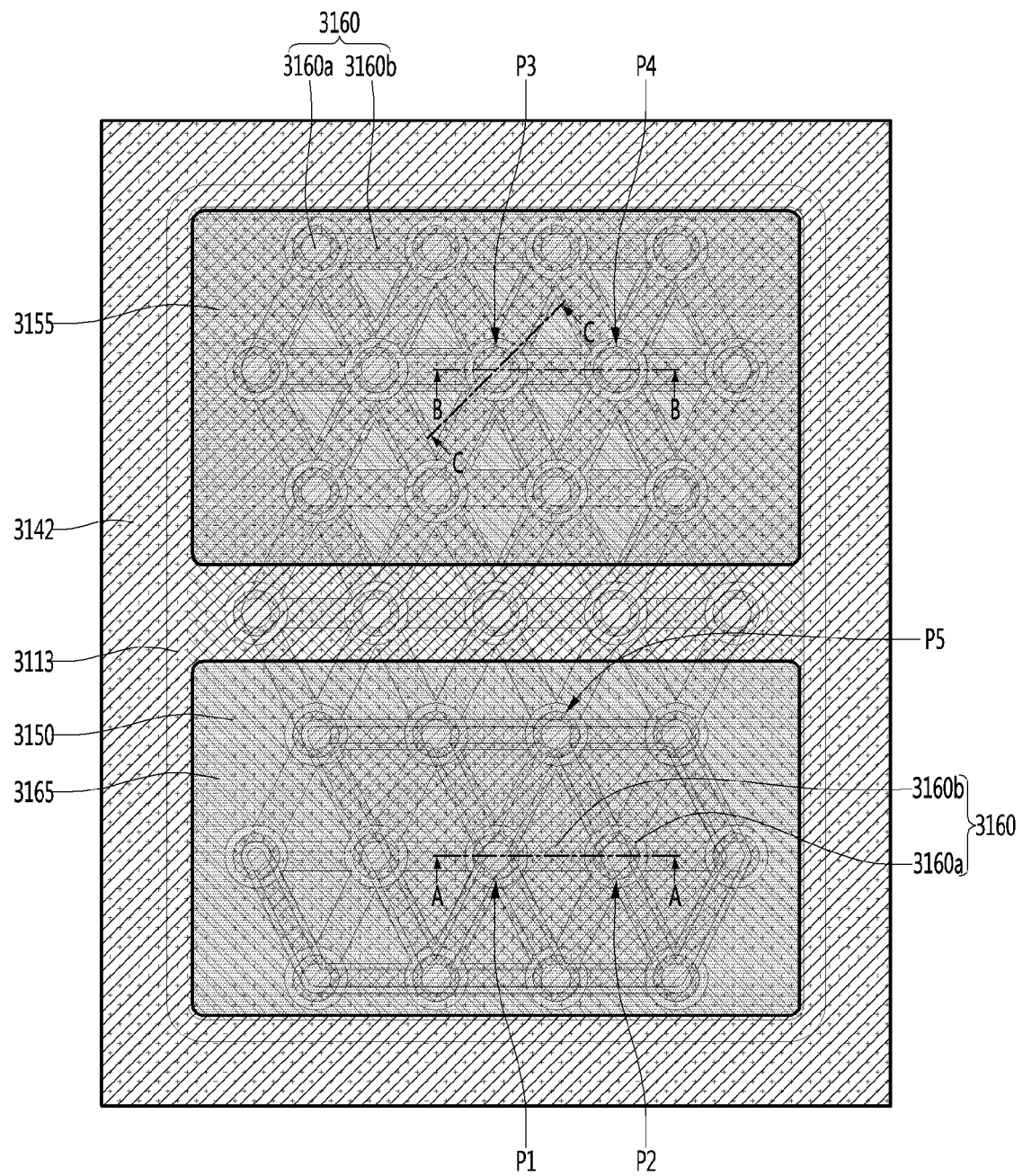

[FIG. 41b]
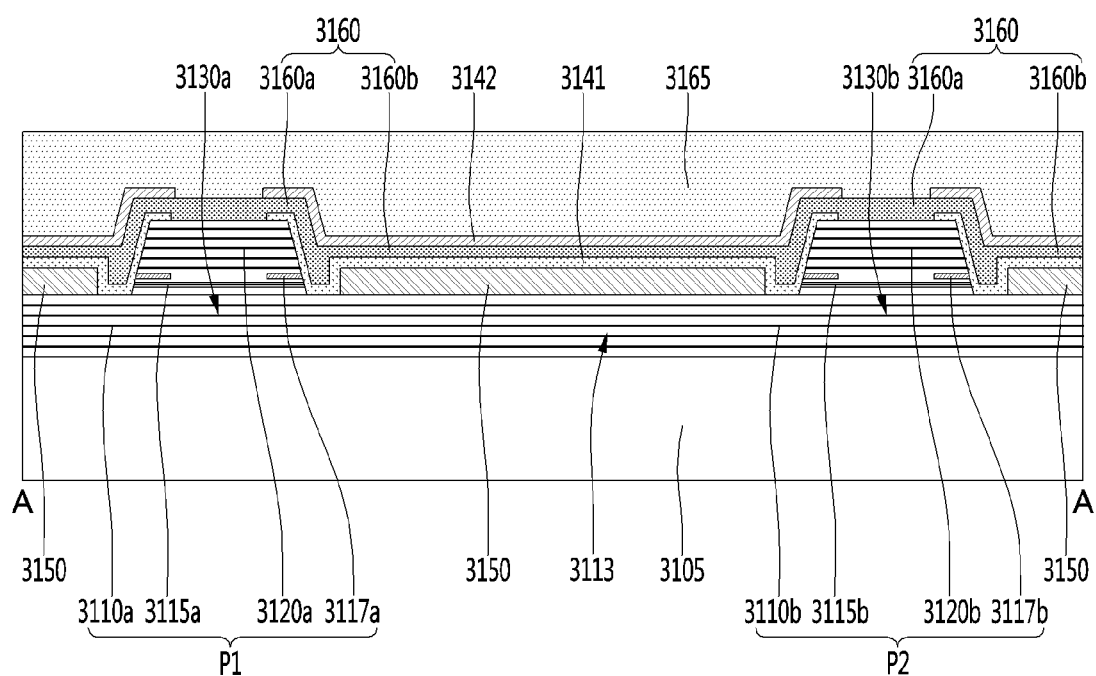

【FIG. 41c】
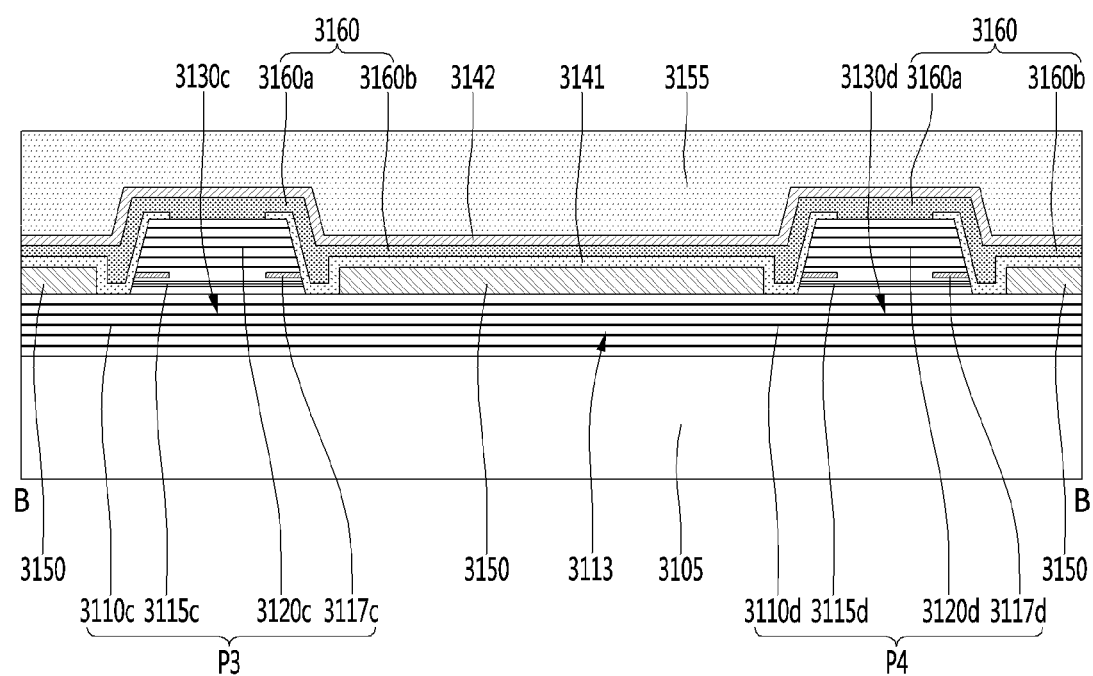

[FIG. 41d]
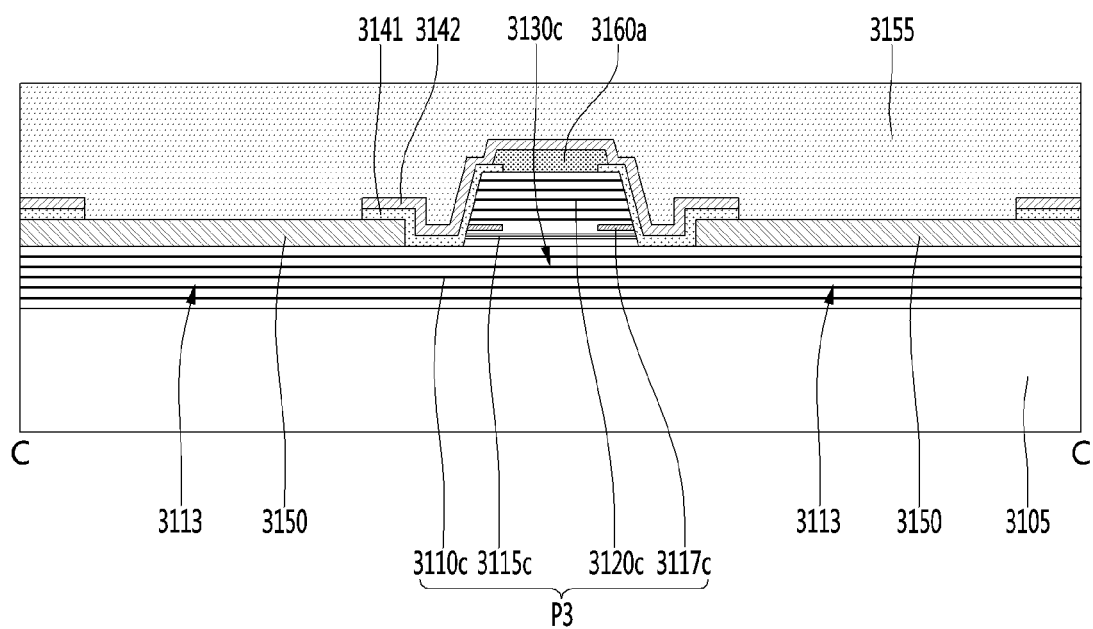

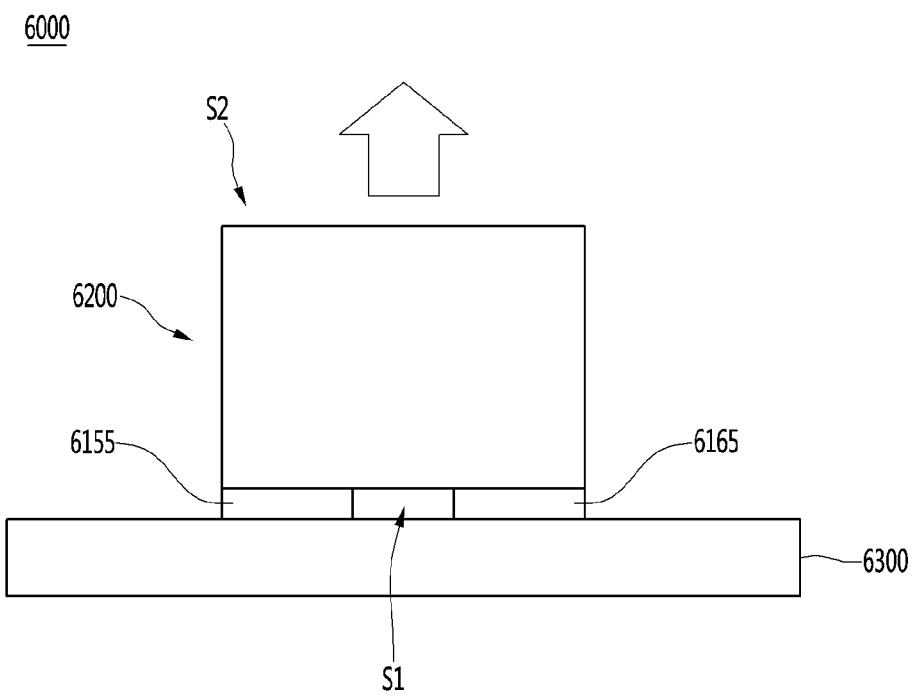
[FIG. 42]

[FIG. 43]
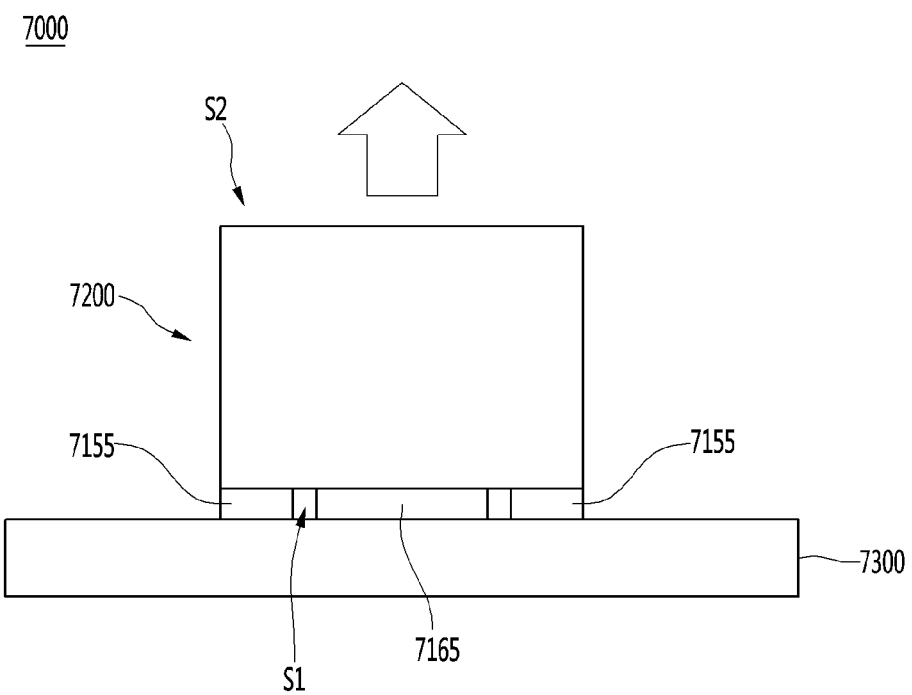

[FIG. 44]
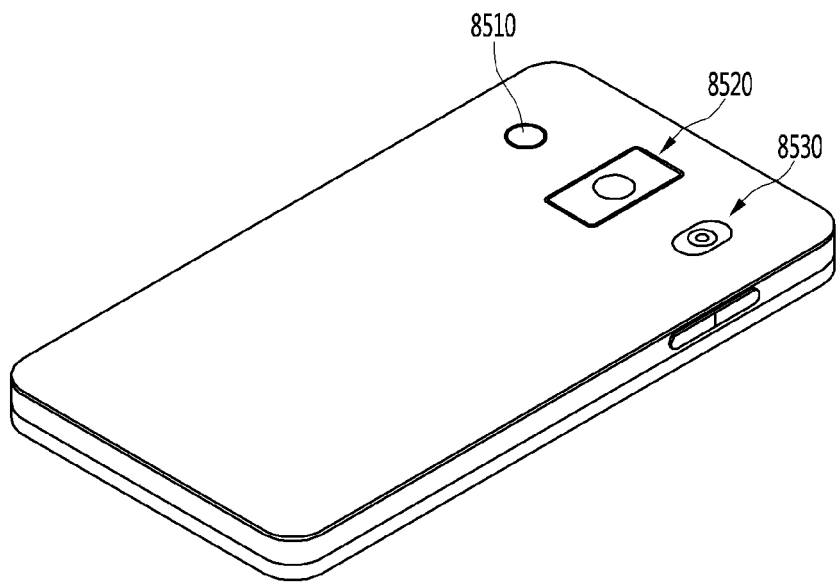

SEMICONDUCTOR DEVICE INCLUDING MULTIPLE DISTRIBUTED BRAGG REFLECTOR LAYERS

CROSS REFERENCE TO RELATED APPLICATIONS

This application is the National Phase of PCT International Application No. PCT/KR2018/001131, filed on Jan. 25, 2018, which claims priority under 35 U.S.C. 119(a) to Patent Application No. 10-2017-0012006, filed in the Republic of Korea on Jan. 25, 2017, Patent Application No. 10-2017-0040524, filed in the Republic of Korea on Mar. 30, 2017 and Patent Application No. 10-2017-0040526, filed in the Republic of Korea on Mar. 30, 2017, all of which are hereby expressly incorporated by reference into the present application.

TECHNICAL FIELD

Embodiments relate to a semiconductor device, a method of manufacturing a semiconductor device, a semiconductor device package, and an object detecting apparatus comprising a semiconductor device package.

BACKGROUND ART

A semiconductor device comprising compounds such as GaN and AlGaN has many merits such as wide and easily adjustable bandgap energy, so the device can be used variously as light emitting devices, light receiving devices and various kinds of diodes.

In particular, light emitting devices such as light emitting diodes and laser diodes obtained by using a group III-V or a group II-VI compound semiconductor substances can implement light having various wavelength band such as red, green, blue and ultraviolet rays due to the development of thin film growth technology and device materials. In addition, the light emitting devices such as light emitting diodes and laser diodes obtained by using a group III-V or a group II-VI compound semiconductor substances can implement a white light source having high efficiency by using fluorescent substances or combining colors. Such a light emitting device has advantages such as low power consumption, semi-permanent lifetime, quick response speed, safety, and environmental friendliness compared to conventional light source such as fluorescent lamps and incandescent lamps.

In addition, when a light receiving device such as a photo detector or a solar cell is manufactured using a group III-V or a group II-VI compound semiconductor substances, a photoelectric current is generated by absorbing light having various wavelength domains with the development of device materials, so that light having various wavelength domains such as from gamma rays to radio waves can be used. In addition, the above light receiving device has advantages such as quick response speed, safety, environmental friendliness, and easy control of device materials, so that the light receiving device can be easily used for a power control, a super-high frequency circuit or a communication module.

Accordingly, the semiconductor device has been applied and expanded to a transmission module of an optical communication tool, a light emitting diode backlight replacing a cold cathode fluorescence lamp (CCFL) constituting a backlight of a liquid crystal display (LCD), a white light emitting diode lighting apparatus replaceable with a fluorescent lamp or an incandescent bulb, a vehicular headlight, a traffic light, and a sensor for detecting gas or fire. In addition, the applications of the semiconductor device can be expanded to a high frequency application circuit, a power control apparatus, or a communication module.

For example, the light emitting device may be provided as a p-n junction diode having a characteristic in which electrical energy is converted into light energy by using a group III-V element or a group II-VI element in the periodic table, and various wavelengths can be realized by adjusting the composition ratio of the compound semiconductor substances.

Meanwhile, semiconductor devices are required to have high output and high voltage driving as their application fields become diverse. The temperature is increased by the heat generated in the semiconductor device due to the high output and high voltage driving of the semiconductor device. However, when the heat dissipation from the semiconductor device is not enough, the light output may be lowered and the power conversion efficiency (PCE) may be lowered as the temperature rises. Accordingly, there is a demand for a method for efficiently dissipating heat generated in a semiconductor device and improving power conversion efficiency.

SUMMARY

An embodiment can provide a semiconductor device, a method of manufacturing the same, a semiconductor device package, and an object detecting apparatus that having excellent heat dissipation characteristics.

An embodiment can provide a semiconductor device, a method of manufacturing the same, a semiconductor device package, and an object detecting apparatus that capable of increasing light extraction efficiency and providing light with high output.

An embodiment can provide a semiconductor device, a method of manufacturing the same, a semiconductor device package, and an object detecting apparatus that capable of increasing power conversion efficiency.

A semiconductor device according to an embodiment may comprise a first light emitting structure comprising a first DBR layer of a first conductivity type, a first active layer disposed on the first DBR layer, and a second DBR layer of a second conductivity type disposed on the first active layer; a second light emitting structure disposed spaced apart from the first light emitting structure and comprising a third DBR layer of the first conductivity type, a second active layer disposed on the third DBR layer, and a fourth DBR layer of the second conductivity type disposed on the second active layer; a first electrode electrically connected to the first DBR layer and the third DBR layer, and disposed between the first light emitting structure and the second light emitting structure; a first bonding pad disposed spaced apart from the first light emitting structure and the second light emitting structure, and electrically connected to the first electrode; and a second bonding pad disposed spaced apart from the first bonding pad, electrically connected to the second DBR layer and the fourth DBR layer, and disposed on an upper surface of the second DBR layer and an upper surface of the fourth DBR layer.

The semiconductor device according to the embodiment may further comprise a first conductivity type DBR layer physically connecting the first DBR layer and the third DBR layer, wherein the first electrode may be disposed in contact with an upper surface of the first conductivity type DBR layer.

According to the embodiment, the first electrode may be disposed around the first light emitting structure and the second light emitting structure, and may comprise an opening exposing the first light emitting structure and the second light emitting structure.

The semiconductor device according to the embodiment may comprise a dummy light emitting structure disposed spaced apart from the first light emitting structure and the second light emitting structure, and comprising a first conductivity type DBR layer and a second conductivity type DBR layer, and a pad electrode electrically connected with the first electrode, and disposed on the dummy light emitting structure, wherein the first bonding pad may be disposed on the pad electrode.

According to the embodiment, wherein the pad electrode may be electrically connected to the first conductivity type DBR layer and the second conductivity type DBR layer of the dummy light emitting structure.

According to the embodiment, wherein the dummy light emitting structure may be disposed on at least one side surface of the second bonding pad, and may be disposed spaced apart from and along the side surface of the second bonding pad.

According to the embodiment, wherein a lower surface of the second bonding pad and an upper surface of the second DBR layer may be in direct contact with each other, and a lower surface of the second bonding pad and an upper surface of the fourth DBR layer may be in direct contact with each other.

The semiconductor device according to the embodiment may comprise an insulating layer surrounding a side surface of the first light emitting structure and a side surface of the second light emitting structure, exposing an upper surface of the first light emitting structure and an upper surface of the second light emitting structure, and disposed on the first electrode in a region between the light emitting structure and the second light emitting structure.

According to the embodiment, wherein the insulating layer may be disposed between an upper surface of the first electrode and a lower surface of the second bonding pad, in a periphery of the first light emitting structure and the second light emitting structure.

According to the embodiment, the insulating layer may be a DBR layer.

The semiconductor device according to the embodiment may comprise a first conductivity type DBR layer extending from the first DBR layer of the first light emitting structure and extending from the third DBR layer of the second light emitting structure; a pad electrode disposed on the first conductivity type DBR layer and electrically connected to the first electrode; and wherein the first bonding pad may be disposed on the pad electrode.

The semiconductor device according to the embodiment may comprise a second electrode disposed between an upper surface of the second DBR layer and the second bonding pad, and disposed between an upper surface of the fourth DBR layer and the second bonding pad.

The semiconductor device according to the embodiment may further comprise a substrate disposed under the first light emitting structure and the second light emitting structure, and wherein the substrate may be an intrinsic semiconductor substrate.

According to the embodiment, wherein a reflectance of the first DBR layer may be smaller than a reflectance of the second DBR layer, and wherein a reflectance of the third DBR layer may be smaller than a reflectance of the fourth DBR layer.

A semiconductor device package according to an embodiment may comprise a submount and a semiconductor device disposed on the submount: wherein the semiconductor device may comprise a first light emitting structure comprising a first DBR layer of a first conductivity type, a first active layer disposed on the first DBR layer, and a second DBR layer of a second conductivity type disposed on the first active layer; a second light emitting structure disposed spaced apart from the first light emitting structure and comprising a third DBR layer of the first conductivity type, a second active layer disposed on the third DBR layer, and a fourth DBR layer of the second conductivity type disposed on the second active layer; a first electrode electrically connected to the first DBR layer and the third DBR layer, and disposed between the first light emitting structure and the second light emitting structure; a first bonding pad disposed spaced apart from the first light emitting structure and the second light emitting structure, and electrically connected to the first electrode; and a second bonding pad disposed spaced apart from the first bonding pad, electrically connected to the second DBR layer and the fourth DBR layer, and disposed on an upper surface of the second DBR layer and an upper surface of the fourth DBR layer, wherein the semiconductor device may comprise a first surface on which the first bonding pad and the second bonding pad are disposed and a second surface opposite to the first surface, the first bonding pad and the second bonding pad may be electrically connected to the submount, and light generated in the semiconductor device may be emitted to the outside through the second surface.

An object detecting apparatus according to an embodiment may comprise a semiconductor device package and a light receiving unit receiving reflected light of light emitted from the semiconductor device package; wherein the semiconductor device package may comprise a submount and a semiconductor device disposed on the submount; wherein the semiconductor device may comprise a first light emitting structure comprising a first DBR layer of a first conductivity type, a first active layer disposed on the first DBR layer, and a second DBR layer of a second conductivity type disposed on the first active layer; a second light emitting structure disposed spaced apart from the first light emitting structure and comprising a third DBR layer of the first conductivity type, a second active layer disposed on the third DBR layer, and a fourth DBR layer of the second conductivity type disposed on the second active layer; a first electrode electrically connected to the first DBR layer and the third DBR layer, and disposed between the first light emitting structure and the second light emitting structure; a first bonding pad disposed spaced apart from the first light emitting structure and the second light emitting structure, and electrically connected to the first electrode; and a second bonding pad disposed spaced apart from the first bonding pad, electrically connected to the second DBR layer and the fourth DBR layer, and disposed on an upper surface of the second DBR layer and an upper surface of the fourth DBR layer.

A method of manufacturing a semiconductor device according to an embodiment may comprise forming a first conductivity type DBR layer, an active layer, and a second conductivity type DBR layer on a substrate; performing a mesa etching process on the second conductivity type DBR layer and the active layer; forming a plurality of light emitting structures spaced apart from each other, and forming a dummy light emitting structure on a side of a region where the plurality of light emitting structures are formed; forming a first electrode on the first conductivity type DBR layer exposed between the plurality of light emitting structures and forming a pad electrode disposed on the dummy light emitting structure; forming an insulating layer disposed on the first electrode and exposing an upper surface of the plurality of light emitting structures; forming a first bonding pad disposed on the pad electrode and electrically connected to the first electrode, and a second bonding pad disposed on the insulating layer and electrically connected to the second conductivity type DBR layer of the plurality of light emitting structures.

A semiconductor device according to an embodiment may comprise a substrate comprising a concavo-convex structure provided on a lower surface; a first light emitting structure disposed on the substrate and comprising a first DBR layer of a first conductivity type, a first active layer disposed on the first DBR layer, a second DBR layer of a second conductivity type disposed on the first active layer, and a first light emitting aperture emitting light generated in the first active layer in a direction perpendicular to a lower surface of the first DBR layer; a second light emitting structure disposed on the substrate, disposed spaced apart from the first light emitting structure, and comprising a third DBR layer of the first conductivity type, a second active layer disposed on the third DBR layer, a fourth DBR layer of the second conductivity type disposed on the second active layer, and a second light emitting aperture emitting light generated in the second active layer in a direction perpendicular to a lower surface of the third DBR layer; a first electrode electrically connected to the first DBR layer and the third DBR layer, and disposed between the first light emitting structure and the second light emitting structure; a second electrode electrically connected to the second DBR layer and the fourth DBR layer, and disposed on an upper surface of the second DBR layer and an upper surface of the fourth DBR layer; a first bonding pad disposed on the second light emitting structure and electrically connected to the first electrode; and a second bonding pad disposed on the first light emitting structure and electrically connected to the second electrode.

According to the embodiment, wherein the concave-convex structure may comprise a first recess and a second recess recessed upward in a lower surface of the substrate, wherein the first recess and the first light emitting structure may be overlapped with each other in a direction perpendicular to an upper surface of the substrate, and wherein the second recess and the second light emitting structure may be overlapped with each other in a direction perpendicular to the upper surface of the substrate.

According to the embodiment, wherein a width of the first recess may correspond to a width of the first light emitting aperture provided in the first light emitting structure, and wherein a width of the second recess may correspond to a width of the second light emitting aperture provided in the second light emitting structure.

According to the embodiment, wherein an upper surface of the first recess and an upper surface of the second recess may be provided in any one of a planar shape, a convex lens shape, and a concave lens shape.

According to the embodiment, wherein depths of the first recess and the second recess may be provided with in a range of several micrometers to several tens of micrometers, and wherein widths of the first recess and the second recess may be provided with in a range of several micrometers to several tens of micrometers.

According to the embodiment, wherein the second electrode may comprise an upper electrode disposed in contact with an upper surface of the second DBR layer and an upper surface of the fourth DBR layer, and a connection electrode disposed on the first electrode in a region between the first light emitting structure and the second light emitting structure.

The semiconductor device according to the embodiment may further comprise a first conductivity type DBR layer physically connecting the first DBR layer and the third DBR layer.

The semiconductor device according to the embodiment may comprise a first insulating layer surrounding a side surface of the first light emitting structure and a side surface of the second light emitting structure, and exposing the first electrode disposed between the first light emitting structure and the second light emitting structure.

A semiconductor device according to an embodiment may comprise a substrate comprising a concavo-convex structure provided on a lower surface; a first light emitting structure disposed on the substrate and comprising a first DBR layer of a first conductivity type, a first active layer disposed on the first DBR layer, a second DBR layer of a second conductivity type disposed on the first active layer, and a first light emitting aperture emitting light generated in the first active layer in a direction perpendicular to a lower surface of the first DBR layer; a second light emitting structure disposed on the substrate, disposed spaced apart from the first light emitting structure, and comprising a third DBR layer of the first conductivity type, a second active layer disposed on the third DBR layer, a fourth DBR layer of the second conductivity type disposed on the second active layer, and a second light emitting aperture emitting light generated in the second active layer in a direction perpendicular to a lower surface of the third DBR layer; a first electrode electrically connected to the first DBR layer and the third DBR layer, and disposed between the first light emitting structure and the second light emitting structure; a first bonding pad disposed spaced apart from the first light emitting structure and the second light emitting structure, and electrically connected to the first electrode; and a second bonding pad disposed spaced apart from the first bonding pad, electrically connected to the second DBR layer and the fourth DBR layer, and disposed on an upper surface of the second DBR layer and an upper surface of the fourth DBR layer.

According to the embodiment, wherein the concave-convex structure may comprise a first recess and a second recess recessed upward in a lower surface of the substrate, wherein the first recess and the first light emitting structure may be overlapped with each other in a direction perpendicular to an upper surface of the substrate, and wherein the second recess and the second light emitting structure may be overlapped with each other in a direction perpendicular to the upper surface of the substrate.

According to the embodiment, wherein a width of the first recess may correspond to a width of the first light emitting aperture provided in the first light emitting structure, and wherein a width of the second recess may correspond to a width of the second light emitting structure provided in the second light emitting structure.

According to the embodiment, wherein an upper surface of the first recess and an upper surface of the second recess may be provided in any one of a planar shape, a convex lens shape, and a concave lens shape.

According to the embodiment, wherein depths of the first recess and the second recess may be provided with in a range of several micrometers to several tens of micrometers, and wherein widths of the first recess and the second recess may be provided with several tens of micrometers.

The semiconductor device according to the embodiment may further comprise a first conductivity type DBR layer physically connecting the first DBR layer and the third DBR layer, wherein the first electrode may be disposed in contact with an upper surface of the first conductivity type DBR layer.

According to the embodiment, wherein the first electrode may be disposed around the first light emitting structure and the second light emitting structure, and may comprise an opening exposing the first light emitting structure and the second light emitting structure.

A semiconductor device according to the embodiment may comprise a dummy light emitting structure disposed spaced apart from the first light emitting structure and the second light emitting structure, and comprising a first conductivity type DBR layer and a second conductivity type DBR layer, and a pad electrode electrically connected to the first electrode and disposed on the dummy light emitting structure, wherein the first bonding pad may be disposed on the pad electrode.

A semiconductor device package according to an embodiment may comprise a submount and a semiconductor device disposed on the submount, wherein the semiconductor device may comprise a substrate comprising a concavo-convex structure provided on a lower surface; a first light emitting structure disposed on the substrate and comprising a first DBR layer of a first conductivity type, a first active layer disposed on the first DBR layer, a second DBR layer of a second conductivity type disposed on the first active layer, and a first light emitting aperture emitting light generated in the first active layer in a direction perpendicular to a lower surface of the first DBR layer; a second light emitting structure disposed on the substrate, disposed spaced apart from the first light emitting structure, and comprising a third DBR layer of the first conductivity type, a second active layer disposed on the third DBR layer, a fourth DBR layer of the second conductivity type disposed on the second active layer, and a second light emitting aperture emitting light generated in the second active layer in a direction perpendicular to a lower surface of the third DBR layer; a first electrode electrically connected to the first DBR layer and the third DBR layer, and disposed between the first light emitting structure and the second light emitting structure; a second electrode electrically connected to the second DBR layer and the fourth DBR layer, and disposed on an upper surface of the second DBR layer and an upper surface of the fourth DBR layer; a first bonding pad disposed on the second light emitting structure and electrically connected to the first electrode; and a second bonding pad disposed on the first light emitting structure and electrically connected to the second electrode.

A semiconductor device package according to an embodiment may comprise a submount and a semiconductor device disposed on the submount, wherein the semiconductor device may comprise a substrate comprising a concavo-convex structure provided on a lower surface; a first light emitting structure disposed on the substrate and comprising a first DBR layer of a first conductivity type, a first active layer disposed on the first DBR layer, a second DBR layer of a second conductivity type disposed on the first active layer, and a first light emitting aperture emitting light generated in the first active layer in a direction perpendicular to a lower surface of the first DBR layer; a second light emitting structure disposed on the substrate, disposed spaced apart from the first light emitting structure, and comprising a third DBR layer of the first conductivity type, a second active layer disposed on the third DBR layer, a fourth DBR layer of the second conductivity type disposed on the second active layer, and a second light emitting aperture emitting light generated in the second active layer in a direction perpendicular to a lower surface of the third DBR layer; a first electrode electrically connected to the first DBR layer and the third DBR layer, and disposed between the first light emitting structure and the second light emitting structure; a first bonding pad disposed spaced apart from the first light emitting structure and the second light emitting structure, and electrically connected to the first electrode; and a second bonding pad disposed spaced apart from the first bonding pad, electrically connected to the second DBR layer and the fourth DBR layer, and disposed on an upper surface of the second DBR layer and an upper surface of the fourth DBR layer.

An object detecting apparatus according to an embodiment may comprise a semiconductor device package and a light receiving unit receiving reflected light of light emitted from the semiconductor device package, wherein the semiconductor device package may comprise a submount and a semiconductor device disposed on the submount, wherein the semiconductor device may comprise a substrate comprising a concavo-convex structure provided on a lower surface; a first light emitting structure disposed on the substrate and comprising a first DBR layer of a first conductivity type, a first active layer disposed on the first DBR layer, a second DBR layer of a second conductivity type disposed on the first active layer, and a first light emitting aperture emitting light generated in the first active layer in a direction perpendicular to a lower surface of the first DBR layer; a second light emitting structure disposed on the substrate, disposed spaced apart from the first light emitting structure, and comprising a third DBR layer of the first conductivity type, a second active layer disposed on the third DBR layer, a fourth DBR layer of the second conductivity type disposed on the second active layer, and a second light emitting aperture emitting light generated in the second active layer in a direction perpendicular to a lower surface of the third DBR layer; a first electrode electrically connected to the first DBR layer and the third DBR layer, and disposed between the first light emitting structure and the second light emitting structure; a second electrode electrically connected to the second DBR layer and the fourth DBR layer, and disposed on an upper surface of the second DBR layer and an upper surface of the fourth DBR layer; a first bonding pad disposed on the second light emitting structure and electrically connected to the first electrode; and a second bonding pad disposed on the first light emitting structure and electrically connected to the second electrode.

An object detecting apparatus according to an embodiment may comprise a semiconductor device package and a light receiving unit receiving reflected light of light emitted from the semiconductor device package, wherein the semiconductor device package may comprise a submount and a semiconductor device disposed on the submount, wherein the semiconductor device may comprise a substrate comprising a concavo-convex structure provided on a lower surface; a first light emitting structure disposed on the substrate and comprising a first DBR layer of a first conductivity type, a first active layer disposed on the first DBR layer, a second DBR layer of a second conductivity type disposed on the first active layer, and a first light emitting aperture emitting light generated in the first active layer in a direction perpendicular to a lower surface of the first DBR layer; a second light emitting structure disposed on the substrate, disposed spaced apart from the first light emitting structure, and comprising a third DBR layer of the first conductivity type, a second active layer disposed on the third DBR layer, a fourth DBR layer of the second conductivity type disposed on the second active layer, and a second light emitting aperture emitting light generated in the second active layer in a direction perpendicular to a lower surface of the third DBR layer; a first electrode electrically connected to the first DBR layer and the third DBR layer, and disposed between the first light emitting structure and the second light emitting structure; a first bonding pad disposed spaced apart from the first light emitting structure and the second light emitting structure, and electrically connected to the first electrode; and a second bonding pad disposed spaced apart from the first bonding pad, electrically connected to the second DBR layer and the fourth DBR layer, and disposed on an upper surface of the second DBR layer and an upper surface of the fourth DBR layer.

A semiconductor device according to an embodiment may comprise a first light emitting structure comprising a first DBR layer of a first conductivity type, a first active layer disposed on the first DBR layer, and a second DBR layer of a second conductivity type disposed on the first active layer; a second light emitting structure disposed spaced apart from the first light emitting structure and comprising a third DBR layer of the first conductivity type, a second active layer disposed on the third DBR layer, and a fourth DBR layer of the second conductivity type disposed on the second active layer; a first electrode electrically connected to the first DBR layer and the third DBR layer, and disposed between the first light emitting structure and the second light emitting structure; a second electrode electrically connected to the second DBR layer and the fourth DBR layer, and disposed on an upper surface of the second DBR layer and an upper surface of the fourth DBR layer; a first bonding pad disposed on the second light emitting structure and electrically connected to the first electrode; and a second bonding pad disposed on the first light emitting structure and electrically connected to the second electrode.

According to the embodiment, wherein the second electrode may comprise an upper electrode disposed in contact with an upper surface of the second DBR layer and an upper surface of the fourth DBR layer, and a connection electrode disposed on the first electrode in a region between the first light emitting structure and the second light emitting structure.

The semiconductor device according to the embodiment may further comprise a first conductivity type DBR layer physically connecting the first DBR layer and the third DBR layer, and wherein the first electrode may be disposed in contact with an upper surface of the first conductivity type DBR layer.

According to the embodiment, wherein the first bonding pad may be disposed in contact with an upper surface of the first electrode.

The semiconductor device according to the embodiment may further comprise a substrate disposed under the first light emitting structure and the second light emitting structure, and wherein the substrate may be an intrinsic semiconductor substrate.

According to the embodiment, wherein a reflectance of the first DBR layer may be smaller than a reflectance of the second DBR layer, and wherein a reflectance of the third DBR layer may be smaller than a reflectance of the fourth DBR layer.

The semiconductor device according to the embodiment may comprise a first insulating layer surrounding a side surface of the first light emitting structure and a side surface of the second light emitting structure, and exposing the first electrode disposed between the first light emitting structure and the second light emitting structure.

According to the embodiment, wherein the first insulating layer may expose an upper surface of the first electrode disposed around the second light emitting structure.

According to the embodiment, wherein the first insulating layer may be disposed between an upper surface of the first electrode and a lower surface of the second electrode, at around the first light emitting structure.

According to the embodiment, wherein the first insulating layer may be provided as a DBR layer.

The semiconductor device according to the embodiment may further comprise a second insulating layer disposed on a side surface of the first light emitting structure, disposed on a side surface and an upper surface of the second light emitting structure, and exposing an upper surface of the second electrode disposed on an upper surface of the first light emitting structure.

According to the embodiment, wherein the second insulating layer may be disposed between an upper surface of the second electrode disposed on an upper surface of the fourth DBR layer and the second bonding pad.

According to the embodiment, wherein the second insulating layer may be provided as a DBR layer.

A semiconductor device according to an embodiment may comprise a first light emitting structure comprising a first DBR layer of a first conductivity type, a first active layer disposed on the first DBR layer, and a second DBR layer of a second conductivity type disposed on the first active layer; a second light emitting structure disposed spaced apart from the first light emitting structure and comprising a third DBR layer of the first conductivity type, a second active layer disposed on the third DBR layer, and a fourth DBR layer of the second conductivity type disposed on the second active layer; a first insulating layer disposed on a side surface of the first light emitting structure, on a side surface of the second light emitting structure, between the first light emitting structure and the second light emitting structure, and exposing an upper surface of the second DBR layer and an upper surface of the fourth DBR layer; a first electrode electrically connected to the first DBR layer and the third DBR layer, and disposed under the first insulating layer between the first light emitting structure and the second light emitting structure; a second electrode disposed in direct contact with the upper surface of the second DBR layer and the upper surface of the fourth DBR layer, and disposed on the first insulating layer between the first light emitting structure and the second light emitting structure; a second insulating layer disposed on the second electrode, disposed on a periphery of the first light emitting structure and a periphery of the second light emitting structure, exposing an upper surface of the second electrode disposed on an upper surface of the first light emitting structure, and exposing an upper surface of the second electrode disposed on an upper surface of the second light emitting structure; a first bonding pad disposed on the second insulating layer, and electrically connected to the first electrode; and a second bonding pad disposed on the second insulating layer, disposed in direct contact with the second electrode disposed on the upper surface of the first light emitting structure, and disposed in direct contact with the second electrode disposed on the upper surface of the second light emitting structure.

A semiconductor device according to an embodiment may comprise a first light emitting structure comprising a first DBR layer of a first conductivity type, a first active layer disposed on the first DBR layer, and a second DBR layer of a second conductivity type disposed on the first active layer;

a first conductivity type DBR layer disposed and extending from the first DBR layer in a circumferential direction of the first light emitting structure; a first electrode disposed on the first conductivity type DBR layer and electrically connected to the first DBR layer; a first insulating layer disposed on a side surface of the first light emitting structure and on the first electrode, exposing an upper surface of the second DBR layer, and exposing an upper surface of the first electrode disposed on the first conductivity type DBR layer; a second electrode disposed in direct contact with the upper surface of the second DBR layer; a second insulating layer disposed on the second electrode and the first insulating layer, and disposed on a periphery of the first light emitting structure, and exposing an upper surface of the first electrode disposed on the first conductivity type DBR layer; a first bonding pad disposed on the second insulating layer and the first light emitting structure, and disposed in direct contact with an upper surface of the first electrode disposed on the upper surface of the first conductivity type DBR layer; and a second bonding pad disposed on the second insulating layer, and electrically connected to the second electrode.

A semiconductor device package according to an embodiment may comprise a submount and a semiconductor device disposed on the submount, wherein the semiconductor device may comprises a first light emitting structure comprising a first DBR layer of a first conductivity type, a first active layer disposed on the first DBR layer, and a second DBR layer of a second conductivity type disposed on the first active layer; a second light emitting structure disposed spaced apart from the first light emitting structure and comprising a third DBR layer of the first conductivity type, a second active layer disposed on the third DBR layer, and a fourth DBR layer of the second conductivity type disposed on the second active layer; a first electrode electrically connected to the first DBR layer and the third DBR layer, and disposed between the first light emitting structure and the second light emitting structure; a second electrode electrically connected to the second DBR layer and the fourth DBR layer, and disposed on an upper surface of the second DBR layer and an upper surface of the fourth DBR layer; a first bonding pad disposed on the second light emitting structure and electrically connected to the first electrode; and a second bonding pad disposed on the first light emitting structure and electrically connected to the second electrode, wherein the semiconductor device may comprise a first surface on which the first bonding pad and the second bonding pad are disposed and a second surface opposite to the first surface, the first bonding pad and the second bonding pad may be electrically connected to the submount, and light generated in the semiconductor device may be emitted to the outside through the second surface.

A semiconductor device package according to an embodiment may comprise a submount and a semiconductor device disposed on the submount, wherein the semiconductor device may comprise a first light emitting structure comprising a first DBR layer of a first conductivity type, a first active layer disposed on the first DBR layer, and a second DBR layer of a second conductivity type disposed on the first active layer; a second light emitting structure disposed spaced apart from the first light emitting structure and comprising a third DBR layer of the first conductivity type, a second active layer disposed on the third DBR layer, and a fourth DBR layer of the second conductivity type disposed on the second active layer; a first insulating layer disposed on a side surface of the first light emitting structure, on a side surface of the second light emitting structure, between the first light emitting structure and the second light emitting structure, and exposing an upper surface of the second DBR layer and an upper surface of the fourth DBR layer; a first electrode electrically connected to the first DBR layer and the third DBR layer, and disposed under the first insulating layer between the first light emitting structure and the second light emitting structure; a second electrode disposed in direct contact with the upper surface of the second DBR layer and the upper surface of the fourth DBR layer, and disposed on the first insulating layer between the first light emitting structure and the second light emitting structure; a second insulating layer disposed on the second electrode, disposed on a periphery of the first light emitting structure and a periphery of the second light emitting structure, exposing an upper surface of the second electrode disposed on an upper surface of the first light emitting structure, and exposing an upper surface of the second electrode disposed on an upper surface of the second light emitting structure; a first bonding pad disposed on the second insulating layer, and electrically connected to the first electrode; and a second bonding pad disposed on the second insulating layer, disposed in direct contact with the second electrode disposed on the upper surface of the first light emitting structure, and disposed in direct contact with the second electrode disposed on the upper surface of the second light emitting structure, wherein the semiconductor device may comprise a first surface on which the first bonding pad and the second bonding pad are disposed and a second surface opposite to the first surface, the first bonding pad and the second bonding pad may be electrically connected to the submount, and light generated in the semiconductor device may be emitted to the outside through the second surface.

A semiconductor device package according to an embodiment may comprise a submount and a semiconductor device disposed on the submount, wherein the semiconductor device may comprise a first light emitting structure comprising a first DBR layer of a first conductivity type, a first active layer disposed on the first DBR layer, and a second DBR layer of a second conductivity type disposed on the first active layer; a first conductivity type DBR layer disposed and extending from the first DBR layer in a circumferential direction of the first light emitting structure; a first electrode disposed on the first conductivity type DBR layer and electrically connected to the first DBR layer; a first insulating layer disposed on a side surface of the first light emitting structure and on the first electrode, exposing an upper surface of the second DBR layer, and exposing an upper surface of the first electrode disposed on the first conductivity type DBR layer; a second electrode disposed in direct contact with the upper surface of the second DBR layer; a second insulating layer disposed on the second electrode and the first insulating layer, and disposed on a periphery of the first light emitting structure, and exposing an upper surface of the first electrode disposed on the first conductivity type DBR layer; a first bonding pad disposed on the second insulating layer and the first light emitting structure, and disposed in direct contact with an upper surface of the first electrode disposed on the upper surface of the first conductivity type DBR layer; and a second bonding pad disposed on the second insulating layer, and electrically connected to the second electrode, wherein the semiconductor device may comprise a first surface on which the first bonding pad and the second bonding pad are disposed and a second surface opposite to the first surface, the first bonding pad and the second bonding pad may be electrically connected to the submount, and light generated in the semiconductor device may be emitted to the outside through the second surface.

An object detecting apparatus according to an embodiment may comprise a semiconductor device package and a light receiving unit receiving reflected light of light emitted from the semiconductor device package, wherein the semiconductor device package may comprise a submount and a semiconductor device disposed on the submount, wherein the semiconductor device may comprise a first light emitting structure comprising a first DBR layer of a first conductivity type, a first active layer disposed on the first DBR layer, and a second DBR layer of a second conductivity type disposed on the first active layer; a second light emitting structure disposed spaced apart from the first light emitting structure and comprising a third DBR layer of the first conductivity type, a second active layer disposed on the third DBR layer, and a fourth DBR layer of the second conductivity type disposed on the second active layer; a first electrode electrically connected to the first DBR layer and the third DBR layer, and disposed between the first light emitting structure and the second light emitting structure; a second electrode electrically connected to the second DBR layer and the fourth DBR layer, and disposed on an upper surface of the second DBR layer and an upper surface of the fourth DBR layer; a first bonding pad disposed on the second light emitting structure and electrically connected to the first electrode; and a second bonding pad disposed on the first light emitting structure and electrically connected to the second electrode, wherein the semiconductor device may comprise a first surface on which the first bonding pad and the second bonding pad are disposed and a second surface opposite to the first surface, the first bonding pad and the second bonding pad may be electrically connected to the submount, and light generated in the semiconductor device may be emitted to the outside through the second surface.

An object detecting apparatus according to an embodiment may comprise a semiconductor device package and a light receiving unit receiving reflected light of light emitted from the semiconductor device package, wherein the semiconductor device package may comprise a submount and a semiconductor device disposed on the submount, wherein the semiconductor device may comprise a first light emitting structure comprising a first DBR layer of a first conductivity type, a first active layer disposed on the first DBR layer, and a second DBR layer of a second conductivity type disposed on the first active layer; a second light emitting structure disposed spaced apart from the first light emitting structure and comprising a third DBR layer of the first conductivity type, a second active layer disposed on the third DBR layer, and a fourth DBR layer of the second conductivity type disposed on the second active layer; a first insulating layer disposed on a side surface of the first light emitting structure, on a side surface of the second light emitting structure, between the first light emitting structure and the second light emitting structure, and exposing an upper surface of the second DBR layer and an upper surface of the fourth DBR layer; a first electrode electrically connected to the first DBR layer and the third DBR layer, and disposed under the first insulating layer between the first light emitting structure and the second light emitting structure; a second electrode disposed in direct contact with the upper surface of the second DBR layer and the upper surface of the fourth DBR layer, and disposed on the first insulating layer between the first light emitting structure and the second light emitting structure; a second insulating layer disposed on the second electrode, disposed on a periphery of the first light emitting structure and a periphery of the second light emitting structure, exposing an upper surface of the second electrode disposed on an upper surface of the first light emitting structure, and exposing an upper surface of the second electrode disposed on an upper surface of the second light emitting structure; a first bonding pad disposed on the second insulating layer, and electrically connected to the first electrode; and a second bonding pad disposed on the second insulating layer, disposed in direct contact with the second electrode disposed on the upper surface of the first light emitting structure, and disposed in direct contact with the second electrode disposed on the upper surface of the second light emitting structure, wherein the semiconductor device may comprise a first surface on which the first bonding pad and the second bonding pad are disposed and a second surface opposite to the first surface, the first bonding pad and the second bonding pad may be electrically connected to the submount, and light generated in the semiconductor device may be emitted to the outside through the second surface.

An object detecting apparatus according to an embodiment may comprise a semiconductor device package and a light receiving unit receiving reflected light of light emitted from the semiconductor device package, wherein the semiconductor device package may comprise a submount and a semiconductor device disposed on the submount, wherein the semiconductor device may comprise a first light emitting structure comprising a first DBR layer of a first conductivity type, a first active layer disposed on the first DBR layer, and a second DBR layer of a second conductivity type disposed on the first active layer; a first conductivity type DBR layer disposed and extending from the first DBR layer in a circumferential direction of the first light emitting structure; a first electrode disposed on the first conductivity type DBR layer and electrically connected to the first DBR layer; a first insulating layer disposed on a side surface of the first light emitting structure and on the first electrode, exposing an upper surface of the second DBR layer, and exposing an upper surface of the first electrode disposed on the first conductivity type DBR layer; a second electrode disposed in direct contact with the upper surface of the second DBR layer; a second insulating layer disposed on the second electrode and the first insulating layer, and disposed on a periphery of the first light emitting structure, and exposing an upper surface of the first electrode disposed on the first conductivity type DBR layer; a first bonding pad disposed on the second insulating layer and the first light emitting structure, and disposed in direct contact with an upper surface of the first electrode disposed on the upper surface of the first conductivity type DBR layer; and a second bonding pad disposed on the second insulating layer, and electrically connected to the second electrode, wherein the semiconductor device may comprise a first surface on which the first bonding pad and the second bonding pad are disposed and a second surface opposite to the first surface, the first bonding pad and the second bonding pad may be electrically connected to the submount, and light generated in the semiconductor device may be emitted to the outside through the second surface.

A method of manufacturing a semiconductor device according to an embodiment may comprise forming a first conductivity type DBR layer, an active layer, and a second conductivity type DBR layer on a substrate; performing a mesa etching on the second conductivity type DBR layer and the active layer, and forming a plurality of light emitting structures spaced apart from each other; forming a first electrode on the first conductivity type DBR layer to expose the plurality of light emitting structures; forming a first insulating layer disposed on the first electrode and exposing an upper surface of the plurality of light emitting structures;

forming an upper electrode disposed on the upper surface of the plurality of light emitting structures exposed by the first insulating layer, and a second electrode disposed on the first insulating layer and comprising a connection electrode connecting the upper electrode; and forming a second insulating layer comprising a first opening exposing the first electrode disposed under a region between the plurality of light emitting structures, and a second opening exposing the upper electrode of the second electrode; forming a first bonding pad disposed on the first opening and electrically connected to the first electrode, and a second bonding pad disposed on the second opening and electrically connected to the second electrode.

Advantageous Effects

According to the semiconductor device, the method of manufacturing the semiconductor device, the semiconductor device package, and the object detecting apparatus, there is an advantage that an excellent heat dissipation characteristic can be provided.

According to the semiconductor device, the method of manufacturing the semiconductor device, the semiconductor device package, and the object detecting apparatus, there is an advantage that the light extraction efficiency can be enhanced and light of high output can be provided.

According to the semiconductor device, the method of manufacturing the semiconductor device, the semiconductor device package, and the object detecting apparatus, there is an advantage that the power conversion efficiency can be improved.

According to the semiconductor device, the method of manufacturing the semiconductor device, the semiconductor device package, and the object detecting apparatus, there is an advantage that the manufacturing cost can be reduced and the reliability can be improved.

BRIEF DESCRIPTION OF THE DRAWINGS

FIG. 1 is a view showing a semiconductor device according to an embodiment of the present invention.

FIG. 2 is a sectional view taken along line A-A of the semiconductor device according to the embodiment shown in FIG. 1.

FIGS. 3a and 3b are views showing an example in which a plurality of light emitting structures and a dummy light emitting structure are formed in a method of manufacturing a semiconductor device according to an embodiment of the present invention.

FIGS. 4a and 4b are views showing an example in which a first electrode is formed in the method of manufacturing the semiconductor device according to the embodiment of the present invention.

FIGS. 5a and 5b are views showing an example in which an insulating layer is formed in the method of manufacturing the semiconductor device according to the embodiment of the present invention.

FIGS. 6a and 6b are views showing an example in which a first bonding pad and a second bonding pad are formed in the method of manufacturing the semiconductor device according to the embodiment of the present invention.

FIG. 7 is a view showing another example of a semiconductor device according to an embodiment of the present invention.

FIG. 8 is a view showing still another example of a semiconductor device according to an embodiment of the present invention.

FIG. 9 is a view showing still another example of a semiconductor device according to an embodiment of the present invention.

FIG. 10 is a view showing still another example of a semiconductor device according to an embodiment of the present invention.

FIG. 11 is a sectional view taken along line A-A of the semiconductor device according to the embodiment shown in FIG. 10.

FIG. 12 is a sectional view taken along line B-B of the semiconductor device according to the embodiment shown in FIG. 10.

FIG. 13 is a sectional view taken along line C-C of the semiconductor device according to the embodiment shown in FIG. 10.

FIGS. 14a to 14d are views showing an example in which a light emitting structure is formed in a method of manufacturing a semiconductor device according to an embodiment of the present invention.

FIGS. 15a to 15d are views showing an example in which a first electrode is formed in the method of manufacturing the semiconductor device according to the embodiment of the present invention.

FIGS. 16a to 16d are views showing an example in which a first insulating layer is formed in the method of manufacturing the semiconductor device according to the embodiment of the present invention.

FIGS. 17a to 17d are views showing an example in which a second electrode is formed in the method of manufacturing the semiconductor device according to the embodiment of the present invention.

FIGS. 18a to 18d are views showing an example in which a second insulating layer is formed in the method of manufacturing the semiconductor device according to the embodiment of the present invention.

FIGS. 19a to 19d are views showing an example in which a first bonding pad and a second bonding pad are formed in the method of manufacturing the semiconductor device according to the embodiment of the present invention.

FIGS. 20 and 21 are views showing still another example of a semiconductor device according to an embodiment of the present invention.

FIGS. 22 and 23 are views showing still another example of a semiconductor device according to an embodiment of the present invention.

FIG. 24 is a view showing still another example of a semiconductor device according to an embodiment of the present invention.

FIG. 25 is a sectional view taken along line D-D of the semiconductor device according to the embodiment shown in FIG. 24.

FIGS. 26a and 26b are views showing an example in which a plurality of light emitting structures and a dummy light emitting structure are formed in a method of manufacturing a semiconductor device according to an embodiment of the present invention.

FIGS. 27a and 27b are views showing an example in which a first electrode is formed in the method of manufacturing the semiconductor device according to the embodiment of the present invention.

FIGS. 28a and 28b are views showing an example in which an insulating layer is formed in the method of manufacturing the semiconductor device according to the embodiment of the present invention.

FIGS. 29a and 29b are views showing an example in which a first bonding pad and a second bonding pad are formed in the method of manufacturing the semiconductor device according to the embodiment of the present invention.

FIG. 30 is a view showing still another example of a semiconductor device according to an embodiment of the present invention.

FIG. 31 is a view showing still another example of a semiconductor device according to an embodiment of the present invention.

FIG. 32 is a view showing a semiconductor device according to an embodiment of the present invention.

FIG. 33 is a sectional view taken along line A-A of the semiconductor device according to the embodiment shown in FIG. 32.

FIG. 34 is a sectional view taken along line B-B of the semiconductor device according to the embodiment shown in FIG. 32.

FIG. 35 is a sectional view taken along line C-C of the semiconductor device according to the embodiment shown in FIG. 32

FIGS. 36a to 36d are views showing an example in which a light emitting structure is formed in a method of manufacturing a semiconductor device according to an embodiment of the present invention.

FIGS. 37a to 37d are views showing an example in which a first electrode is formed in the method of manufacturing the semiconductor device according to the embodiment of the present invention.

FIGS. 38a to 38d are views showing an example in which a first insulating layer is formed in the method of manufacturing the semiconductor device according to the embodiment of the present invention.

FIGS. 39a to 39d are views showing an example in which a second electrode is formed in the method of manufacturing the semiconductor device according to the embodiment of the present invention.

FIGS. 40a to 40d are views showing an example in which a second insulating layer is formed in the method of manufacturing the semiconductor device according to the embodiment of the present invention.

FIGS. 41a to 41d are views showing an example in which a first bonding pad and a second bonding pad are formed in the method of manufacturing the semiconductor device according to the embodiment of the present invention.

FIG. 42 is a view showing a semiconductor device package according to an embodiment of the present invention.

FIG. 43 is a view showing another example of a semiconductor device package according to an embodiment of the present invention.

FIG. 44 is a perspective view of a mobile terminal to which an autofocus device comprising a semiconductor device package according to an embodiment of the present invention is applied.

DETAILED DESCRIPTION

Hereinafter, embodiments will be described with reference to the accompanying drawings. In the description of the embodiments, in the case that each layer (film), region, pattern or structure may be referred to as provided "on/over" or "under" a substrate, each layer (film), region, pad, or pattern, the terms "on/over" and "under" include both "directly" and "indirectly interposed with another layer". In addition, "on/over" or "under" of each layer will be described based on the drawings, but the embodiments are not limited thereto.

Hereinafter, a semiconductor device, a method of manufacturing a semiconductor device, a semiconductor device package, and an object detecting apparatus comprising a semiconductor device package according to an embodiment of the present invention will be described in detail with reference to the accompanying drawings.

The semiconductor device according to an embodiment of the present invention may be any one of a light emitting device comprising a light emitting diode device and a laser diode device. For example, a semiconductor device according to an embodiment may be a vertical cavity surface emitting laser (VCSEL) semiconductor device. A vertical cavity surface emitting laser (VCSEL) semiconductor devices can emit beams in a direction perpendicular to an upper surface. A vertical cavity surface emitting laser (VCSEL) semiconductor devices can emit beams in a direction perpendicular to the upper surface, for example, at a beam angle of 5 degrees to 30 degrees. A vertical cavity surface emitting laser (VCSEL) semiconductor devices can more particularly emit beams in a direction perpendicular to the upper surface at a beam angle of 15 degrees to 25 degrees. A vertical cavity surface emitting laser (VCSEL) semiconductor devices may comprise a single light emitting aperture or multiple light emitting apertures that emit a circular beam. The light emitting aperture may be provided as a diameter in a range of several micrometers to several tens of micrometers, for example. For example, the light emitting aperture may be defined as a region in which light is emitted in a direction perpendicular to the upper surface of the semiconductor device.

Hereinafter, a semiconductor device according to an embodiment of the present invention will be described with reference to FIGS. 1 and 2. FIG. 1 is a view showing the semiconductor device according to the embodiment of the present invention, and FIG. 2 is a sectional view taken along line A-A of the semiconductor device according to the embodiment shown in FIG. 1.

Meanwhile, in order to facilitate understanding, in FIG. 1, the first bonding pad 155 and the second bonding pad 165 disposed on an upper portion are treated as transparent so that the arrangement relationship of the components positioned in a lower portion can be easily grasped.

As shown in FIGS. 1 and 2, the semiconductor device 200 according to the embodiment of the present invention may comprise a plurality of light emitting structures P1, P2, P3, P4, . . . , a first electrode 150, the first bonding pad 155, and the second bonding pad 165.

The semiconductor device 200 according to the embodiment may be a vertical cavity surface emitting laser (VCSEL), and may emit light generated in the plurality of light emitting structures P1, P2, P3, P4, . . . , for example, at a beam angle of 5 degrees to 30 degrees. Each of the plurality of light emitting structures P1, P2, P3, P4, . . . may comprise a first conductivity type DBR (Distributed Bragg Reflector) layer, an active layer, and a second conductivity type DBR layer. Each of the plurality of light emitting structures P1, P2, P3, P4, . . . may be formed in a similar structure, and the semiconductor device 200 according to the embodiment will be described using a cross section taken along line A-A shown in FIG. 1.

The semiconductor device 200 according to the embodiment may comprise the plurality of light emitting structures P1, P2, P3, P4, . . . , as shown in FIGS. 1 and 2. The second bonding pad 165 may be disposed on the region where the plurality of light emitting structures P1, P2, P3, P4, . . . are disposed.

The first electrode 150 may be disposed between the plurality of light emitting structures P1, P2, P3, P4, . . . . The first electrode 150 may comprise a plurality of first openings exposing the plurality of light emitting structures P1, P2, P3, P4, . . . .

The plurality of first openings provided in the first electrode 150 may expose upper surfaces of the plurality of light emitting structures P1, P2, P3, P4, . . . . The plurality of first openings provided in the first electrode 150 may expose upper surfaces of the second conductivity type DBR layers of the plurality of light emitting structures P1, P2, P3, P4, . . . . The first electrode 150 may be electrically connected to the first conductivity type DBR layer of the plurality of light emitting structures P1, P2, P3, P4, . . . . The plurality of first openings exposing the plurality of light emitting structures P1, P2, P3, P4, . . . will be described later while explaining a method of manufacturing a semiconductor device according to an embodiment.

The first bonding pad 155 may be spaced apart from the plurality of light emitting structures P1, P2, P3, P4, . . . . The first bonding pad 155 may be electrically connected to the first electrode 150. The first bonding pad 155 may be disposed along a side of the second bonding pad 165. The first bonding pad 155 may be disposed along an outer side of the region where the plurality of light emitting structures P1, P2, P3, P4, . . . are provided. For example, the first bonding pad 155 may be disposed on both sides of the second bonding pad 165, as shown in FIG. 1.

The second bonding pad 165 may be spaced apart from the first bonding pad 155. The second bonding pad 165 may be electrically connected to the second conductivity type DBR layer of the plurality of light emitting structures P1, P2, P3, P4, . . . . For example, the second bonding pad 165 may be disposed on an upper surface of the second conductivity type DBR layer of the plurality of light emitting structures P1, P2, P3, P4, . . . .

In addition, the semiconductor device 200 according to the embodiment may comprise a plurality of dummy light emitting structures D1, D2, D3, and D4, as shown in FIG. 1. The plurality of dummy light emitting structures D1, D2, D3, and D4 may comprise a first conductivity type DBR layer, an active layer, and a second conductivity type DBR layer. In addition, the first bonding pad 155 may be disposed on an upper portion of the first dummy light emitting structure D1 and an upper portion of the second dummy light emitting structure D2 among the plurality of dummy light emitting structures D1, D2, D3, and D4.

Then, referring to FIGS. 1 and 2, the semiconductor device 200 according to the embodiment will be further described based on the light emitting structure of P1 and the light emitting structure of P2 disposed under the second bonding pad 165.

The semiconductor device 200 according to the embodiment may comprise the plurality of light emitting structures P1, P2, . . . disposed under the second bonding pad 165. The plurality of light emitting structures P1, P2, . . . may comprise light emitting apertures 130a, 130b, . . . , respectively, which emit light. The plurality of light emitting structures P1, P2, . . . may be spaced apart from each other. For example, the light emitting apertures 130a, 130b, may be provided with a diameter in a range of several micrometers to several tens of micrometers.

The light emitting structure of P1 may comprise a first DBR layer 110a of a first conductivity type, a second DBR layer 120a of a second conductivity type, and a first active layer 115a. The first active layer 115a may be disposed between the first DBR layer 110a and the second DBR layer 120a. For example, the first active layer 115a may be disposed on the first DBR layer 110a, and the second DBR layer 120a may be disposed on the first active layer 115a. The light emitting structure of P1 may further comprise a first aperture layer 117a disposed between the first active layer 115a and the second DBR layer 120a.

The light emitting structure of P2 may comprise a third DBR layer 110b of the first conductivity type, a fourth DBR layer 120b of the second conductivity type, and a second active layer 115b. The second active layer 115b may be disposed between the third DBR layer 110b and the fourth DBR layer 120b. For example, the second active layer 115b may be disposed on the third DBR layer 110b, and the fourth DBR layer 120b may be disposed on the second active layer 115b. The light emitting structure of P2 may further comprise a second aperture layer 117b disposed between the second active layer 115b and the fourth DBR layer 120b.

In addition, a first conductivity type DBR layer 113 may be disposed between the first DBR layer 110a of the light emitting structure of P1 and the third DBR layer 110b of the light emitting structure of P2. The first DBR layer 110a and the third DBR layer 110b may be physically connected by the first conductivity type DBR layer 113. For example, an upper surface of the first conductivity type DBR layer 113 and an upper surface of the first DBR layer 110a may be disposed on the same horizontal plane. The upper surface of the first conductivity type DBR layer 113 and an upper surface of the third DBR layer 110b may be disposed on the same horizontal plane.

In addition, the first active layer 115a of the light emitting structure of P1 and the second active layer 115b of the light emitting structure of P2 may be spaced apart from each other. In addition, the second DBR layer 120a of the light emitting structure of P1 and the fourth DBR layer 120b of the light emitting structure of P2 may be spaced apart from each other.

The semiconductor device 200 according to the embodiment may comprise an insulating layer 140, as shown in FIGS. 1 and 2. The insulating layer 140 may be disposed on a side surface of the light emitting structure of P1. The insulating layer 140 may be disposed to surround the side of the light emitting structure of P1. The insulating layer 140 may be disposed on a side surface of the light emitting structure of P2. The insulating layer 140 may be disposed to surround the side surface of the light emitting structure of P2.

In addition, the insulating layer 140 may be disposed between the light emitting structure of P1 and the light emitting structure of P2. The insulating layer 140 may be disposed on the first conductivity type DBR layer 113.

The insulating layer 140 may expose an upper surface of the light emitting structure of P1. The insulating layer 140 may expose an upper surface of the second DBR layer 120a of the light emitting structure of P1. The insulating layer 140 may expose an upper surface of the light emitting structure of P2. The insulating layer 140 may expose an upper surface of the fourth DBR layer 120b of the light emitting structure of P2. The insulating layer 140 may comprise a second opening exposing the upper surface of the light emitting structure of P1 and the upper surface of the light emitting structure of P2. The second opening exposing the upper surface of the light emitting structure of P1 and the upper surface of the light emitting structure of P2 will be described in further detail below while explaining a method of manufacturing a semiconductor device according to an embodiment.

The semiconductor device 200 according to the embodiment may comprise a first electrode 150, as shown in FIGS. 1 and 2. The first electrode 150 may be disposed between the plurality of light emitting structures P1, P2, P3, P4, . . . . The first electrode 150 may comprise a plurality of first openings exposing the plurality of light emitting structures P1, P2, P3, P4, . . . .

The first electrode 150 may be disposed on the first conductivity type DBR layer 113. The first electrode 150 may be electrically connected to the first DBR layer 110a. The first electrode 150 may be electrically connected to the third DBR layer 110b. The first electrode 150 may be disposed under the insulating layer 140. The first electrode 150 may be disposed under the insulating layer 140 in a region between the light emitting structure of P1 and the light emitting structure of P2. The first electrode 150 may be disposed between the insulating layer 140 and the first conductivity type DBR layer 113 in a region between the light emitting structure of P1 and the light emitting structure of P2.

For example, a lower surface of the first electrode 150 may be disposed in direct contact with an upper surface of the first conductivity type DBR layer 113. An upper surface of the first electrode 150 may be disposed in direct contact with a lower surface of the insulating layer 140. The first electrode 150 may be electrically connected in common to the first DBR layer 110a and the third DBR layer 110b.

The semiconductor device 200 according to the embodiment may comprise the first bonding pad 155 and the second bonding pad 165, as shown in FIGS. 1 and 2.

According to the embodiment, the first bonding pad 155 may be electrically connected to the first conductivity type DBR layer of the plurality of light emitting structures P1, P2, P3, P4, . . . . According to the embodiment, the first bonding pad 155 may be electrically connected in common to the first conductivity type DBR layers of the plurality of light emitting structures P1, P2, P3, P4, . . . .

The second bonding pad 165 may be electrically connected to the second conductivity type DBR layer of the plurality of light emitting structures P1, P2, P3, P4, . . . . The second bonding pad 165 may be electrically connected in common to the second conductivity type DBR layers of the plurality of light emitting structures P1, P2, P3, P4, . . . .

The semiconductor device 200 according to the embodiment may comprise a plurality of dummy light emitting structures D1, D2, D3, and D4, as shown in FIGS. 1 and 2. The plurality of dummy light emitting structures D1, D2, D3 and D4 may be spaced apart from the plurality of light emitting structures P1, P2, P3, P4, . . . .

The plurality of dummy light emitting structures D1, D2, D3, and D4 may be spaced apart from the second bonding pad 165. For example, the first bonding pad 155 may be disposed in an upper portion of the first dummy light emitting structure D1. In addition, the first bonding pad 155 may be disposed in an upper portion of the second dummy light emitting structure D2. The plurality of dummy light emitting structures D1, D2, D3, and D4 may be provided in a similar structure.

The first dummy light emitting structure D1 may comprise a first conductivity type DBR layer 113 and a second conductivity type DBR layer 119. In addition, the first dummy light emitting structure D1 may comprise an active layer 116 and an aperture layer 118.

The semiconductor device 200 according to the embodiment may comprise a pad electrode 153, as shown in FIGS. 1 and 2. The pad electrode 153 may be electrically connected to the first electrode 150. The pad electrode 153 may extend from the first electrode 150 disposed between the first light emitting structure P1 and the second light emitting structure P2. The connection relationship between the pad electrode 153 and the first electrode 150 will be further described below while explaining a method of manufacturing a semiconductor device according to an embodiment.

The pad electrode 153 may be electrically connected to the first conductivity type DBR layer 113. The pad electrode 153 may be electrically connected to the active layer 116. The pad electrode 153 may be electrically connected to the second conductivity type DBR layer 119. The pad electrode 153 may be electrically connected in common to the first conductivity type DBR layer 113 and the second conductivity type DBR layer 119. Accordingly, the first dummy light emitting structure D1 may not generate light.

The pad electrode 153 may be disposed on the first dummy light emitting structure D1 and the second dummy light emitting structure D2. The pad electrode 153 may be disposed on an upper surface of the first dummy light emitting structure D1. The pad electrode 153 may be disposed on an upper surface of the second dummy light emitting structure D2. The pad electrode 153 may be disposed on the second conductivity type DBR layer 119 provided in the first dummy light emitting structure D1 and the second dummy light emitting structure D2.

According to the embodiment, the first bonding pad 155 may be disposed on the pad electrode 153. The insulating layer 140 may be disposed on a side surface of the pad electrode 153. The first bonding pad 155 may be disposed on an upper surface of the pad electrode 153 exposed by the insulating layer 140.

Meanwhile, the semiconductor device 200 according to the embodiment may further comprise a substrate 105, as shown in FIGS. 1 and 2. The plurality of light emitting structures P1, P2, P3, P4, . . . and the plurality of dummy light emitting structures D1, D2, D3, and D4 may be disposed on the substrate 105. For example, the substrate 105 may be a growth substrate on which the plurality of light emitting structures P1, P2, P3, P4, . . . and the plurality of dummy light emitting structures D1, D2, D3, and D4 can be grown. For example, the substrate 105 may be an intrinsic semiconductor substrate.

According to the semiconductor device 200 of the embodiment, power may be supplied to the plurality of light emitting structures P1, P2, P3, P4, . . . through the first bonding pad 155 and the second bonding pad 165. The first bonding pad 155 may be electrically connected to the first electrode 150 through the pad electrode 153. The first electrode 150 may be electrically connected to the first conductivity type DBR layer of the plurality of light emitting structures P1, P2, P3, P4, . . . . The second bonding pad 165 may be disposed on an upper surface of the second conductivity type DBR layer of the plurality of light emitting structures P1, P2, P3, P4, . . . . For example, a lower surface of the second bonding pad 165 may be disposed in direct contact with the upper surface of the second conductivity type DBR layer of the plurality of light emitting structures P1, P2, P3, P4, . . . .

Therefore, according to the embodiment, when power is supplied to the plurality of light emitting structures P1, P2, P3, P4, . . . , power does not need to be applied through a lower surface of the substrate 105. In a conventional semiconductor device, when power is to be applied through the lower surface of the substrate, the substrate 105 must be provided as a conductive substrate. However, according to the semiconductor device 200 of the embodiment, the substrate 105 may be a conductive substrate or an insulating substrate. For example, the substrate 105 according to the embodiment may be provided as an intrinsic semiconductor substrate.

In addition, the substrate 105 may be a support substrate attached to the plurality of light emitting structures P1, P2, P3, P4, . . . , in which the support substrate may be attached after the plurality of light emitting structures P1, P2, P3, P4, . . . are grown on a growth substrate and the growth substrate is removed. For example, the support substrate may be a transparent substrate through which light generated in the plurality of light emitting structures P1, P2, P3, P4, . . . can be transmitted.

Meanwhile, the semiconductor device 200 according to the embodiment may be implemented such that light is emitted in a lower direction of the semiconductor device 200, as shown in FIGS. 1 and 2. That is, according to the semiconductor device 200 of the embodiment, light can be emitted in a direction in which the first conductivity type DBR layer is disposed from the active layer constituting the plurality of light emitting structures P1, P2, P3, P4, . . . . Light may be emitted from the active layer constituting the plurality of light emitting structures P1, P2, P3, P4, . . . in the direction in which the substrate 105 is disposed.

According to the embodiment, the second bonding pad 165 is disposed in contact with the upper surface of the second conductivity type DBR layer of the plurality of light emitting structures P1, P2, P3, P4, . . . . The first electrode 150 is disposed to be connected to the first conductivity type DBR layer of the plurality of light emitting structures P1, P2, P3, P4, . . . , and the first bonding pad 155 is disposed on and in contact with the pad electrode 153 extended from the first electrode 150. Accordingly, the heat generated in the plurality of light emitting structures P1, P2, P3, P4, . . . can be effectively dissipated to the outside through the first bonding pad 155 and the second bonding pad 165.

Meanwhile, in the case of a general semiconductor device, it is known that the power conversion efficiency (PCE) is significantly lowered due to the heat generated in the light emitting structure. When power is supplied to the light emitting structure through the substrate disposed at the lower portion, generally heat dissipation is performed through the substrate. However, since the thermal conductivity of the substrate is low, it is difficult to dissipate the heat generated in the light emitting structure to the outside. For example, it is known that the thermal conductivity of a GaAs substrate is as low as 52 W/(m*K).

However, according to the embodiment, since the first bonding pad 155 and the second bonding pad 165 may be connected to the external heat dissipating substrate or the like, so that the heat generated in the plurality of light emitting structures P1, P2, P3, P4, . . . can be effectively dissipated to the outside. Therefore, according to the embodiment, since the heat generated in the semiconductor device 200 can be effectively dissipated to the outside, the power conversion efficiency (PCE) can be improved.

Meanwhile, according to the semiconductor device 200 of the embodiment, as described above, light can be emitted in a downward direction of the semiconductor device 200. According to the semiconductor device 200 of the embodiment, the reflectance of the first conductivity type DBR layer provided in a lower portion of the plurality of light emitting structures P1, P2, P3, P4, . . . can be selected to be smaller than the reflectance of the second conductivity type DBR layer provided in an upper portion of the plurality of light emitting structures P1, P2, P3, P4, . . . . Accordingly, light generated in the plurality of light emitting structures P1, P2, P3, P4, . . . can be emitted toward the substrate 105 of the semiconductor device 200.

In addition, according to the semiconductor device 200 of the embodiment, the insulating layer 140 may be provided as a DBR layer. Accordingly, the light generated in the plurality of light emitting structures P1, P2, P3, P4, . . . can be reflected by the insulating layer 140 disposed at the upper portion and can be effectively extracted downward.

For example, the insulating layer 140 may be provided as a DBR layer formed by stacking $SiO_2$ and $TiO_2$ as a plurality of layers. In addition, the insulating layer 140 may be provided as a DBR layer formed by stacking $Ta_2O_3$ and $SiO_2$ as a plurality of layers. In addition, the insulating layer 140 may be provided as a DBR layer formed by stacking $SiO_2$ and $Si_3N_4$ as a plurality of layers.

Meanwhile, in the conventional semiconductor device, when the power is supplied to the light emitting structure through the substrate, the substrate must be conductive. Accordingly, when a conductive semiconductor substrate is applied, a dopant is added to the substrate to improve the conductivity. However, the dopant added to the substrate causes absorption and scattering of the emitted light, which may cause a decrease in power conversion efficiency (PCE).

However, according to the semiconductor device 200 of the embodiment, as described above, the substrate 105 may not be a conductive substrate, so that an additional dopant may not be added to the substrate 105. Accordingly, the dopant is not added to the substrate 105 according to the embodiment, so that absorption and scattering by the dopant in the substrate 105 can be reduced. Therefore, according to the embodiment, light generated in the plurality of light emitting structures P1, P2, P3, P4, . . . can be effectively provided in a downward direction, and power conversion efficiency (PCE) can be improved.

In addition, the semiconductor device 200 according to the embodiment may further comprise an anti-reflection layer provided on the lower surface of the substrate 105. The anti-reflection layer prevents light emitted from the semiconductor device 200 from being reflected on the surface of the substrate 105 and transmits the light, thereby improving light loss due to reflection.

In addition, according to the semiconductor device 200 of the embodiment, current spreading between the plurality of light emitting structures P1, P2, P3, P4, . . . can be efficiently performed by the first electrode 150 connected to the first bonding pad 155 and the second bonding pad 165. Therefore, according to the semiconductor device 200 of the embodiment, current can be efficiently diffused in the plurality of light emitting structures P1, P2, P3, P4, . . . without current crowding, and the light extraction efficiency can be improved.

Meanwhile, the semiconductor device 200 according to the embodiment described with reference to FIGS. 1 and 2 has been described based on a case where the first bonding pad 155 is provided on the first dummy light emitting structure D1 and the second dummy light emitting structure D2.

However, according to a semiconductor device of another embodiment, the first bonding pad 155 may be provided only on one dummy light emitting structure. In addition, the first bonding pad 155 may be provided on three dummy light emitting structures or may be provided on all four dummy light emitting structures.

The area where the first bonding pad 155 is provided can be flexibly selected in consideration of the size of the semiconductor device, the degree of current spreading requested, and the like. For example, the first bonding pad 155 may be disposed on four sides of the semiconductor device, in the case of a semiconductor device having a large size or a large current spreading requirement.

Hereinafter, a method of manufacturing a semiconductor device according to an embodiment of the present invention will be described with reference to the drawings. In explaining the method of manufacturing the semiconductor device according to the embodiment, description overlapping with those described with reference to FIGS. 1 and 2 may be omitted.

First, FIGS. 3a and 3b are views showing an example in which a plurality of light emitting structures and dummy light emitting structures are formed in the method of manufacturing the semiconductor device according to the embodiment of the present invention. FIG. 3a is a plan view showing a step of forming a plurality of light emitting structures and dummy light emitting structures according to the method of manufacturing the semiconductor device according to the embodiment, and FIG. 3b is a sectional view taken along line A-A of the semiconductor device according to the embodiment shown in FIG. 3a.

According to the method of manufacturing the semiconductor device of the embodiment, as shown in FIGS. 3a and 3b, a plurality of light emitting structures P1, P2, P3, P4, . . . bay be formed on a substrate 105. Also, a plurality of dummy light emitting structures D1, D2, D3, and D4 may be formed on the substrate 105. For example, the plurality of dummy light emitting structures D1, D2, D3, and D4 may be formed around the plurality of light emitting structures P1, P2, P3, P4, . . . .

The substrate 105 may be any one selected from an intrinsic semiconductor substrate, a conductive substrate, and an insulating substrate. For example, the substrate 105 may be a GaAs intrinsic semiconductor substrate. Also, the substrate 105 may be provided with at least one selected from a conductive material including copper (Cu), gold (Au), nickel (Ni), molybdenum (Mo), copper-tungsten (Cu—W), and a carrier wafer such as Si, Ge, AlN, GaAs, ZnO, SiC, and the like.

For example, a first conductivity type DBR layer, an active layer, and a second conductivity type DBR layer may be sequentially formed on the substrate 105. The plurality of light emitting structures P1, P2, P3, P4, . . . may be formed through mesa etching for the second conductivity type DBR layer and the active layer. Further, the plurality of dummy light emitting structures D1, D2, D3, and D4 may be formed through the mesa etching for the second conductivity type DBR layer and the active layer. The plurality of dummy light emitting structures D1, D2, D3 and D4 may be formed on a side of the region where the plurality of light emitting structures P1, P2, P3, P4, . . . are formed.

The plurality of light emitting structures P1, P2, . . . may comprise a first conductivity type DBR layer 110a, 110b, . . . , an active layer 115a, 115b, . . . , an aperture layer 117a, 117b, . . . , and a second conductivity type DBR layer 120a, 120b, . . . . A first conductivity type DBR layer 113 may be provided around the plurality of light emitting structures P1, P2, P3, P4, . . . . The first conductivity type DBR layer 113 may be disposed in a region between the plurality of light emitting structures P1, P2, P3, P4, . . . .

In addition, the plurality of dummy light emitting structures D1, D2, D3, and D4 may comprise a first conductivity type DBR layer 113, an active layer 116, an aperture layer 118, and a second conductivity type DBR layer 119. For example, the plurality of dummy light emitting structures D1, D2, D3, and D4 may be provided in a line shape having a width along the side of the region where the plurality of light emitting structures P1, P2, P3, P4, . . . are formed.

For example, the plurality of light emitting structures P1, P2, P3, P4, . . . and the plurality of dummy light emitting structures D1, D2, D3, and D4 may be grown as a plurality of compound semiconductor layers. The plurality of light emitting structures P1, P2, P3, P4, . . . and the plurality of dummy light emitting structures D1, D2, D3, and D4 may be formed by an electron beam evaporator, physical vapor deposition (PVD), chemical vapor deposition (CVD), plasma laser deposition (PLD), dual-type thermal evaporator, sputtering, metal organic chemical vapor deposition (MOCVD), or the like.

The first conductivity type DBR layer 110a, 110b, . . . constituting the plurality of light emitting structures P1, P2, . . . may be provided of at least one of a Group III-V or a Group II-VI compound semiconductors doped with a dopant of the first conductivity type. The first conductivity type DBR layer 113 constituting the plurality of dummy light emitting structures D1, D2, D3, and D4 may be provided of at least one of a Group III-V or a Group II-VI compound semiconductors doped with a dopant of the first conductivity type.

For example, the first conductivity type DBR layer 113, 110a, 110b, . . . may be one of a group including GaAs, GaAl, InP, InAs, and GaP. The first conductivity type DBR layer 113, 110a, 110b, . . . may be provided of a semiconductor material having a composition formula of $Al_xGa_{1-x}As$ ($0<x<1$)/$Al_yGa_{1-y}As$ ($0<y<1$)($y<x$). The first conductivity type DBR layer 113, 110a, 110b, . . . may be n-type semiconductor layer doped with the first conductivity type dopant that is an n-type dopant such as Si, Ge, Sn, Se, Te, or the like. The first conductivity type DBR layer 113, 110a, 110b, . . . may be a DBR layer having a thickness of $\lambda/4n$ by alternately arranging different semiconductor layers.

The active layer 115a, 115b, . . . constituting the plurality of light emitting structures P1, P2, . . . may be provided of at least one of a Group III-V or a Group II-VI compound semiconductors. The active layer 116 constituting the plurality of dummy light emitting structures D1, D2, D3, and D4 may be provided of at least one of a Group III-V or a Group II-VI compound semiconductors.

For example, the active layer 116, 115a, 115b, . . . may be one of a group including GaAs, GaAl, InP, InAs, and GaP. When the active layer 116, 115a, 115b, . . . are implemented in a multi-well structure, the active layer 116, 115a, 115b, . . . may comprise alternately arranged a plurality of well layers and a plurality of barrier layers. The plurality of well layers may be provided of a semiconductor material having a composition formula of $In_pGa_{1-p}As$ ($0 \leq p \leq 1$), for example. The barrier layer may be disposed of a semiconductor material having a composition formula of, for example, $In_qGa_{1-q}As$ ($0 \leq q \leq 1$).

The aperture layer 117a, 117b, . . . constituting the plurality of light emitting structures P1, P2, . . . may be disposed on the active layer 115a, 115b, . . . . The aperture layer 117a, 117b, . . . may comprise circular openings at the central portion. The aperture layer 117a, 117b, . . . may comprise a function of restricting current movement so as to concentrate currents to the central portion of the active layer 115a, 115b, . . . . That is, the aperture layer 117a, 117b, . . . can adjust the resonance wavelength and adjust the beam angle to emit light in the vertical direction from the active layer 115a, 115b, . . . . The aperture layer 117a, 117b, . . . may comprise an insulating material such as $SiO_2$ or $Al_2O_3$. The aperture layer 117a, 117b, . . . may have a higher band gap energy than the active layer 115a, 115b, . . . , the first conductivity type DBR layer 110a, 110b, . . . , and the second conductivity type DBR layer 120a, 120b, . . . .

The aperture layer 118 forming the plurality of dummy light emitting structures D1, D2, D3, and D4 may be disposed on the active layer 116. However, as described above with reference to FIGS. 1 and 2, in the aperture layer 118 disposed in the plurality of dummy light emitting structures D1, D2, D3, and D4, the function of restricting current movement, so that the current can be concentrated at the central portion of the active layer 116, is not performed unlike the functions of the aperture layer 117a and 117b provided in the plurality of light emitting structures P1, P2, . . . . According to the embodiment, it is because a common voltage is applied between the first conductivity type DBR layer 113 and the second conductivity type DBR layer 119 disposed in the plurality of dummy light emitting structures D1, D2, D3, and D4.

The second conductivity type DBR layer 120a, 120b, . . . constituting the plurality of light emitting structures P1, P2, . . . may be provided of at least one of a group III-V or a group II-VI compound semiconductor doped with a dopant of the second conductivity type. The second conductivity type DBR layer 119 constituting the plurality of dummy light emitting structures D1, D2, D3, and D4 may be provided of at least one of a Group III-V or a Group II-VI compound semiconductors doped with a dopant of the second conductivity type.

For example, the second conductivity type DBR layer 119, 120a, 120b, . . . may be one of a group including GaAs, GaAl, InP, InAs, and GaP. The second conductivity type DBR layer 119, 120a, 120b, . . . may be formed of a semiconductor material having a composition formula of $Al_xGa_{1-x}As$ ($0<x<1$)/$Al_yGa_{1-y}As$ ($0<y<1$)($y<x$). The second conductivity type DBR layer 119, 120a, 120b, . . . may be a p-type semiconductor layer having the second conductivity type dopant that is a p-type dopant such as Mg, Zn, Ca, Sr and Ba. The second conductivity type DBR layer 119, 120a, 120b, . . . may be a DBR layer having a thickness of $\lambda/4n$ by alternately arranging different semiconductor layers.

For example, the second conductivity type DBR layer 120a, 120b, . . . may have a higher reflectance than the first conductivity type DBR layer 110a, 110b, . . . . For example, the second conductivity type DBR layer 120a, 120b, . . . and the first conductivity type DBR layer 110a, 110b, . . . can form a resonant cavity in the vertical direction by a reflectance of 90% or more. At this time, the generated light can be emitted to the outside through the first conductivity type DBR layer 110a, 110b, . . . , which are lower than the reflectance of the second conductivity type DBR layer 120a, 120b, . . . .

Next, as shown in FIGS. 4a and 4b, a first electrode 150 and an electrode pad 153 according to the embodiment may be formed.

FIGS. 4a and 4b are views showing an example in which the first electrode and the electrode pad are formed in the method of manufacturing the semiconductor device according to the embodiment of the present invention. FIG. 4a is a plan view showing a step of forming the first electrode and the electrode pad according to the method of manufacturing the semiconductor device according to the embodiment, and FIG. 4b is a sectional view taken along line A-A of the semiconductor device according to the embodiment shown in FIG. 4a.

According to the embodiment, as shown in FIGS. 4a and 4b, the first electrode 150 may be formed around the plurality of light emitting structures P1, P2, P3, P4, . . . . The first electrode 150 may be formed on the first conductivity type DBR layer 113 and may comprise a first opening H1 exposing the plurality of light emitting structures P1, P2, P3, P4, . . . . The first electrode 150 may be formed in a region between the plurality of light emitting structures P1, P2, P3, P4, . . . .

For example, an area Ae of the first electrode 150 may be provided larger than an area Am of the plurality of light emitting structures P1, P2, P3, P4, . . . . Here, the area Am of the plurality of light emitting structures P1, P2, P3, P4, . . . may indicate the area of the remaining active layer 115a, 115b, . . . without being etched by the mesa etching. A ratio of Am/Ae, that is the area Am of the plurality of light emitting structures P1, P2, P3, P4, . . . with reference to the area Ae of the first electrode 150, may be provided larger than 25%, for example. According to the semiconductor device 200 of the embodiment, the number and the diameter of the plurality of light emitting structures P1, P2, P3, P4, . . . may be variously modified according to the application example.

According to the embodiment, the ratio of Am/Ae, that is the area Am of the plurality of light emitting structures P1, P2, P3, P4, . . . with reference to the area Ae of the first electrode 150, may be provided of, for example, in a range of 25% to 70%. According to another embodiment, the ratio of Am/Ae, that is the area Am of the plurality of light emitting structures P1, P2, P3, P4, . . . with reference to the area Ae of the first electrode 150, may be provided of, for example, in a range of 30% to 60%.

The number and diameter of the plurality of light emitting structures P1, P2, P3, P4, . . . disposed in the semiconductor device 200 can be changed variously according to the application example of the semiconductor device 200 of the embodiment. [Table shows data for semiconductor devices provided with 621 light emitting structures as one example.

TABLE 1

| | Diameter of light emitting structure (μm) | | | |
|---|---|---|---|---|
| | 24 | 26 | 28 | 30 |
| Am (μm²) | 280,934 | 329,707 | 382,382 | 438,959 |
| Ae (μm²) | 969,334 | 900,062 | 826,832 | 749,643 |
| Am/Ae (%) | 29 | 37 | 46 | 59 |

In addition, according to the method of manufacturing the semiconductor of the embodiment, as shown in FIGS. 4a and 4b, a pad electrode 153 disposed on the dummy light emitting structures D1, D2, D3, and D4 may be formed. The pad electrode 153 may be formed to extend from the first electrode 150. The pad electrode 153 may be formed on the second conductivity type DBR layer 119 of the dummy light emitting structures D1, D2, D3, and D4.

According to the embodiment, a voltage may be commonly applied to the first electrode 150 and the pad electrode 153. The first electrode 150 and the pad electrode 153 may provide an equipotential surface.

For example, the first electrode 150 and the electrode pad 153 may be formed of selected material from a group including Ag, Ni, Al, Rh, Pd, Ir, Ru, Mg, Zn, Pt, Au, Hf, Ti, W, Cr, and those alloys including two or more materials above. The first electrode 150 and the electrode pad 153 may be formed of one layer or a plurality of layers. As the first electrode 150, a plurality of metal layers may be applied as a reflective metal, and Cr, Ti or the like may be applied as an adhesive layer. For example, the first electrode 150 and the electrode pad 153 may be formed of a Cr/Al/Ni/Au/Ti layer.

Next, as shown in FIGS. 5a and 5b, an insulating layer 140 may be formed on the first electrode 150 according to the embodiment.

FIGS. 5a and 5b are views showing an example in which the insulating layer is formed in the method of manufacturing the semiconductor device according to the embodiment of the present invention. FIG. 5a is a plan view showing a step of forming the insulating layer according to the method of manufacturing the semiconductor device according to the embodiment, and FIG. 5b is a sectional view taken along line A-A of the semiconductor device according to the embodiment shown in FIG. 5a.

According to the embodiment, as shown in FIGS. 5a and 5b, the insulating layer 140 exposing upper surfaces of the plurality of light emitting structures P1, P2, P3, P4, . . . may be formed on the first electrode 150. The insulating layer 140 may be formed on side surfaces of the plurality of light emitting structures P1, P2, P3, P4, . . . . The insulating layer 140 may be formed on the first conductivity type DBR layer 113. The insulating layer 140 may be formed in a region between the plurality of light emitting structures P1, P2, P3, P4, . . . .

The insulating layer 140 may comprise a plurality of second openings H2 exposing upper surfaces of the plurality of light emitting structures P1, P2, P3, P4, . . . . A size of the second opening H2 may be smaller than a size of the first opening H1. For example, the plurality of second openings H2 may be arranged in alignment with the region provided with the plurality of first openings H1.

According to the embodiment, the insulating layer 140 may expose an upper surface of the electrode pad 153. The insulating layer 140 may be formed on the third dummy light emitting structure D3. In addition, the insulating layer 140 may be formed on the fourth dummy light emitting structure D4.

The insulating layer 140 may be provided as an insulating material. For example, the insulating layer 140 may be formed of at least one material selected from a group including $SiO_2$, $TiO_2$, $Ta_2O_5$, $SiO_x$, $SiO_xN_y$, $Si_3N_4$, and $Al_2O_3$. In addition, the insulating layer 140 may be formed of a DBR layer. According to the embodiment, since the insulating layer 140 is provided as a DBR layer, light generated in the plurality of light emitting structures P1, P2, P3, P4, . . . can be efficiently reflected and extracted downward. For example, the insulating layer 140 may be provided as a DBR layer formed by stacking $SiO_2$ and $TiO_2$ as a plurality of layers. In addition, the insulating layer 140 may be provided as a DBR layer formed by stacking $Ta_2O_3$ and $SiO_2$ as a plurality of layers. In addition, the insulating layer 140 may be provided as a DBR layer formed by stacking $SiO_2$ and $Si_3N_4$ as a plurality of layers.

In addition, as shown in FIGS. 6a and 6b, a first bonding pad 155 may be formed on the pad electrode 153 according to the embodiment, and a second bonding pad 165 may be formed on the second conductivity type DBR layer of the plurality of light emitting structures P1, P2, . . . .

FIGS. 6a and 6b are views showing an example in which the first bonding pad and the second bonding pad are formed in the method of manufacturing the semiconductor device according to the embodiment of the present invention. FIG. 6a is a plan view showing a step of forming the first bonding pad and the second bonding pad according to the method of manufacturing the semiconductor device of the embodiment, and FIG. 6b is a sectional view taken along line A-A of the semiconductor device according to the embodiment shown in FIG. 6a.

According to the embodiment, as shown in FIGS. 6a and 6b, the first bonding pad 155 and the second bonding pad 165 may be formed to be spaced apart from each other.

The first bonding pad 155 may be formed on the first dummy light emitting structure D1 and the second dummy light emitting structure D2. The first bonding pad 155 may be disposed on the first dummy light emitting structure D1 and electrically connected to the pad electrode 153. For example, the first bonding pad 155 may be disposed in direct contact with an upper surface of the pad electrode 153. The first bonding pad 155 may be disposed on the second dummy light emitting structure D2. In addition, the first bonding pad 155 may be disposed in direct contact with the pad electrode provided on the second dummy light emitting structure D2.

According to the embodiment, the first bonding pad 155 may be electrically connected to the first conductivity type DBR layer of the plurality of light emitting structures P1, P2, P3, P4, . . . . According to the embodiment, the first bonding pad 155 may be electrically connected in common to the first conductivity type DBR layers of the plurality of light emitting structures P1, P2, P3, P4, . . . .

The second bonding pad 165 may be formed on the plurality of light emitting structures P1, P2, P3, P4, . . . . The second bonding pad 165 may be formed on the second conductivity type DBR layer 120a, 120b, . . . of the plurality of light emitting structures P1, P2, . . . . In addition, the second bonding pad 165 may be formed on the insulating layer 140.

The second bonding pad 165 may be electrically connected to the second conductivity type DBR layer of the plurality of light emitting structures P1, P2, P3, P4, . . . . According to the embodiment, the second bonding pad 165 may be electrically connected in common to the second conductivity type DBR layers of the plurality of light emitting structures P1, P2, P3, P4, . . . .

The second bonding pad 165 may be disposed on the second opening H2 provided in the insulating layer 140. For example, a lower surface of the second bonding pad 165 may be in direct connect with an upper surface of the second conductivity type DBR layer 120a, 120b, . . . of the plurality of light emitting structures P1, P2, . . . through the second opening H2.

For example, the first bonding pad 155 and the second bonding pad 165 may be formed of selected material from a group including Ag, Ni, Al, Rh, Pd, Ir, Ru, Mg, Zn, Pt, Au, Hf, Ti, W, Cr, Cu, and those alloys including two or more materials above. The first bonding pad 155 and the second bonding pad 165 may be formed of one layer or a plurality of layers. The first bonding pad 155 and the second bonding pad 165 may comprise a diffusion barrier metal such as Cr, Cu, and the like to prevent diffusion of Sn from solder bonding. For example, the first bonding pad 155 and the second bonding pad 172 may be formed of a plurality of layers including Ti, Ni, Cu, Cr, and Au.

According to the semiconductor device 200 of the embodiment, power may be supplied to the plurality of light emitting structures P1, P2, P3, P4, . . . through the first bonding pad 155 and the second bonding pad 165.

Therefore, according to the embodiment, when power is supplied to the plurality of light emitting structures P1, P2, P3, P4, . . . , power does not need to be applied through the lower surface of the substrate 105. In a conventional semiconductor device, when power is to be applied through the lower surface of the substrate, the substrate 105 must be provided as a conductive substrate. However, according to the semiconductor device 200 of the embodiment, the substrate 105 may be a conductive substrate or an insulating substrate. For example, the substrate 105 according to the embodiment may be provided as an intrinsic semiconductor substrate.

In addition, the substrate 105 may be a support substrate attached to the plurality of light emitting structures P1, P2, P3, P4, . . . , in which the support substrate may be attached after the plurality of light emitting structures P1, P2, P3, P4, . . . are grown on a growth substrate and the growth substrate is removed. For example, the support substrate may be a transparent substrate through which light generated in the plurality of light emitting structures P1, P2, P3, P4, . . . can be transmitted.

Meanwhile, the semiconductor device 200 according to the embodiment may be implemented such that light is emitted in a lower direction of the semiconductor device 200. That is, according to the semiconductor device 200 of the embodiment, light can be emitted in a direction in which the first conductivity type DBR layer is disposed from the active layer constituting the plurality of light emitting structures P1, P2, P3, P4, . . . . Light may be emitted from the active layer constituting the plurality of light emitting structures P1, P2, P3, P4, . . . in the direction in which the substrate 105 is disposed.

According to the embodiment, the second bonding pad 165 is disposed in contact with the upper surface of the second conductivity type DBR layer of the plurality of light emitting structures P1, P2, P3, P4, . . . . The first electrode 150 is connected to the first conductivity type DBR layer of the plurality of light emitting structures P1, P2, P3, P4, . . . , and the first bonding pad 155 is disposed on and in contact with the pad electrode 153 extended from the first electrode 150. Accordingly, the heat generated in the plurality of light emitting structures P1, P2, P3, P4, . . . can be effectively dissipated to the outside through the first bonding pad 155 and the second bonding pad 165.

Meanwhile, in the case of a general semiconductor device, it is known that the power conversion efficiency (PCE) is significantly lowered due to the heat generated in the light emitting structure. When power is supplied to the light emitting structure through the substrate disposed at the lower portion, generally heat dissipation is performed through the substrate. However, since the thermal conductivity of the substrate is low, it is difficult to dissipate the heat generated in the light emitting structure to the outside. For example, it is known that the thermal conductivity of a GaAs substrate is as low as 52 W/(m*K).

However, according to the embodiment, since the first bonding pad 155 and the second bonding pad 165 may be connected to the external heat dissipating substrate or the like, so that the heat generated in the plurality of light emitting structures P1, P2, P3, P4, . . . can be effectively dissipated to the outside. Therefore, according to the embodiment, since the heat generated in the semiconductor device 200 can be effectively dissipated to the outside, the power conversion efficiency (PCE) can be improved.

Meanwhile, according to the semiconductor device 200 of the embodiment, as described above, light can be emitted in a downward direction of the semiconductor device 200. According to the semiconductor device 200 of the embodiment, the reflectance of the first conductivity type DBR layer provided in a lower portion of the plurality of light emitting structures P1, P2, P3, P4, can be selected to be smaller than the reflectance of the second conductivity type DBR layer provided in an upper portion of the plurality of light emitting structures P1, P2, P3, P4, . . . . Accordingly, light generated in the plurality of light emitting structures P1, P2, P3, P4, . . . can be emitted toward the substrate 105 of the semiconductor device 200.

In addition, according to the semiconductor device 200 of the embodiment, the insulating layer 140 may be provided as a DBR layer. Accordingly, the light generated in the plurality of light emitting structures P1, P2, P3, P4, . . . can be reflected by the insulating layer 140 that is disposed at the upper portion and can be effectively extracted downward.

Meanwhile, in the conventional semiconductor device, when the power is supplied to the light emitting structure through the substrate, the substrate must be conductive. Accordingly, when a conductive semiconductor substrate is applied, a dopant is added to the substrate to improve the conductivity. However, the dopant added to the substrate causes absorption and scattering of the emitted light, which may cause a decrease in power conversion efficiency (PCE).

However, according to the semiconductor device 200 of the embodiment, as described above, the substrate 105 may not be a conductive substrate, so that an additional dopant may not be added to the substrate 105. Accordingly, the dopant is not added to the substrate 105 according to the embodiment, so that absorption and scattering by the dopant in the substrate 105 can be reduced. Therefore, according to the embodiment, light generated in the plurality of light emitting structures P1, P2, P3, P4, . . . can be effectively provided in a downward direction, and power conversion efficiency (PCE) can be improved.

In addition, according to the semiconductor device 200 of the embodiment, current spreading between the plurality of light emitting structures P1, P2, P3, P4, . . . can be efficiently performed by the first electrode 150 connected to the first bonding pad 155 and the second bonding pad 165. Therefore, according to the semiconductor device 200 of the embodiment, current can be efficiently diffused in the plurality of light emitting structures P1, P2, P3, P4, . . . without current crowding, and the light extraction efficiency can be improved.

Meanwhile, FIG. 7 is a view showing another example of a semiconductor device according to an embodiment of the present invention. Hereinafter, another example of the semiconductor device according to the embodiment will be described with reference to FIG. 7, and description overlapping with those of the semiconductor device described above with reference to FIGS. 1 to 6a and 6b will be omitted.

The semiconductor device 200 according to the embodiment may further comprise a second electrode 160 as shown in FIG. 7, as compared to the semiconductor device according to the embodiment described with reference to FIGS. 1 and 2.

The semiconductor device 200 according to the embodiment of the present invention may comprise a plurality of light emitting structures P1, P2, . . . , a first electrode 150, a second electrode 160, a bonding pad 155, and a second bonding pad 165, as shown in FIG. 7.

The first electrode 150 may be disposed between the plurality of light emitting structures P1, P2, . . . . The first electrode 150 may comprise a plurality of first openings exposing the plurality of light emitting structures P1, P2, . . . .

The plurality of first openings provided in the first electrode 150 may expose upper surfaces of the plurality of light emitting structures P1, P2, . . . . The plurality of first openings provided in the first electrode 150 may expose an upper surface of the second conductivity type DBR layer of the plurality of light emitting structures P1, P2, . . . . The first electrode 150 may be electrically connected to the first conductivity type DBR layer of the plurality of light emitting structures P1, P2, . . . .

The second electrode 160 may be electrically connected to the second conductivity type DBR layer of the plurality of light emitting structures P1, P2, . . . . The second electrode 150 may be electrically connected in common to the second conductivity type DBR layers of the plurality of light emitting structures P1, P2, . . . . The second electrode 150 may be disposed on an upper surface of the second conductivity type DBR layer of the plurality of light emitting structures P1, P2, . . . . For example, a lower surface of the second electrode 160 may be disposed in direct contact with the upper surface of the second conductivity type DBR layer of the plurality of light emitting structures P1, P2, . . . .

The first bonding pad 155 may be spaced apart from the plurality of light emitting structures P1, P2, . . . . The first bonding pad 155 may be electrically connected to the first electrode 150.

According to the embodiment, the first bonding pad 155 may be electrically connected to the first conductivity type DBR layer of the plurality of light emitting structures P1, P2, . . . . According to the embodiment, the first bonding pad 155 may be electrically connected in common to the first conductivity type DBR layers of the plurality of light emitting structures P1, P2, . . . .

The second bonding pad 165 may be spaced apart from the first bonding pad 155. The second bonding pad 165 may be electrically connected to the second conductivity type DBR layer of the plurality of light emitting structures P1, P2, . . . . The second bonding pad 165 may be electrically connected in common to the second conductivity type DBR layers of the plurality of light emitting structures P1, P2, . . . . For example, the second bonding pad 165 may be disposed on an upper surface of the second conductivity type DBR layer of the plurality of light emitting structures P1, P2, . . . .

According to the embodiment, the second electrode 160 may be disposed between the upper surface of the second conductivity type DBR layer of the plurality of light emitting structures P1, P2, . . . and the second bonding pad 165. The second electrode 160 may improve ohmic characteristics between the second bonding pad 165 and the second conductivity type DBR layer of the plurality of light emitting structures P1, P2, . . . .

For example, the second electrode 160 may be formed of selected material from a group including Ag, Ni, Al, Rh, Pd, Ir, Ru, Mg, Zn, Pt, Au, Hf, Ti, W, Cr, and those alloys including two or more materials above. The second electrode 160 may be formed of one layer or a plurality of layers.

Also, the semiconductor device 200 according to the embodiment may comprise a plurality of dummy light emitting structures D1, D2, D3, and D4, as shown in FIG. 1. The plurality of dummy light emitting structures D1, D2, D3, and D4 may comprise a first conductivity type DBR layer, an active layer, and a second conductivity type DBR layer. Also, the first bonding pad 155 may be disposed on an upper portion of the first dummy light emitting structure D1 and the second dummy light emitting structure D2 among the plurality of dummy light emitting structures D1, D2, D3, and D4.

The plurality of dummy light emitting structures D1, D2, D3, and D4 may be spaced apart from the second bonding pad 165. For example, the first bonding pad 155 may be disposed in an upper portion of the first dummy light emitting structure D1.

The first dummy light emitting structure D1 may comprise a first conductivity type DBR layer 113 and a second conductivity type DBR layer 119. In addition, the first dummy light emitting structure D1 may comprise an active layer 116 and an aperture layer 118.

The semiconductor device 200 according to the embodiment may comprise a pad electrode 153, as shown in FIG. 7. The pad electrode 153 may be electrically connected to the first electrode 150. The pad electrode 153 may extend from the first electrode 150 that is disposed between the first light emitting structure P1 and the second light emitting structure P2.

The pad electrode 153 may be electrically connected to the first conductivity type DBR layer 113. The pad electrode 153 may be electrically connected to the active layer 116. The pad electrode 153 may be electrically connected to the second conductivity type DBR layer 119. The pad electrode 153 may be electrically connected in common to the first conductivity type DBR layer 113 and the second conductivity type DBR layer 119. Accordingly, the first dummy light emitting structure D1 may not generate light.

According to the embodiment, the first bonding pad 155 may be disposed on the pad electrode 153. The insulating layer 140 may be disposed on a side surface of the pad electrode 153. The first bonding pad 155 may be disposed on an upper surface of the pad electrode 153 exposed by the insulating layer 140.

In addition, the insulating layer 140 may be disposed on an upper surface of the first electrode 150 and a lower surface of the second bonding pad 165, at the periphery of the first light emitting structure P1 and the second light emitting structure P2.

According to the embodiment, the second bonding pad 165 may be disposed in contact with an upper surface of the second conductivity type DBR layer of the plurality of light emitting structures P1, P2, . . . . Also, the first electrode 150 may be disposed to be connected to the first conductivity type DBR layer of the plurality of light emitting structures P1, P2, . . . and the first bonding pad 155 may be disposed on and in contact with the pad electrode 153 extended from the first electrode 150. Accordingly, the heat generated in the plurality of light emitting structures P1, P2, . . . can be effectively dissipated to the outside through the first bonding pad 155 and the second bonding pad 165.

Meanwhile, in the case of a general semiconductor device, it is known that the power conversion efficiency (PCE) is significantly lowered due to the heat generated in the light emitting structure. When power is supplied to the light emitting structure through the substrate disposed at the lower portion, generally heat dissipation is performed through the substrate. However, since the thermal conductivity of the substrate is low, it is difficult to dissipate the heat generated in the light emitting structure to the outside. For example, it is known that the thermal conductivity of a GaAs substrate is as low as 52 W/(m*K).

However, according to the embodiment, since the first bonding pad 155 and the second bonding pad 165 may be connected to the external heat dissipating substrate or the like, so that the heat generated in the plurality of light emitting structures P1, P2, . . . can be effectively dissipated to the outside. Therefore, according to the embodiment, since the heat generated in the semiconductor device 200 can be effectively dissipated to the outside, the power conversion efficiency (PCE) can be improved.

Meanwhile, according to the semiconductor device 200 of the embodiment, as described above, light can be emitted in a downward direction of the semiconductor device 200.

According to the semiconductor device 200 of the embodiment, the reflectance of the first conductivity type DBR layer provided in a lower portion of the plurality of light emitting structures P1, P2, . . . can be selected to be smaller than the reflectance of the second conductivity type DBR layer provided in an upper portion of the plurality of light emitting structures P1, P2, . . . , Accordingly, light generated in the plurality of light emitting structures P1, P2, . . . can be emitted toward the substrate 105 of the semiconductor device 200.

In addition, according to the semiconductor device 200 of the embodiment, the insulating layer 140 may be provided as a DBR layer. Accordingly, the light generated in the plurality of light emitting structures P1, P2, . . . can be reflected by the insulating layer 140 disposed at the upper portion and can be effectively extracted downward.

For example, the insulating layer 140 may be provided as a DBR layer formed by stacking $SiO_2$ and $TiO_2$ as a plurality of layers. In addition, the insulating layer 140 may be provided as a DBR layer formed by stacking $Ta_2O_3$ and $SiO_2$ as a plurality of layers. In addition, the insulating layer 140 may be provided as a DBR layer formed by stacking $SiO_2$ and $Si_3N_4$ as a plurality of layers.

Meanwhile, in the conventional semiconductor device, when the power is supplied to the light emitting structure through the substrate, the substrate must be conductive. Accordingly, when a conductive semiconductor substrate is applied, a dopant is added to the substrate to improve the conductivity. However, the dopant added to the substrate causes absorption and scattering of the emitted light, which may cause a decrease in power conversion efficiency (PCE).

However, according to the semiconductor device 200 of the embodiment, as described above, the substrate 105 may not be a conductive substrate, so that an additional dopant may not be added to the substrate 105. Accordingly, the dopant is not added to the substrate 105 according to the embodiment, so that absorption and scattering by the dopant in the substrate 105 can be reduced. Therefore, according to the embodiment, light generated in the plurality of light emitting structures P1, P2, . . . can be effectively provided in a downward direction, and the power conversion efficiency (PCE) can be improved.

In addition, according to the semiconductor device 200 of the embodiment, current spreading between the plurality of light emitting structures P1, P2, . . . can be efficiently performed by the first electrode 150 connected to the first bonding pad 155 and the second electrode 160 connected to the second bonding pad 165. Therefore, according to the semiconductor device 200 of the embodiment, current can be efficiently diffused in the plurality of light emitting structures P1, P2, . . . without current crowding, and the light extraction efficiency can be improved.

Meanwhile, FIG. 8 is a view showing another example of a semiconductor device according to an embodiment of the present invention. Hereinafter, another example of the semiconductor device according to the embodiment will be described with reference to FIG. 8, and the description overlapping with those of the semiconductor device described above with reference to FIGS. 1 to 7 may be omitted.

The semiconductor device 200 according to the embodiment, as shown in FIG. 8, is different from the semiconductor device according to the embodiment described with reference to FIGS. 1 and 2, related to the arrangement between elements in the region where the first bonding pad 155 is provided.

The semiconductor device 200 according to the embodiment of the present invention may comprise a plurality of light emitting structures P1, P2, . . . , a first electrode 150, a first bonding pad 155, and a second bonding pad 165.

The first electrode 150 may be disposed between the plurality of light emitting structures P1, P2, . . . . The first electrode 150 may comprise a plurality of first openings exposing the plurality of light emitting structures P1, P2, . . . .

The plurality of first openings provided in the first electrode 150 may expose upper surfaces of the plurality of light emitting structures P1, P2, . . . . The plurality of first openings provided in the first electrode 150 may expose an upper surface of the second conductivity type DBR layer of the plurality of light emitting structures P1, P2, . . . . The first electrode 150 may be electrically connected to the first conductivity type DBR layer of the plurality of light emitting structures P1, P2, . . . .

The second electrode 150 may be electrically connected to the second conductivity type DBR layer of the plurality of light emitting structures P1, P2, . . . . The second electrode 150 may be electrically connected in common to the second conductivity type DBR layers of the plurality of light emitting structures P1, P2, . . . . The second electrode 150 may be disposed on an upper surface of the second conductivity type DBR layer of the plurality of light emitting structures P1, P2, . . . . For example, a lower surface of the second electrode 150 may be disposed in direct contact with the upper surface of the second conductivity type DBR layer of the plurality of light emitting structures P1, P2, . . . .

The first bonding pad 155 may be spaced apart from the plurality of light emitting structures P1, P2, . . . . The first bonding pad 155 may be electrically connected to the first electrode 150.

According to the embodiment, the first bonding pad 155 may be electrically connected to the first conductivity type DBR layer of the plurality of light emitting structures P1, P2, . . . . According to the embodiment, the first bonding pad 155 may be electrically connected in common to the first conductivity type DBR layers of the plurality of light emitting structures P1, P2, . . . .

The second bonding pad 165 may be spaced apart from the first bonding pad 155. The second bonding pad 165 may be electrically connected to the second conductivity type DBR layer of the plurality of light emitting structures P1, P2, . . . . The second bonding pad 165 may be electrically connected in common to the second conductivity type DBR layers of the plurality of light emitting structures P1, P2, . . . . For example, the second bonding pad 165 may be disposed on an upper surface of the second conductivity type DBR layer of the plurality of light emitting structures P1, P2, . . . .

The semiconductor device 200 according to the embodiment may comprise a pad electrode 153, as shown in FIG. 8. The pad electrode 153 may be electrically connected to the first electrode 150. The pad electrode 153 may extend from the first electrode 150 disposed between the first light emitting structure P1 and the second light emitting structure P2.

The pad electrode 153 may be electrically connected to the first conductivity type DBR layer 113. The pad electrode 153 may be disposed on the first conductivity type DBR layer 113. For example, a lower surface of the pad electrode 153 may be disposed in direct contact with an upper surface of the first conductivity type DBR layer 113.

According to the semiconductor device 200 of the embodiment, as shown in FIG. 8, an upper surface of the pad electrode 153 may be disposed on the same plane as an upper surface of the first electrode 150. That is, the pad electrode 153 and the first electrode 150 may be arranged without a step. Therefore, according to the embodiment, it is possible to prevent damage to the pad electrode 153 or the first electrode 150, which may occur in the step difference region.

According to the embodiment, the first bonding pad 155 may be disposed on the pad electrode 153. For example, the insulating layer 140 may be disposed on a portion of the pad electrode 153. The first bonding pad 155 may be disposed on an upper surface of the pad electrode 153 exposed by the insulating layer 140.

In addition, the insulating layer 140 may be disposed between an upper surface of the first electrode 150 and an lower surface of the second bonding pad 165, at the periphery of the first light emitting structure P1 and the second light emitting structure P2.

According to the embodiment, the second bonding pad 165 may be disposed in contact with an upper surface of the second conductivity type DBR layer of the plurality of light emitting structures P1, P2, . . . . Also, the first electrode 150 may be disposed to be connected to the first conductivity type DBR layer of the plurality of light emitting structures P1, P2, . . . and the first bonding pad 155 may be disposed on an in contact with the pad electrode 153 extended from the first electrode 150. Accordingly, the heat generated in the plurality of light emitting structures P1, P2, . . . can be effectively dissipated to the outside through the first bonding pad 155 and the second bonding pad 165.

Meanwhile, in the case of a general semiconductor device, it is known that the power conversion efficiency (PCE) is significantly lowered due to the heat generated in the light emitting structure. When power is supplied to the light emitting structure through the substrate disposed at the lower portion, generally heat dissipation is performed through the substrate. However, since the thermal conductivity of the substrate is low, it is difficult to dissipate the heat generated in the light emitting structure to the outside. For example, it is known that the thermal conductivity of a GaAs substrate is as low as 52 W/(m*K).

However, according to the embodiment, since the first bonding pad 155 and the second bonding pad 165 may be connected to the external heat dissipating substrate or the like, so that the heat generated in the plurality of light emitting structures P1, P2, . . . can be effectively dissipated to the outside. Therefore, according to the embodiment, since the heat generated in the semiconductor device 200 can be effectively dissipated to the outside, the power conversion efficiency (PCE) can be improved.

Meanwhile, according to the semiconductor device 200 of the embodiment, as described above, light can be emitted in a downward direction of the semiconductor device 200. According to the semiconductor device 200 of the embodiment, the reflectance of the first conductivity type DBR layer provided in a lower portion of the plurality of light emitting structures P1, P2, . . . can be selected to be smaller than the reflectance of the second conductivity type DBR layer provided in an upper portion of the plurality of light emitting structures P1, P2, . . . . Accordingly, light generated in the plurality of light emitting structures P1, P2, . . . can be emitted toward the substrate 105 of the semiconductor device 200.

In addition, according to the semiconductor device 200 of the embodiment, the insulating layer 140 may be provided as a DBR layer. Accordingly, the light generated in the plurality of light emitting structures P1, P2, . . . can be reflected by the insulating layer 140 disposed at the upper portion and can be effectively extracted downward.

For example, the insulating layer 140 may be provided as a DBR layer formed by stacking $SiO_2$ and $TiO_2$ as a plurality of layers. In addition, the insulating layer 140 may be provided as a DBR layer formed by stacking $Ta_2O_3$ and $SiO_2$ as a plurality of layers. In addition, the insulating layer 140 may be provided as a DBR layer formed by stacking $SiO_2$ and $Si_3N_4$ as a plurality of layers.

Meanwhile, in the conventional semiconductor device, when the power is supplied to the light emitting structure through the substrate, the substrate must be conductive. Accordingly, when a conductive semiconductor substrate is applied, a dopant is added to the substrate to improve the conductivity. However, the dopant added to the substrate causes absorption and scattering of the emitted light, which may cause a decrease in power conversion efficiency (PCE).

However, according to the semiconductor device 200 of the embodiment, as described above, the substrate 105 may not be a conductive substrate, so that an additional dopant may not be added to the substrate 105. Accordingly, the dopant is not added to the substrate 105 according to the embodiment, so that absorption and scattering by the dopant in the substrate 105 can be reduced. Therefore, according to the embodiment, light generated in the plurality of light emitting structures P1, P2, . . . can be effectively provided in a downward direction, and the power conversion efficiency (PCE) can be improved.

In addition, according to the semiconductor device 200 of the embodiment, current spreading between the plurality of light emitting structures P1, P2, . . . can be efficiently performed by the first electrode 150 that is connected to the first bonding pad 155 and the second bonding pad 165. Therefore, according to the semiconductor device 200 of the embodiment, current can be efficiently diffused in the plurality of light emitting structures P1, P2, . . . without current crowding, and the light extraction efficiency can be improved.

Meanwhile, FIG. 9 is a view showing another example of a semiconductor device according to an embodiment of the present invention. Hereinafter, another example of the semiconductor device according to the embodiment will be described with reference to FIG. 9, and description overlapping with those of the semiconductor device described above with reference to FIGS. 1 to 8 may be omitted.

The semiconductor device 200 according to the embodiment differs from the semiconductor device according to the embodiment described with reference to FIGS. 1 and 2 in the position where the first bonding pad 155 is provided, as shown in FIG. 9. According to the embodiment, as shown in FIG. 9, the first bonding pad 155 may be disposed only on one side of the second bonding pad 165.

In the case of the semiconductor device described with reference to FIGS. 1 and 2, the first bonding pad 155 is provided on both sides of the second bonding pad 165. Accordingly, a loss may occur in which the light emitting structure can not be formed by the area where the first bonding pad 155 is to be disposed.

However, according to the semiconductor device 200 of the embodiment, as shown in FIG. 9, since the first bonding pad 155 is provided only on one side of the second bonding pad 165, so that the space for forming the first bonding pad 155 can be reduced in the outer region above the substrate. Accordingly, the semiconductor device 200 according to the embodiment can reduce the area of the substrate on which the semiconductor devices are formed, thereby increasing the number of semiconductor devices that can be manufactured with respect to the same area of the wafer.

Next, another example of a semiconductor device according to an embodiment of the present invention will be described with reference to FIGS. 10 to 13. FIG. 10 is a view showing the semiconductor device according to the embodiment of the present invention, FIG. 11 is a sectional view taken along line A-A of the semiconductor device according to the embodiment shown in FIG. 10, FIG. 12 is a sectional view taken along line B-B of the semiconductor device according to the embodiment shown in FIG. 10, and FIG. 13 is a sectional view taken along line C-C of the semiconductor device according to the embodiment shown in FIG. 10.

In describing the semiconductor device according to the embodiment with reference to FIGS. 10 to 13, description overlapping with those described above may be omitted.

Meanwhile, in order to facilitate understanding, in FIG. 10, the first bonding pad 1155 and the second bonding pad 1165 disposed on an upper portion are treated as transparent so that the arrangement relationship of the components located in a lower portion can be easily grasped.

As shown in FIGS. 10 to 13, the semiconductor device 1200 according to the embodiment of the present invention may comprise a substrate 1105, a plurality of light emitting structures P1, P2, P3, P4, P5, . . . , a first electrode 1150, a second electrode 1160, a first bonding pad 1155, and a second bonding pad 1165.

The semiconductor device 1200 according to the embodiment may be a vertical cavity surface emitting laser (VCSEL), and may emit light generated in the plurality of light emitting structures P1, P2, P3, P4, P5, . . . , for example, at a beam angle of about 15 degrees to about 25 degrees. Each of the plurality of light emitting structures P1, P2, P3, P4, P5, . . . may comprise a first conductivity type DBR (Distributed Bragg Reflector) layer, an active layer, and a second conductivity type DBR layer. Each of the plurality of light emitting structures P1, P2, P3, P4, P5, . . . may be formed in a similar structure, and the semiconductor device 1200 will be described using cross sections taken along lines A-A, B-B, and C-C shown in FIG. 10.

The semiconductor device 1200 according to the embodiment may comprise the substrate 1105, as shown in FIGS. 10 to 13. The substrate 1105 may comprise a concavo-convex structure provided on a lower surface thereof. A plurality of light emitting structures P1, P2, P3, P4, P5, . . . may be disposed on the substrate 1105.

For example, the substrate 1105 may be a growth substrate on which the plurality of light emitting structures P1, P2, P3, P4, P5, . . . can be grown. For example, the substrate 1105 may be an intrinsic semiconductor substrate.

According to the embodiment, the concavo-convex structure provided on the substrate 1105 may comprise a plurality of recesses R1, R2, R3, R4, . . . , which are recessed upward in the lower surface of the substrate 1105. The concavo-convex structure provided on the substrate 1105 will be described later.

The semiconductor device 1200 according to the embodiment may comprise a plurality of light emitting structures P1, P2, P3, P4, P5, . . . , as shown in FIGS. 10 and 11. The first bonding pad 1155 may be disposed on a region where some of the light emitting structures P3, P4, . . . are disposed, among the plurality of light emitting structures P1, P2, P3, P4, P5, . . . . Also, the second bonding pad 1165 may be disposed on a region where some of the light emitting structures P1, P2, P5, . . . are disposed, among the plurality of light emitting structures P1, P2, P3, P4, P5, . . . .

The first bonding pad 1155 and the second bonding pad 1165 may be spaced apart from each other. The first bonding pad 1155 may be electrically connected to the first electrode 1150. The first electrode 1150 may be disposed under the first bonding pad 1155. For example, a lower surface of the first bonding pad 1155 may be disposed in direct contact with an upper surface of the first electrode 1150. The first electrode 1150 may be electrically connected to the first conductivity type DBR layer of the plurality of light emitting structures P1, P2, P3, P4, P5, . . . .

The second bonding pad 1165 may be electrically connected to the second electrode 1160. The second electrode 1160 may be disposed under the second bonding pad 1165. For example, a lower surface of the second bonding pad 1165 may be disposed in direct contact with an upper surface of the second electrode 1160. The second electrode 1160 may be electrically connected to the second conductivity type DBR layer of the plurality of light emitting structures P1, P2, P3, P4, P5, . . . .

According to the embodiment, the first electrode 1150 may be disposed under both the first bonding pad 1155 and the second bonding pad 1165. In addition, the second electrode 1160 may be disposed under both the first bonding pad 1155 and the second bonding pad 1165. The electrical connection between the first electrode 1150 and the first bonding pad 1155, and the electrical connection between the second electrode 1160 and the second bonding pad 1165 will be described later.

First, referring to FIGS. 10 and 11, the semiconductor device 1200 according to the embodiment will be described based on a first light emitting structure P1 and a second light emitting structure P2 disposed under the second bonding pad 1165. FIG. 11 is a sectional view taken along line A-A of the semiconductor device according to the embodiment shown in FIG. 10.

The semiconductor device 1200 according to the embodiment may comprise a plurality of light emitting structures P1, P2, . . . disposed under the second bonding pads 1165. The plurality of light emitting structures P1, P2, . . . may comprise light emitting apertures 1130a, 1130b, . . . , respectively, which emit light. The plurality of light emitting structures P1, P2, . . . may be spaced apart from each other. For example, the light emitting aperture 1130a, 1130b, may be provided with a diameter in a range of several micrometers to several tens of micrometers.

The first light emitting structure P1 may comprise a first DBR layer 1110a of a first conductivity type, a second DBR layer 1120a of a second conductivity type, and a first active layer 1115a. The first active layer 1115a may be disposed between the first DBR layer 1110a and the second DBR layer 1120a. For example, the first active layer 1115a may be disposed on the first DBR layer 1110a, and the second DBR layer 1120a may be disposed on the first active layer 1115a. The first light emitting structure P1 may further comprise a first aperture layer 1117a disposed between the first active layer 1115a and the second DBR layer 1120a.

The second light emitting structure P2 may comprise a third DBR layer 1110b of the first conductivity type, a fourth DBR layer 1120b of the second conductivity type, and a second active layer 1115b. The second active layer 1115b may be disposed between the third DBR layer 1110b and the fourth DBR layer 1120b. For example, the second active layer 1115b may be disposed on the third DBR layer 1110b, and the fourth DBR layer 1120b may be disposed on the second active layer 1115b. The second light emitting structure P2 may further comprise a second aperture layer 1117b disposed between the second active layer 1115b and the fourth DBR layer 1120b.

In addition, a first conductivity type DBR layer 1113 may be disposed between the first DBR layer 1110a of the first light emitting structure P1 and the third DBR layer 1110b of the second light emitting structure P2. The first DBR layer 1110a and the third DBR layer 1110b may be physically connected by the first conductivity type DBR layer 1113. For example, an upper surface of the first conductivity type DBR layer 1113 and an upper surface of the first DBR layer 1110a may be disposed on the same horizontal plane. The upper surface of the first conductivity type DBR layer 1113 and an upper surface of the third DBR layer 1110b may be disposed on the same horizontal plane.

In addition, the first active layer 1115a of the first light emitting structure P1 and the second active layer 1115b of the second light emitting structure P2 may be spaced apart from each other. Also, the second DBR layer 1120a of the first light emitting structure P1 and the fourth DBR layer 1120b of the second light emitting structure P2 may be spaced apart from each other.

The semiconductor device 1200 according to the embodiment may comprise a substrate 1105 provided with a concavo-convex structure on a lower surface, as shown in FIGS. 10 and 11. The substrate 1105 may comprise, for example, a first recess R1 and a second recess R2.

The first recess R1 may be provided to be recessed in an upper direction from the lower surface of the substrate 1105. The first recess R1 may be disposed to overlap with the first light emitting structure P1. The first recess R1 and the first light emitting structure P1 may be disposed to overlap with each other in a direction perpendicular to the upper surface of the substrate 1105.

The second recess R2 may be provided to be recessed in the upper direction from the lower surface of the substrate 1105. The second recess R2 may be disposed to overlap with the second light emitting structure P2. The second recess R2 and the second light emitting structure P2 may be disposed to overlap with each other in a direction perpendicular to the upper surface of the substrate 1105.

According to the embodiment, a width of the first recess R1 may be provided corresponding to a width of the first light emitting aperture 1130a provided in the first light emitting structure P1. In addition, the width of the first recess R1 may be provided corresponding to a diameter of the first light emitting aperture 1130a provided in the first light emitting structure P1. For example, the first light emitting aperture 1130a may be defined as a region in which light is emitted in a direction perpendicular to the lower surface of the first light emitting structure P1.

In addition, a width of the second recess R2 may be provided corresponding to a width of the second light emitting aperture 1130b provided in the second light emitting structure P2. The width of the second recess R2 may be provided corresponding to the width of the second light emitting aperture 1130b provided in the second light emitting structure P2. For example, the second light emitting aperture 1130b may be defined as a region where light is emitted in a direction perpendicular to the lower surface of the second light emitting structure P2.

A thickness t1 of the substrate 1105 may be provided in a range of several tens of micrometers to several hundreds of micrometers. The thickness t1 of the substrate 1105 may be provided, for example, in a range of 100 micrometers to 110 micrometers.

When the thickness t1 of the substrate 1105 is smaller than 100 micrometers, the components disposed on the substrate 1105 can not be stably supported, thereby reducing the reliability of the semiconductor device. In addition, when the thickness t1 of the substrate 1105 is larger than 110 micrometers, there is a disadvantage that the size of the semiconductor device may be increased.

A depth t2 of the first recess R1 and the second recess R2 may be provided in a range of several micrometers to several tens of micrometers. For example, the depth t2 of the first recess R1 and the second recess R2 may be provided in a range of 5 micrometers to 20 micrometers.

When the depth t2 of the first recess R1 and the second recess R2 is smaller than 5 micrometers, the increase in the light extraction effect that can be provided by the first recess R1 the second recess R2 can be small. When the depth t2 of the first recess R1 and the second recess R2 is larger than 20 micrometers, the light extracting effect that can be provided by the first recess R1 and the second recess R2 may be large, but there is a disadvantage that the processing time may be increased. When the depth t2 of the first recess R1 and the second recess R2 is greater than 20 micrometers, it is difficult to stably support the components disposed on the substrate 1105, so reliability of the semiconductor device may be reduced.

In addition, the width w1 of the first recess R1 and the second recess R2 may be provided of several tens of micrometers. The width w1 of the first recess R1 and the second recess R2 may be provided, for example, in a range of 6 micrometers to 15 micrometers.

For example, the width w1 of the first recess R1 and the second recess R2 may be provided corresponding to the width of the first light emitting aperture 1130a and the width of the second light emitting aperture 1130b. Light emitted from the first light emitting structure P1 and the second light emitting structure P2 is emitted in a downward direction. Therefore, the width w1 of the first recess R1 and the second recess R2 may be formed to be provided in a region where light propagates.

According to another embodiment, the width w1 of the first recess R1 and the second recess R2 may be provided several micrometers larger than a diameter of the first light emitting aperture 1130a and the second light emitting aperture 1130b. Considering the process error in the formation of the first recess R1 and the second recess R2, so that the alignment between the plurality of recesses R1, R2, . . . and the plurality of light emitting structures P1 and P2 can be performed stably. For example, the width w1 of the first recess R1 and the second recess R2 may be provided in a range of 8 micrometers to 25 micrometers.

For example, the first recess R1 may be provided in a shape of a hole having a circular horizontal cross section in a portion under the first light emitting structure P1. In addition, the second recess R2 may be provided in a shape of a hole having a circular horizontal cross section in a portion under the second light emitting structure P2. An upper surface of the first recess R1 and an upper surface of the second recess R2 may be provided in a planar shape, for example. The upper surface of the first recess R1 and the upper surface of the second recess R2 may be provided parallel to the upper surface of the substrate 1105, for example.

The semiconductor device 1200 according to the embodiment may comprise a first insulating layer 1141, as shown in FIGS. 10 and 11. The first insulating layer 1141 may be disposed on a side surface of the first light emitting structure P1. The first insulating layer 1141 may be disposed to surround the side surface of the first light emitting structure P1. The first insulating layer 1141 may be disposed on a side surface of the second light emitting structure P2. The first insulating layer 1141 may be disposed to surround the side surface of the second light emitting structure P2.

In addition, the first insulating layer 1141 may be disposed between the first light emitting structure P1 and the second light emitting structure P2. The first insulating layer 1141 may be disposed on the first conductivity type DBR layer 1113.

The first insulating layer 1141 may expose an upper surface of the first light emitting structure P1. The first insulating layer 1141 may expose an upper surface of the second DBR layer 1120a of the first light emitting structure P1. The first insulating layer 1141 may expose an upper surface of the second light emitting structure P2. The first insulating layer 1141 may expose an upper surface of the fourth DBR layer 1120b of the second light emitting structure P2.

The semiconductor device 1200 according to the embodiment may comprise a first electrode 1150, as shown in FIGS. 10 and 11. The first electrode 1150 may be disposed around the plurality of light emitting structures P1, P2, P3, P4, P5, . . . . The first electrode 1150 may comprise a plurality of openings exposing the plurality of light emitting structures P1, P2, P3, P4, P5, . . . . The first electrode 1150 may be commonly connected to a plurality of first conductivity type DBR layers constituting the plurality of light emitting structures P1, P2, P3, P4, P5, . . . .

The first electrode 1150 may be disposed on the first conductivity type DBR layer 1113. The first electrode 1150 may be electrically connected to the first DBR layer 1110a. The first electrode 1150 may be electrically connected to the third DBR layer 1110b. The first electrode 1150 may be disposed under the first insulating layer 1141. The first electrode 1150 may be disposed under the first insulating layer 1141 in a region between the first light emitting structure P1 and the second light emitting structure P2. The first electrode 1150 may be disposed between the first insulating layer 1141 and the first conductivity type DBR layer 1113 in a region between the first light emitting structure P1 and the second light emitting structure P2.

The semiconductor device 1200 according to the embodiment may comprise a second electrode 1160, as shown in FIGS. 10 and 11. The second electrode 1160 may be disposed on the first insulating layer 1141. The second electrode 1160 may comprise an upper electrode 1160a disposed on an upper surface of the plurality of light emitting structures P1, P2, P3, P4, P5, . . . and a connection electrode 1160b connecting the upper electrode 1160a. The second electrode 1160 may be commonly connected to a plurality of second conductivity type DBR layers constituting the plurality of light emitting structures P1, P2, P3, P4, P5, . . . .

The second electrode 1160 may be disposed on a side surface of the first light emitting structure P1. The second electrode 1160 may be disposed on the upper surface of the first light emitting structure P1. The upper electrode 1160a of the second electrode 1160 may be disposed on the second DBR layer 1120a of the first light emitting structure P1. The upper electrode 1160a of the second electrode 1160 may be disposed in direct contact with an upper surface of the second DBR layer 1120a.

In addition, the second electrode 1160 may be disposed on a side surface of the second light emitting structure P2. The second electrode 1160 may be disposed on the upper surface of the second light emitting structure P2. The upper electrode 1160a of the second electrode 1160 may be disposed on the fourth DBR layer 1120b of the second light emitting structure P2. The upper electrode 1160a of the second electrode 1160 may be disposed in direct contact with an upper surface of the fourth DBR layer 1120b.

The second electrode 1160 may be disposed between the first light emitting structure P1 and the second light emitting structure P2. The connection electrode 1160b of the second electrode 1160 may be disposed on the first insulating layer 1141 in a region between the first light emitting structure P1 and the second light emitting structure P2.

The second electrode 1160 according to the embodiment may connect the upper surfaces of the plurality of light emitting structures P1, P2, P3, P4, . . . , as shown in FIG. 10. The second electrode 1160 may be physically connected to each second conductivity type DBR layer of the plurality of light emitting structures P1, P2, P3, P4, . . . . That is, the second electrode 1160 may be physically connected not only to the upper surface of the plurality of light emitting structures P1, P2, . . . disposed under the second bonding pad 1165, but also to the upper surface of the plurality of light emitting structures P3, P4, . . . disposed under the first bonding pad 1155.

For example, the connection electrode 1160b of the second electrode 1160 may be provided in a linear shape having a constant line width, as shown in FIG. 10. Of course, the shape of the connection electrode 1160b of the second electrode 1160 may be variously modified according to embodiments.

The semiconductor device 1200 according to the embodiment may comprise a second insulating layer 1142, as shown in FIGS. 10 and 11. The second insulating layer 1142 may be disposed on the second electrode 1160.

The second insulating layer 1142 may be disposed around the first light emitting structure P1. The second insulating layer 1142 may be disposed on the second electrode 1160 around the first light emitting structure P1. The second insulating layer 1142 may be disposed around the second light emitting structure P2. The second insulating layer 1142 may be disposed on the second electrode 1160 around the second light emitting structure P2.

In addition, the second insulating layer 1142 may be disposed between the first light emitting structure P1 and the second light emitting structure P2. The second insulating layer 1142 may be disposed on the first conductivity type DBR layer 1113. The second insulating layer 1142 may be disposed on the connection electrode 1160b of the second electrode 1160 between the first light emitting structure P1 and the second light emitting structure P2.

The second insulating layer 1142 may expose an upper surface of the second electrode 1160 disposed on the upper surface of the first light emitting structure P1. The second insulating layer 1142 may expose an upper surface of the upper electrode 1160a disposed on the upper surface of the second DBR layer 1120a. The second insulating layer 1142 may expose an upper surface of the second electrode 1160 disposed on the upper surface of the second light emitting structure P2. The second insulating layer 1142 may expose an upper surface of the upper electrode 1160a disposed on the upper surface of the fourth DBR layer 1120b.

The second insulating layer 1142 according to the embodiment may be provided to expose an upper surface of the first electrode 1150 disposed between the plurality of light emitting structures P3, P4, . . . , in a region where the first bonding pad 1155 is disposed, as shown in FIG. 10. Also, the second insulating layer 1142 may be provided to expose an upper surface of the second electrode 1160 disposed on the plurality of light emitting structures P1, P2, . . . , in a region where the second bonding pad 1165 is disposed.

In addition, according to the embodiment, the second insulating layer 1142 may be provided to expose an upper surface of the second electrode 1160 physically connecting the plurality of light emitting structures, in the region where the second bonding pad 1165 is disposed. At this time, the second insulating layer 1142 may be disposed such that the connection electrode 1160b of the second electrode 1160, having a line shape, disposed on the first conductivity type DBR layer 1113 is selectively exposed. For example, the second insulating layer 1142 may be disposed on the upper surface of the connection electrode 1160b connecting the first light emitting structure P1 and the second light emitting structure P2 such that the second electrode 1160 is not exposed. In addition, the second insulating layer 1142 may be disposed such that an upper surface of the connection electrode 1160b connecting the first light emitting structure P1 and the fifth light emitting structures P5 is exposed. The formation of the second insulating layer 1142 will be further described with reference to a method of manufacturing a semiconductor device according to an embodiment.

The semiconductor device 1200 according to the embodiment may comprise a first bonding pad 1155 and a second bonding pad 1165, as shown in FIGS. 10 and 11. According to the embodiment, the first bonding pad 1155 may be electrically connected to the first conductivity type DBR layer of the plurality of light emitting structures P1, P2, P3, P4, P5, . . . . The second bonding pad 1165 may be electrically connected to the second conductivity type DBR layer of the plurality of light emitting structures P1, P2, P3, P4, P5, . . . .

The first bonding pad 1155 may be disposed on the second insulating layer 1142. The first bonding pad 1155 may be electrically connected to the first electrode 1150. The first bonding pad 1155 may be connected to the first electrode 1150 exposed through the first insulating layer 1141 and the second insulating layer 1142 as shown in FIG. 10. The first bonding pad 1155 may be directly contacted with an upper surface of the first electrode 1150 exposed through the first insulating layer 1141 and the second insulating layer 1142 at the periphery of the third light emitting structure P3 and the periphery of the fourth light emitting structure P4.

The second bonding pad 1165 may be disposed on the second insulating layer 1142. The second bonding pad 1165 may be electrically connected to the second electrode 1160 disposed on an upper surface of the first light emitting structure P1. The second bonding pad 1165 may be disposed in direct contact with an upper surface of the upper electrode 1160a disposed on the second DBR layer 1120a. Also, the second bonding pad 1165 may be electrically connected to the second electrode 1160 disposed on an upper surface of the second light emitting structure P2. The second bonding pad 1165 may be disposed in direct contact with the upper surface of the upper electrode 1160a disposed on the fourth DBR layer 1120b.

Next, referring to FIGS. 10 and 12, the semiconductor device 1200 according to the embodiment will be further described based on a third light emitting structure P3 and a fourth light emitting structure P4 disposed under the first bonding pad 1155. FIG. 12 is a sectional view taken along line B-B of the semiconductor device according to the embodiment shown in FIG. 10. In describing the semiconductor device according to the embodiment with reference to FIGS. 10 and 12, description overlapping with those described above may be omitted. The semiconductor device 1200 according to the embodiment may comprise a plurality of light emitting structures P3, P4, . . . disposed under the first bonding pad 1155. The plurality of light emitting structures P3, P4, . . . may comprise light emitting apertures 1130c, 1130d, . . . , respectively, which emit light. The plurality of light emitting structures P3, P4, . . . may be spaced apart from each other. For example, the light emitting aperture 1130c, 1130d, . . . may be provided with a diameter in a range of several micrometers to several tens of micrometers.

The third light emitting structure P3 may comprise a fifth DBR layer 1110c of the first conductivity type, a sixth DBR layer 1120c of the second conductivity type, and a third active layer 1115c. The third active layer 1115c may be disposed between the fifth DBR layer 1110c and the sixth DBR layer 1120c. For example, the third active layer 1115c may be disposed on the fifth DBR layer 1110c, and the sixth DBR layer 1120c may be disposed on the third active layer 1115c. The third light emitting structure P3 may further comprise a third aperture layer 1117c disposed between the third active layer 1115c and the sixth DBR layer 1120c.

The fourth light emitting structure P4 may comprise a seventh DBR layer 1110d of the first conductivity type, an eighth DBR layer 1120d of the second conductivity type, and a fourth active layer 1115d. The fourth active layer 1115d may be disposed between the seventh DBR layer 1110d and the eighth DBR layer 1120d. For example, the fourth active layer 1115d may be disposed on the seventh DBR layer 1110d, and the eighth DBR layer 1120d may be disposed on the fourth active layer 1115d. The fourth light emitting structure P4 may further comprise a fourth aperture layer 1117d disposed between the fourth active layer 1115d and the eighth DBR layer 1120d.

In addition, the first conductivity type DBR layer 1113 may be disposed between the fifth DBR layer 1110c of the third light emitting structure P3 and the seventh DBR layer 1110d of the fourth light emitting structure P4. The fifth DBR layer 1110c and the seventh DBR layer 1110d may be physically connected by the first conductivity type DBR layer 1113. For example, an upper surface of the first conductivity type DBR layer 1113 and an upper surface of the fifth DBR layer 1110c may be disposed on the same horizontal plane. The upper surface of the first conductivity type DBR layer 1113 and an upper surface of the seventh DBR layer 1110d may be disposed on the same horizontal plane.

In addition, the third active layer 1115c of the third light emitting structure P3 and the fourth active layer 1115d of the fourth light emitting structure P4 may be spaced apart from each other. Also, the sixth DBR layer 1120c of the third light emitting structure P3 and the eighth DBR layer 1120d of the fourth light emitting structure P4 may be spaced apart from each other.

The semiconductor device 1200 according to the embodiment may comprise a substrate 1105 provided with a concavo-convex structure on a lower surface, as shown in FIGS. 10 and 12. The substrate 1105 may comprise, for example, a third recess R3 and a fourth recess R4.

The third recess R3 may be provided to be recessed in an upward direction from the lower surface of the substrate 1105. The third recess R3 may be disposed to overlap with the third light emitting structure P3. The third recess R3 and the third light emitting structure P3 may be overlapped with each other in a direction perpendicular to the upper surface of the substrate 1105.

The fourth recess R4 may be provided to be recessed in an upward direction from the lower surface of the substrate 1105. The fourth recess R4 may be disposed to overlap with the fourth light emitting structure P4. The fourth recess R4 and the fourth light emitting structure P4 may be disposed to overlap with each other in a direction perpendicular to the upper surface of the substrate 1105.

According to the embodiment, a width of the third recess R3 may be provided corresponding to a width of the third light emitting aperture 1130c provided in the third light emitting structure P3. In addition, the width of the third recess R3 may be provided corresponding to a diameter of the third light emitting aperture 1130c provided in the third light emitting structure P3. For example, the third light emitting aperture 1130c may be defined as a region where light is emitted in a direction perpendicular to a lower surface of the third light emitting structure P3.

In addition, a width of the fourth recess R4 may be provided corresponding to a width of the fourth light emitting aperture 1130d provided in the fourth light emitting structure P4. In addition, the width of the fourth recess R4 may be provided corresponding to a diameter of the fourth light emitting aperture 1130d provided in the fourth light emitting structure P4. For example, the fourth light emitting aperture 1130d may be defined as a region where light is emitted in a direction perpendicular to a lower surface of the fourth light emitting structure P4.

A thickness t1 of the substrate 1105 may be provided in a range of several tens of micrometers to several hundreds of micrometers. The thickness t1 of the substrate 1105 may be provided in a range of, for example, 100 micrometers to 110 micrometers.

A depth t2 of the third recess R3 and the fourth recess R4 may be provided in a range of several micrometers to several tens of micrometers. For example, the depth t2 of the third recess R3 and the fourth recess R4 may be provided in a range of 5 micrometers to 20 micrometers.

In addition, a width w1 of the third recess R3 and the fourth recess R4 may be provided of several tens of micrometers. The width w1 of the third recess R3 and the fourth recess R4 may be provided in a range of, for example, 6 micrometers to 15 micrometers.

According to another embodiment, the width w1 of the third recess R3 and the fourth recess R4 may be provided several micrometers greater than a diameter of the third light emitting aperture 1130c and the fourth light emitting aperture 1130d. For example, the width w1 of the third recess R3 and the fourth recess R4 may be provided in a range of 8 micrometers to 25 micrometers.

For example, the third recess R3 may be provided in a shape of a hole having a circular horizontal cross section in a portion under the third light emitting structure P3. The fourth recess R4 may be provided in a shape of hole having a circular horizontal cross section in a portion under the fourth light emitting structure P4. An upper surface of the third recess R3 and an upper surface of the fourth recess R4 may be provided in a planar shape, for example. The upper surface of the third recess R3 and the fourth recess R4 may be provided parallel to the upper surface of the substrate 1105, for example.

The semiconductor device 1200 according to the embodiment may comprise a first insulating layer 1141, as shown in FIGS. 10 and 12. The first insulating layer 1141 may be disposed on a side surface of the third light emitting structure P3. The first insulating layer 1141 may be disposed to surround the side surface of the third light emitting structure P3. The first insulating layer 1141 may be disposed on a side surface of the fourth light emitting structure P4. The first insulating layer 1141 may be disposed to surround the side surface of the fourth light emitting structure P4.

In addition, the first insulating layer 1141 may be disposed between the third light emitting structure P3 and the fourth light emitting structure P4. The first insulating layer 1141 may be disposed on the first conductivity type DBR layer 1113.

The first insulating layer 1141 may expose an upper surface of the third light emitting structure P3. The first insulating layer 1141 may expose an upper surface of the sixth DBR layer 1120c of the third light emitting structure P3. The first insulating layer 1141 may expose an upper surface of the fourth light emitting structure P4. The first insulating layer 1141 may expose an upper surface of the eighth DBR layer 1120d of the fourth light emitting structure P4.

The semiconductor device 1200 according to the embodiment may comprise a first electrode 1150, as shown in FIGS. 10 and 12. The first electrode 1150 may be disposed around the plurality of light emitting structures P3, P4, . . . . The first electrode 1150 may comprise a plurality of openings exposing the plurality of light emitting structures P3, P4, . . . .

The first electrode 1150 may be disposed on the first conductivity type DBR layer 1113. The first electrode 1150 may be electrically connected to the fifth DBR layer 1110c. The first electrode 1150 may be electrically connected to the seventh DBR layer 1110d. The first electrode 1150 may be disposed under the first insulating layer 1141. The first electrode 1150 may be disposed under the first insulating layer 1141 in a region between the third light emitting structure P3 and the fourth light emitting structure P4. The first electrode 1150 may be disposed between the first insulating layer 1141 and the first conductivity type DBR layer 1113 in a region between the third light emitting structure P3 and the fourth light emitting structure P4.

The semiconductor device 1200 according to the embodiment may comprise a second electrode 1160, as shown in FIGS. 10 and 12. The second electrode 1160 may be disposed on the first insulating layer 1141. The second electrode 1160 may comprise an upper electrode 1160a disposed on an upper surface of the plurality of light emitting structures P1, P2, P3, P4, P5, . . . and a connection electrode 1160b connecting the upper electrode 1160a.

The second electrode 1160 may be disposed on a side surface of the third light emitting structure P3. The second electrode 1160 may be disposed on the upper surface of the third light emitting structure P3. The upper electrode 1160a of the second electrode 1160 may be disposed on the sixth DBR layer 1120c of the third light emitting structure P3. The upper electrode 1160a of the second electrode 1160 may be disposed in direct contact with an upper surface of the sixth DBR layer 1120c.

Also, the second electrode 1160 may be disposed on a side surface of the fourth light emitting structure P4. The second electrode 1160 may be disposed on the upper surface of the fourth light emitting structure P4. The upper electrode 1160a of the second electrode 1160 may be disposed on the sixth DBR layer 1120d of the fourth light emitting structure P4. The upper electrode 1160a of the second electrode 1160 may be disposed in direct contact with an upper surface of the sixth DBR layer 1120d.

The second electrode 1160 may be disposed between the third light emitting structure P3 and the fourth light emitting structure P4. The connection electrode 1160b of the second electrode 1160 may be disposed on the first insulating layer 1141 in a region between the third light emitting structure P3 and the fourth light emitting structure P4.

The second electrode 1160 according to the embodiment may connect the upper surfaces of the plurality of light emitting structures P1, P2, P3, P4, P5, . . . as shown in FIG. 10. The second electrode 1160 may be physically connected to each second conductivity type DBR layer of the plurality of light emitting structures P1, P2, P3, P4, P5, . . . . That is, the second electrode 1160 may be physically connected not only to the upper surface of the plurality of light emitting structures P1, P2, . . . disposed under the second bonding pad 1165, but also to the upper surface of the plurality of light emitting structures P3, P4, . . . disposed under the first bonding pad 1155.

For example, the connection electrode 1160b of the second electrode 1160 may be provided in a linear shape having a constant line width, as shown in FIG. 10. Of course, the shape of the connection electrode 1160b of the second electrode 1160 may be variously modified according to embodiments.

The semiconductor device 1200 according to the embodiment may comprise a second insulating layer 1142, as shown in FIGS. 10 and 12. The second insulating layer 1142 may be disposed on the second electrode 1160. The second insulating layer 1142 may be disposed on the first insulating layer 1141.

The second insulating layer 1142 may be disposed around the third light emitting structure P3. The second insulating layer 1142 may be disposed on the second electrode 1160 around the third light emitting structure P3. The second insulating layer 1142 may be disposed around the fourth light emitting structure P4. The second insulating layer 1142 may be disposed on the second electrode 1160 around the fourth light emitting structure P4.

Also, the second insulating layer 1142 may be disposed between the third light emitting structure P3 and the fourth light emitting structure P4. The second insulating layer 1142 may be disposed on the first conductivity type DBR layer 1113. The second insulating layer 1142 may be disposed on the connection electrode 1160b of the second electrode 1160 between the third light emitting structure P3 and the fourth light emitting structure P4.

The second insulating layer 1142 may be disposed on an upper surface of the second electrode 1160 disposed on the upper surface of the third light emitting structure P3. The second insulating layer 1142 may be disposed on an upper surface of the upper electrode 1160a disposed on the upper surface of the sixth DBR layer 1120c. The second insulating layer 1142 may be disposed on an upper surface of the second electrode 1160 disposed on the upper surface of the fourth light emitting structure P4. The second insulating layer 1142 may be disposed on an upper surface of the upper electrode 1160a disposed on the upper surface of the eighth DBR layer 1120d.

The second insulating layer 1142 according to the embodiment may be provided to expose an upper surface of the first electrode 1150 disposed between the plurality of light emitting structures P3, P4, . . . , in a region where the first bonding pad 1155 is disposed, as shown in FIG. 10. Also, the second insulating layer 1142 may be provided to expose an upper surface of the second electrode 1160 disposed on the plurality of light emitting structures P1, P2, . . . , in a region where the second bonding pad 1165 is disposed.

In addition, according to the embodiment, the second insulating layer 1142 may be disposed to expose an upper surface of the second electrode 1160 that is physically connecting the plurality of the light emitting structures, in the region where the second bonding pad 1165 is disposed.

At this time, the second insulating layer 1142 may be disposed such that the connection electrode 1160b of the second electrode 1160, having a line shape, disposed on the first conductivity type DBR layer 1113 is selectively exposed. For example, the second insulating layer 1142 may be disposed on the upper surface of the connection electrode 1160b connecting the first light emitting structure P1 and the second light emitting structure P2 such that the second electrode 1160 is not exposed. In addition, the second insulating layer 1142 may be disposed such that an upper surface of the connection electrode 1160b connecting the first light emitting structure P1 and the fifth light emitting structure P5 is exposed. The formation of the second insulating layer 1142 will be further described with reference to a method of manufacturing a semiconductor device according to an embodiment.

The semiconductor device 1200 according to the embodiment may comprise a first bonding pad 1155 and a second bonding pad 1165, as shown in FIGS. 10 and 12. According to the embodiment, the first bonding pad 1155 may be electrically connected to the first conductivity type DBR layer of the plurality of light emitting structures P1, P2, P3, P4, P5, . . . . The second bonding pad 1165 may be electrically connected to the second conductivity type DBR layer of the plurality of light emitting structures P1, P2, P3, P4, P5, . . . .

The first bonding pad 1155 may be disposed on the second insulating layer 1142. The first bonding pad 1155 may be electrically connected to the first electrode 1150. The first bonding pad 1155 may be connected to the first electrode 1150 exposed through the first insulating layer 1141 and the second insulating layer 1142 as shown in FIG. 10. The electrical connection between the first bonding pad 1155 and the first electrode 1150 according to the embodiment will be further described with reference to FIG. 4.

The second bonding pad 1165 may be disposed on the second insulating layer 1142. The second bonding pad 1165 may be electrically connected to the second electrode 1160 disposed on the upper surface of the third light emitting structure P3 and disposed on the upper surface of the fourth light emitting structure P4.

Next, referring to FIGS. 10 and 13, the semiconductor device 1200 according to the embodiment will be further described based on the third light emitting structure P3 disposed under the first bonding pads 1155. FIG. 13 is a sectional view taken along line C-C of the semiconductor device according to the embodiment shown in FIG. 10. In describing the semiconductor device according to the embodiment with reference to FIGS. 10 and 13, description overlapping with those described with reference to FIGS. 10 to 12 may be omitted.

The semiconductor device 1200 according to the embodiment may comprise a plurality of light emitting structures P3, P4, . . . disposed under the first bonding pad 1155. The third light emitting structure P3 according to the embodiment may comprise a fifth DBR layer 1110c of the first conductivity type, a sixth DBR layer 1120c of the second conductivity type, and a third active layer 1115c.

As shown in FIG. 13, the semiconductor device 1200 according to the embodiment may comprise a first conductivity type DBR layer 1113 extending from the fifth DBR layer 1110c in the circumferential direction of the third light emitting structure P3. The first conductivity type DBR layer 1113 may be physically connected to the fifth DBR layer 1110c. For example, an upper surface of the first conductivity type DBR layer 1113 and an upper surface of the fifth DBR layer 1110*c* may be disposed on the same horizontal plane.

In addition, the semiconductor device 1200 according to the embodiment may comprise the first electrode 1150, as shown in FIGS. 10 and 13. The first electrode 1150 may be disposed around the third light emitting structure P3 and the fourth light emitting structure P4. The first electrode 1150 may comprise a plurality of openings exposing the plurality of light emitting structures P1, P2, P3, P4, P5, . . . .

The first electrode 1150 may be disposed on the first conductivity type DBR layer 1113. The first electrode 1150 may be electrically connected to the fifth DBR layer 1110*c*. The first electrode 1150 may be disposed on the first conductivity type DBR layer 1113 around the third light emitting structure P3.

The semiconductor device 1200 according to the embodiment may comprise a first insulating layer 1141, as shown in FIGS. 10 and 13. The first insulating layer 1141 may be disposed on a side surface of the third light emitting structure P3. The first insulating layer 1141 may be disposed to surround the side surface of the third light emitting structure P3. The first insulating layer 1141 may expose the upper surface of the third light emitting structure P3. The first insulating layer 1141 may expose an upper surface of the sixth DBR layer 1120*c* of the third light emitting structure P3. The first insulating layer 1141 may be disposed on the first electrode 1150.

Meanwhile, according to the semiconductor device 1200 of the embodiment, as shown in FIG. 13, the first insulating layer 1141 may expose a portion of the first electrode 1150. The first insulating layer 1141 may comprise an opening exposing an upper surface of the first electrode 1150 in the periphery of the third light emitting structure P3. The first insulating layer 1141 may expose the upper surface of the first electrode 1150 disposed on the first conductivity type DBR layer 1113 in the periphery of the third light emitting structure P3.

The semiconductor device 1200 according to the embodiment may comprise a second electrode 1160, as shown in FIGS. 10 and 13. The second electrode 1160 may be electrically connected to the second conductivity type DBR layer of the plurality of light emitting structures P1, P2, P3, P4, P5, . . . . The second electrode 1160 may comprise an upper electrode 1160*a* disposed on the upper surface of the plurality of light emitting structures P1, P2, P3, P4, P5, . . . and a connection electrode 1160*b* connecting the upper electrode 1160*a*.

The second electrode 1160 may be disposed on the upper surface of the third light emitting structure P3. The upper electrode 1160*a* of the second electrode 1160 may be disposed on the sixth DBR layer 1120*c* of the third light emitting structure P3. The upper electrode 1160*a* of the second electrode 1160 may be disposed in direct contact with an upper surface of the sixth DBR layer 1120*c*.

The connection electrode 1160*b* of the second electrode 1160 according to the embodiment may connect the upper surfaces of the plurality of light emitting structures P1, P2, P3, P4, P5, . . . . The second electrode 1160 may be physically connected to each second conductivity type DBR layer of the plurality of light emitting structures P1, P2, P3, P4, P5, . . . . That is, the second electrode 1160 may be physically connected not only to the upper surface of the plurality of light emitting structures P1, P2, . . . disposed under the second bonding pad 1165, but also to the upper surface of the plurality of light emitting structures P3, P4, . . . disposed under the first bonding pad 1155.

For example, the connection electrode 1160*b* of the second electrode 1160 may be provided in a linear shape having a constant line width, as shown in FIG. 10. Of course, the shape of the connection electrode 1160*b* of the second electrode 1160 may be variously modified according to embodiments.

The semiconductor device 1200 according to the embodiment may comprise a second insulating layer 1142, as shown in FIGS. 10 and 13. The second insulating layer 1142 may be disposed on the second electrode 1160. The second insulating layer 1142 may be disposed on the first insulating layer 1141.

The second insulating layer 1142 may be disposed around the third light emitting structure P3. The second insulating layer 1142 may be disposed on the first insulating layer 1141 around the third light emitting structure P3. The second insulating layer 1142 may be disposed on the third light emitting structure P3. The second insulating layer 1142 may be disposed on the second electrode 1160 that is disposed on the sixth DBR layer 1120*c*.

Meanwhile, according the semiconductor device 1200 of the embodiment, as shown in FIG. 13, the second insulating layer 1142 may comprise an opening exposing a portion of the first electrode 1150. The second insulating layer 1142 may expose an upper surface of the first electrode 1150 at the periphery of the third light emitting structure P3. The second insulating layer 1142 may expose the upper surface of the first electrode 1150 disposed on the first conductivity type DBR layer 1113 in the periphery of the third light emitting structure P3. For example, the opening provided by the second insulating layer 1142 may be disposed on a region between the connection electrodes 1160*b*.

As shown in FIGS. 10 and 13, the second insulating layer 1142 according to the embodiment may be provided to expose an upper surface of the first electrode 1150 between the plurality of light emitting structures P3, P4, . . . , in a region where the first bonding pad 1155 is disposed. Also, the second insulating layer 1142 may be provided to expose an upper surface of the second electrode 1160 disposed on the plurality of light emitting structures P1, P2, . . . , in a region where the second bonding pad 1165 is disposed.

In addition, according to the embodiment, the second insulating layer 1142 may be disposed to expose an upper surface of the second electrode 1160 that is physically connecting the plurality of the light emitting structures, in the region where the second bonding pad 1165 is disposed. At this time, the second insulating layer 1142 is disposed such that the connection electrode 1160*b* of the second electrode 1160, having a line shape, disposed on the first conductivity type DBR layer 1113 is selectively exposed. For example, the second insulating layer 1142 may be disposed on the upper surface of the connection electrode 1160*b* that is connecting the first light emitting structure P1 and the second light emitting structure P2 such that the second electrode 1160 is not exposed. In addition, the second insulating layer 1142 may be disposed such that an upper surface of the connection electrode 1160*b* that is connecting the first light emitting structure P1 and the fifth light emitting structure P5 is exposed. The formation of the second insulating layer 1142 will be further described with reference to a method of manufacturing a semiconductor device according to an embodiment.

The semiconductor device 1200 according to the embodiment may comprise a first bonding pad 1155 and a second bonding pad 1165, as shown in FIGS. 10 and 13. According to the embodiment, the first bonding pad 1155 may be electrically connected to the first conductivity type DBR layer of the plurality of light emitting structures P1, P2, P3, P4, P5, . . . . The second bonding pad 1165 may be electrically connected to the second conductivity type DBR layer of the plurality of light emitting structures P1, P2, P3, P4, P5, . . . .

The first bonding pad 1155 may be disposed on the second insulating layer 1142. The first bonding pad 1155 may be electrically connected to the first electrode 1150. The first bonding pad 1155 may be disposed on the third light emitting structure P3, as shown in FIGS. 10 and 13. The first bonding pad 1155 may be connected to the first electrode 1150 through an opening provided by the first insulating layer 1141 and the second insulating layer 1142. For example, the opening provided by the first insulating layer 1141 and the second insulating layer 1142 may be disposed in a region between the connection electrodes 1160b.

The first bonding pad 1155 may be connected to the first electrode 1150 disposed on the first conductivity type DBR layer 1113 in the periphery of the third light emitting structure P3. The first bonding pad 1155 may be disposed in direct contact with an upper surface of the first electrode 1150 disposed on the first conductivity type DBR layer 1113. For example, a lower surface of the first bonding pad 1155 may be disposed in direct contact with the upper surface of the first electrode 1150 disposed on the first conductivity type DBR layer 1113.

The second bonding pad 1165 may be disposed on the second insulating layer 1142. The second bonding pad 1165 may be electrically connected to the second electrode 1160 disposed on the upper surface of the third light emitting structure P3. For example, a lower surface of the second bonding pad 1165 may be disposed in direct contact with an upper surface of the upper electrode 1160a disposed on the third light emitting structure P3.

Next, referring to FIGS. 10, 11, and 13, the semiconductor device 1200 according to the embodiment will be further described based on the third light emitting structure P3 disposed under the first bonding pad 1155 and a first light emitting structure P1 disposed under the second bonding pad 1165. Description overlapping with those described above may be omitted.

The semiconductor device 1200 according to the embodiment may comprise a plurality of light emitting structures P3, P4, . . . disposed under the first bonding pad 1155, as shown in FIGS. 10 and 13. The third light emitting structure P3 according to the embodiment may comprise a fifth DBR layer 1110c of the first conductivity type, a sixth DBR layer 1120c of the second conductivity type, and a third active layer 1115c.

The semiconductor device 1200 according to the embodiment may comprise a plurality of light emitting structures P1, P2, . . . disposed under the second bonding pad 1165 as shown in FIGS. 10 and 11. The first light emitting structure P1 according to the embodiment may comprise a first DBR layer 1110a of the first conductivity type, a second DBR layer 1120a of the second conductivity type, and a first active layer 1115a.

In addition, the semiconductor device 1200 according to the embodiment may comprise a first electrode 1150 and a second electrode 1160. The first electrode 1150 may comprise a plurality of openings exposing the plurality of light emitting structures P1, P2, P3, P4, P5, . . . . The second electrode 1160 may comprise an upper electrode 1160a disposed on an upper surface of the plurality of light emitting structures P1, P2, P3, P4, P5, . . . and a connection electrode 1160b connecting the upper electrode 1160a.

The first electrode 1150 may be electrically connected to the first DBR layer 1110a and the fifth DBR layer 1110c. The first electrode 1150 may be disposed around the first light emitting structure P1. The first electrode 1150 may be disposed around the third light emitting structure P3. The first electrode 1150 may be disposed between the first light emitting structure P1 and the third light emitting structure P3.

The second electrode 1160 may be electrically connected to the second DBR layer 1120a and the sixth DBR layer 1120c. The second electrode 1160 may be disposed on a side surface of the first light emitting structure P1. The second electrode 1160 may be disposed on an upper surface of the second DBR layer 1120a. For example, a lower surface of the upper electrode 1160a may be disposed in direct contact with the upper surface of the second DBR layer 1120a. The second electrode 1160 may be disposed on an upper surface of the sixth DBR layer 1120c. For example, a lower surface of the upper electrode 1160a may be disposed in direct contact with the upper surface of the sixth DBR layer 1120c.

The first bonding pad 1155 according to the embodiment may be disposed on the third light emitting structure P3, as shown in FIGS. 10 and 13. The first bonding pad 1155 may be electrically connected to the first electrode 1150. For example, a lower surface of the first bonding pad 1155 may be disposed in direct contact with an upper surface of the first electrode 1150.

The second bonding pad 1165 according to the embodiment may be disposed on the first light emitting structure P1 as shown in FIGS. 10 and 11. The second bonding pad 1165 may be electrically connected to the second electrode 1160. For example, a lower surface of the second bonding pad 1165 may be disposed in direct contact with an upper surface of the second electrode 1160.

Meanwhile, the second electrode 1160 according to the embodiment may be disposed in contact with an upper surface of the second DBR layer 1120a, as shown in FIG. 11. For example, a lower surface of the upper electrode 1160a of the second electrode 1160 may be disposed in direct contact with the upper surface of the second DBR layer 1120a. In addition, the second electrode 1160 according to the embodiment may be disposed in contact with an upper surface of the sixth DBR layer 1120c, as shown in FIG. 13. For example, a lower surface of the upper electrode 1160a of the second electrode 1160 may be disposed in direct contact with the upper surface of the sixth DBR layer 1120c.

In addition, as shown in FIGS. 10 and 11, the second electrode 1160 may be disposed on the first electrode 1150 between the first light emitting structure P1 and the third light emitting structure P3. The second electrode 1160 may be disposed on the first electrode 1150 around the first light emitting structure P1. The connection electrode 1160b may be disposed on the first electrode 1150 around the first light emitting structure P1. The second electrode 1160 may be disposed on the first conductivity type DBR layer 1113 around the first light emitting structure P1. The connection electrode 1160b may be disposed on the first conductivity type DBR layer 1113 around the first light emitting structure P1.

The first conductivity type DBR layer 1113 may physically connect the first DBR layer 1110a and the fifth DBR layer 1110c. The first electrode 1150 may be disposed in contact with an upper surface of the first conductivity type DBR layer 1113. For example, a lower surface of the first electrode 1150 may be disposed in direct contact with the upper surface of the first conductivity type DBR layer 1113.

According to the embodiment, the first bonding pad 1155 may be disposed in contact with an upper surface of the first electrode 1150 in a region where the first conductivity type DBR layer 1113 is provided. For example, in the region where the first conductivity type DBR layer 1113 is provided, a lower surface of the first bonding pad 1155 may be disposed in direct contact with the upper surface of the first electrode 1150.

The first bonding pad 1155 may be in direct contact with an upper surface of the first electrode 1150 through an opening provided by the first insulating layer 1141 and the second insulating layer 1142. For example, the opening provided by the first insulating layer 1141 and the second insulating layer 1142 may be disposed in a region between the connection electrodes 1160b.

According to the semiconductor device 1200 of the embodiment, power may be supplied to the plurality of light emitting structures P1, P2, P3, P4, P5, . . . through the first bonding pad 1155 and the second bonding pad 1165. Also, the first electrode 1150 may be disposed on an upper surface of the first conductivity type DBR layer of the plurality of light emitting structures P1, P2, P3, P4, P5, . . . . Also, the second electrode 1160 may be disposed on an upper surface of the second conductivity type DBR layer of the plurality of light emitting structures P1, P2, P3, P4, P5, . . . .

Accordingly, according to the embodiment, when power is supplied to the plurality of light emitting structures P1, P2, P3, P4, P5, . . . , power does not need to be applied through a lower surface of the substrate 1105. In a conventional semiconductor device, when power is to be applied through the lower surface of the substrate, the substrate 1105 must be provided as a conductive substrate. However, according to the semiconductor device 1200 of the embodiment, the substrate 1105 may be a conductive substrate or an insulating substrate. For example, the substrate 1105 according to the embodiment may be provided as an intrinsic semiconductor substrate.

In addition, the substrate 1105 may be a support substrate attached to the plurality of light emitting structures P1, P2, P3, P4, P5, . . . , in which the support substrate may be attached after the plurality of light emitting structures P1, P2, P3, P4, P5, . . . are grown on a growth substrate and the growth substrate is removed.

Meanwhile, the semiconductor device 1200 according to the embodiment may be implemented such that light is emitted in a lower direction of the semiconductor device 1200, as shown in FIGS. 10 to 13. That is, according to the semiconductor device 1200 of the embodiment, light can be emitted in a direction in which the first conductivity type DBR layer is disposed from the active layer constituting the plurality of light emitting structures P1, P2, P3, P4, P5, . . . . Light may be emitted from the active layer constituting the plurality of light emitting structures P1, P2, P3, P4, P5, . . . in the direction in which the substrate 1105 is disposed.

According to the embodiment, the second electrode 1160 is disposed on the upper surface of the second conductivity type DBR layer of the plurality of light emitting structures P1, P2, P3, P4, P5, . . . , and the second bonding pad 1165 is disposed on and in contact with the second electrode 1160. Also, the first electrode 1150 is disposed on the upper surface of the first conductivity type DBR layer of the plurality of light emitting structures P1, P2, P3, P4, P5, . . . , and the first bonding pad 1155 is disposed on and in contact with the first electrode 1150. Accordingly, heat generated in the plurality of light emitting structures P1, P2, P3, P4, P5, . . . can be effectively dissipated to the outside through the first bonding pad 1155 and the second bonding pad 1165.

Meanwhile, in the case of a general semiconductor device, it is known that the power conversion efficiency (PCE) is significantly lowered due to the heat generated in the light emitting structure. When power is supplied to the light emitting structure through the substrate disposed at the lower portion, generally heat dissipation is performed through the substrate. However, since the thermal conductivity of the substrate is low, it is difficult to dissipate the heat generated in the light emitting structure to the outside. For example, it is known that the thermal conductivity of a GaAs substrate is as low as 52 W/(m*K).

However, according to the embodiment, since the first bonding pad 1155 and the second bonding pad 1165 may be connected to the external heat dissipating substrate or the like, so that the heat generated in the plurality of light emitting structures P1, P2, P3, P4, P5, . . . can be effectively dissipated to the outside. Therefore, according to the embodiment, since the heat generated in the semiconductor device 1200 can be effectively dissipated to the outside, so that the power conversion efficiency (PCE) can be improved.

Meanwhile, according to the semiconductor device 1200 of the embodiment, as described above, light can be emitted in a downward direction of the semiconductor device 1200. According to the semiconductor device 1200 of the embodiment, the reflectance of the first conductivity type DBR layer provided in a lower portion of the plurality of light emitting structures P1, P2, P3, P4, P5, . . . can be selected to be smaller than the reflectance of the second conductivity type DBR layer provided in an upper portion of the plurality of light emitting structures P1, P2, P3, P4, P5, . . . . Accordingly, light generated in the plurality of light emitting structures P1, P2, P3, P4, P5, . . . can be emitted toward the substrate 1105 of the semiconductor device 1200.

In addition, according to the semiconductor device 1200 of the embodiment, the first insulating layer 1141 may be provided as a DBR layer. According to the semiconductor device 1200 of the embodiment, the second insulating layer 1142 may be provided as a DBR layer. According to the embodiment, at least one of the first insulating layer 1141 and the second insulating layer 1142 may be provided as a DBR layer. Accordingly, the light generated in the plurality of light emitting structures P1, P2, P3, P4, P5, . . . is reflected by the first insulating layer 1141 and the second insulating layer 1142 disposed at the upper portion, and can be effectively extracted downward.

For example, at least one of the first insulating layer 1141 and the second insulating layer 1142 may be provided as a DBR layer formed by stacking $SiO_2$ and $TiO_2$ as a plurality of layers. Also, at least one of the first insulating layer 1141 and the second insulating layer 1142 may be provided as a DBR layer formed by stacking $Ta_2O_3$ and $SiO_2$ as a plurality of layers. Also, at least one of the first insulating layer 1141 and the second insulating layer 1142 may be provided as a DBR layer formed by stacking $SiO_2$ and $Si_3N_4$ as a plurality of layers.

Meanwhile, in the conventional semiconductor device, when the power is supplied to the light emitting structure through the substrate, the substrate must be conductive. Accordingly, when a conductive semiconductor substrate is applied, a dopant is added to the substrate to improve the conductivity. However, the dopant added to the substrate causes absorption and scattering of the emitted light, which may cause a decrease in power conversion efficiency (PCE).

However, according to the semiconductor device 1200 of the embodiment, as described above, the substrate 1105 may not be a conductive substrate, so that an additional dopant may not be added to the substrate 1105. Accordingly, since the dopant is not added to the substrate 1105 according to the embodiment, absorption and scattering by the dopant in the substrate 1105 can be reduced. Therefore, according to the embodiment, light generated in the plurality of light emitting structures P1, P2, P3, P4, P5, . . . can be effectively provided in a downward direction, and power conversion efficiency (PCE) can be improved.

In addition, according to the semiconductor device 1200 of the embodiment, light can be emitted through the concavo-convex structure provided on the lower surface of the substrate 1105. That is, according to the embodiment, light is emitted in a downward direction of the substrate 1105, and the optical path length of light transmitted through the substrate 1105 can be shortened. Accordingly, it is possible to reduce the phenomenon of absorption and scattering of light generated in the plurality of light emitting structures P1, P2, P3, P4, P5, . . . while passing through the substrate 1105. Therefore, according to the embodiment, light generated in the plurality of light emitting structures P1, P2, P3, P4, P5, . . . can be effectively provided in a downward direction, and power conversion efficiency (PCE) can be improved.

In addition, the semiconductor device 1200 according to the embodiment may further comprise an anti-reflection layer 1170 provided on the lower surface of the substrate 1105. The anti-reflection layer 1170 can prevent light emitted from the semiconductor device 1200 from being reflected on the surface of the substrate 1105, and transmit the light, thereby improving light loss due to reflection.

The anti-reflection layer 1170 may be formed of, for example, an anti-reflection coating film and attached to the surface of the substrate 1105. Also, the anti-reflection layer 1170 may be formed on the surface of the substrate 1105 by spin coating or spray coating. For example, the anti-reflection layer 1170 may be formed as a single layer or a multilayer including at least one of a group including $TiO_2$, $SiO_2$, $Al_2O_3$, $Ta_2O_3$, $ZrO_2$, and $MgF_2$.

Meanwhile, in the case of a conventional semiconductor device, as a method for providing power to a plurality of light emitting structures, a bonding pad is disposed in an outer region on the upper surface of the substrate. Thus, a loss occurs in which the light emitting structure can not be formed by the region where the bonding pads are disposed.

However, according to the semiconductor device of the embodiment, since the bonding pad is provided on the region where the light emitting structure is formed, an additional space for forming the bonding pad may not be provided in the outer region on the substrate. Thus, according to the semiconductor device of the embodiment, the area of the substrate on which the semiconductor device is formed can be reduced, so that the number of semiconductor devices that can be manufactured with respect to the same area of the wafer can be increased.

Hereinafter, a method of manufacturing a semiconductor device according to an embodiment of the present invention will be described with reference to the drawings. In describing the method of manufacturing the semiconductor device according to the embodiment, descriptions overlapping with those described with reference to FIGS. 10 to 13 may be omitted.

First, FIGS. 14a to 14d are views showing an example in which a light emitting structure is formed in the method of manufacturing the semiconductor device according to the embodiment of the present invention. FIG. 14a is a plan view showing a step of forming a light emitting structure according to the method of manufacturing the semiconductor device of the embodiment, FIG. 14b is a sectional view taken along line A-A of the semiconductor device according to the embodiment shown in FIG. 14a, and FIG. 14c is a sectional view taken along line B-B of the semiconductor device according to the embodiment shown in FIG. 14a.

According to the method of manufacturing the semiconductor device of the embodiment, a plurality of light emitting structures P1, P2, P3, P4, P5, . . . may be formed on a substrate 1105, as shown in FIGS. 14a to 14d.

The substrate 1105 may be any one selected from an intrinsic semiconductor substrate, a conductive substrate, and an insulating substrate. For example, the substrate 1105 may be a GaAs intrinsic semiconductor substrate. The substrate 1105 may be provided with at least one selected from the conductive material including copper (Cu), gold (Au), nickel (Ni), molybdenum (Mo), copper-tungsten (Cu—W), and a carrier wafer such as Si, Ge, AlN, GaAs, ZnO, SiC, and the like.

For example, a first conductivity type DBR layer, an active layer, and a second conductivity type DBR layer may be sequentially formed on the substrate 1105. The plurality of light emitting structures P1, P2, P3, P4, P5, . . . may be formed through mesa etching for the second conductivity type DBR layer and the active layer.

The plurality of light emitting structures P1, P2, P3, P4, . . . may comprise a first conductivity type DBR layer 1110a, 1110b, 1110c, 1110d, . . . , an active layer 1115a, 1115b, 1115c, 1115d, . . . an aperture layer 1117a, 1117b, 1117c, 1117d, . . . , and a second conductivity type DBR layer 1120a, 1120b, 1120c, 1120d, . . . . A first conductivity type DBR layer 1113 may be provided around the plurality of light emitting structures P1, P2, P3, P4, P5, . . . . The first conductivity type DBR layer 1113 may be disposed in a region between the plurality of light emitting structures P1, P2, P3, P4, P5, . . . .

For example, the plurality of light emitting structures P1, P2, P3, P4, . . . may be grown as a plurality of compound semiconductor layers. The plurality of light emitting structures P1, P2, P3, P4, . . . may be formed by an electron beam evaporator, physical vapor deposition (PVD), chemical vapor deposition (CVD), plasma laser deposition (PLD), dual-type thermal evaporator, sputtering, metal organic chemical vapor deposition (MOCVD), or the like.

The first conductivity type DBR layer 1110a, 1110b, 1110c, 1110d, . . . constituting the plurality of light emitting structures P1, P2, P3, P4, . . . may be provided of at least one of a Group III-V or a Group II-VI compound semiconductor doped with a dopant of the first conductivity type. For example, the first conductivity type DBR layer 1110a, 1110b, 1110c, 1110d, . . . may be one of a group including GaAs, GaAl, InP, InAs, and GaP. The first conductivity type DBR layer 1110a, 1110b, 1110c, 1110d, . . . may be provided of semiconductor material having a compositional formula of $Al_xGa_{1-x}As$ $(0<x<1)/Al_yGa_{1-y}As$ $(0<y<1)(y<x)$, for example. The first conductivity type DBR layer 1110a, 1110b, 1110c, 1110d, . . . may be n-type semiconductor layer doped with the first conductivity type dopant that is an n-type dopant such as Si, Ge, Sn, Se, Te, or the like. The first conductivity type DBR layer 1110a, 1110b, 1110c, 1110d, . . . may be a DBR layer having a thickness of $\lambda/4n$ by alternately arranging different semiconductor layers.

The active layer 1115a, 1115b, 1115c, 1115d, . . . constituting the plurality of light emitting structures P1, P2, P3, P4, . . . may be provided of at least one of a Group III-V or a Group II-VI compound semiconductors. For example, the active layer 1115a, 1115b, 1115c, 1115d, . . . may be one of a group including GaAs, GaAl, InP, InAs, and GaP. When the active layer 1115a, 1115b, 1115c, 1115d, . . . is implemented in a multi-well structure, the active layer 1115a, 1115b, 1115c, 1115d, . . . may comprise alternately arranged a plurality of well layers and a plurality of barrier layers. The plurality of well layers may be provided of a semiconductor material having a composition formula of $In_pGa_{1-p}As$ (0≤p≤1), for example. The barrier layer may be disposed of a semiconductor material having a composition formula of, for example, $In_qGa_{1-q}As$ (0≤q≤1).

The aperture layer 1117a, 1117b, 1117c, 1117d, . . . constituting the plurality of light emitting structures P1, P2, P3, P4, . . . may be disposed on the active layer 1115a, 1115b, 1115c, 1115d, . . . . The aperture layer 1117a, 1117b, 1117c, 1117d, . . . may comprise circular opening at the central portion. The aperture layer 1117a, 1117b, 1117c, 1117d, . . . may comprise a function of restricting current movement so as to concentrate current to the central portion of the active layer 1115a, 1115b, 1115c, 1115d, . . . . That is, the aperture layer 1117a, 1117b, 1117c, 1117d, . . . can adjust the resonance wavelength and adjust the beam angle to emit light in the vertical direction from the active layer 115a, 115b, 115c, 1175, . . . . The aperture layer 1117a, 1117b, 1117c, 1117d, . . . may comprise an insulating material such as $SiO_2$ or $Al_2O_3$. The aperture layer 1117a, 1117b, 1117c, 1117d, . . . may have a higher band gap energy than the active layer 1115a, 1115b, 1115c, 1115d, . . . , the first conductivity type DBR layer 1110a, 1110b, 1110c, 1110d, . . . , and the second conductivity type DBR layer 1120a, 1120b, 1120c, 1120d, . . . .

The second conductivity type DBR layer 1120a, 1120b, 1120c, 1120d, . . . constituting the plurality of light emitting structures P1, P2, P3, P4, . . . may be provided of at least one of a Group III-V or a Group II-VI compound semiconductors doped with a dopant of the second conductivity type. For example, the second conductivity type DBR layer 1120a, 1120b, 1120c, 1120d, . . . may be one of a group including GaAs, GaAl, InP, InAs, and GaP. The second conductivity type DBR layer 1120a, 1120b, 1120c, 1120d, . . . may be formed of a semiconductor material having a composition formula of $Al_xGa_{1-x}As$ (0<x<1)/ $Al_yGa_{1-y}As$ (0<y<1)(y<x). The second conductivity type DBR layer 1120a, 1120b, 1120c, 1120d, . . . may be a p-type semiconductor layer having the second conductivity type dopant that is a p-type dopant such as Mg, Zn, Ca, Sr, and Ba. The second conductivity type DBR layer 1120a, 1120b, 1120c, 1120d, . . . may be a DBR layer having a thickness of λ/4n by alternately arranging different semiconductor layers.

For example, the second conductivity type DBR layer 1120a, 1120b, 1120c, 1120d, . . . may have a higher reflectance than the first conductivity type DBR layer 1110a, 1110b, 1110c, 1110d, . . . . For example, the second conductivity type DBR layer 1120a, 1120b, 1120c, 1120d, . . . and the first conductivity type DBR layer 1110a, 1110b, 1110c, 1110d, . . . can form a resonant cavity in the vertical direction by a reflectance of 90% or more. At this time, the generated light can be emitted to the outside through the first conductivity type DBR layer 1110a, 1110b, 1110c, 1110d, . . . , which is lower than the reflectance of the second conductivity type DBR layer 1120a, 1120b, 1120c, 1120d, . . . .

Next, as shown in FIGS. 15a to 15d, a first electrode 1150 may be formed.

FIGS. 15a to 15d are views showing an example in which the first electrode is formed in the method of manufacturing the semiconductor device according to the embodiment of the present invention. FIG. 15a is a plan view showing a step of forming the first electrode according to the method of manufacturing the semiconductor device of the embodiment, FIG. 15b is a sectional view taken along line A-A of the semiconductor device according to the embodiment shown in FIG. 15a, FIG. 15c is a sectional view taken along line B-B of the semiconductor device according to the embodiment shown in FIG. 15a, and FIG. 15d is a sectional view taken along line C-C of the semiconductor device according to the embodiment shown in FIG. 15a.

According to the embodiment, the first electrode 1150 may be formed around the plurality of light emitting structures P1, P2, P3, P4, P5, . . . , as shown in FIGS. 15a to 15d. The first electrode 1150 may be formed on the first conductivity type DBR layer 1113 and may comprise an opening exposing the plurality of light emitting structures P1, P2, P3, P4, P5, . . . . The first electrode 1150 may be formed in a region between the plurality of light emitting structures P1, P2, P3, P4, P5, . . . .

For example, an area Ae of the first electrode 1150 may be larger than an area Am of the plurality of light emitting structures P1, P2, P3, P4, P5, . . . . Here, the area Am of the plurality of light emitting structures P1, P2, P3, P4, P5, . . . may indicate the area of the remaining active layer 1115a, 1115b, 1115c, 1115d, . . . without being etched by the mesa etching. A ratio of Am/Ae, that is the area Am of the plurality of light emitting structures P1, P2, P3, P4, P5, . . . with reference to the area Ae of the first electrode 1150, may be provided larger than 25%, for example. According to the semiconductor device 1200 of the embodiment, the number and the diameter of the plurality of light emitting structures P1, P2, P3, P4, P5, . . . may be variously modified according to the application example.

According to the embodiment, the ratio of Am/Ae, that is the area Am of the plurality of light emitting structures P1, P2, P3, P4, P5, . . . with reference to the area Ae of the first electrode 1150, may be provided of, for example, in a range of 25% to 70%. According to the another embodiment, the ratio of Am/Ae, that is the area Am of the plurality of light emitting structures P1, P2, P3, P4, P5, . . . with reference to the area Ae of the first electrode 1150, may be provided of, for example, in a range of 30% to 60%.

The number and diameter of the plurality of light emitting structures P1, P2, P3, P4, P5, . . . disposed in the semiconductor device 1200 can be changed variously according to the application example of the semiconductor device 1200 of the embodiment. [Table described above shows data on semiconductor devices provided with 621 light emitting structures as one example.

For example, the first electrode 1150 may be formed of selected material from a group including Ag, Ni, Al, Rh, Pd, Ir, Ru, Mg, Zn, Pt, Au, Hf, Ti, W, Cr, and those alloys including two or more materials above. The first electrode 1150 may be formed of one layer or a plurality of layers. As the first electrode 1150, a plurality of metal layers may be applied as a reflective metal, and Cr, Ti or the like may be applied as an adhesive layer. For example, the first electrode 1150 may be formed of a Cr/Al/Ni/Au/Ti layer.

Then, as shown in FIGS. 16a to 16d, a first insulating layer 1141 may be formed on the first electrode 1150.

FIGS. 16a to 16d are views showing an example in which the first insulating layer is formed in the method of manufacturing the semiconductor device according to the embodiment of the present invention. FIG. 16a is a plan view showing a step of forming the first insulating layer according to the method of manufacturing the semiconductor device according to the embodiment, FIG. 16b is a sectional view taken along line A-A of the semiconductor device according to the embodiment shown in FIG. 16a, 16c is a sectional view taken along line B-B of the semiconductor device according to the embodiment shown in FIG. 16a, and FIG. 16d is a sectional view taken along line C-C of the semiconductor device according to the embodiment shown in FIG. 16a.

According to the embodiment, as shown in FIGS. 16a to 16d, the first insulating layer 1141 exposing an upper surfaces of the plurality of light emitting structures P1, P2, P3, P4, P5, . . . may be formed on the first electrode 1150. The first insulating layer 1141 may be formed on side surfaces of the plurality of light emitting structures P1, P2, P3, P4, P5, . . . . The first insulating layer 1141 may be formed on the first conductivity type DBR layer 1113. The first insulating layer 1141 may be formed in a region between the plurality of light emitting structures P1, P2, P3, P4, P5, . . . .

The first insulating layer 1141 may be provided as an insulating material. For example, the first insulating layer 1141 may be formed of at least one material selected from a group including $SiO_2$, $TiO_2$, $Ta_2O_5$, $SiO_x$, $SiO_xN_y$, $Si_3N_4$, and $Al_2O_3$. In addition, the first insulating layer 1141 may be formed of a DBR layer. According to the embodiment, since the first insulating layer 1141 is provided as a DBR layer, light generated in the plurality of light emitting structures P1, P2, P3, P4, P5, . . . can be efficiently reflected and extracted downward. For example, the first insulating layer 1141 may be provided as a DBR layer formed by stacking $SiO_2$ and $TiO_2$ as a plurality of layers. In addition, the first insulating layer 1141 may be provided as a DBR layer formed by stacking $Ta_2O_3$ and $SiO_2$ as a plurality of layers. In addition, the first insulating layer 1141 may be provided as a DBR layer formed by stacking $SiO_2$ and $Si_3N_4$ as a plurality of layers.

In addition, as shown in FIGS. 17a to 17d, a second electrode 1160 may be formed on the first insulating layer 1141.

FIGS. 17a to 17d are views showing an example in which the second electrode is formed in the method of manufacturing the semiconductor device according to the embodiment of the present invention. FIG. 17a is a plan view showing a step of forming the second electrode according to the method of manufacturing the semiconductor device according to the embodiment, FIG. 17b is a sectional view taken along line A-A of the semiconductor device according to the embodiment shown in FIG. 17a, 17c is a sectional view taken along line B-B of the semiconductor device according to the embodiment shown in FIG. 17a, and FIG. 17d is a sectional view taken along line C-C of the semiconductor device according to the embodiment shown in FIG. 17a.

According to the embodiment, as shown in FIGS. 17a to 17d, the second electrode 1160 comprising an upper electrode 1160a and a connection electrode 1160b may be formed on the first insulating layer 1141. The upper electrode 1160a may be formed on upper surfaces of the plurality of light emitting structures P1, P2, P3, P4, P5, . . . exposed by the first insulating layer 1141. The connection electrode 1160b may connect the upper electrode 1160a.

The upper electrode 1160a may be formed on an upper surface of the second conductivity type DBR layer constituting the plurality of light emitting structures P1, P2, P3, P4, P5, . . . . The connection electrode 1160b may connect the upper electrodes 1160a disposed on the plurality of light emitting structures P1, P2, P3, P4, P5, . . . to each other. The connection electrode 1160b may be formed in a region between the plurality of light emitting structures P1, P2, P3, P4, P5, . . . .

For example, the connection electrode 1160b of the second electrode 1160 may be provided in a linear shape having a constant line width. Of course, the shape of the connection electrode 1160b of the second electrode 1160 may be variously modified according to embodiments.

For example, the second electrode 1160 may be formed of selected material from a group including Ag, Ni, Al, Rh, Pd, Ir, Ru, Mg, Zn, Pt, Au, Hf, Ti, W, Cr, and those alloys including two or more materials above. The second electrode 1160 may be formed of one layer or a plurality of layers. As the second electrode 1160, a plurality of metal layers may be applied as a reflective metal, and Cr, Ti or the like may be applied as an adhesive layer. For example, the second electrode 1160 may be formed of a Cr/Al/Ni/Au/Ti layer.

Next, as shown in FIGS. 18a to 18d, a second insulating layer 1142 may be formed on the second electrode 1160.

FIGS. 18a to 18d are views showing an example in which the second insulating layer is formed in the method of manufacturing the semiconductor device according to the embodiment of the present invention. FIG. 18a is a plan view showing a step of forming the second insulating layer according to the method of manufacturing the semiconductor device according to the embodiment, FIG. 18b is a sectional view taken along line A-A of the semiconductor device according to the embodiment shown in FIG. 18a, FIG. 18c is a sectional view taken along line B-B of the semiconductor device according to the embodiment shown in FIG. 18a, and FIG. 18d is a sectional view taken along line C-C of the semiconductor device according to the embodiment shown in FIG. 18a.

According to the embodiment, as shown in FIGS. 18a to 18d, the second insulating layer 1142 may be formed to expose the first electrode 1150 disposed under a region between the plurality of light emitting structures P1, P2, P3, P4, P5 . . . , The second insulating layer 1142 may comprise a first opening exposing the first electrode 1150. In addition, the second insulating layer 1142 may comprise a second opening exposing the upper electrode 1160a of the second electrode 1160.

In addition, the second insulating layer 1142 may be formed to selectively expose the connection electrode 1160b of the second electrode 1160, having a line shape, disposed on the first conductivity type DBR layer 1113. For example, the second insulating layer 1142 may be formed on the upper surface of the connection electrode 1160b that is connecting the first light emitting structure P1 and the second light emitting structure P2 such that the second electrode 1160 is not exposed. In addition, the second insulating layer 1142 may be formed to expose an upper surface of the connection electrode 1160b that is connecting the first light emitting structure P1 and the fifth light emitting structure P5.

The second insulating layer 1142 may be provided as an insulating material. For example, the second insulating layer 1142 may be formed of at least one material selected from a group including $SiO_2$, $TiO_2$, $Ta_2O_5$, $SiO_x$, $SiO_xN_y$, $Si_3N_4$, and $Al_2O_3$. In addition, the second insulating layer 1142 may be formed of a DBR layer. According to the embodiment, since the second insulating layer 1142 is provided of a DBR layer, light generated in the plurality of light emitting structures P1, P2, P3, P4, P5, . . . can be efficiently reflected and extracted downward. For example, the second insulating layer 1142 may be provided as a DBR layer formed by stacking $SiO_2$ and $TiO_2$ as a plurality of layers. In addition, the second insulating layer 1142 may be provided as a DBR layer formed by stacking $Ta_2O_3$ and $SiO_2$ as a plurality of layers. In addition, the second insulating layer 1142 may be provided as a DBR layer formed by stacking $SiO_2$ and $Si_3N_4$ as a plurality of layers.

Then, as shown in FIGS. 19a to 19d, a first bonding pad 1155 and a second bonding pad 1165 may be formed on the second insulating layer 1142.

FIGS. 19a to 19d are views showing an example in which the first bonding pad and the second bonding pad are formed in the method of manufacturing the semiconductor device according to the embodiment of the present invention. FIG. 19a is a plan view showing a step of forming the first bonding pad and the second bonding pad according to the method of manufacturing the semiconductor device according to the embodiment, FIG. 19b is a sectional view taken along line A-A of the semiconductor device according to the embodiment shown in FIG. 19a, FIG. 19c is a sectional view taken along line B-B of the semiconductor device according to the embodiment shown in FIG. 19a, and FIG. 19d is a sectional view taken along line C-C of the semiconductor device according to the embodiment shown in FIG. 19a.

According to the embodiment, the first bonding pad 1155 and the second bonding pad 1165 may be formed on the second insulating layer 1142 spaced apart from each other, as shown in FIGS. 19a to 19d.

The first bonding pad 1155 may be disposed on the first opening and electrically connected to the first electrode 1150. For example, a lower surface of the first bonding pad 1155 may be disposed in direct contact with an upper surface of the first electrode 1150 through the first opening.

The second bonding pad 1165 may be disposed on the second opening and electrically connected to the second electrode 1160. For example, a lower surface of the second bonding pad 1165 may be disposed in direct contact with an upper surface of the second electrode 1160 through the second opening.

For example, the first bonding pad 1155 and the second bonding pad 1165 may be formed of selected material from a group including Ag, Ni, Al, Rh, Pd, Ir, Ru, Mg, Zn, Pt, Au, Hf, Ti, W, Cr, Cu, and those alloys including two or more materials above. The first bonding pad 1155 and the second bonding pad 1165 may be formed of one layer or a plurality of layers. The first bonding pad 1155 and the second bonding pad 1165 may comprise a diffusion barrier metal such as Cr, Cu, and the like to prevent diffusion of Sn from solder bonding. For example, the first bonding pad 1155 and the second bonding pad 172 may be formed of a plurality of layers including Ti, Ni, Cu, Cr, and Au.

In addition, as shown in FIGS. 19a to 19d, a concavo-convex structure may be formed on a lower surface of the substrate 1105.

According to the embodiment, the concavo-convex structure provided on the substrate 1105 may comprise a plurality of recesses R1, R2, R3, R4, . . . , which are recessed upwardly from the lower surface of the substrate 1105. The substrate 1105 may comprise, for example, a first recess R1, a second recess R2, a third recess R3, and a fourth recess R4.

The plurality of recesses R1, R2, R3, R4, . . . may be formed, for example, through an etching process. The plurality of recesses R1, R2, R3, R4, . . . may be formed through a dry etching process or a wet etching process.

In addition, the plurality of recesses R1, R2, R3, R4, . . . may be formed through a laser ablation process or a sawing process. When the plurality of recesses R1, R2, R3, R4, . . . are formed through a laser ablation process or a sawing process, there is an advantage that the plurality of recesses R1, R2, R3, R4, . . . can be formed rapidly and the process time can be shortened.

According to the method of manufacturing the semiconductor device of the embodiment, when the concavo-convex structure is formed on the substrate 1105 through a laser ablation process or a sawing process, a thickness t2 of the plurality of recesses R1, R2, R3, R4, . . . can be deeply formed up to several tens of micrometers and can be easily adjusted.

When the plurality of recesses R1, R2, R3, R4, . . . are formed through a laser ablation process or a sawing process, a roughness may be formed on side surfaces of the plurality of recesses R1, R2, R3, R4, . . . . At this time, if the roughness is formed on the side surfaces of the plurality of recesses R1, R2, R3, R4, . . . , the roughness formed on the plurality of recesses R1, R2, R3, R4, . . . may be removed by an additional etching process.

Meanwhile, FIGS. 20 and 21 are views showing another example of a semiconductor device according to an embodiment of the present invention. FIG. 20 is a sectional view taken along line A-A of the semiconductor device according to the embodiment shown in FIG. 10, and FIG. 21 is a sectional view taken along line B-B of the semiconductor device according to the embodiment shown in FIG. 10.

Next, another example of the semiconductor device according to the embodiment will be described with reference to FIGS. 20 and 21. In describing the semiconductor device according to the embodiment with reference to FIGS. 20 and 21, description overlapping with those described above may be omitted.

The semiconductor device according to the embodiment may comprise a substrate 1105 provided with a concavo-convex structure on a lower surface, as shown in FIGS. 20 and 21. The substrate 1105 may comprise a plurality of recesses R1, R2, R3, R4, . . . provided on the lower surface. The substrate 1105 may comprise, for example, a first recess R1, a second recess R2, a third recess R3, and a fourth recess R4.

The first recess R1 may be provided to be recessed in an upper direction from the lower surface of the substrate 1105. The first recess R1 may be disposed to overlap with the first light emitting structure P1. The first recess R1 and the first light emitting structure P1 may be disposed to overlap with each other in a direction perpendicular to the upper surface of the substrate 1105.

The second recess R2 may be provided to be recessed in the upper direction from the lower surface of the substrate 1105. The second recess R2 may be disposed to overlap with the second light emitting structure P2. The second recess R2 and the second light emitting structure P2 may be disposed to overlap with each other in a direction perpendicular to the upper surface of the substrate 1105.

The third recess R3 may be provided to be recessed in the upper direction from the lower surface of the substrate 1105. The third recess R3 may be disposed to overlap with the third light emitting structure P3. The third recess R3 and the third light emitting structure P3 may be disposed to overlap with each other in a direction perpendicular to the upper surface of the substrate 1105.

The fourth recess R4 may be provided to be recessed in the upper direction from the lower surface of the substrate 1105. The fourth recess R4 may be disposed to overlap with the fourth light emitting structure P4. The fourth recess R4 and the fourth light emitting structure P4 may be disposed to overlap with each other in a direction perpendicular to the upper surface of the substrate 1105.

According to the embodiment, a width of the first recess R1 may be provided corresponding to a width of the first light emitting aperture 1130a provided in the first light emitting structure P1. In addition, the width of the first recess R1 may be provided corresponding to a diameter of the first light emitting aperture 1130a provided in the first light emitting structure P1. For example, the first light emitting aperture 1130a may be defined as a region in which light is emitted in a direction perpendicular to the lower surface of the first light emitting structure P1.

In addition, a width of the second recess R2 may be provided corresponding to a width of the second light emitting aperture 1130b provided in the second light emitting structure P2. The width of the second recess R2 may be provided corresponding to the width of the second light emitting aperture 1130b provided in the second light emitting structure P2. For example, the second light emitting aperture 1130b may be defined as a region where light is emitted in a direction perpendicular to the lower surface of the second light emitting structure P2.

In addition, a width of the third recess R3 may be provided corresponding to a width of the third light emitting aperture 1130c provided in the third light emitting structure P3. The width of the third recess R3 may be provided corresponding to the width of the third light emitting aperture 1130c provided in the third light emitting structure P3. For example, the third light emitting aperture 1130c may be defined as a region where light is emitted in a direction perpendicular to the lower surface of the third light emitting structure P3.

In addition, a width of the fourth recess R4 may be provided corresponding to the width of the fourth light emitting aperture 1130d provided in the fourth light emitting structure P4. The width of the fourth recess R4 may be provided corresponding to the width of the fourth light emitting aperture 1130d provided in the fourth light emitting structure P4. For example, the fourth light emitting aperture 1130d may be defined as a region where light is emitted in a direction perpendicular to the lower surface of the fourth light emitting structure P4.

A thickness t1 of the substrate 1105 may be provided in a range of several tens of micrometers to several hundreds of micrometers. The thickness t1 of the substrate 1105 may be, for example, in a range of 100 micrometers to 110 micrometers.

A depth t3 of the first recess R1, the second recess R2, the third recess R3, and the fourth recess R4 may be provided in a range of several micrometers to several tens of micrometers. For example, the depth t3 of the first recess R1, the second recess R2, the third recess R3, and the fourth recess R4 may be provided in a range of 5 micrometers to 20 micrometers.

In addition, a width w2 of the first recess R1, the second recess R2, the third recess R3, and the fourth recess R4 may be provided several tens of micrometers. The width w2 of the first recess R1, the second recess R2, the third recess R3, and the fourth recess R4 may be provided in a range of, for example, 6 micrometers to 15 micrometers.

According to another embodiment, the width w2 of the plurality of recesses R1, R2, R3, R4, . . . may be provided several micrometers larger than a diameter of the plurality of light emitting apertures 1130a, 1130b, 1130c, 1130d, . . . . As an example, the width w2 of the plurality of recesses R1, R2, R3, R4, . . . may be provided in a range of 8 micrometers to 25 micrometers.

For example, the first recess R1 may be provided in a shape of a hole having a circular horizontal cross section in a portion under the first light emitting structure P1. In addition, the second recess R2 may be provided in a shape of a hole having a circular horizontal cross section in a portion under the second light emitting structure P2. The third recess R3 may be provided in a shape of a hole having a circular horizontal section in a portion under the third light emitting structure P3. The fourth recess R4 may be provided in a shape of a hole having a circular horizontal section in a portion under the fourth light emitting structure P4.

According to the embodiment, as shown in FIGS. 20 and 21, upper surfaces of the plurality of recesses R1, R2, R3, R4, . . . may be provided in a convex lens shape as an example. The upper surfaces of the plurality of recesses R1, R2, R3, R4, . . . may be provided in a convex lens shape with respect to the upper surface of the substrate 1105, for example. Accordingly, the plurality of recesses R1, R2, R3, R4, . . . can diffuse light emitted from the plurality of light emitting apertures 1130a, 1130b, 1130c, 1130d, . . . .

The semiconductor device according to the embodiment may be usefully applied to an IR heater or the like. In addition, the semiconductor device according to the embodiment can be usefully applied to an IR illumination for CCTV or the like. The semiconductor device according to the embodiment can be usefully applied to a product requiring irradiation in a wide area.

Meanwhile, FIGS. 22 and 23 are views showing still another example of a semiconductor device according to an embodiment of the present invention. FIG. 22 is a sectional view taken along line A-A of the semiconductor device according to the embodiment shown in FIG. 10, and FIG. 23 is a sectional view taken along line B-B of the semiconductor device according to the embodiment shown in FIG. 10.

Then, another example of the semiconductor device according to the embodiment will be described with reference to FIGS. 22 and 23. In describing the semiconductor device according to the embodiment with reference to FIGS. 22 and 23, description overlapping with those described above may be omitted.

The semiconductor device according to the embodiment may comprise a substrate 1105 provided with a concave-convex structure on a lower surface, as shown in FIGS. 22 and 23. The substrate 1105 may comprise a plurality of recesses R1, R2, R3, R4, . . . provided on the lower surface. The substrate 1105 may comprise, for example, a first recess R1, a second recess R2, a third recess R3, and a fourth recess R4.

The plurality of recesses R1, R2, R3, R4, . . . may be provided to be recessed in an upper direction from the lower surface of the substrate 1105. The plurality of recesses R1, R2, R3, R4, . . . may be disposed to overlap with the corresponding plurality of the light emitting structures P1, P2, P3, P4, . . . , respectively. The plurality of recesses R1, R2, R3, R4, . . . may be disposed to overlap with the corresponding plurality of the light emitting structures P1, P2, P3, P4, . . . , respectively, in a direction perpendicular to the upper surface of the substrate 1105.

According to the embodiment, a width of the first recess R1 may be provided corresponding to a width of the first light emitting aperture 1130a provided in the first light emitting structure P1. In addition, the width of the first recess R1 may be provided corresponding to a diameter of the first light emitting aperture 1130a provided in the first light emitting structure P1. For example, the first light emitting aperture 1130a may be defined as a region in which light is emitted in a direction perpendicular to the lower surface of the first light emitting structure P1.

In addition, a width of the second recess R2 may be provided corresponding to a width of the second light emitting aperture 1130b provided in the second light emitting structure P2. The width of the second recess R2 may be provided corresponding to the width of the second light emitting aperture 1130b provided in the second light emitting structure P2. For example, the second light emitting aperture 1130b may be defined as a region where light is emitted in a direction perpendicular to the lower surface of the second light emitting structure P2.

In addition, a width of the third recess R3 may be provided corresponding to a width of the third light emitting aperture 1130c provided in the third light emitting structure P3. The width of the third recess R3 may be provided corresponding to the width of the third light emitting aperture 1130c provided in the third light emitting structure P3. For example, the third light emitting aperture 1130c may be defined as a region where light is emitted in a direction perpendicular to the lower surface of the third light emitting structure P3.

In addition, a width of the fourth recess R4 may be provided corresponding to a width of the fourth light emitting aperture 1130d provided in the fourth light emitting structure P4. The width of the fourth recess R4 may be provided corresponding to the width of the fourth light emitting aperture 1130d provided in the fourth light emitting structure P4. For example, the fourth light emitting aperture 1130d may be defined as a region where light is emitted in a direction perpendicular to the lower surface of the fourth light emitting structure P4.

A thickness t1 of the substrate 1105 may be provided in a range of several tens of micrometers to several hundreds of micrometers. The thickness t1 of the substrate 1105 may be, for example, in a range of 100 micrometers to 110 micrometers.

A depth t4 of the first recess R1, the second recess R2, the third recess R3, and the fourth recess R4 may be provided in a range of several micrometers to several tens of micrometers. For example, the depth t4 of the first recess R1, the second recess R2, the third recess R3, and the fourth recess R4 may be provided in a range of 5 micrometers to 20 micrometers.

In addition, a width w3 of the first recess R1, the second recess R2, the third recess R3, and the fourth recess R4 may be provided several tens of micrometers. The width w3 of the first recess R1, the second recess R2, the third recess R3, and the fourth recess R4 may be provided in a range of, for example, 6 micrometers to 15 micrometers.

According to another embodiment, the width w3 of the recesses R1, R2, R3, R4, . . . may be provided several micrometers greater than a diameter of the plurality of light emitting apertures 1130a, 1130b, 1130c, 1130d, . . . . As an example, the width w3 of the plurality of recesses R1, R2, R3, R4, . . . may be provided in a range of 8 micrometers to 25 micrometers.

For example, the first recess R1 may be provided in a shape of a hole having a circular horizontal cross section in a portion under the first light emitting structure P1. In addition, the second recess R2 may be provided in a shape of hole having a circular horizontal section in a portion under the second light emitting structure P2. The third recess R3 may be provided in a shape of a hole having a circular horizontal section in a portion under the third light emitting structure P3. The fourth recess R4 may be provided in a shape of a hole having a circular horizontal section in a portion under the fourth light emitting structure P4.

According to the embodiment, as shown in FIGS. 22 and 23, upper surfaces of the plurality of recesses R1, R2, R3, R4, . . . may be provided in a concave lens shape as an example. The upper surfaces of the plurality of recesses R1, R2, R3, R4, . . . may be provided in a concave lens shape with respect to the upper surface of the substrate 1105, for example. Accordingly, the plurality of recesses R1, R2, R3, R4, . . . can concentrate the light emitted from the plurality of light emitting apertures 1130a, 1130b, 1130c, 1130d, . . . .

The semiconductor device according to the embodiment can be usefully applied to a product in which an optical system is disposed at a lower portion. For example, when an optical system such as a diffractive optical element (DOE) or a micro lens is disposed under the semiconductor device, an angle of a beam emitted from the semiconductor device can be provided to be reduced, so that the matching efficiency with reference to the optical system can be improved. The semiconductor device according to the embodiment can be usefully applied to a three-dimensional motion recognition product requiring a certain angle of view angle.

Meanwhile, FIGS. 24 and 25 are views showing still another example of a semiconductor device according to an embodiment of the present invention.

The semiconductor device 2200 according to the embodiment shown in FIGS. 24 and 25 differs from the semiconductor device according to the embodiment described with reference to FIGS. 10 to 23 in the arrangement of bonding pads and the like.

Then, the semiconductor device according to the embodiment of the present invention will be described with reference to FIGS. 24 and 25. FIG. 24 is a view showing the semiconductor device according to the embodiment of the present invention, and FIG. 25 is a sectional view taken along line D-D of the semiconductor device according to the embodiment shown in FIG. 24.

In describing the semiconductor device according to the embodiment with reference to FIGS. 24 and 25, description overlapping with those described with reference to FIGS. 10 to 23 may be omitted.

Meanwhile, in order to facilitate understanding, in FIG. 24, the first bonding pad 2155 and the second bonding pad 2165 disposed on an upper portion are treated as transparent so that the arrangement relationship of the components positioned in a lower portion can be easily grasped.

As shown in FIGS. 24 and 25, the semiconductor device 2200 according to the embodiment of the present invention may comprise a substrate 2105, a plurality of light emitting structures P1, P2, P3, P4, . . . , a first electrode 2150, a first bonding pad 2155, and a second bonding pad 2165.

The semiconductor device 2200 according to the embodiment may be a vertical cavity surface emitting laser (VCSEL), and may emit light generated in the plurality of light emitting structures P1, P2, P3, P4, . . . , for example, at a beam angle of 5 degrees to 30 degrees. Each of the plurality of light emitting structures P1, P2, P3, P4, . . . may comprise a first conductivity type DBR layer, an active layer, and a second conductivity type DBR layer. Each of the plurality of light emitting structures P1, P2, P3, P4, . . . may be formed in a similar structure, and the semiconductor device 2200 according to the embodiment will be described using a cross section taken along line D-D shown in FIG. 24.

The semiconductor device 2200 according to the embodiment may comprise a plurality of light emitting structures P1, P2, P3, P4, . . . , as shown in FIGS. 24 and 25. The second bonding pad 2165 may be disposed on the region where the plurality of light emitting structures P1, P2, P3, P4, . . . are disposed.

The first electrode 2150 may be disposed between the plurality of light emitting structures P1, P2, P3, P4, . . . . The first electrode 2150 may comprise a plurality of first openings exposing the plurality of light emitting structures P1, P2, P3, P4, . . . .

The plurality of first openings provided in the first electrode 2150 may expose upper surfaces of the plurality of light emitting structures P1, P2, P3, P4, . . . . The plurality of first openings provided in the first electrode 2150 may expose upper surfaces of the second conductivity type DBR layer of the plurality of light emitting structures P1, P2, P3, P4, . . . . The first electrode 2150 may be electrically connected to the first conductivity type DBR layer of the plurality of light emitting structures P1, P2, P3, P4, . . . . The plurality of first openings exposing the plurality of light emitting structures P1, P2, P3, P4, . . . will be described later while explaining a method of manufacturing a semiconductor device according to an embodiment.

The first bonding pad 2155 may be spaced apart from the plurality of light emitting structures P1, P2, P3, P4, . . . . The first bonding pad 2155 may be electrically connected to the first electrode 2150. The first bonding pad 2155 may be disposed along a side of the second bonding pad 2165. The first bonding pads 2155 may be disposed along an outer side of the region where the plurality of light emitting structures P1, P2, P3, P4, . . . are provided. For example, the first bonding pads 2155 may be disposed on both sides of the second bonding pads 2165.

The second bonding pad 2165 may be spaced apart from the first bonding pad 2155. The second bonding pad 2165 may be electrically connected to the second conductivity type DBR layer of the plurality of light emitting structures P1, P2, P3, P4, . . . . For example, the second bonding pad 2165 may be disposed on an upper surface of the second conductivity type DBR layer of the plurality of light emitting structures P1, P2, P3, P4, . . . .

In addition, the semiconductor device 2200 according to the embodiment may comprise a plurality of dummy light emitting structures D1, D2, D3, and D4 as shown in FIG. 24. The plurality of dummy light emitting structures D1, D2, D3, and D4 may comprise a first conductivity type DBR layer, an active layer, and a second conductivity type DBR layer. In addition, the first bonding pad 2155 may be disposed on an upper portion of the first dummy light emitting structure D1 and the second dummy light emitting structure D2 among the plurality of dummy light emitting structures D1, D2, D3, and D4.

Then, referring to FIGS. 24 and 25, the semiconductor device 2200 according to the embodiment will be further described with reference to a first light emitting structure P1 and a second light emitting structure P2 disposed under the second bonding pad 2165.

The semiconductor device 2200 according to the embodiment may comprise the substrate 2105, as shown in FIGS. 24 and 25. The substrate 2105 may comprise a concavo-convex structure provided on a lower surface thereof. A plurality of light emitting structures P1, P2, . . . may be disposed on the substrate 2105.

For example, the substrate 2105 may be a growth substrate on which the plurality of light emitting structures P1, P2, . . . can be grown. For example, the substrate 2105 may be an intrinsic semiconductor substrate.

According to the embodiment, the concavo-convex structure provided on the substrate 2105 may comprise a plurality of recesses R1, R2, . . . , which are recessed upward from the lower surface of the substrate 2105. The concavo-convex structure provided on the substrate 2105 will be described later.

The semiconductor device 2200 according to the embodiment may comprise a plurality of light emitting structures P1, P2, . . . disposed under the second bonding pad 2165. Each of the plurality of light emitting structures P1, P2, . . . may comprise light emitting apertures 2130a, 2130b, . . . , respectively, that emit light. The plurality of light emitting structures P1, P2, . . . may be spaced apart from each other. For example, the light emitting apertures 2130a, 2130b, . . . may be provided with a diameter in a range of a few micrometers to a few tens of micrometers. For example, the light emission apertures 2130a, 2130b, . . . may be defined as regions where light is emitted in a direction perpendicular to the lower surfaces of the light emitting structures P1, P2, . . . .

The first light emitting structure P1 may comprise a first DBR layer 2110a of a first conductivity type, a second DBR layer 2120a of a second conductivity type, and a first active layer 2115a. The first active layer 2115a may be disposed between the first DBR layer 2110a and the second DBR layer 2120a. For example, the first active layer 2115a may be disposed on the first DBR layer 2110a, and the second DBR layer 2120a may be disposed on the first active layer 2115a. The first light emitting structure P1 may further comprise a first aperture layer 2117a disposed between the first active layer 2115a and the second DBR layer 2120a.

The second light emitting structure P2 may comprise a third DBR layer 2110b of the first conductivity type, a fourth DBR layer 2120b of the second conductivity type, and a second active layer 2115b. The second active layer 2115b may be disposed between the third DBR layer 2110b and the fourth DBR layer 2120b. For example, the second active layer 2115b may be disposed on the third DBR layer 2110b, and the fourth DBR layer 2120b may be disposed on the second active layer 2115b. The second light emitting structure P2 may further comprise a second aperture layer 2117b disposed between the second active layer 2115b and the fourth DBR layer 2120b.

In addition, a first conductivity type DBR layer 2113 may be disposed between the first DBR layer 2110a of the first light emitting structure P1 and the third DBR layer 2110b of the second light emitting structure P2. The first DBR layer 2110a and the third DBR layer 2110b may be physically connected by the first conductivity type DBR layer 2113. For example, an upper surface of the first conductivity type DBR layer 2113 and an upper surface of the first DBR layer 2110a may be disposed on the same horizontal plane. The upper surface of the first conductivity type DBR layer 2113 and an upper surface of the third DBR layer 2110b may be disposed on the same horizontal plane.

In addition, the first active layer 2115a of the first light emitting structure P1 and the second active layer 2115b of the second light emitting structure P2 may be spaced apart from each other. Also, the second DBR layer 2120a of the first light emitting structure P1 and the fourth DBR layer 2120b of the second light emitting structure P2 may be spaced apart from each other.

The semiconductor device 2200 according to the embodiment may comprise a substrate 2105 provided with a concave-convex structure on a lower surface, as shown in FIGS. 24 and 25. The substrate 2105 may comprise, for example, a first recess R1 and a second recess R2.

The first recess R1 may be provided to be recessed in an upper direction from the lower surface of the substrate 2105.

The first recess R1 may be disposed to overlap with the first light emitting structure P1. The first recess R1 and the first light emitting structure P1 may be disposed to overlap with each other in a direction perpendicular to the upper surface of the substrate 2105.

The second recess R2 may be provided to be recessed in the upper direction from the lower surface of the substrate 2105. The second recess R2 may be disposed to overlap with the second light emitting structure P2. The second recess R2 and the second light emitting structure P2 may be disposed to overlap with each other in a direction perpendicular to the upper surface of the substrate 2105.

According to the embodiment, a width of the first recess R1 may be provided corresponding to a width of the first light emitting aperture 2130a provided in the first light emitting structure P1. In addition, the width of the first recess R1 may be provided corresponding to a diameter of the first light emitting aperture 2130a provided in the first light emitting structure P1. For example, the first light emitting aperture 2130a may be defined as a region where light is emitted in a direction perpendicular to the lower surface of the first light emitting structure P1.

In addition, a width of the second recess R2 may be provided corresponding to a width of the second light emitting aperture 2130b provided in the second light emitting structure P2. The width of the second recess R2 may be provided corresponding to the width of the second light emitting aperture 2130b provided in the second light emitting structure P2. For example, the second light emitting aperture 2130b may be defined as a region where light is emitted in a direction perpendicular to the lower surface of the second light emitting structure P2.

A thickness t5 of the substrate 2105 may be provided in a range of several tens of micrometers to several hundreds of micrometers. The thickness t5 of the substrate 2105 may be provided, for example, in a range of 100 micrometers to 110 micrometers.

When the thickness t5 of the substrate 2105 is smaller than 100 micrometers, the components disposed on the substrate 2105 can not be stably supported, thereby reducing the reliability of the semiconductor device. In addition, when the thickness t5 of the substrate 2105 is larger than 110 micrometers, there is a disadvantage that the size of the semiconductor device may be increased.

A depth t6 of the first recess R1 and the second recess R2 may be provided in a range of several micrometers to several tens of micrometers. For example, the depth t6 of the first recess R1 and the second recess R2 may be provided in a range of 5 micrometers to 20 micrometers.

When the depth t6 of the first recess R1 and the second recess R2 is smaller than 5 micrometers, the increase in the light extraction effect that can be provided by the first recess R1 the second recess R2 can be small. When the depth t6 of the first recess R1 and the second recess R2 is larger than 20 micrometers, the light extracting effect which can be provided by the first recess R1 and the second recess R2 may be large, but there is a disadvantage that the processing time may be increased. When the depth t6 of the first recess R1 and the second recess R2 is greater than 20 micrometers, it is difficult to stably support the components disposed on the substrate 2105, so reliability of the semiconductor device may be reduced.

In addition, the width w4 of the first recess R1 and the second recess R2 may be provided of several tens of micrometers. The width w4 of the first recess R1 and the second recess R2 may be provided, for example, in a range of 6 micrometers to 15 micrometers.

For example, the width w4 of the first recess R1 and the second recess R2 may be provided corresponding to the width of the first light emitting aperture 2130a and the width of the second light emitting aperture 2130b. Light emitted from the first light emitting structure P1 and the second light emitting structure P2 is emitted in a downward direction. Therefore, the width w4 of the first recess R1 and the second recess R2 may be formed to be provided in a region where light propagates.

According to another embodiment, the width w4 of the first recess R1 and the second recess R2 may be provided several micrometers larger than a diameter of the first light emitting aperture 2130a and the second light emitting aperture 2130b. Considering the process error in the formation of the first recess R1 and the second recess R2, so that the alignment between the plurality of recesses R1, R2, . . . and the plurality of light emitting structures P1 and P2 can be performed stably. For example, the width w4 of the first recess R1 and the second recess R2 may be provided in a range of 8 micrometers to 25 micrometers.

For example, the first recess R1 may be provided in a shape of a hole having a circular horizontal cross section in a portion under the first light emitting structure P1. In addition, the second recess R2 may be provided in a shape of a hole having a circular horizontal cross section in a portion under the second light emitting structure P2. An upper surface of the first recess R1 and an upper surface of the second recess R2 may be provided in a planar shape, for example. The upper surface of the first recess R1 and the upper surface of the second recess R2 may be provided parallel to the upper surface of the substrate 2105, for example.

The semiconductor device 2200 according to the embodiment may comprise an insulating layer 2140, as shown in FIGS. 24 and 25. The insulating layer 2140 may be disposed on a side surface of the first light emitting structure P1. The insulating layer 2140 may be disposed to surround the side surface of the first light emitting structure P1. The insulating layer 2140 may be disposed on a side surface of the second light emitting structure P2. The insulating layer 2140 may be disposed to surround the side surface of the second light emitting structure P2.

In addition, the insulating layer 2140 may be disposed between the first light emitting structure P1 and the second light emitting structure P2. The insulating layer 2140 may be disposed on the first conductivity type DBR layer 2113.

The insulating layer 2140 may expose an upper surface of the first light emitting structure P1. The insulating layer 2140 may expose an upper surface of the second DBR layer 2120a of the first light emitting structure P1. The insulating layer 2140 may expose an upper surface of the second light emitting structure P2. The insulating layer 2140 may expose an upper surface of the fourth DBR layer 2120b of the second light emitting structure P2. The insulating layer 2140 may comprise a second opening exposing the upper surface of the first light emitting structure P1 and the upper surface of the second light emitting structure P2. The second opening exposing the upper surface of the first light emitting structure P1 and the upper surface of the second light emitting structure P2 will be described in further detail below with reference to a method for manufacturing the semiconductor device according to the embodiment.

The semiconductor device 2200 according to the embodiment may comprise a first electrode 2150, as shown in FIGS. 24 and 25. The first electrode 2150 may be disposed between the plurality of light emitting structures P1, P2, P3, P4, . . . . The first electrode 2150 may comprise a plurality of first openings exposing the plurality of light emitting structures P1, P2, P3, P4, . . . .

The first electrode 2150 may be disposed on the first conductivity type DBR layer 2113. The first electrode 2150 may be electrically connected to the first DBR layer 2110*a*. The first electrode 2150 may be electrically connected to the third DBR layer 2110*b*. The first electrode 2150 may be disposed under the insulating layer 2140. The first electrode 2150 may be disposed under the insulating layer 2140 in a region between the first light emitting structure P1 and the second light emitting structure P2. The first electrode 2150 may be disposed between the insulating layer 2140 and the first conductivity type DBR layer 2113 in a region between the first light emitting structure P1 and the second light emitting structure P2.

For example, a lower surface of the first electrode 2150 may be disposed in direct contact with the upper surface of the first conductivity type DBR layer 2113. The upper surface of the first electrode 2150 may be disposed in direct contact with the lower surface of the insulating layer 2140. The first electrode 2150 may be electrically connected to the first DBR layer 2110*a* and the third DBR layer 2110*b* in common.

The semiconductor device 2200 according to the embodiment may comprise the first bonding pad 2155 and the second bonding pad 2165 as shown in FIGS. 24 and 25.

According to the embodiment, the first bonding pad 2155 may be electrically connected to the first conductivity type DBR layer of the plurality of light emitting structures P1, P2, P3, P4, . . . . According to the embodiment, the first bonding pad 2155 may be electrically connected in common to the first conductivity type DBR layers of the plurality of light emitting structures P1, P2, P3, P4, . . . .

The second bonding pad 2165 may be electrically connected to the second conductivity type DBR layer of the plurality of light emitting structures P1, P2, P3, P4, . . . . According to the embodiment, the second bonding pads 2165 may be electrically connected in common to the second conductivity type DBR layers of the plurality of light emitting structures P1, P2, P3, P4, . . . .

The semiconductor device 2200 according to the embodiment may comprise a plurality of dummy light emitting structures D1, D2, D3, and D4, as shown in FIGS. 24 and 25. The plurality of dummy light emitting structures D1, D2, D3 and D4 may be spaced apart from the plurality of light emitting structures P1, P2, P3, P4, . . . .

The plurality of dummy light emitting structures D1, D2, D3, and D4 may be spaced apart from the second bonding pads 2165. For example, the first bonding pad 2155 may be disposed on an upper portion of the first dummy light emitting structure D1. In addition, the first bonding pad 2155 may be disposed on an upper portion of the second dummy light emitting structure D2. The plurality of dummy light emitting structures D1, D2, D3, and D4 may be provided in a similar structure.

The first dummy light emitting structure D1 may comprise a first conductivity type DBR layer 2113 and a second conductivity type DBR layer 2119. The first dummy light emitting structure D1 may comprise an active layer 2116 and an aperture layer 2118.

The semiconductor device 2200 according to the embodiment may comprise a pad electrode 2153, as shown in FIGS. 24 and 25. FIG. The pad electrode 2153 may be electrically connected to the first electrode 2150. The pad electrode 2153 may be disposed to extend from the first electrode 2150 disposed between the first light emitting structure P1 and the second light emitting structure P2. The connection relation between the pad electrode 2153 and the first electrode 2150 will be described later while explaining the method of manufacturing the semiconductor device according to the embodiment.

The pad electrode 2153 may be electrically connected to the first conductivity type DBR layer 2113. The pad electrode 2153 may be electrically connected to the active layer 2116. The pad electrode 2153 may be electrically connected to the second conductivity type DBR layer 2119. The pad electrode 2153 may be electrically connected to the first conductivity type DBR layer 2113 and the second conductivity type DBR layer 2119 in common. Accordingly, the first dummy light emitting structure D1 may not generate light.

The pad electrode 2153 may be disposed on the first dummy light emitting structure D1 and the second dummy light emitting structure D2. The pad electrode 2153 may be disposed on an upper surface of the first dummy light emitting structure D1. The pad electrode 2153 may be disposed on an upper surface of the second dummy light emitting structure D2. The pad electrode 2153 may be disposed on the second conductivity type DBR layer 2119 provided on the first dummy light emitting structure D1 and the second dummy light emitting structure D2.

According to the embodiment, the first bonding pad 2155 may be disposed on the pad electrode 2153. The insulating layer 2140 may be disposed on a side surface of the pad electrode 2153. The first bonding pad 2155 may be disposed on an upper surface of the pad electrode 2153 exposed by the insulating layer 2140.

According to the semiconductor device 2200 of the embodiment, the power may be supplied to the plurality of light emitting structures P1, P2, P3, P4, . . . through the first bonding pad 2155 and the second bonding pad 2165. The first bonding pad 2155 may be electrically connected to the first electrode 2150 through the pad electrode 2153. Also, the first electrode 2150 may be electrically connected to the first conductivity type DBR layer of the plurality of light emitting structures P1, P2, P3, P4, . . . . Also, the second bonding pad 2165 may be disposed on an upper surface of the second conductivity type DBR layer of the plurality of light emitting structures P1, P2, P3, P4, . . . . For example, a lower surface of the second bonding pad 2165 may be disposed in direct contact with an upper surface of the second conductivity type DBR layer of the plurality of light emitting structures P1, P2, P3, P4, . . . .

Accordingly, according to the embodiment, when power is supplied to the plurality of light emitting structures P1, P2, P3, P4, . . . , power does not need to be applied through a lower surface of the substrate 2105. In a conventional semiconductor device, when power is to be applied through the lower surface of the substrate, the substrate 2105 must be provided as a conductive substrate. However, according to the semiconductor device 2200 of the embodiment, the substrate 2105 may be a conductive substrate or an insulating substrate. For example, the substrate 2105 according to the embodiment may be provided as an intrinsic semiconductor substrate.

In addition, the substrate 2105 may be a support substrate attached to the plurality of light emitting structures P1, P2, P3, P4, . . . , in which the support substrate may be attached after the plurality of light emitting structures P1, P2, P3, P4, . . . are grown on a growth substrate and the growth substrate is removed. For example, the support substrate may be a transparent substrate through which light generated in the plurality of light emitting structures P1, P2, P3, P4, . . . can be transmitted.

Meanwhile, the semiconductor device 2200 according to the embodiment may be implemented such that light is emitted in a lower direction of the semiconductor device 2200, as shown in FIGS. 24 and 25. That is, according to the semiconductor device 2200 of the embodiment, light can be emitted in a direction in which the first conductivity type DBR layer is disposed from the active layer constituting the plurality of light emitting structures P1, P2, P3, P4, . . . . Light may be emitted from the active layer constituting the plurality of light emitting structures P1, P2, P3, P4, . . . in the direction in which the substrate 2105 is disposed.

According to the embodiment, the second bonding pad 2165 is disposed on and in contact with the upper surface of the second conductivity type DBR layer of the plurality of light emitting structures P1, P2, P3, P4, . . . . Also, the first electrode 2150 is disposed to be connected to the first conductivity type DBR layer of the plurality of light emitting structures P1, P2, P3, P4, . . . , and the first bonding pad 2155 is disposed on and in contact with the pad electrode 2153 extended from the first electrode 2150. Accordingly, heat generated in the plurality of light emitting structures P1, P2, P3, P4, . . . can be effectively dissipated to the outside through the first bonding pad 2155 and the second bonding pad 2165.

Meanwhile, in the case of a general semiconductor device, it is known that the power conversion efficiency (PCE) is significantly lowered due to the heat generated in the light emitting structure. When power is supplied to the light emitting structure through the substrate disposed at the lower portion, generally heat dissipation is performed through the substrate. However, since the thermal conductivity of the substrate is low, it is difficult to dissipate the heat generated in the light emitting structure to the outside. For example, it is known that the thermal conductivity of a GaAs substrate is as low as 52 W/(m*K).

However, according the embodiment, since the first bonding pad 2155 and the second bonding pad 2165 may be connected to the external heat dissipating substrate or the like, so that the heat generated in the plurality of light emitting structures P1, P2, P3, P4, . . . can be effectively dissipated to the outside. Therefore, according to the embodiment, the heat generated in the semiconductor device 2200 can be effectively dissipated to the outside, so that the power conversion efficiency (PCE) can be improved.

Meanwhile, according to the semiconductor device 2200 of the embodiment, as described above, light can be emitted in a downward direction of the semiconductor device 2200. According to the semiconductor device 2200 of the embodiment, the reflectance of the first conductivity type DBR layer provided in a lower portion of the plurality of light emitting structures P1, P2, P3, P4, . . . can be selected to be smaller than the reflectance of the second conductivity type DBR layer provided in an upper portion of the plurality of light emitting structures P1, P2, P3, P4, . . . . Accordingly, light generated in the plurality of light emitting structures P1, P2, P3, P4, . . . can be emitted toward the substrate 2105 of the semiconductor device 2200.

In addition, according to the semiconductor device 2200 of the embodiment, the insulating layer 2140 may be provided as a DBR layer. Accordingly, the light generated in the plurality of light emitting structures P1, P2, P3, P4, . . . can be reflected by the insulating layer 2140 disposed on the upper portion and cab be effectively extracted downward.

For example, the insulating layer 2140 may be provided as a DBR layer formed by stacking $SiO_2$ and $TiO_2$ as a plurality of layers. In addition, the insulating layer 2140 may be provided as a DBR layer formed by stacking $Ta_2O_3$ and $SiO_2$ as a plurality of layers. In addition, the insulating layer 2140 may be provided as a DBR layer formed by stacking $SiO_2$ and $Si_3N_4$ as a plurality of layers.

Meanwhile, in the conventional semiconductor device, when the power is supplied to the light emitting structure through the substrate, the substrate must be conductive. Accordingly, when a conductive semiconductor substrate is applied, a dopant is added to the substrate to improve the conductivity. However, the dopant added to the substrate causes absorption and scattering of the emitted light, which may cause a decrease in power conversion efficiency (PCE).

However, according to the semiconductor device 2200 of the embodiment, as described above, since the substrate 2105 may not be a conductive substrate, an additional dopant may not be added to the substrate 2105. Accordingly, dopant is not added to the substrate 2105 according to the embodiment, so that absorption and scattering by the dopant in the substrate 2105 can be reduced. Therefore, according to the embodiment, light generated in the plurality of light emitting structures P1, P2, P3, P4, . . . can be effectively provided in a downward direction, and power conversion efficiency (PCE) can be improved.

In addition, according to the semiconductor device 2200 of the embodiment, light can be emitted through the concavo-convex structure provided on the lower surface of the substrate 2105. That is, according to the embodiment, light is emitted in a downward direction of the substrate 2105, and the optical path length of light transmitted through the substrate 2105 can be shortened. Accordingly, it is possible to reduce the phenomenon of absorption and scattering of light generated in the plurality of light emitting structures P1, P2, P3, P4, . . . while passing through the substrate 2105. Therefore, according to the embodiment, light generated in the plurality of light emitting structures P1, P2, P3, P4, . . . can be effectively provided in a downward direction, and power conversion efficiency (PCE) can be improved.

In addition, the semiconductor device 2200 according to the embodiment may further comprise an anti-reflection layer 2170 provided on a lower surface of the substrate 2105. The anti-reflection layer 2170 can prevent light emitted from the semiconductor device 2200 from being reflected on the surface of the substrate 2105, and transmit the light, thereby improving light loss due to reflection.

The anti-reflection layer 2170 may be formed of, for example, an anti-reflection coating film and attached to the surface of the substrate 2105. Also, the anti-reflection layer 2170 may be formed on the surface of the substrate 2105 through spin coating or spray coating. For example, the anti-reflection layer 2170 may be formed as a single layer or a multilayer including at least one of a group including $TiO_2$, $SiO_2$, $Al_2O_3$, $Ta_2O_3$, $ZrO_2$, and $MgF_2$.

In addition, according to the semiconductor device 2200 of the embodiment, current spreading between the plurality of light emitting structures P1, P2, P3, P4, . . . can be efficiently performed by the first electrode 150 connected to the first bonding pad 155 and the second bonding pad 165. Therefore, according to the semiconductor device 2200 of the embodiment, current can be efficiently diffused in the plurality of light emitting structures P1, P2, P3, P4, . . . without current crowding, and the light extraction efficiency can be improved.

Meanwhile, the semiconductor device 2200 according to the embodiment described with reference to FIGS. 24 and 25 has been described based on a case where the first bonding pad 2155 is provided on the first dummy light emitting structure D1 and the second dummy light emitting structure D2.

However, according to the semiconductor device of another embodiment, the first bonding pad 2155 may be provided only on one dummy light emitting structure. In addition, the first bonding pad 2155 may be provided on three dummy light emitting structures or may be provided on all four dummy light emitting structures.

The area where the first bonding pad 2155 is provided can be flexibly selected in consideration of the size of the semiconductor device, the degree of current spreading requested, and the like. For example, the first bonding pad 2155 may be disposed on four sides of the semiconductor device, in the case of a semiconductor device having a large size or a large current spreading requirement.

Hereinafter, a method of manufacturing a semiconductor device according to an embodiment of the present invention will be described with reference to the accompanying drawings. In describing the method of manufacturing the semiconductor device according to the embodiment, description overlapping with those described above may be omitted.

First, FIGS. 26a and 26b are views showing an example in which a plurality of light emitting structures and dummy light emitting structures are formed in the method of manufacturing the semiconductor device according to the embodiment of the present invention. FIG. 26a is a plan view showing a step of forming a plurality of light emitting structures and dummy light emitting structures according to the method of manufacturing the semiconductor device of the embodiment, and FIG. 26b is a sectional view taken along line D-D of the semiconductor device according to the embodiment shown in FIG. 26a.

According to the method of manufacturing the semiconductor of the embodiment, the plurality of light emitting structures P1, P2, P3, P4, . . . may be formed on the substrate 2105, as shown in FIGS. 26A and 26B. In addition, a plurality of dummy light emitting structures D1, D2, D3, and D4 may be formed on the substrate 2105. For example, the plurality of dummy light emitting structures D1, D2, D3, and D4 may be formed around the plurality of light emitting structures P1, P2, P3, P4, . . . .

The substrate 2105 may be any one selected from an intrinsic semiconductor substrate, a conductive substrate, and an insulating substrate. For example, the substrate 2105 may be a GaAs intrinsic semiconductor substrate. Also, the substrate 2105 may be provided with at least one selected from a conductive material including copper (Cu), gold (Au), nickel (Ni), molybdenum (Mo), copper-tungsten (Cu—W), and a carrier wafer such as Si, Ge, AlN, GaAs, ZnO, SiC, and the like.

For example, a first conductivity type DBR layer, an active layer, and a second conductivity type DBR layer may be sequentially formed on the substrate 2105. The plurality of light emitting structures P1, P2, P3, P4, . . . may be formed through mesa etching for the second conductivity type DBR layer and the active layer. Further, the plurality of dummy light emitting structures D1, D2, D3, and D4 may be formed through the mesa etching for the second conductivity type DBR layer and the active layer. The plurality of dummy light emitting structures D1, D2, D3 and D4 may be formed on a side of the region where the plurality of light emitting structures P1, P2, P3, P4, . . . are formed.

The plurality of light emitting structures P1, P2, . . . may comprise first conductivity type DBR layers 2110a, 2110b, . . . , active layers 2115a, 2115b, . . . , aperture layers 2117a, 2117b, . . . , and second conductivity type DBR layers 2120a, 2120b, . . . . A first conductivity type DBR layer 2113 may be provided around the plurality of light emitting structures P1, P2, P3, P4, . . . . The first conductivity type DBR layer 2113 may be disposed in a region between the plurality of light emitting structures P1, P2, P3, P4, . . . .

In addition, the plurality of dummy light emitting structures D1, D2, D3, and D4 according to the embodiment may comprise a first conductivity type DBR layer 2113, an active layer 2116, an aperture layer 2118, and a second conductivity type DBR layer 2119. For example, the plurality of dummy light emitting structures D1, D2, D3, and D4 may be provided in a line shape having a width along the side of the region where the plurality of light emitting structures P1, P2, P3, P4, are formed.

For example, the plurality of light emitting structures P1, P2, P3, P4, . . . and the plurality of dummy light emitting structures D1, D2, D3, and D4 may be grown as a plurality of compound semiconductor layers. The plurality of light emitting structures P1, P2, P3, P4, . . . and the plurality of dummy light emitting structures D1, D2, D3, and D4 may be formed by an electron beam evaporator, physical vapor deposition (PVD), chemical vapor deposition (CVD), plasma laser deposition (PLD), dual-type thermal evaporator, sputtering, metal organic chemical vapor deposition (MOCVD), or the like.

The aperture layer 2118 constituting the plurality of dummy light emitting structures D1, D2, D3, and D4 may be disposed on the active layer 2116. However, as described with reference to FIGS. 24 and 25, the aperture layer 2118 disposed in the plurality of dummy light emitting structures D1, D2, D3, and D4 does not perform a function of restricting current movement to concentrate current at the central portion of the active layer 2116, unlike the functions of the aperture layers 2117a, 2117b . . . provided in the plurality of light emitting structures P1, P2, . . . . According to the embodiment, it is because a common voltage is applied between the first conductivity type DBR layer 2113 and the second conductivity type DBR layer 2119 disposed in the plurality of dummy light emitting structures D1, D2, D3, and D4.

For example, the second conductivity type DBR layers 2120a, 2120b, . . . may have a higher reflectance than the first conductivity type DBR layers 2110a, 2110b, . . . . For example, the second conductivity type DBR layers 2120a, 2120b, . . . and the first conductivity type DBR layers 2110a, 2110b, . . . can form a resonant cavity in a vertical direction by a reflectance of 90% or more. At this time, the generated light may be emitted to the outside through the first conductivity type DBR layers 2110a, 2110b, . . . , which are lower than the reflectance of the second conductivity type DBR layers 2120a, 2120b, . . . .

Next, as shown in FIGS. 27a and 27b, a first electrode 2150 and an electrode pad 2153 according to the embodiment may be formed.

FIGS. 27a and 27b are views showing an example in which the first electrode and the electrode pad are formed in the method of manufacturing the semiconductor device according to the embodiment of the present invention. FIG. 27a is a plan view showing a step of forming the first electrode and the electrode pad according to the method of manufacturing the semiconductor device of the embodiment, and FIG. 27b is a sectional taken along line D-D of the semiconductor device according to the embodiment shown in FIG. 27a.

According to the embodiment, the first electrode 2150 may be formed around the plurality of light emitting structures P1, P2, P3, P4, . . . , as shown in FIGS. 27a and 27b. The first electrode 2150 may be formed on the first conductivity type DBR layer 2113 and may comprise a first openings H1 exposing the plurality of light emitting structures P1, P2, P3, P4, . . . . The first electrode 2150 may be formed in a region between the plurality of light emitting structures P1, P2, P3, P4, . . . .

For example, as described above with reference to [Table 1], an area Ae of the first electrode 2150 may be provided larger than an area Am of the plurality of light emitting structures P1, P2, P3, P4, . . . . Here, the area Am of the plurality of light emitting structures P1, P2, P3, P4, . . . may indicate the area of the remaining active layers 2115a, 2115b, . . . which remain unetched by the mesa etching. A ration of Am/Ae, that is the area Am of the plurality of light emitting structures P1, P2, P3, P4, . . . with reference to the area Ae of the first electrode 2150, may be provided larger than 25%, for example. According to the semiconductor device 2200 of the embodiment, the number and the diameter of the plurality of light emitting structures P1, P2, P3, P4, . . . may be variously modified according to the application example.

According to the embodiment, as described above with reference to [Table 1], the ratio of Am/Ae, that is the area Am of the plurality of light emitting structures P1, P2, P3, P4, . . . with reference to the area Ae of the first electrode 2150, may be provided of, for example, in a range of 25% to 70%. According to another embodiment, the ratio of Am/Ae, that is the area Am of the plurality of light emitting structures P1, P2, P3, P4, . . . with reference to the area Ae of the first electrode 2150, may be provided of, for example, in a range of 30% to 60%.

The number and the diameter of the plurality of light emitting structures P1, P2, P3, P4, . . . disposed in the semiconductor device 2200 can be modified variously according to the application example of the semiconductor device 2200 according to the embodiment.

In addition, according to the method of manufacturing the semiconductor of the embodiment, as shown in FIGS. 27a and 27b, a pad electrode 2153 disposed on the dummy light emitting structures D1, D2, D3, and D4 may be formed. The pad electrode 2153 may be formed to extend from the first electrode 2150. The pad electrode 2153 may be formed on the second conductivity type DBR layer 2119 of the dummy light emitting structures D1, D2, D3, and D4.

According to the embodiment, a voltage may be commonly applied to the first electrode 2150 and the pad electrode 2153. The first electrode 2150 and the pad electrode 2153 may provide an equipotential surface.

For example, the first electrode 2150 and the electrode pad 2153 may be formed of selected material from a group including Ag, Ni, Al, Rh, Pd, Ir, Ru, Mg, Zn, Pt, Au, Hf, Ti, W, Cr, and those alloys including two or more materials above. The first electrode 2150 and the electrode pad 2153 may be formed of one layer or a plurality of layers. As the first electrode 2150 and the electrode pad 2153, for example, a plurality of metal layers may be applied as a reflective metal, and Cr, Ti, or the like may be applied as an adhesive layer. For example, the first electrode 2150 and the electrode pad 2153 may be formed of a Cr/Al/Ni/Au/Ti layer.

Next, as shown in FIGS. 28a and 28b, an insulating layer 2140 may be formed on the first electrode 2150 according to the embodiment.

FIGS. 28a and 28b are views showing an example in which an insulating layer is formed in the method of manufacturing the semiconductor device according to the embodiment of the present invention. FIG. 28a is a plan view showing a step of forming the insulating layer according to the method of manufacturing the semiconductor device according to the embodiment, and FIG. 28b is a sectional view taken along line D-D of the semiconductor device according to the embodiment shown in FIG. 28a.

according to the embodiment, as shown in FIGS. 28a and 28b, the insulating layer 2140 exposing upper surfaces of the plurality of light emitting structures P1, P2, P3, P4, . . . may be formed on the first electrode 2150. The insulating layer 2140 may be formed on side surfaces of the plurality of light emitting structures P1, P2, P3, P4, . . . . The insulating layer 2140 may be formed on the first conductivity type DBR layer 2113. The insulating layer 2140 may be formed in a region between the plurality of light emitting structures P1, P2, P3, P4, . . . .

The insulating layer 2140 may comprise a plurality of second openings H2 exposing upper surfaces of the plurality of light emitting structures P1, P2, P3, P4, . . . . A size of the second opening H2 may be smaller than a size of the first opening H1. For example, the plurality of second openings H2 may be arranged in alignment with the region provided with the plurality of first openings H1.

According to the embodiment, the insulating layer 2140 may expose an upper surface of the electrode pad 2153. The insulating layer 2140 may be formed on the third dummy light emitting structure D3. In addition, the insulating layer 2140 may be formed on the fourth dummy light emitting structure D4.

The insulating layer 2140 may be provided as an insulating material. For example, the insulating layer 2140 may be formed of at least one material selected from a group including $SiO_2$, $TiO_2$, $Ta_2O_5$, $SiO_x$, $SiO_xN_y$, $Si_3N_4$, and $Al_2O_3$. In addition, the insulating layer 2140 may be formed of a DBR layer. According to the embodiment, since the insulating layer 2140 is provided as a DBR layer, light generated in the plurality of light emitting structures P1, P2, P3, P4, . . . can be efficiently reflected and extracted downward. For example, the insulating layer 2140 may be provided as a DBR layer formed by stacking $SiO_2$ and $TiO_2$ as a plurality of layers. In addition, the insulating layer 2140 may be provided as a DBR layer formed by stacking $Ta_2O_3$ and $SiO_2$ as a plurality of layers. In addition, the insulating layer 2140 may be provided as a DBR layer formed by stacking $SiO_2$ and $Si_3N_4$ as a plurality of layers.

In addition, as shown in FIGS. 29a and 29b, a first bonding pad 2155 may be formed on the pad electrode 2153 according to the embodiment, and a second bonding pad 2165 may be formed on the second conductivity type DBR layer of the plurality of light emitting structures P1, P2, . . . .

FIGS. 29a and 29b are views showing an example in which the first bonding pad and the second bonding pad are formed in the method of manufacturing the semiconductor device according to the embodiment of the present invention. FIG. 29a is a plan view showing a step of forming the first bonding pad and the second bonding pad according to the method of manufacturing the semiconductor device of the embodiment, FIG. 29b is a sectional view taken along line D-D of the semiconductor device according to the embodiment shown in FIG. 29a.

According to the embodiment, as shown in FIGS. 29a and 29b, the first bonding pad 2155 and the second bonding pad 2165 may be formed to be spaced apart from each other.

The first bonding pad 2155 may be formed on the first dummy light emitting structure D1 and the second dummy light emitting structure D2. The first bonding pad 2155 may be disposed on the first dummy light emitting structure D1 and electrically connected to the pad electrode 2153. For example, the first bonding pad 2155 may be disposed in direct contact with an upper surface of the pad electrode 2153. The first bonding pad 2155 may be disposed on the second dummy light emitting structure D2. In addition, the first bonding pad 2155 may be disposed in direct contact with the pad electrode provided on the second dummy light emitting structure D2.

According to the embodiment, the first bonding pad 2155 may be electrically connected to the first conductivity type DBR layer of the plurality of light emitting structures P1, P2, P3, P4, . . . . According to the embodiment, the first bonding pad 2155 may be electrically connected in common to the first conductivity type DBR layers of the plurality of light emitting structures P1, P2, P3, P4, . . . .

The second bonding pad 2165 may be formed on the plurality of light emitting structures P1, P2, P3, P4, . . . . The second bonding pad 2165 may be formed on the second conductivity type DBR layers 2120a, 2120b, . . . of the plurality of light emitting structures P1, P2, . . . . In addition, the second bonding pad 2165 may be formed on the insulating layer 2140.

The second bonding pad 2165 may be electrically connected to the second conductivity type DBR layer of the plurality of light emitting structures P1, P2, P3, P4, . . . . According to the embodiment, the second bonding pads 2165 may be electrically connected in common to the second conductivity type DBR layers of the plurality of light emitting structures P1, P2, P3, P4, . . . .

The second bonding pad 2165 may be disposed on the second opening H2 provided in the insulating layer 2140. For example, a lower surface of the second bonding pad 2165 may be in direct connect with an upper surface of the second conductivity type DBR layers 2120a, 2120b, . . . of the plurality of light emitting structures P1, P2, . . . through the second opening H2.

For example, the first bonding pad 2155 and the second bonding pad 2165 may be formed of selected material from a group including Ag, Ni, Al, Rh, Pd, Ir, Ru, Mg, Zn, Pt, Au, Hf, Ti, W, Cr, Cu, and those alloys including two or more materials above. The first bonding pad 2155 and the second bonding pad 2165 may be formed of one layer or a plurality of layers. The first bonding pad 2155 and the second bonding pad 2165 may comprise a diffusion barrier metal such as Cr, Cu, and the like to prevent diffusion of Sn from solder bonding. For example, the first bonding pad 2155 and the second bonding pad 2165 may be formed of a plurality of layers including Ti, Ni, Cu, Cr, and Au.

Next, as shown in FIGS. 29a and 29b, a concave-convex structure may be formed on the lower surface of the substrate 2105.

According to the embodiment, the concavo-convex structure provided on the substrate 2105 may comprise a plurality of recesses R1, R2, . . . , which are recessed upward in the lower surface of the substrate 2105. The substrate 2105 may comprise, for example, a first recess R1 and a second recess R2.

The plurality of recesses R1, R2, . . . may be formed, for example, through an etching process. The plurality of recesses R1, R2, . . . may be formed through a dry etching process or a wet etching process.

In addition, the plurality of recesses R1, R2, . . . may be formed through a laser ablation process or a sawing process. When the plurality of recesses R1, R2, . . . are formed through a laser ablation process or a sawing process, there is an advantage that the plurality of recesses R1, R2, . . . can be formed rapidly and the process time can be shortened.

According to the method of manufacturing the semiconductor device according to the embodiment, when the concavo-convex structure is formed on the substrate 2105 through a laser ablation process or a sawing process, a thickness t6 of the plurality of recesses R1, R2, can be deeply formed up to several tens of micrometers and can be easily adjusted.

In the case where the plurality of recesses R1, R2, . . . are formed through a laser ablation process or a sawing process, a roughness may be formed on side surfaces of the plurality of recesses R1, R2, . . . . At this time, if the roughness is formed on the side surfaces of the plurality of recesses R1, R2, . . . , the roughness formed on the plurality of recesses R1, R2, . . . may be removed by an additional etching process.

Meanwhile, FIG. 30 is a view showing another example of a semiconductor device according to an embodiment of the present invention. FIG. 30 is a sectional view taken along line D-D of the semiconductor device according to the embodiment shown in FIG. 24.

Then, another example of the semiconductor device according to the embodiment will be described with reference to FIG. 30. In the description of the semiconductor device according to the embodiment with reference to FIG. 30, descriptions overlapping with those described above may be omitted.

The semiconductor device according to the embodiment may comprise a substrate 2105 provided with a concavo-convex structure on a lower surface, as shown in FIG. 30. The substrate 2105 may comprise a plurality of recesses R1, R2, . . . provided on the lower surface. The substrate 2105 may comprise, for example, a first recess R1 and a second recess R2.

The first recess R1 may be provided to be recessed in an upper direction from the lower surface of the substrate 2105. The first recess R1 may be disposed to overlap with the first light emitting structure P1. The first recess R1 and the first light emitting structure P1 may be disposed to overlap with each other in a direction perpendicular to the upper surface of the substrate 2105.

The second recess R2 may be provided to be recessed in an upper direction from the lower surface of the substrate 2105. The second recess R2 may be disposed to overlap with the second light emitting structure P2. The second recess R2 and the second light emitting structure P2 may be disposed to overlap with each other in a direction perpendicular to the upper surface of the substrate 2105.

According to the embodiment, a width of the first recess R1 may be provided corresponding to a width of the first light emitting aperture 2130a provided in the first light emitting structure P1. In addition, the width of the first recess R1 may be provided corresponding to a diameter of the first light emitting aperture 2130a provided in the first light emitting structure P1. For example, the first light emitting aperture 2130a may be defined as a region where light is emitted in a direction perpendicular to the lower surface of the first light emitting structure P1.

In addition, a width of the second recess R2 may be provided corresponding to a width of the second light emitting aperture 2130b provided in the second light emitting structure P2. The width of the second recess R2 may be provided corresponding to the width of the second light emitting aperture 2130b provided in the second light emitting structure P2. For example, the second light emitting device 2130b may be defined as a region where light is emitted in a direction perpendicular to the lower surface of the second light emitting structure P2.

A thickness t5 of the substrate 2105 may be provided in a range of several tens of micrometers to several hundreds of micrometers. The thickness t5 of the substrate 2105 may be, for example, in a range of 100 micrometers to 110 micrometers.

A depth t7 of the first recess R1 and the second recess R2 may be provided in a range of several micrometers to several tens of micrometers. For example, the depth t7 of the first recess R1 and the second recess R2 may be provided in a range of 5 micrometers to 20 micrometers.

In addition, a width w5 of the first recess R1 and the second recess R2 may be provided several tens of micrometers. The width w5 of the first recess R1 and the second recess R2 may be provided in a range of, for example, 6 micrometers to 15 micrometers.

According to another embodiment, the width w5 of the plurality of recesses R1, R2, . . . may be provided several micrometers larger than a diameter of the plurality of light emitting apertures 2130a, 2130b, . . . . For example, the width w5 of the plurality of recesses R1, R2, . . . may be provided in a range of 8 micrometers to 25 micrometers.

For example, the first recess R1 may be provided in a shape of a hole having a circular horizontal cross section in a portion under the first light emitting structure P1. In addition, the second recess R2 may be provided in a shape of a hole having a circular horizontal cross section in a portion under the second light emitting structure P2.

According to the embodiment, as shown in FIG. 30, upper surfaces of the plurality of recesses R1, R2, . . . may be provided in a convex lens shape, for example. The upper surfaces of the plurality of recesses R1, R2, . . . may be provided in a convex lens shape with respect to the upper surface of the substrate 2105, for example. Accordingly, the plurality of recesses R1, R2, . . . can diffuse light emitted from the plurality of light emitting apertures 2130a, 2130b, . . . .

The semiconductor device according to the embodiment may be usefully applied to an IR heater or the like. In addition, the semiconductor device according to the embodiment can be usefully applied to an IR illumination for CCTV or the like. The semiconductor device according to the embodiment can be usefully applied to a product requiring irradiation in a wide area.

Meanwhile, FIG. 31 is a view showing still another example of a semiconductor device according to an embodiment of the present invention. FIG. 31 is a sectional view taken along line D-D of the semiconductor device according to the embodiment shown in FIG. 24.

Then, another example of the semiconductor device according to the embodiment will be described with reference to FIG. 31. In describing the semiconductor device according to the embodiment with reference to FIG. 31, descriptions overlapping with those described above may be omitted.

The semiconductor device according to the embodiment may comprise a substrate 2105 provided with a concave-convex structure on the lower surface, as shown in FIG. 31. The substrate 2105 may comprise a plurality of recesses R1, R2, . . . provided on the lower surface. The substrate 2105 may comprise, for example, a first recess R1 and a second recess R2.

The plurality of recesses R1, R2, . . . may be provided to be recessed in an upper direction from the lower surface of the substrate 2105. The plurality of recesses R1, R2, . . . may be arranged to overlap with the corresponding plurality of light emitting structures P1, P2, . . . , respectively. The plurality of recesses R1, R2, . . . may be disposed to overlap with the corresponding plurality of the light emitting structures P1, P2, . . . , respectively, in a direction perpendicular to the upper surface of the substrate 2105.

According to the embodiment, a width of the first recess R1 may be provided corresponding to a width of the first light emitting aperture 2130a provided in the first light emitting structure P1. In addition, the width of the first recess R1 may be provided corresponding to a diameter of the first light emitting aperture 2130a provided in the first light emitting structure P1. For example, the first light emitting aperture 2130a may be defined as a region where light is emitted in a direction perpendicular to the lower surface of the first light emitting structure P1.

In addition, a width of the second recess R2 may be provided corresponding to a width of the second light emitting aperture 2130b provided in the second light emitting structure P2. The width of the second recess R2 may be provided corresponding to the width of the second light emitting aperture 2130b provided in the second light emitting structure P2. For example, the second light emitting device 2130b may be defined as a region where light is emitted in a direction perpendicular to the lower surface of the second light emitting structure P2.

A thickness t5 of the substrate 2105 may be provided in a range of several tens of micrometers to several hundreds of micrometers. The thickness t5 of the substrate 2105 may be, for example, in a range of 100 micrometers to 110 micrometers.

A depth t8 of the first recess R1 and the second recess R2 may be provided in a range of several micrometers to several tens of micrometers. For example, the depth t8 of the first recess R1 and the second recess R2 may be provided in a range of 5 micrometers to 20 micrometers.

In addition, a width w6 of the first recess R1 and the second recess R2 may be provided several tens of micrometers. The width w6 of the first recess R1 and the second recess R2 may be provided in a range of, for example, 6 micrometers to 15 micrometers.

According to another embodiment, the width w6 of the recesses R1, R2, . . . may be provided several micrometers larger than a diameter of the plurality of light emitting apertures 2130a, 2130b, . . . . As an example, the width w6 of the plurality of recesses R1, R2, . . . may be provided in a range of 8 micrometers to 25 micrometers.

For example, the first recess R1 may be provided in a portion under the first light emitting structure P1 in a shape a through hole. The second recess R2 may be provided in a portion under the second light emitting structure P2 in a shape of a through hole.

According to the embodiment, as shown in FIG. 31, upper surfaces of the plurality of recesses R1, R2, . . . may be provided in a concave lens shape, for example. The upper surfaces of the plurality of recesses R1, R2, . . . may be provided in a concave lens shape with respect to the upper surface of the substrate 2105, for example. Accordingly, the plurality of recesses R1, R2, . . . can concentrate the light emitted from the plurality of light emitting apertures 2130a, 2130b, . . . .

The semiconductor device according to the embodiment can be usefully applied to a product in which an optical system is disposed at a lower portion. For example, when an optical system such as a diffractive optical element (DOE) or a micro lens is disposed under the semiconductor device, an angle of a beam emitted from the semiconductor device can be provided to be reduced, so that the matching efficiency with reference to the optical system can be improved. The semiconductor device according to the embodiment can be usefully applied to a three-dimensional motion recognition product requiring a certain angle of view angle.

Next, a semiconductor device according to an embodiment of the present invention will be described with reference to FIGS. 32 to 35. FIG. 32 is a view showing the semiconductor device according to the embodiment of the present invention, FIG. 33 is a sectional view taken along line A-A of the semiconductor device according to the embodiment shown in FIG. 32, FIG. 34 is a sectional view taken along line B-B of the semiconductor device according to the embodiment shown in FIG. 32, and FIG. 35 is a sectional view taken along line C-C of the semiconductor device according to the embodiment shown in FIG. 32.

Meanwhile, in order to facilitate understanding, in FIG. 32, the first bonding pad 3155 and the second bonding pad 3165 disposed on an upper portion are treated as transparent so that the arrangement relationship of the components positioned on a lower portion can be easily grasped.

As shown in FIGS. 32 to 35, the semiconductor device 3200 according to the embodiment of the present invention may comprise a plurality of light emitting structures P1, P2, P3, P4, P5, . . . , a first electrode 3150, a second electrode 3160, a first bonding pad 3155, and a second bonding pad 3165.

The semiconductor device 3200 according to the embodiment may be a vertical cavity surface emitting laser (VCSEL), and may emit light generated in the plurality of light emitting structures P1, P2, P3, P4, P5, . . . , for example, at a beam angle of 15 degrees to 25 degrees. Each of the plurality of light emitting structures P1, P2, P3, P4, P5, . . . may comprise a first conductivity type DBR (Distributed Bragg Reflector) layer, an active layer, and a second conductivity type DBR layer. Each of the plurality of light emitting structures P1, P2, P3, P4, P5, . . . may be formed in a similar structure, and the semiconductor device 3200 according to the embodiment will be described using cross sections taken along lines A-A, line B-B, and line C-C shown in FIG. 32.

The semiconductor device 3200 according to the embodiment may comprise a plurality of light emitting structures P1, P2, P3, P4, P5, . . . , as shown in FIGS. 32 and 33. The first bonding pad 3155 may be disposed on the region where some of the light emitting structures P1, P2, P5, . . . are disposed, among the plurality of light emitting structures P1, P2, P3, P4, P5, . . . . In addition, the second bonding pads 3165 may be disposed on the region where some of the light emitting structures P1, P2, P5, . . . are disposed, among the plurality of light emitting structures P1, P2, P3, P4, P5, . . . .

The first bonding pad 3155 and the second bonding pad 3165 may be disposed spaced apart from each other. The first bonding pad 3155 may be electrically connected to the first electrode 3150. The first electrode 3150 may be disposed under the first bonding pad 3155. For example, a lower surface of the first bonding pad 3155 may be disposed in direct contact with an upper surface of the first electrode 3150. The first electrode 3150 may be electrically connected to a first conductivity type DBR layer of the plurality of light emitting structures P1, P2, P3, P4, P5, . . . .

The second bonding pad 3165 may be electrically connected to the second electrode 3160. The second electrode 3160 may be disposed under the second bonding pad 3165. For example, a lower surface of the second bonding pad 3165 may be disposed in direct contact with an upper surface of the second electrode 3160. The second electrode 3160 may be electrically connected to a second conductivity type DBR layer of the plurality of light emitting structures P1, P2, P3, P4, P5, . . . .

According to the embodiment, the first electrode 3150 may be disposed under both the first bonding pad 3155 and the second bonding pad 3165. In addition, the second electrode 3160 may be disposed under both the first bonding pad 3155 and the second bonding pad 3165. The electrical connection between the first electrode 3150 and the first bonding pad 3155, and the electrical connection between the second electrode 3160 and the second bonding pad 3165 will be described later.

First, referring to FIGS. 32 and 33, the semiconductor device 3200 according to the embodiment will be described based on a light emitting structure of P1 and a light emitting structure of P2 disposed under the second bonding pad 3165. FIG. 33 is a sectional view taken along line A-A of the semiconductor device according to the embodiment shown in FIG. 32.

The semiconductor device 3200 according to the embodiment may comprise a plurality of light emitting structures P1, P2, . . . disposed under the second bonding pads 3165. The plurality of light emitting structures P1, P2, . . . may comprise light emitting apertures 3130a, 3130b, . . . , respectively, which emit light. The plurality of light emitting structures P1, P2, . . . may be spaced apart from each other. For example, the light emitting apertures 3130a, 3130b, may be provided with a diameter in a range of several micrometers to several tens of micrometers.

The light emitting structure of P1 may comprise a first DBR layer 3110a of a first conductivity type, a second DBR layer 3120a of a second conductivity type, and a first active layer 3115a. The first active layer 3115a may be disposed between the first DBR layer 3110a and the second DBR layer 3120a. For example, the first active layer 3115a may be disposed on the first DBR layer 3110a, and the second DBR layer 3120a may be disposed on the first active layer 3115a. The light emitting structure of P1 may further comprise a first aperture layer 3117a disposed between the first active layer 3115a and the second DBR layer 3120a.

The light emitting structure of P2 may comprise a third DBR layer 3110b of the first conductivity type, a fourth DBR layer 3120b of the second conductivity type, and a second active layer 3115b. The second active layer 3115b may be disposed between the third DBR layer 3110b and the fourth DBR layer 3120b. For example, the second active layer 3115b may be disposed on the third DBR layer 3110b, and the fourth DBR layer 3120b may be disposed on the second active layer 3115b. The light emitting structure of P2 may comprise a second aperture layer 3117b disposed between the second active layer 3115b and the fourth DBR layer 3120b.

In addition, a first conductivity type DBR layer 3113 may be disposed between the first DBR layer 3110a of the light emitting structure of P1 and the third DBR layer 3110b of the light emitting structure of P2. The first DBR layer 3110a and the third DBR layer 3110b may be physically connected by the first conductivity type DBR layer 3113. For example, an upper surface of the first conductivity type DBR layer 3113 and an upper surface of the first DBR layer 3110a may be disposed on the same horizontal plane. The upper surface of the first conductivity type DBR layer 3113 and an upper surface of the third DBR layer 3110b may be disposed on the same horizontal plane.

In addition, the first active layer 3115a of the light emitting structure of P1 and the second active layer 3115b of the light emitting structure of P2 may be spaced apart from each other. In addition, the second DBR layer 3120a of the light emitting structure of P1 and the fourth DBR layer 3120b of the light emitting structure of P2 may be spaced apart from each other.

The semiconductor device 3200 according to the embodiment may comprise a first insulating layer 3141, as shown in FIGS. 32 and 33. The first insulating layer 3141 may be disposed on a side surface of the light emitting structure of P1. The first insulating layer 3141 may be disposed to surround the side surface of the light emitting structure of P1. The first insulating layer 3141 may be disposed on a side surface of the light emitting structure of P2. The first insulating layer 3141 may be disposed to surround the side surface of the light emitting structure of P2.

In addition, the first insulating layer 3141 may be disposed between the light emitting structure of P1 and the light emitting structure of P2. The first insulating layer 3141 may be disposed on the first conductivity type DBR layer 3113.

The first insulating layer 3141 may expose an upper surface of the light emitting structure of P1. The first insulating layer 3141 may expose an upper surface of the second DBR layer 3120a of the light emitting structure of P1. The first insulating layer 3141 may expose an upper surface of the light emitting structure of P2. The first insulating layer 3141 may expose an upper surface of the fourth DBR layer 3120b of the light emitting structure of P2.

The semiconductor device 3200 according to the embodiment may comprise a first electrode 3150, as shown in FIGS. 32 and 33. The first electrode 3150 may be disposed around the plurality of light emitting structures P1, P2, P3, P4, P5, . . . . The first electrode 3150 may comprise a plurality of openings exposing the plurality of light emitting structures P1, P2, P3, P4, P5, . . . . The first electrode 3150 may be commonly connected to a plurality of first conductivity type DBR layers constituting the plurality of light emitting structures P1, P2, P3, P4, P5, . . . .

The first electrode 3150 may be disposed on the first conductivity type DBR layer 3113. The first electrode 3150 may be electrically connected to the first DBR layer 3110a. The first electrode 3150 may be electrically connected to the third DBR layer 3110b. The first electrode 3150 may be disposed under the first insulating layer 3141. The first electrode 3150 may be disposed under the first insulating layer 3141 in a region between the light emitting structure of P1 and the light emitting structure of P2. The first electrode 3150 may be disposed between the first insulating layer 3141 and the first conductivity type DBR layer 3113 in a region between the light emitting structure of P1 and the light emitting structure of P2.

The semiconductor device 3200 according to the embodiment may comprise a second electrode 3160, as shown in FIGS. 32 and 33. The second electrode 3160 may be disposed on the first insulating layer 3141. The second electrode 3160 may comprise an upper electrode 3160a disposed on an upper surface of the plurality of light emitting structures P1, P2, P3, P4, P5, . . . and a connection electrode 3160b connecting the upper electrode 3160a. The second electrode 3160 may be commonly connected to a plurality of second conductivity type DBR layers constituting the plurality of light emitting structures P1, P2, P3, P4, P5, . . . .

The second electrode 3160 may be disposed on a side surface of the light emitting structure of P1. The second electrode 3160 may be disposed on an upper surface of the light emitting structure of P1. The upper electrode 3160a of the second electrode 3160 may be disposed on the second DBR layer 3120a of the light emitting structure of P1. The upper electrode 3160a of the second electrode 3160 may be disposed in direct contact with the upper surface of the second DBR layer 3120a.

In addition, the second electrode 3160 may be disposed on a side surface of the light emitting structure of P2. The second electrode 3160 may be disposed on an upper surface of the light emitting structure of P2. The upper electrode 3160a of the second electrode 3160 may be disposed on the fourth DBR layer 3120b of the light emitting structure of P2. The upper electrode 3160a of the second electrode 3160 may be disposed in direct contact with the upper surface of the fourth DBR layer 3120b.

The second electrode 3160 may be disposed between the light emitting structure of P1 and the light emitting structure of P2. The connection electrode 3160b of the second electrode 3160 may be disposed on the first insulating layer 3141 in a region between the light emitting structure of P1 and the light emitting structure of P2.

The second electrode 3160 according to the embodiment may connect upper surfaces of the plurality of light emitting structures P1, P2, P3, P4, . . . , as shown in FIG. 32. The second electrode 3160 may be physically connected to each second conductivity type DBR layer of the plurality of light emitting structures P1, P2, P3, P4, . . . . That is, the second electrode 3160 may be physically connected not only to the upper surface of the plurality of light emitting structures P1, P2, . . . disposed under the second bonding pad 3165, but also to the upper surface of the plurality of light emitting structures P3, P4, . . . disposed under the first bonding pad 3155.

For example, the connection electrode 3160b of the second electrode 3160 may be provided in a linear shape having a constant line width, as shown in FIG. 32. Of course, the shape of the connection electrode 3160b of the second electrode 3160 may be variously modified according to embodiments.

The semiconductor device 3200 according to the embodiment may comprise a second insulating layer 3142, as shown in FIGS. 32 and 33. The second insulating layer 3142 may be disposed on the second electrode 3160.

The second insulating layer 3142 may be disposed around the light emitting structure of P1. The second insulating layer 3142 may be disposed on the second electrode 3160 around the light emitting structure of P1. The second insulating layer 3142 may be disposed around the light emitting structure of P2. The second insulating layer 3142 may be disposed on the second electrode 3160 around the light emitting structure of P2.

In addition, the second insulating layer 3142 may be disposed between the light emitting structure of P1 and the light emitting structure of P2. The second insulating layer 3142 may be disposed on the first conductivity type DBR layer 3113. The second insulating layer 3142 may be disposed on the connection electrode 3160b of the second electrode 3160 between the light emitting structure of P1 and the light emitting structure of P2.

The second insulating layer 3142 may expose an upper surface of the second electrode 3160 disposed on the upper surface of the light emitting structure of P1. The second insulating layer 3142 may expose an upper surface of the upper electrode 3160a disposed on the upper surface of the second DBR layer 3120a. The second insulating layer 3142 may expose an upper surface of the second electrode 3160 disposed on the upper surface of the light emitting structure of P2. The second insulating layer 3142 may expose an upper surface of the upper electrode 3160a disposed on the upper surface of the fourth DBR layer 3120b.

The second insulating layer 3142 according to the embodiment may be provided to expose an upper surface of the first electrode 3150 disposed between the plurality of light emitting structures P3, P4, . . . in a region where the first bonding pad 3155 is disposed, as shown in FIG. 32. Also, the second insulating layer 3142 may be provided to expose an upper surface of the second electrode 3160 disposed on the plurality of light emitting structures P1, P2, . . . in a region where the second bonding pad 3165 is disposed.

In addition, according to the embodiment, the second insulating layer 3142 may be provided to expose an upper surface of the second electrode 3160 physically connecting the plurality of light emitting structures, in the region where the second bonding pad 3165 is disposed. At this time, the second insulating layer 3142 may be disposed such that the connection electrode 3160b of the second electrode 3160, having a line shape, disposed on the first conductivity type DBR layer 3113 is selectively exposed. For example, the second insulating layer 3142 may be disposed on the upper surface of the connection electrode 3160b connecting the light emitting structure of P1 and the light emitting structure of P2 such that the second electrode 3160 is not exposed. In addition, the second insulating layer 3142 may be disposed such that an upper surface of the connection electrode 3160b connecting the light emitting structure of P1 and the light emitting structure of P5 is exposed. The formation of the second insulating layer 3142 will be further described with reference to a method of manufacturing a semiconductor device according to an embodiment.

The semiconductor device 3200 according to the embodiment may comprise a first bonding pad 3155 and a second bonding pad 3165, as shown in FIGS. 32 and 33. According to the embodiment, the first bonding pad 3155 may be electrically connected to the first conductivity type DBR layer of the plurality of light emitting structures P1, P2, P3, P4, P5, . . . . The second bonding pad 3165 may be electrically connected to the second conductivity type DBR layer of the plurality of light emitting structures P1, P2, P3, P4, P5, . . . .

The first bonding pad 3155 may be disposed on the second insulating layer 3142. The first bonding pad 3155 may be electrically connected to the first electrode 3150. The first bonding pad 3155 may be connected to the first electrode 3150 exposed through the first insulating layer 3141 and the second insulating layer 3142 as shown in FIG. 32. The first bonding pad 3155 may be directly contacted with an upper surface of the first electrode 3150 exposed through the first insulating layer 3141 and the second insulating layer 3142 at the periphery of the light emitting structure of P3 and the periphery of the light emitting structure of P4.

The second bonding pad 3165 may be disposed on the second insulating layer 3142. The second bonding pad 3165 may be electrically connected to the second electrode 3160 disposed on an upper surface of the light emitting structure of P1. The second bonding pad 3165 may be disposed in direct contact with an upper surface of the upper electrode 3160a disposed on the second DBR layer 3120a. In addition, the second bonding pad 3165 may be electrically connected to the second electrode 3160 disposed on an upper surface of the light emitting structure of P2. The second bonding pad 3165 may be disposed in direct contact with the upper surface of the upper electrode 3160a disposed on the fourth DBR layer 3120b.

Next, the semiconductor device 3200 according to the embodiment will be further described with reference to FIGS. 32 and 35, based on a light emitting structure of P3 and a light emitting structure of P4 disposed under the first bonding pad 3155. FIG. 34 is a sectional view taken along line B-B of the semiconductor device according to the embodiment shown in FIG. 32. In describing the semiconductor device according to the embodiment with reference to FIGS. 32 and 34, description overlapping with those described above may be omitted.

The semiconductor device 3200 according to the embodiment may comprise a plurality of light emitting structures P3, P4, . . . disposed under the first bonding pad 3155. The plurality of light emitting structures P3, P4, . . . may comprise light emitting apertures 3130c, 3130d, . . . , respectively, which emit light. The plurality of light emitting structures P3, P4, . . . may be spaced apart from each other. For example, the light emitting apertures 3130c, 3130d, . . . may be provided with a diameter in a range of several micrometers to several tens of micrometers.

The light emitting structure of P3 may comprise a fifth DBR layer 3110c of a first conductivity type, a sixth DBR layer 3120c of a second conductivity type, and a third active layer 3115c. The third active layer 3115c may be disposed between the fifth DBR layer 3110c and the sixth DBR layer 3120c. For example, the third active layer 3115c may be disposed on the fifth DBR layer 3110c, and the sixth DBR layer 3120c may be disposed on the third active layer 3115c. The light emitting structure of P3 may further comprise a third aperture layer 3117c disposed between the third active layer 3115c and the sixth DBR layer 3120c.

The light emitting structure of P4 may comprise a seventh DBR layer 3110d of the first conductivity type, an eighth DBR layer 3120d of the second conductivity type, and a fourth active layer 3115d. The fourth active layer 3115d may be disposed between the seventh DBR layer 3110d and the eighth DBR layer 3120d. For example, the fourth active layer 3115d may be disposed on the seventh DBR layer 3110d, and the eighth DBR layer 3120d may be disposed on the fourth active layer 3115d. The light emitting structure of P4 may further comprise a fourth aperture layer 3117d disposed between the fourth active layer 3115d and the eighth DBR layer 3120d.

In addition, the first conductivity type DBR layer 3113 may be disposed between the fifth DBR layer 3110c of the light emitting structure of P3 and the seventh DBR layer 3110d of the light emitting structure of P4. The fifth DBR layer 3110c and the seventh DBR layer 3110d may be physically connected by the first conductivity type DBR layer 3113. For example, an upper surface of the first conductivity type DBR layer 3113 and an upper surface of the fifth DBR layer 3110c may be disposed on the same horizontal plane. The upper surface of the first conductivity type DBR layer 3113 and an upper surface of the seventh DBR layer 3110d may be disposed on the same horizontal plane.

In addition, the third active layer 3115c of the light emitting structure of P3 and the fourth active layer 3115d of the light emitting structure of P4 may be spaced apart from each other. In addition, the sixth DBR layer 3120c of the light emitting structure of P3 and the eighth DBR layer 3120d of the light emitting structure of P4 may be spaced apart from each other.

The semiconductor device 3200 according to the embodiment may comprise a first insulating layer 3141, as shown in FIGS. 32 and 34. The first insulating layer 3141 may be disposed on a side surface of the light emitting structure of P3. The first insulating layer 3141 may be disposed to surround the side surface of the light emitting structure of P3. The first insulating layer 3141 may be disposed on a side surface of the light emitting structure of P4. The first insulating layer 3141 may be disposed to surround the side surface of the light emitting structure of P4.

In addition, the first insulating layer 3141 may be disposed between the light emitting structure of P3 and the light emitting structure of P4. The first insulating layer 3141 may be disposed on the first conductivity type DBR layer 3113.

The first insulating layer 3141 may expose an upper surface of the light emitting structure of P3. The first insulating layer 3141 may expose an upper surface of the sixth DBR layer 3120c of the light emitting structure of P3. The first insulating layer 3141 may expose an upper surface of the light emitting structure of P4. The first insulating layer 3141 may expose an upper surface of the eighth DBR layer 3120d of the light emitting structure of P4.

The semiconductor device 3200 according to the embodiment may comprise a first electrode 3150, as shown in FIGS. 32 and 34. The first electrode 3150 may be disposed around the plurality of light emitting structures P3, P4, . . . . The first electrode 3150 may comprise a plurality of openings exposing the plurality of light emitting structures P3, P4, . . . .

The first electrode 3150 may be disposed on the first conductivity type DBR layer 3113. The first electrode 3150 may be electrically connected to the fifth DBR layer 3110c. The first electrode 3150 may be electrically connected to the seventh DBR layer 3110d. The first electrode 3150 may be disposed under the first insulating layer 3141. The first electrode 3150 may be disposed under the first insulating layer 3141 in a region between the light emitting structure of P3 and the light emitting structure of P4. The first electrode 3150 may be disposed between the first insulating layer 3141 and the first conductivity type DBR layer 3113 in a region between the light emitting structure P3 and the light emitting structure of P4.

The semiconductor device 3200 according to the embodiment may comprise a second electrode 3160, as shown in FIGS. 32 and 34. FIG. The second electrode 3160 may be disposed on the first insulating layer 3141. The second electrode 3160 may comprise an upper electrode 3160a disposed on an upper surface of the plurality of light emitting structures P1, P2, P3, P4, P5, . . . and a connection electrode 3160b connecting the upper electrode 3160a.

The second electrode 3160 may be disposed on a side surface of the light emitting structure of P3. The second electrode 3160 may be disposed on the upper surface of the light emitting structure of P3. The upper electrode 3160a of the second electrode 3160 may be disposed on the sixth DBR layer 3120c of the light emitting structure of P3. The upper electrode 3160a of the second electrode 3160 may be disposed in direct contact with an upper surface of the sixth DBR layer 3120c.

In addition, the second electrode 3160 may be disposed on a side surface of the light emitting structure of P4. The second electrode 3160 may be disposed on the upper surface of the light emitting structure of P4. The upper electrode 3160a of the second electrode 3160 may be disposed on the sixth DBR layer 3120d of the light emitting structure of P4. The upper electrode 3160a of the second electrode 3160 may be disposed in direct contact with an upper surface of the sixth DBR layer 3120d.

The second electrode 3160 may be disposed between the light emitting structure of P3 and the light emitting structure of P4. The connection electrode 3160b of the second electrode 3160 may be disposed on the first insulating layer 3141 in a region between the light emitting structure of P3 and the light emitting structure of P4.

The second electrode 3160 according to the embodiment may connect the upper surfaces of the plurality of light emitting structures P1, P2, P3, P4, P5, . . . as shown in FIG. 32. The second electrode 3160 may be physically connected to each second conductivity type DBR layer of the plurality of light emitting structures P1, P2, P3, P4, P5, . . . . That is, the second electrode 3160 may be physically connected not only to the upper surface of the plurality of light emitting structures P1, P2, . . . disposed under the second bonding pad 3165, but also to the upper surface of the plurality of light emitting structures P3, P4, . . . disposed under the first bonding pad 3155.

For example, the connection electrode 3160b of the second electrode 3160 may be provided in a linear shape having a constant line width, as shown in FIG. 32. Of course, the shape of the connection electrode 3160b of the second electrode 3160 may be variously modified according to embodiments.

The semiconductor device 3200 according to the embodiment may comprise a second insulating layer 3142, as shown in FIGS. 32 and 34. The second insulating layer 3142 may be disposed on the second electrode 3160. The second insulating layer 3142 may be disposed on the first insulating layer 3141.

The second insulating layer 3142 may be disposed around the light emitting structure of P3. The second insulating layer 3142 may be disposed on the second electrode 3160 around the light emitting structure of P3. The second insulating layer 3142 may be disposed around the light emitting structure of P4. The second insulating layer 3142 may be disposed on the second electrode 3160 around the light emitting structure of P4.

In addition, the second insulating layer 3142 may be disposed between the light emitting structure of P3 and the light emitting structure of P4. The second insulating layer 3142 may be disposed on the first conductivity type DBR layer 3113. The second insulating layer 3142 may be disposed on the connection electrode 3160b of the second electrode 3160 between the light emitting structure of P3 and the light emitting structure of P4.

The second insulating layer 3142 may be disposed on an upper surface of the second electrode 3160 disposed on the upper surface of the light emitting structure of P3. The second insulating layer 3142 may be disposed on an upper surface of the upper electrode 3160a disposed on the upper surface of the sixth DBR layer 3120c. The second insulating layer 3142 may be disposed on an upper surface of the second electrode 3160 disposed on the upper surface of the light emitting structure of P4. The second insulating layer 3142 may be disposed on an upper surface of the upper electrode 3160a disposed on the upper surface of the eighth DBR layer 3120d.

The second insulating layer 3142 according to the embodiment may be provided to expose an upper surface of the first electrode 3150 disposed between the plurality of light emitting structures P3, P4, . . . in a region where the first bonding pad 3155 is disposed, as shown in FIG. 32. Also, the second insulating layer 3142 may be provided to expose an upper surface of the second electrode 3160 disposed on the plurality of light emitting structures P1, P2, . . . in a region where the second bonding pad 3165 is disposed.

In addition, according to the embodiment, the second insulating layer 3142 may be disposed to expose an upper surface of the second electrode 3160 that is physically connecting the plurality of the light emitting structures, in the region where the second bonding pad 3165 is disposed.

At this time, the second insulating layer 3142 may be disposed such that the connection electrode 3160*b* of the second electrode 3160, having a line shape, disposed on the first conductivity type DBR layer 3113 is selectively exposed. For example, the second insulating layer 3142 may be disposed on the upper surface of the connection electrode 3160*b* connecting the light emitting structure of P1 and the light emitting structure of P2 such that the second electrode 3160 is not exposed. In addition, the second insulating layer 3142 may be disposed such that an upper surface of the connection electrode 3160*b* connecting the light emitting structure of P1 and the light emitting structure of P5 is exposed. The formation of the second insulating layer 3142 will be further described with reference to a method of manufacturing a semiconductor device according to an embodiment.

The semiconductor device 3200 according to the embodiment may comprise a first bonding pad 3155 and a second bonding pad 3165, as shown in FIGS. 32 and 34. According to the embodiment, the first bonding pad 3155 may be electrically connected to the first conductivity type DBR layer of the plurality of light emitting structures P1, P2, P3, P4, P5, . . . . The second bonding pad 3165 may be electrically connected to the second conductivity type DBR layer of the plurality of light emitting structures P1, P2, P3, P4, P5, . . . .

The first bonding pad 3155 may be disposed on the second insulating layer 3142. The first bonding pad 3155 may be electrically connected to the first electrode 3150. The first bonding pad 3155 may be connected to the first electrode 3150 exposed through the first insulating layer 3141 and the second insulating layer 3142 as shown in FIG. 32. The electrical connection between the first bonding pad 3155 and the first electrode 3150 according to the embodiment will be further described with reference to FIG. 35.

The second bonding pad 3165 may be disposed on the second insulating layer 3142. The second bonding pad 3165 may be electrically connected to the second electrode 3160 disposed on the upper surface of the light emitting structure of P3 and disposed on the upper surface of the light emitting structure of P4.

Next, referring to FIGS. 32 and 35, the semiconductor device 3200 according to the embodiment will be further described based on the light emitting structure of P3 disposed under the first bonding pad 3155. FIG. 35 is a sectional view taken along line C-C of the semiconductor device according to the embodiment shown in FIG. 32. In describing the semiconductor device according to the embodiment with reference to FIGS. 32 and 35, description overlapping with those described above may be omitted.

The semiconductor device 3200 according to the embodiment may comprise a plurality of light emitting structures P3, P4, . . . disposed under the first bonding pad 3155. The light emitting structure of P3 according to the embodiment may comprise a fifth DBR layer 3110*c* of the first conductivity type, a sixth DBR layer 3120*c* of the second conductivity type, and a third active layer 3115*c*.

As shown in FIG. 35, the semiconductor device 3200 according to the embodiment may comprise a first conductivity type DBR layer 3113 extending from the fifth DBR layer 3110*c* in the circumferential direction of the light emitting structure of P3. The first conductivity type DBR layer 3113 may be physically connected to the fifth DBR layer 3110*c*. For example, an upper surface of the first conductivity type DBR layer 3113 and an upper surface of the fifth DBR layer 3110*c* may be disposed on the same horizontal plane.

In addition, the semiconductor device 3200 according to the embodiment may comprise a first electrode 3150, as shown in FIGS. 32 and 35. The first electrode 3150 may be disposed around the light emitting structure of P3 and the light emitting structure of P4. The first electrode 3150 may comprise a plurality of openings exposing the plurality of light emitting structures P1, P2, P3, P4, P5, . . . .

The first electrode 3150 may be disposed on the first conductivity type DBR layer 3113. The first electrode 3150 may be electrically connected to the fifth DBR layer 3110*c*. The first electrode 3150 may be disposed on the first conductivity type DBR layer 3113 around the light emitting structure of P3.

The semiconductor device 3200 according to the embodiment may comprise a first insulating layer 3141, as shown in FIGS. 32 and 35. The first insulating layer 3141 may be disposed on a side surface of the light emitting structure of P3. The first insulating layer 3141 may be disposed to surround the side surface of the light emitting structure of P3. The first insulating layer 3141 may expose the upper surface of the light emitting structure of P3. The first insulating layer 3141 may expose an upper surface of the sixth DBR layer 3120*c* of the light emitting structure of P3. The first insulating layer 3141 may be disposed on the first electrode 3150.

Meanwhile, according to the semiconductor device 3200 of the embodiment, as shown in FIG. 35, the first insulating layer 3141 may expose a portion of the first electrode 3150. The first insulating layer 3141 may comprise an opening exposing an upper surface of the first electrode 3150 in the periphery of the light emitting structure of P3. The first insulating layer 3141 may expose the upper surface of the first electrode 3150 disposed on the first conductivity type DBR layer 3113 in the periphery of the light emitting structure of P3.

The semiconductor device 3200 according to the embodiment may comprise a second electrode 3160, as shown in FIGS. 32 and 35. The second electrode 3160 may be electrically connected to the second conductivity type DBR layer of the plurality of light emitting structures P1, P2, P3, P4, P5, . . . . The second electrode 3160 may comprise an upper electrode 3160*a* disposed on the upper surface of the plurality of light emitting structures P1, P2, P3, P4, P5, . . . and a connection electrode 3160*b* connecting the upper electrode 3160*a*.

The second electrode 3160 may be disposed on the upper surface of the light emitting structure of P3. The upper electrode 3160*a* of the second electrode 3160 may be disposed on the sixth DBR layer 3120*c* of the light emitting structure of P3. The upper electrode 3160*a* of the second electrode 3160 may be disposed in direct contact with an upper surface of the sixth DBR layer 3120*c*.

The connection electrode 3160*b* of the second electrode 3160 according to the embodiment may connect the upper surfaces of the plurality of light emitting structures P1, P2, P3, P4, P5, . . . . The second electrode 3160 may be physically connected to each second conductivity type DBR layer of the plurality of light emitting structures P1, P2, P3, P4, P5, . . . . That is, the second electrode 3160 may be physically connected not only to the upper surface of the plurality of light emitting structures P1, P2, . . . disposed under the second bonding pad 3165, but also to the upper surface of the plurality of light emitting structures P3, P4, . . . disposed under the first bonding pad 3155.

For example, the connection electrode 3160*b* of the second electrode 3160 may be provided in a linear shape having a constant line width, as shown in FIG. 32. Of course, the shape of the connection electrode 3160b of the second electrode 3160 may be variously modified according to embodiments.

The semiconductor device 3200 according to the embodiment may comprise a second insulating layer 3142, as shown in FIGS. 32 and 35. The second insulating layer 3142 may be disposed on the second electrode 3160. The second insulating layer 3142 may be disposed on the first insulating layer 3141.

The second insulating layer 3142 may be disposed around the light emitting structure of P3. The second insulating layer 3142 may be disposed on the first insulating layer 3141 around the light emitting structure of P3. The second insulating layer 3142 may be disposed on the light emitting structure of P3. The second insulating layer 3142 may be disposed on the second electrode 3160 that is disposed on the sixth DBR layer 3120c.

Meanwhile, according the semiconductor device 3200 of the embodiment, as shown in FIG. 35, the second insulating layer 3142 may comprise an opening exposing a portion of the first electrode 3150. The second insulating layer 1142 may expose an upper surface of the first electrode 3150 at the periphery of the third light emitting structure of P3. The second insulating layer 3142 may expose the upper surface of the first electrode 3150 disposed on the first conductivity type DBR layer 1113 in the periphery of the third light emitting structure of P3. For example, the opening provided by the second insulating layer 3142 may be disposed on a region between the connection electrodes 3160b.

As shown in FIGS. 32 and 35, the second insulating layer 3142 according to the embodiment may be provided to expose an upper surface of the first electrode 3150 between the plurality of light emitting structures P3, P4, . . . , in a region where the first bonding pad 3155 is disposed. Also, the second insulating layer 3142 may be provided to expose an upper surface of the second electrode 3160 disposed on the plurality of light emitting structures P1, P2, . . . in a region where the second bonding pad 3165 is disposed.

In addition, according to the embodiment, the second insulating layer 3142 may be disposed to expose an upper surface of the second electrode 1160 that is physically connecting the plurality of the light emitting structures, in the region where the second bonding pad 3165 is disposed. At this time, the second insulating layer 3142 is disposed such that the connection electrode 3160b of the second electrode 3160, having a line shape, disposed on the first conductivity type DBR layer 3113 is selectively exposed. For example, the second insulating layer 3142 may be disposed on the upper surface of the connection electrode 3160b that si connecting the light emitting structure of P1 and the light emitting structure of P2 such that the second electrode 3160 is not exposed. In addition, the second insulating layer 3142 may be disposed such that an upper surface of the connection electrode 3160b that is connecting the light emitting structure of P1 and the light emitting structure of P5 is exposed. The formation of the second insulating layer 3142 will be further described with reference to a method of manufacturing a semiconductor device according to an embodiment.

The semiconductor device 3200 according to the embodiment may comprise a first bonding pad 3155 and a second bonding pad 3165, as shown in FIGS. 32 and 35. According to the embodiment, the first bonding pad 3155 may be electrically connected to the first conductivity type DBR layer of the plurality of light emitting structures P1, P2, P3, P4, P5, . . . . The second bonding pad 3165 may be electrically connected to the second conductivity type DBR layer of the plurality of light emitting structures P1, P2, P3, P4, P5, . . . .

The first bonding pad 3155 may be disposed on the second insulating layer 3142. The first bonding pad 3155 may be electrically connected to the first electrode 3150. The first bonding pad 3155 may be disposed on the light emitting structure of P3, as shown in FIGS. 32 and 35. The first bonding pad 3155 may be connected to the first electrode 3150 through an opening provided by the first insulating layer 3141 and the second insulating layer 3142. For example, the openings provided by the first insulating layer 3141 and the second insulating layer 3142 may be disposed in a region between the connection electrodes 3160b.

The first bonding pad 3155 may be connected to the first electrode 3150 disposed on the first conductivity type DBR layer 3113 in the periphery of the light emitting structure of P3. The first bonding pad 3155 may be disposed in direct contact with an upper surface of the first electrode 3150 disposed on the first conductivity type DBR layer 3113. For example, a lower surface of the first bonding pad 3155 may be disposed in direct contact with the upper surface of the first electrode 3150 disposed on the first conductivity type DBR layer 3113.

The second bonding pad 3165 may be disposed on the second insulating layer 3142. The second bonding pad 3165 may be electrically connected to the second electrode 3160 disposed on the upper surface of the light emitting structure of P3. For example, a lower surface of the second bonding pad 3165 may be disposed in direct contact with an upper surface of the upper electrode 3160a disposed on the light emitting structure of P3.

Then, referring to FIGS. 32, 33 and 35, the semiconductor device 3200 according to the embodiment will be further described based on the light emitting structure of P3 disposed under the first bonding pad 3155 and a light emitting structure of P1 disposed under the second bonding pad 3165. In the following description, description overlapping with those described above may be omitted.

The semiconductor device 3200 according to the embodiment may comprise a plurality of light emitting structures P3, P4, . . . disposed under the first bonding pad 3155, as shown in FIGS. 32 and 35. The light emitting structure of P3 according to the embodiment may comprise a fifth DBR layer 3110c of the first conductivity type, a sixth DBR layer 3120c of the second conductivity type, and a third active layer 3115c.

The semiconductor device 3200 according to the embodiment may comprise a plurality of light emitting structures P1, P2, . . . disposed under the second bonding pad 3165, as shown in FIGS. 32 and 33. The light emitting structure of P1 according to the embodiment may comprise a first DBR layer 3110a of the first conductivity type, a second DBR layer 3120a of the second conductivity type, and a first active layer 3115a.

In addition, the semiconductor device 3200 according to the embodiment may comprise a first electrode 3150 and a second electrode 3160. The first electrode 3150 may comprise a plurality of openings exposing the plurality of light emitting structures P1, P2, P3, P4, P5, . . . . The second electrode 3160 may comprise an upper electrode 3160a disposed on an upper surface of the plurality of light emitting structures P1, P2, P3, P4, P5, . . . and a connection electrode 3160b connecting the upper electrode 3160a.

The first electrode 3150 may be electrically connected to the first DBR layer 3110a and the fifth DBR layer 3110c. The first electrode 3150 may be disposed around the light emitting structure of P1. The first electrode 3150 may be disposed around the light emitting structure of P3. The first electrode 3150 may be disposed between the light emitting structure of P1 and the light emitting structure of P3.

The second electrode 3160 may be electrically connected to the second DBR layer 3120a and the sixth DBR layer 3120c. The second electrode 3160 may be disposed on a side surface of the light emitting structure of P1. The second electrode 3160 may be disposed on an upper surface of the second DBR layer 3120a. For example, a lower surface of the upper electrode 3160a may be disposed in direct contact with the upper surface of the second DBR layer 3120a. The second electrode 3160 may be disposed on an upper surface of the sixth DBR layer 3120c. For example, a lower surface of the upper electrode 3160a may be disposed in direct contact with the upper surface of the sixth DBR layer 3120c.

The first bonding pad 3155 according to the embodiment may be disposed on the light emitting structure of P3, as shown in FIGS. 32 and 35. The first bonding pad 3155 may be electrically connected to the first electrode 3150. For example, a lower surface of the first bonding pad 3155 may be disposed in direct contact with an upper surface of the first electrode 3150.

The second bonding pad 3165 according to the embodiment may be disposed on the light emitting structure of P1, as shown in FIGS. 32 and 34. The second bonding pad 3165 may be electrically connected to the second electrode 3160. For example, a lower surface of the second bonding pad 3165 may be disposed in direct contact with an upper surface of the second electrode 3160.

Meanwhile, the second electrode 3160 according to the embodiment may be disposed in contact with an upper surface of the second DBR layer 3120a, as shown in FIG. 33. For example, a lower surface of the upper electrode 3160a of the second electrode 3160 may be disposed in direct contact with the upper surface of the second DBR layer 3120a. In addition, the second electrode 3160 according to the embodiment may be disposed in contact with an upper surface of the sixth DBR layer 3120c, as shown in FIG. 35. For example, a lower surface of the upper electrode 3160a of the second electrode 3160 may be disposed in direct contact with the upper surface of the sixth DBR layer 3120c.

In addition, the second electrode 3160 may be disposed on the first electrode 3150 between the light emitting structure of P1 and the light emitting structure of P3, as shown in FIGS. 32 and 33. The second electrode 3160 may be disposed on the first electrode 3150 around the light emitting structure of P1. The connection electrode 3160b may be disposed on the first electrode 3150 around the light emitting structure of P1. The second electrode 3160 may be disposed on the first conductivity type DBR layer 3113 around the light emitting structure of P1. The connection electrode 3160b may be disposed on the first conductivity type DBR layer 3113 around the light emitting structure of P1.

The first conductivity type DBR layer 3113 may physically connect the first DBR layer 3110a and the fifth DBR layer 3110c. The first electrode 3150 may be disposed in contact with an upper surface of the first conductivity type DBR layer 3113. For example, a lower surface of the first electrode 3150 may be disposed in direct contact with the upper surface of the first conductivity type DBR layer 3113.

According to the embodiment, the first bonding pad 3155 may be disposed in contact with an upper surface of the first electrode 3150 in a region where the first conductivity type DBR layer 3113 is provided. For example, in the region where the first conductivity type DBR layer 3113 is provided, a lower surface of the first bonding pad 3155 may be disposed in direct contact with the upper surface of the first electrode 3150.

The first bonding pad 3155 may be in direct contact with an upper surface of the first electrode 3150 through an opening provided by the first insulating layer 3141 and the second insulating layer 3142. For example, the openings provided by the first insulating layer 3141 and the second insulating layer 3142 may be disposed in a region between the connection electrodes 3160b.

Meanwhile, the semiconductor device 3200 according to the embodiment may further comprise a substrate 3105 as shown in FIGS. 32 to 35. A plurality of light emitting structures P1, P2, P3, P4, P5, . . . may be disposed on the substrate 3105. For example, the substrate 3105 may be a growth substrate on which the plurality of light emitting structures P1, P2, P3, P4, P5, . . . may be grown. For example, the substrate 3105 may be an intrinsic semiconductor substrate.

According to the semiconductor device 3200 of the embodiment, power may be supplied to the plurality of light emitting structures P1, P2, P3, P4, P5, . . . through the first bonding pad 3155 and the second bonding pad 3165. Also, the first electrode 3150 may be disposed on an upper surface of the first conductivity type DBR layer of the plurality of light emitting structures P1, P2, P3, P4, P5, . . . . Also, the second electrode 3160 may be disposed on an upper surface of the second conductivity type DBR layer of the plurality of light emitting structures P1, P2, P3, P4, P5, . . . .

Accordingly, according to the embodiment, when power is supplied to the plurality of light emitting structures P1, P2, P3, P4, P5, . . . , power does not need to be applied through a lower surface of the substrate 3105. In a conventional semiconductor device, when power is to be applied through the lower surface of the substrate, the substrate 3105 must be provided as a conductive substrate. However, according to the semiconductor device 3200 of the embodiment, the substrate 3105 may be a conductive substrate or an insulating substrate. For example, the substrate 3105 according to the embodiment may be provided as an intrinsic semiconductor substrate.

In addition, the substrate 3105 may be a support substrate attached to the plurality of light emitting structures P1, P2, P3, P4, P5, . . . , in which the support substrate may be attached after the plurality of light emitting structures P1, P2, P3, P4, P5, . . . are grown on a growth substrate and the growth substrate is removed.

Meanwhile, the semiconductor device 3200 according to the embodiment may be implemented such that light is emitted in a downward direction of the semiconductor device 3200, as shown in FIGS. 32 to 35. That is, according to the semiconductor device 3200 of the embodiment, light can be emitted in a direction in which the first conductivity type DBR layer is disposed from the active layer constituting the plurality of light emitting structures P1, P2, P3, P4, P5, . . . . Light may be emitted from the active layer constituting the plurality of light emitting structures P1, P2, P3, P4, P5, . . . in the direction in which the substrate 3105 is disposed.

According to the embodiment, the second electrode 3160 is disposed on the upper surface of the second conductivity type DBR layer of the plurality of light emitting structures P1, P2, P3, P4, P5, . . . , and the second bonding pad 3165 is disposed on and in contact with the second electrode 3160. Also, the first electrode 3150 is disposed on the upper surface of the first conductivity type DBR layer of the plurality of light emitting structures P1, P2, P3, P4, P5, . . . , and the first bonding pad 3155 is disposed on and in contact with the first electrode 3150. Accordingly, heat generated in the plurality of light emitting structures P1, P2, P3, P4, P5, . . . can be effectively dissipated to the outside through the first bonding pad 3155 and the second bonding pad 3165.

Meanwhile, in the case of a general semiconductor device, it is known that the power conversion efficiency (PCE) is significantly lowered due to the heat generated in the light emitting structure. When power is supplied to the light emitting structure through the substrate disposed at the lower portion, generally heat dissipation is performed through the substrate. However, since the thermal conductivity of the substrate is low, it is difficult to dissipate the heat generated in the light emitting structure to the outside. For example, it is known that the thermal conductivity of a GaAs substrate is as low as 52 W/(m*K).

However, according to the embodiment, since the first bonding pad 3155 and the second bonding pad 3165 may be connected to the external heat dissipating substrate or the like, so that the heat generated in the plurality of light emitting structures P1, P2, P3, P4, P5, . . . can be effectively dissipated to the outside. Therefore, according to the embodiment, since the heat generated in the semiconductor device 3200 can be effectively dissipated to the outside, so that the power conversion efficiency (PCE) can be improved.

Meanwhile, according to the semiconductor device 3200 of the embodiment, as described above, light can be emitted in a downward direction of the semiconductor device 3200. According to the semiconductor device 3200 of the embodiment, the reflectance of the first conductivity type DBR layer provided in a lower portion of the plurality of light emitting structures P1, P2, P3, P4, P5, . . . can be selected to be smaller than that the reflectance of the second conductivity type DBR layer provided in an upper portion of the plurality of light emitting structures P1, P2, P3, P4, P5, . . . . Accordingly, light generated in the plurality of light emitting structures P1, P2, P3, P4, P5, . . . can be emitted toward the substrate 3105 of the semiconductor device 3200.

In addition, according to the semiconductor device 3200 of the embodiment, the first insulating layer 3141 may be provided as a DBR layer. According to the semiconductor device 3200 of the embodiment, the second insulating layer 3142 may be provided as a DBR layer. According to the embodiment, at least one of the first insulating layer 3141 and the second insulating layer 3142 may be provided as a DBR layer. Accordingly, the light generated in the plurality of light emitting structures P1, P2, P3, P4, P5, . . . is reflected by the first insulating layer 3141 and the second insulating layer 3142 disposed at the upper portion, and can be effectively extracted downward.

For example, at least one of the first insulating layer 3141 and the second insulating layer 3142 may be provided as a DBR layer formed by stacking $SiO_2$ and $TiO_2$ as a plurality of layers. Also, at least one of the first insulating layer 3141 and the second insulating layer 3142 may be provided as a DBR layer formed by stacking $Ta_2O_3$ and $SiO_2$ as a plurality of layers. Also, at least one of the first insulating layer 3141 and the second insulating layer 3142 may be provided as a DBR layer formed by stacking $SiO_2$ and $Si_3N_4$ as a plurality of layers.

Meanwhile, in the conventional semiconductor device, when the power is supplied to the light emitting structure through the substrate, the substrate must be conductive. Accordingly, when a conductive semiconductor substrate is applied, a dopant is added to the substrate to improve the conductivity. However, the dopant added to the substrate causes absorption and scattering of the emitted light, which may cause a decrease in power conversion efficiency (PCE).

However, according to the semiconductor device 3200 of the embodiment, as described above, since the substrate 3105 may not be a conductive substrate, so that an additional dopant may not be added to the substrate 3105. Accordingly, the dopant is not added to the substrate 3105 according to the embodiment, absorption and scattering by the dopant in the substrate 3105 can be reduced. Therefore, according to the embodiment, light generated in the plurality of light emitting structures P1, P2, P3, P4, P5, . . . can be effectively provided in a downward direction, and power conversion efficiency (PCE) can be improved.

In addition, the semiconductor device 3200 according to the embodiment may further comprise an anti-reflection layer provided on the lower surface of the substrate 3105. The anti-reflection layer can prevent light emitted from the semiconductor device 3200 from being reflected on the surface of the substrate 3105, and transmit the light, thereby improving light loss due to reflection.

Meanwhile, in the case of a conventional semiconductor device, as a method for providing power to a plurality of light emitting structures, a bonding pad is disposed in an outer region on the upper surface of the substrate. Thus, a loss occurs in which the light emitting structure can not be formed by the region where the bonding pads are disposed.

However, according to the semiconductor device of the embodiment, since the bonding pad is provided on the region where the light emitting structure is formed, an additional space for forming the bonding pad may not be provided in the outer region on the substrate. Thus, according to the semiconductor device of the embodiment, the area of the substrate on which the semiconductor device is formed can be reduced, so that the number of semiconductor devices that can be manufactured with respect to the same area of the wafer can be increased.

Hereinafter, a method of manufacturing a semiconductor device according to an embodiment of the present invention will be described with reference to the drawings. In explaining the method of manufacturing the semiconductor device according to the embodiment, description overlapping with those described with reference to FIGS. 32 to 35 may be omitted.

First, FIGS. 36*a* to 36*d* are views showing an example in which a light emitting structure is formed in the method of manufacturing the semiconductor device according to the embodiment of the present invention. FIG. 36*a* is a plan view showing a step of forming a light emitting structure according to the method of manufacturing the semiconductor device of the embodiment, FIG. 36*b* is a sectional view taken along line A-A of the semiconductor device according to the embodiment shown in FIG. 36*a*, FIG. 36*c* is a sectional view taken along line B-B of the semiconductor device according to the embodiment shown in FIG. 36*a*, and FIG. 36*d* is a sectional view taken along line C-C of the semiconductor device according to the embodiment shown in FIG. 36*a*.

According to the method of manufacturing the semiconductor device of the embodiment, a plurality of light emitting structures P1, P2, P3, P4, P5, . . . may be formed on a substrate 3105, as shown in FIGS. 36*a* to 36*d*.

The substrate 3105 may be any one selected from an intrinsic semiconductor substrate, a conductive substrate, and an insulating substrate. For example, the substrate 3105 may be a GaAs intrinsic semiconductor substrate. The substrate 3105 may be provided with at least one selected from the conductive material including copper (Cu), gold (Au), nickel (Ni), molybdenum (Mo), copper-tungsten (Cu—W), and a carrier wafer such as Si, Ge, AlN, GaAs, ZnO, SiC, and the like.

For example, a first conductivity type DBR layer, an active layer, and a second conductivity type DBR layer may be sequentially formed on the substrate 3105. The plurality of light emitting structures P1, P2, P3, P4, P5, . . . may be formed through mesa etching for the second conductivity type DBR layer and the active layer.

The plurality of light emitting structures P1, P2, P3, P4, . . . may comprise a first conductivity type DBR layer 3110a, 3110b, 3110c, 3110d, . . . , an active layer 3115a, 3115b, 3115c, 3115d, . . . , an aperture layer 3117a, 3117b, 3117c, 3117d, . . . , and a second conductivity type DBR layer 3120a, 3120b, 3120c, 3120d, . . . . A first conductivity type DBR layer 3113 may be provided around the plurality of light emitting structures P1, P2, P3, P4, P5, . . . . The first conductivity type DBR layer 3113 may be disposed in a region between the plurality of light emitting structures P1, P2, P3, P4, P5, . . . .

For example, the plurality of light emitting structures P1, P2, P3, P4, . . . may be grown as a plurality of compound semiconductor layers. The plurality of light emitting structures P1, P2, P3, P4, . . . may be formed by an electron beam evaporator, physical vapor deposition (PVD), chemical vapor deposition (CVD), plasma laser deposition (PLD), dual-type thermal evaporator, sputtering, metal organic chemical vapor deposition (MOCVD), or the like.

The first conductivity type DBR layer 3110a, 3110b, 3110c, 3110d, . . . constituting the plurality of light emitting structures P1, P2, P3, P4, . . . may be provided of at least one of a Group III-V or a Group II-VI compound semiconductor doped with a dopant of the first conductivity type. For example, the first conductivity type DBR layer 3110a, 3110b, 3110c, 3110d, . . . may be one of a group including GaAs, GaAl, InP, InAs, and GaP. The first conductivity type DBR layer 3110a, 3110b, 3110c, 3110d, . . . may be provided of semiconductor material having a compositional formula of $Al_xGa_{1-x}As$ (0<x<1)/$Al_yGa_{1-y}As$ (0<y<1)(y<x), for example. The first conductivity type DBR layer 3110a, 3110b, 3110c, 3110d, . . . may be n-type semiconductor layer doped with the first conductivity type dopant that is an n-type dopant such as Si, Ge, Sn, Se, Te, or the like. The first conductivity type DBR layer 3110a, 3110b, 3110c, 3110d, . . . may be a DBR layer having a thickness of $\lambda/4n$ by alternately arranging different semiconductor layers.

The active layer 3115a, 3115b, 3115c, 3115d, . . . constituting the plurality of light emitting structures P1, P2, P3, P4, . . . may be provided of at least one of a Group III-V or a Group II-VI compound semiconductors. For example, the active layer 3115a, 3115b, 3115c, 3115d, . . . may be one of a group including GaAs, GaAl, InP, InAs, and GaP. When the active layer 3115a, 3115b, 3115c, 3115d, . . . is implemented in a multi-well structure, the active layer 3115a, 3115b, 3115c, 3115d, . . . may comprise alternately arranged a plurality of well layers and a plurality of barrier layers. The plurality of well layers may be provided of a semiconductor material having a composition formula of $In_pGa_{1-p}As$ (0≤p≤1), for example. The barrier layer may be disposed of a semiconductor material having a composition formula of, for example, $In_qGa_{1-q}As$ (0≤q≤1).

The aperture layer 3117a, 3117b, 3117c, 3117d, . . . constituting the plurality of light emitting structures P1, P2, P3, P4, . . . may be disposed on the active layer 3115a, 3115b, 3115c, 3115d, . . . . The aperture layer 3117a, 3117b, 3117c, 3117d, . . . may comprise circular opening at the central portion. The aperture layer 3117a, 3117b, 3117c, 3117d, . . . may comprise a function of restricting current movement so as to concentrate current to the central portion of the active layer 3115a, 3115b, 3115c, 3115d, . . . . That is, the aperture layer 3117a, 3117b, 3117c, 3117d, . . . can adjust the resonance wavelength and adjust the beam angle to emit light in the vertical direction from the active layer 3115a, 3115b, 3115c, 3115d, . . . . The aperture layer 3117a, 3117b, 3117c, 3117d, . . . may comprise an insulating material such as $SiO_2$ or $Al_2O_3$. The aperture layer 3117a, 3117b, 3117c, 3117d, . . . may have a higher band gap energy than the active layer 3115a, 3115b, 3115c, 3115d, . . . , the first conductivity type DBR layer 3110a, 3110b, 3110c, 3110d, . . . , and the second conductivity type DBR layer 3120a, 3120b, 3120c, 3120d, . . . .

The second conductivity type DBR layer 3120a, 3120b, 3120c, 3120d, . . . constituting the plurality of light emitting structures P1, P2, P3, P4, . . . may be provided of at least one of a Group III-V or a Group II-VI compound semiconductors doped with a dopant of the second conductivity type. For example, the second conductivity type DBR layer 3120a, 3120b, 3120c, 3120d, . . . may be one of a group including GaAs, GaAl, InP, InAs, and GaP. The second conductivity type DBR layer 3120a, 3120b, 3120c, 3120d, . . . may be formed of a semiconductor material having a composition formula of $Al_xGa_{1-x}As$ (0<x<1)/$Al_yGa_{1-y}As$ (0<y<1)(y<x). The second conductivity type DBR layer 3120a, 3120b, 3120c, 3120d, . . . may be a p-type semiconductor layer having the second conductivity type dopant that is a p-type dopant such as Mg, Zn, Ca, Sr, and Ba. The second conductivity type DBR layer 3120a, 3120b, 3120c, 3120d, . . . may be a DBR layer having a thickness of $\lambda/4n$ by alternately arranging different semiconductor layers.

For example, the second conductivity type DBR layer 3120a, 3120b, 3120c, 3120d, . . . may have a higher reflectance than the first conductivity type DBR layer 3110a, 3110b, 3110c, 3110d, . . . . For example, the second conductivity type DBR layer 3120a, 3120b, 3120c, 3120d, . . . and the first conductivity type DBR layer 3110a, 3110b, 3110c, 3110d, . . . can form a resonant cavity in the vertical direction by a reflectance of 90% or more. At this time, the generated light can be emitted to the outside through the first conductivity type DBR layer 3110a, 3110b, 3110c, 3110d, . . . , which is lower than the reflectance of the second conductivity type DBR layer 3120a, 3120b, 3120c, 3120d, . . . .

Next, as shown in FIGS. 37a to 37d, a first electrode 3150 may be formed.

FIGS. 37a to 37d are views showing an example in which the first electrode is formed in the method of manufacturing the semiconductor device according to the embodiment of the present invention. FIG. 37a is a plan view showing a step of forming the first electrode according to the method of manufacturing the semiconductor device of the embodiment, FIG. 37b is a sectional view taken along line A-A of the semiconductor device according to the embodiment shown in FIG. 37a, 37c is a sectional view taken along line B-B of the semiconductor device according to the embodiment shown in FIG. 37a, and FIG. 37d is a sectional view taken along line C-C of the semiconductor device according to the embodiment shown in FIG. 37a.

According to the embodiment, the first electrode 3150 may be formed around the plurality of light emitting structures P1, P2, P3, P4, P5, . . . , as shown in FIGS. 37a to 37d. The first electrode 3150 may be formed on the first conductivity type DBR layer 3113 and may comprise an opening exposing the plurality of light emitting structures P1, P2, P3, P4, P5, . . . . The first electrode 3150 may be formed in a region between the plurality of light emitting structures P1, P2, P3, P4, P5, . . . .

For example, an area Ae of the first electrode 3150 may be larger than an area Am of the plurality of light emitting structures P1, P2, P3, P4, P5, . . . . Here, the area Am of the plurality of light emitting structures P1, P2, P3, P4, P5, . . . may indicate the area of the remaining active layer 3115a, 3115b, 3115c, 3115d, . . . without being etched by the mesa etching. A ratio of Am/Ae, that is the area Am of the plurality of light emitting structures P1, P2, P3, P4, P5, . . . with reference to the area Ae of the first electrode 3150, may be provided larger than 25%, for example. According to the semiconductor device 3200 of the embodiment, the number and the diameter of the plurality of light emitting structures P1, P2, P3, P4, P5, . . . may be variously modified according to the application example.

According to the embodiment, the ratio of Am/Ae, that is the area Am of the plurality of light emitting structures P1, P2, P3, P4, P5, . . . with reference to the area Ae of the first electrode 3150, may be provided of, for example, in a range of 25% to 70%. According to the another embodiment, the ratio of Am/Ae, that is the area Am of the plurality of light emitting structures P1, P2, P3, P4, P5, . . . with reference to the area Ae of the first electrode 3150, may be provided of, for example, in a range of 30% to 60%.

The number and diameter of the plurality of light emitting structures P1, P2, P3, P4, P5, . . . disposed in the semiconductor device 3200 can be changed variously according to the application example of the semiconductor device 3200 of the embodiment. [Table described above shows data on semiconductor devices provided with 621 light emitting structures as one example.

For example, the first electrode 3150 may be formed of selected material from a group including Ag, Ni, Al, Rh, Pd, Ir, Ru, Mg, Zn, Pt, Au, Hf, Ti, W, Cr, and those alloys including two or more materials above. The first electrode 3150 may be formed of one layer or a plurality of layers. As the first electrode 3150, a plurality of metal layers may be applied as a reflective metal, and Cr, Ti or the like may be applied as an adhesive layer. For example, the first electrode 3150 may be formed of a Cr/Al/Ni/Au/Ti layer.

Then, as shown in FIGS. 38a to 38d, a first insulating layer 3141 may be formed on the first electrode 3150.

FIGS. 38a to 38d are views showing an example in which the first insulating layer is formed in the method of manufacturing the semiconductor device according to the embodiment of the present invention. FIG. 38a is a plan view showing a step of forming the first insulating layer according to the method of manufacturing the semiconductor device according to the embodiment, FIG. 38b is a sectional view taken along line A-A of the semiconductor device according to the embodiment shown in FIG. 38a, FIG. 38c is a sectional view taken along line B-B of the semiconductor device according to the embodiment shown in FIG. 38a, and FIG. 38d is a sectional view taken along line C-C of the semiconductor device according to the embodiment shown in FIG. 38a.

According to the embodiment, as shown in FIGS. 38a to 38d, the first insulating layer 3141 exposing an upper surface of the plurality of light emitting structures P1, P2, P3, P4, P5, . . . may be formed on the first electrode 3150. The first insulating layer 3141 may be formed on side surfaces of the plurality of light emitting structures P1, P2, P3, P4, P5, . . . . The first insulating layer 3141 may be formed on the first conductivity type DBR layer 3113. The first insulating layer 3141 may be formed in a region between the plurality of light emitting structures P1, P2, P3, P4, P5, . . . .

The first insulating layer 3141 may be provided as an insulating material. For example, the first insulating layer 3141 may be formed of at least one material selected from a group including $SiO_2$, $TiO_2$, $Ta_2O_5$, $SiO_x$, $SiO_xN_y$, $Si_3N_4$, and $Al_2O_3$. In addition, the first insulating layer 3141 may be formed of a DBR layer. According to the embodiment, since the first insulating layer 3141 is provided as a DBR layer, light generated in the plurality of light emitting structures P1, P2, P3, P4, P5, . . . can be efficiently reflected and extracted downward. For example, the first insulating layer 3141 may be provided as a DBR layer formed by stacking $SiO_2$ and $TiO_2$ as a plurality of layers. In addition, the first insulating layer 3141 may be provided as a DBR layer formed by stacking $Ta_2O_3$ and $SiO_2$ as a plurality of layers. In addition, the first insulating layer 3141 may be provided as a DBR layer formed by stacking $SiO_2$ and $Si_3N_4$ as a plurality of layers.

In addition, as shown in FIGS. 39a to 39d, a second electrode 3160 may be formed on the first insulating layer 3141.

FIGS. 39a to 39d are views showing an example in which the second electrode is formed in the method of manufacturing the semiconductor device according to the embodiment of the present invention. FIG. 39a is a plan view showing a step of forming the second electrode according to the method of manufacturing the semiconductor device according to the embodiment, FIG. 39b is a sectional view taken along line A-A of the semiconductor device according to the embodiment shown in FIG. 39a, FIG. 39c is a sectional view taken along line B-B of the semiconductor device according to the embodiment shown in FIG. 39a, and FIG. 39d is a sectional view taken along line C-C of the semiconductor device according to the embodiment shown in FIG. 39a.

According to the embodiment, as shown in FIGS. 39a to 39d, the second electrode 3160 comprising an upper electrode 3160a and a connection electrode 3160b may be formed on the first insulating layer 3141. The upper electrode 3160a may be formed on upper surfaces of the plurality of light emitting structures P1, P2, P3, P4, P5, . . . exposed by the first insulating layer 3141. The connection electrode 3160b may connect the upper electrode 3160a.

The upper electrode 3160a may be formed on an upper surface of the second conductivity type DBR layer constituting the plurality of light emitting structures P1, P2, P3, P4, P5, . . . . The connection electrode 3160b may connect the upper electrodes 3160a disposed on the plurality of light emitting structures P1, P2, P3, P4, P5, . . . to each other. The connection electrode 3160b may be formed in a region between the plurality of light emitting structures P1, P2, P3, P4, P5, . . . .

For example, the connection electrode 3160b of the second electrode 3160 may be provided in a linear shape having a constant line width. Of course, the shape of the connection electrode 3160b of the second electrode 3160 may be variously modified according to embodiments.

For example, the second electrode 3160 may be formed of selected material from a group including Ag, Ni, Al, Rh, Pd, Ir, Ru, Mg, Zn, Pt, Au, Hf, Ti, W, Cr, and those alloys including two or more materials above. The second electrode 3160 may be formed of one layer or a plurality of layers. As the second electrode 3160, a plurality of metal layers may be applied as a reflective metal, and Cr, Ti or the like may be applied as an adhesive layer. For example, the second electrode 3160 may be formed of a Cr/Al/Ni/Au/Ti layer.

Next, as shown in FIGS. 40a to 40d, a second insulating layer 3142 may be formed on the second electrode 3160.

FIGS. 40a to 40d are views showing an example in which the second insulating layer is formed in the method of manufacturing the semiconductor device according to the embodiment of the present invention. FIG. 40a is a plan view showing a step of forming the second insulating layer according to the method of manufacturing the semiconductor device according to the embodiment, FIG. 40b is a sectional view taken along line A-A of the semiconductor device according to the embodiment shown in FIG. 40a, FIG. 40c is a sectional view taken along line B-B of the semiconductor device according to the embodiment shown in FIG. 40a, and FIG. 40d is a sectional view taken along line C-C of the semiconductor device according to the embodiment shown in FIG. 40a.

According to the embodiment, as shown in FIGS. 40a to 40d, the second insulating layer 3142 may be formed to expose the first electrode 3150 disposed under a region between the plurality of light emitting structures P1, P2, P3, P4, P5 . . . , The second insulating layer 3142 may comprise a first opening exposing the first electrode 3150. In addition, the second insulating layer 3142 may comprise a second opening exposing the upper electrode 3160a of the second electrode 3160.

In addition, the second insulating layer 3142 may be formed to selectively expose the connection electrode 3160b of the second electrode 3160, having a line shape, disposed on the first conductivity type DBR layer 3113. For example, the second insulating layer 3142 may be formed on the upper surface of the connection electrode 3160b that is connecting the light emitting structure of P1 and the light emitting structure of P2 such that the second electrode 3160 is not exposed. In addition, the second insulating layer 3142 may be formed to expose an upper surface of the connection electrode 3160b that is connecting the light emitting structure of P1 and the light emitting structure of P5.

The second insulating layer 3142 may be provided as an insulating material. For example, the second insulating layer 3142 may be formed of at least one material selected from a group including $SiO_2$, $TiO_2$, $Ta_2O_5$, $SiO_x$, $SiO_xN_y$, $Si_3N_4$, and $Al_2O_3$. In addition, the second insulating layer 3142 may be formed of a DBR layer. According to the embodiment, since the second insulating layer 3142 is provided of a DBR layer, light generated in the plurality of light emitting structures P1, P2, P3, P4, P5, . . . can be efficiently reflected and extracted downward. For example, the second insulating layer 3142 may be provided as a DBR layer formed by stacking $SiO_2$ and $TiO_2$ as a plurality of layers. In addition, the second insulating layer 3142 may be provided as a DBR layer formed by stacking $Ta_2O_3$ and $SiO_2$ as a plurality of layers. In addition, the second insulating layer 3142 may be provided as a DBR layer formed by stacking $SiO_2$ and $Si_3N_4$ as a plurality of layers.

Then, as shown in FIGS. 41a to 41d, a first bonding pad 3155 and a second bonding pad 3165 may be formed on the second insulating layer 3142.

FIGS. 41a to 41d are views showing an example in which the first bonding pad and the second bonding pad are formed in the method of manufacturing the semiconductor device according to the embodiment of the present invention. FIG. 41a is a plan view showing a step of forming the first bonding pad and the second bonding pad according to the method of manufacturing the semiconductor device according to the embodiment, FIG. 41b is a sectional view taken along line A-A of the semiconductor device according to the embodiment shown in FIG. 41a, FIG. 41c is a sectional view taken along line B-B of the semiconductor device according to the embodiment shown in FIG. 41a, and FIG. 41d is a sectional view taken along line C-C of the semiconductor device according to the embodiment shown in FIG. 41a.

According to the embodiment, the first bonding pad 3155 and the second bonding pad 3165 may be formed on the second insulating layer 3142 spaced apart from each other, as shown in FIGS. 41a to 41d.

The first bonding pad 3155 may be disposed on the first opening to be electrically connected to the first electrode 3150. For example, a lower surface of the first bonding pad 3155 may be disposed in direct contact with an upper surface of the first electrode 3150 through the first opening.

The second bonding pad 3165 may be disposed on the second opening and electrically connected to the second electrode 3160. For example, a lower surface of the second bonding pad 3165 may be disposed in direct contact with an upper surface of the second electrode 3160 through the second opening.

For example, the first bonding pad 3155 and the second bonding pad 3165 may be formed of selected material from a group including Ag, Ni, Al, Rh, Pd, Ir, Ru, Mg, Zn, Pt, Au, Hf, Ti, W, Cr, Cu, and those alloys including two or more materials above. The first bonding pad 3155 and the second bonding pad 3165 may be formed of one layer or a plurality of layers. The first bonding pad 3155 and the second bonding pad 3165 may comprise a diffusion barrier metal such as Cr, Cu, and the like to prevent diffusion of Sn from solder bonding. For example, the first bonding pad 3155 and the second bonding pad 172 may be formed of a plurality of layers including Ti, Ni, Cu, Cr, and Au.

Meanwhile, the semiconductor device according to the embodiment described above can be attached to a submount and supplied in the form of a semiconductor device package.

FIG. 42 is a view showing a semiconductor device package according to an embodiment of the present invention. In describing the semiconductor device package according to the embodiment with reference to FIG. 42, description related to the semiconductor device described above may be omitted.

The semiconductor device package 6000 according to the embodiment may comprise a submount 6300 and a semiconductor device 6200 disposed on the submount 6300 as shown in FIG. 42.

The semiconductor device 6200 may comprise a first bonding pad 6155 and a second bonding pad 6165. The first bonding pad 6155 and the second bonding pad 6165 may be disposed on a first surface 51 of the semiconductor device 6200. In addition, the semiconductor device 6200 may comprise a second surface S2 disposed in a direction opposite to the first surface 51.

According to the embodiment, the semiconductor device 6200 may be disposed on the submount 6300 through the first bonding pad 6155 and the second bonding pad 6165. The first bonding pad 6155 and the second bonding pad 6165 may be electrically connected to the submount 6300. The submount 6300 may comprise a circuit board that provides power to the semiconductor device 6200.

The semiconductor device 6200 according to the embodiment may emit generated light through the second surface S2 as described above. The semiconductor device 6200 may provide a beam to the outside through the second surface S2, which is an opposite surface of the first surface 51 on which the first bonding pad 6155 and the second bonding pad 6165 are formed.

According to the semiconductor device package 6000 of the embodiment, power can be supplied to the semiconductor device 6200 through the submount 6300. In addition, the semiconductor device package 6000 can effectively dissipate the heat generated in the semiconductor device 6200 through the submount 6300.

According to the embodiment, the submount 6300 may comprise a circuit electrically connected to the semiconductor device 6200. For example, the submount 6300 may be formed based on a material such as silicon (Si), aluminum nitride (AlN), or the like.

Meanwhile, FIG. 43 is a view showing another example of a semiconductor device package according to an embodiment of the present invention. In describing the semiconductor device package of the embodiment with reference to FIG. 43, descriptions overlapping with those of the semiconductor device and the semiconductor device package described above may be omitted.

The semiconductor device package 7000 according to the embodiment may comprise a submount 7300 and a semiconductor device 7200 disposed on the submount 7300 as shown in FIG. 43.

The semiconductor device 7200 may comprise a first bonding pad 7155 and a second bonding pad 7165. The first bonding pad 7155 and the second bonding pad 7165 may be disposed on a first surface 51 of the semiconductor device 7200. In addition, the semiconductor device 7200 may comprise a second surface S2 disposed in a direction opposite to the first surface 51.

According to the embodiment, the semiconductor device 7200 may be disposed on the submount 7300 through the first bonding pad 7155 and the second bonding pad 7165. The first bonding pad 7155 and the second bonding pad 7165 may be electrically connected to the submount 7300. The submount 7300 may comprise a circuit board that provides power to the semiconductor device 7200.

The semiconductor device 7200 according to the embodiment may emit generated light through the second surface S2 as described above. The semiconductor device 7200 may provide a beam to the outside through the second surface S2, which is an opposite surface of the first surface 51 on which the first bonding pad 7155 and the second bonding pad 7165 are formed.

According to the semiconductor device package 7000 of the embodiment, power can be supplied to the semiconductor device 7200 through the submount 7300. In addition, the semiconductor device package 7000 can effectively dissipate the heat generated in the semiconductor device 7200 through the submount 7300.

According to the embodiment, the submount 7300 may comprise a circuit electrically connected to the semiconductor device 7200. For example, the submount 7300 may be formed based on a material such as silicon (Si), aluminum nitride (AlN), or the like.

Meanwhile, the semiconductor device and the semiconductor device package described above may be applied to object detection, three-dimensional motion recognition, and IR illumination. Also, the semiconductor device and the semiconductor device package described above may be applied to the fields of Light Detection and Ranging (LiDAR), Blind Spot Detection (BSD), and Advanced Driver Assistance System (ADAS) for autonomous driving. In addition, the semiconductor device and the semiconductor device package described above may also be applied to the Human Machine Interface (HMI) field.

The semiconductor device and the semiconductor device package according to the embodiment may be applied to a proximity sensor, an autofocus device, and the like as an example of an object detection apparatus. For example, the object detecting apparatus according to the embodiment may comprise a light emitting unit that emits light and a light receiving unit that receives light. As an example of the light emitting unit, any one of the semiconductor device packages described with reference to FIGS. 15 and 24 may be applied. A photodiode may be applied as an example of the light receiving unit. The light receiving unit may receive light reflected from an object by the light emitted from the light emitting unit.

In addition, the autofocus device may be variously applied to a mobile terminal, a camera, a vehicle sensor, an optical communication device, and the like. The autofocus device may be applied to various fields for multi position detection for detecting the position of a subject.

FIG. 44 is a perspective view of a mobile terminal to which an autofocus device comprising the semiconductor device package according to the embodiment of the present invention is applied.

As shown in FIG. 44, the mobile terminal 8500 of the embodiment may comprise a camera module 8520, a flash module 8530, and an autofocus device 8510 provided on the rear side. Here, the autofocus device 8510 may comprise any one of the semiconductor device packages according to the embodiments described above as the light emitting unit.

The flash module 8530 may comprise a light emitting device that emits light and is disposed inside. The flash module 8530 may be operated by the camera operation of the mobile terminal or the user's control. The camera module 8520 may comprise an image photographing function and an auto focus function. For example, the camera module 8520 may comprise an auto focus function using an image.

The autofocus device 8510 may comprise an autofocusing function using a laser. The autofocus device 8510 may be used mainly in a close, for example, 10 m or less, or dark environment where the auto focus function using the image of the camera module 8520 is degraded. The autofocus device 8510 may comprise a light emitting unit comprising a vertical cavity surface emitting laser (VCSEL) semiconductor device, and a light receiving unit such as a photodiode, that converts light energy into electrical energy.

The features, structures, effects and the like described in the above embodiments are included in at least one embodiment and are not limited to one embodiment only. Further, with respect to the features, structures, effects, and the like described in the embodiments, other embodiments may be carried out with combinations or modifications by those having ordinary skill in the art. Accordingly, the contents relevant to the combinations and modifications should be construed as being included in the scope of the embodiments.

Although preferable embodiments have been proposed and set forth in the aforementioned description, the present invention should not be construed as limited thereto. It will be apparent that various deformations and modifications not illustrated are available within the scope without departing from inherent features of the embodiment of the present invention by any one having ordinary skill in the art. For example, each component specifically shown in the embodiments may be carried out with the modifications. In addition, it is apparent that differences relevant to the modifications and deformations are included in the scope of the embodiments set in the accompanying claims of the present invention.

According to the semiconductor device, the method of manufacturing the semiconductor device, the semiconductor device package, and the object detecting apparatus, there is an advantage that an excellent heat dissipation characteristic can be provided.

According to the semiconductor device, the method of manufacturing the semiconductor device, the semiconductor device package, and the object detecting apparatus, there is an advantage that the light extraction efficiency can be enhanced and light of high output can be provided.

According to the semiconductor device, the method of manufacturing the semiconductor device, the semiconductor device package, and the object detecting apparatus, there is an advantage that the power conversion efficiency can be improved.

According to the semiconductor device, the method of manufacturing the semiconductor device, the semiconductor device package, and the object detecting apparatus, there is an advantage that the manufacturing cost can be reduced and the reliability can be improved.

The invention claimed is:

1. A semiconductor device, comprising:
    a first light emitting structure comprising a first DBR layer of a first conductivity type, a first active layer disposed on the first DBR layer, and a second DBR layer of a second conductivity type disposed on the first active layer;
    a second light emitting structure comprising a third DBR layer of the first conductivity type, a second active layer disposed on the third DBR layer, and a fourth DBR layer of the second conductivity type disposed on the second active layer; and
    a dummy structure disposed spaced apart from the second DBR layer and the fourth DBR layer, and comprising a first conductivity type DBR layer and a second conductivity type DBR layer disposed on the first conductivity type DBR layer,
    wherein the first DBR layer, the third DBR layer, and the first conductivity type DBR layer are integrally connected and arranged,
    wherein the first conductivity type DBR layer of the dummy structure and the second conductivity type DBR layer of the dummy structure are electrically connected in common,
    wherein a first electrode is electrically connected with the first DBR layer, the third DBR layer, and the first conductivity type DBR layer, and
    wherein, when viewed from an optical axis direction, the first electrode includes a plurality of openings, and the second DBR layer of the first light emitting structure and the fourth DBR layer of the second light emitting structure are disposed in the plurality of openings.

2. The semiconductor device according to claim 1, further comprising a second electrode electrically connected with the second DBR layer and the fourth DBR layer.

3. The semiconductor device according to claim 1, further comprising a first bonding pad,
    wherein the first bonding pad is electrically connected with the first conductivity type DBR layer of the dummy structure, and
    wherein the first bonding pad is disposed spaced apart from the second DBR layer and the fourth DBR layer.

4. The semiconductor device according to claim 3, further comprising a second bonding pad,
    wherein the second bonding pad is electrically connected with the second DBR layer and the fourth DBR layer, and
    wherein the second bonding pad is disposed spaced apart from the first bonding pad.

5. The semiconductor device according to claim 3, wherein the first bonding pad is disposed to overlap with the first conductivity type DBR layer in the optical axis direction.

6. The semiconductor device according to claim 4, wherein the second bonding pad is disposed to overlap with the second DBR layer and the fourth DBR layer in the optical axis direction.

7. The semiconductor device according to claim 1, further comprising an insulating layer disposed between each of the first light emitting structure, the second light emitting structure, and the dummy structure.

8. The semiconductor device according to claim 1, further comprising an insulating layer disposed between each of the second DBR layer, the fourth DBR layer, and the second conductivity type DBR layer.

9. The semiconductor device according to claim 1, wherein the first DBR layer, the third DBR layer, and the first conductivity type DBR layer are disposed to overlap with each other in a direction perpendicular to the optical axis direction.

10. The semiconductor device according to claim 1, wherein the first DBR layer, the third DBR layer, and the first conductivity type DBR layer are physically connected to each other in a direction perpendicular to the optical axis direction.

11. The semiconductor device according to claim 1, wherein, when viewed from the optical axis direction of light emitted from the first and second light emitting structures, the first and second light emitting structures are disposed in a first region, and the dummy structure does not generate light and is disposed around the first region in a closed loop shape to surround the first region and be spaced apart from the first and second light emitting structures.

12. A semiconductor device, comprising:
    first and second light emitting structures disposed in a first region; and
    a dummy structure disposed in a second region that is around the first region in a closed loop shape to surround the first region and be spaced apart from the first and second light emitting structures, when viewed in an optical axis direction of light emitted from the first and second light emitting structures,
    wherein the first light emitting structure comprises a first DBR layer of a first conductivity type, a second DBR layer of a second conductivity type, and a first active layer disposed between the first DBR layer and the second DBR layer,
    wherein the second light emitting structure comprises a third DBR layer of the first conductivity type, a fourth DBR layer of the second conductivity type, and a second active layer disposed between the third DBR layer and the fourth DBR layer,
    wherein the dummy structure comprises a first conductivity type DBR layer, and a second conductivity type DBR layer,
    wherein the first DBR layer, the third DBR layer, and the first conductivity type DBR layer are disposed to overlap with each other in a direction perpendicular to the optical axis direction, wherein the first conductivity type DBR layer of the dummy structure and the second conductivity type DBR layer of the dummy structure are electrically connected in common, wherein a first electrode is electrically connected with the first DBR layer, the third DBR layer, and the first conductivity type DBR layer, wherein a second electrode is electrically connected with the second DBR layer and the fourth DBR layer, wherein the first electrode is disposed in direct contact with an upper surface of the first DBR layer and an upper surface of the third DBR layer, and wherein the second electrode is electrically insulated from the second conductivity type DBR layer of the dummy structure.

13. The semiconductor device according to claim 12, further comprising:

a first bonding pad electrically connected with the first conductivity type DBR layer of the dummy structure, and disposed to overlap with the second region in the optical axis direction; and a second bonding pad electrically connected with the second DBR layer and the fourth DBR layer, and disposed to overlap with the first region in the optical axis direction.

14. The semiconductor device according to claim 13, wherein the first electrode is electrically connected with the first bonding pad.

15. The semiconductor device according to claim 13, wherein the second electrode is electrically connected with the second bonding pad.

16. The semiconductor device according to claim 13, wherein the first bonding pad is disposed spaced apart from the second DBR layer and the fourth DBR layer.

17. The semiconductor device according to claim 13, wherein the second bonding pad is disposed spaced apart from the first bonding pad.

\* \* \* \* \*